United States Patent
Caldwell et al.

(10) Patent No.: US 9,306,561 B2
(45) Date of Patent: Apr. 5, 2016

(54) TOUCH SWITCHES AND PRACTICAL APPLICATIONS THEREFOR

(75) Inventors: David W. Caldwell, Holland, MI (US); Rick L. Oppor, Schaumburg, IL (US); Anthony V. Gioiosa, Justice, IL (US); Robert B. Campbell, Naperville, IL (US); Thomas M. Schreiber, Wheaton, IL (US); Bahar N. Wadia, Bartlett, IL (US); Mark R. Mathews, Lombard, IL (US); Donald Charles Mueller, Aurora, IL (US); Daniel Eavenson, Tinley Park, IL (US)

(73) Assignee: TOUCHSENSOR TECHNOLOGIES, LLC, Wheaton, IL (US)

( * ) Notice: Subject to any disclaimer, the term of this patent is extended or adjusted under 35 U.S.C. 154(b) by 941 days.

(21) Appl. No.: 13/540,250

(22) Filed: Jul. 2, 2012

(65) Prior Publication Data

US 2012/0267964 A1 Oct. 25, 2012

Related U.S. Application Data

(63) Continuation of application No. 13/027,080, filed on Feb. 14, 2011, now Pat. No. 8,227,940, which is a continuation of application No. 11/236,077, filed on Sep. 26, 2005, now Pat. No. 7,906,875, which is a (Continued)

(51) Int. Cl.
*H02B 1/24* (2006.01)
*B23K 11/24* (2006.01)
(Continued)

(52) U.S. Cl.
CPC .............. *H03K 17/962* (2013.01); *A47B 57/00* (2013.01); *A47B 96/025* (2013.01); *G09F 3/204* (2013.01);

(Continued)

(58) Field of Classification Search
CPC ........... H03K 17/962; H01H 2239/006; Y10T 307/74; Y10T 307/766; Y10T 307/937
USPC ......................... 307/112, 116, 139; 200/600
See application file for complete search history.

(56) References Cited

U.S. PATENT DOCUMENTS 3,200,306 A 8/1965 Atkins et al.
3,254,313 A 5/1966 Atkins et al.

(Continued)

FOREIGN PATENT DOCUMENTS

DE 2311249 9/1973
DE 2739786 3/1979

(Continued)

OTHER PUBLICATIONS

Int'l Search Report issued Feb. 20, 2006, in application No. PCT/US05/34554 (2006).

(Continued)

*Primary Examiner* — Carlos Amaya
(74) *Attorney, Agent, or Firm* — Barnes & Thornburg LLP

(57) ABSTRACT

A touch switch apparatus emulating a mechanical switch includes a field effect sensor and an electric field stimulator mechanically associated with the field effect sensor. A field generation signal applied to the field effect sensor causes an electric field to be generated thereabout. The electric field stimulator can be moved between first and second positions with respect to the field effect sensor. When moved into proximity with the field effect sensor, the electric field stimulator disturbs the electric field. A detection circuit coupled to the field effect sensor detects and responds to the disturbance to the electric field.

24 Claims, 89 Drawing Sheets

Related U.S. Application Data continuation-in-part of application No. 10/272,377, filed on Oct. 15, 2002, now Pat. No. 7,218,498, which is a continuation of application No. 10/027,884, filed on Oct. 25, 2001, now Pat. No. 6,713,897, which is a continuation of application No. 09/234,150, filed on Jan. 19, 1999, now Pat. No. 6,320,282.

(60) Provisional application No. 60/613,073, filed on Sep. 24, 2004, provisional application No. 60/334,040, filed on Nov. 20, 2001, provisional application No. 60/341,350, filed on Dec. 18, 2001, provisional application No. 60/341,550, filed on Dec. 18, 2001, provisional application No. 60/341,551, filed on Dec. 18, 2001, provisional application No. 60/388,245, filed on Jun. 13, 2002.

(51) Int. Cl.
*H03K 17/96* (2006.01)
*A47B 57/00* (2006.01)
*A47B 96/02* (2006.01)
*G09F 3/20* (2006.01)
*G09F 9/30* (2006.01)
*F25D 25/02* (2006.01)

(52) U.S. Cl.
CPC *G09F 9/30* (2013.01); *H03K 17/96* (2013.01); *H03K 17/9622* (2013.01); *F25D 25/02* (2013.01); *F25D 2325/022* (2013.01); *F25D 2331/803* (2013.01); *H03K 2017/9602* (2013.01); *Y10T 307/74* (2015.04); *Y10T 307/766* (2015.04); *Y10T 307/937* (2015.04)

(56) References Cited

U.S. PATENT DOCUMENTS

| | | | |
|---|---|---|---|
| 3,275,897 A | 9/1966 | Atkins |
| 3,909,625 A | 9/1975 | Colglazier et al. |
| 3,944,843 A | 3/1976 | Vaz Martins |
| 3,974,472 A | 8/1976 | Gould |
| 4,016,490 A | 4/1977 | Weckenmann et al. |
| 4,054,860 A | 10/1977 | Henderson et al. |
| 4,090,092 A | 5/1978 | Serrano |
| 4,091,610 A | 5/1978 | Sasaki et al. |
| 4,105,902 A | 8/1978 | Iwai et al. |
| 4,123,631 A | 10/1978 | Lewis |
| 4,175,239 A | 11/1979 | Sandler |
| 4,221,975 A | 9/1980 | Ledniczki et al. |
| 4,257,117 A | 3/1981 | Besson |
| 4,263,618 A | 4/1981 | Wine |
| 4,291,303 A | 9/1981 | Cutler et al. |
| 4,295,132 A | 10/1981 | Burney et al. |
| 4,321,479 A | 3/1982 | Ledniczki et al. |
| 4,345,167 A | 8/1982 | Calvin |
| 4,352,552 A | 10/1982 | Stange |
| 4,353,552 A | 10/1982 | Pepper, Jr. |
| 4,363,029 A | 12/1982 | Piliavin et al. |
| 4,379,287 A | 4/1983 | Tyler et al. |
| 4,380,040 A | 4/1983 | Posset |
| 4,394,643 A | 7/1983 | Williams |
| 4,400,758 A | 8/1983 | Frame |
| 4,405,917 A | 9/1983 | Chai |
| 4,405,918 A | 9/1983 | Wall et al. |
| 4,529,968 A | 7/1985 | Hilsum et al. |
| 4,535,254 A | 8/1985 | Khatri |
| 4,550,310 A | 10/1985 | Yamaguchi et al. |
| 4,556,871 A | 12/1985 | Yoshikawa et al. |
| 4,561,002 A | 12/1985 | Chiu |
| 4,562,315 A | 12/1985 | Aufderheide |
| 4,584,519 A | 4/1986 | Gruodis |
| 4,651,033 A | 3/1987 | Yasutake et al. |
| 4,651,133 A | 3/1987 | Ganesan et al. |
| 4,663,542 A | 5/1987 | Buck et al. |
| 4,731,548 A | 3/1988 | Ingraham |
| 4,733,222 A | 3/1988 | Evans |
| 4,740,781 A | 4/1988 | Brown |
| 4,758,735 A | 7/1988 | Ingraham |
| 4,831,279 A | 5/1989 | Ingraham |
| 4,855,550 A | 8/1989 | Schultz, Jr. |
| 4,924,222 A | 5/1990 | Antikidis et al. |
| 4,950,922 A | 8/1990 | Krummer |
| 5,012,124 A | 4/1991 | Hollaway |
| 5,063,306 A | 11/1991 | Edwards |
| 5,087,825 A | 2/1992 | Ingraham |
| 5,153,572 A | 10/1992 | Caldwell et al. |
| 5,155,338 A | 10/1992 | Hoffmann |
| 5,189,417 A | 2/1993 | Caldwell et al. |
| 5,194,862 A | 3/1993 | Edwards |
| 5,239,152 A | 8/1993 | Caldwell et al. |
| 5,270,710 A | 12/1993 | Gaultier et al. |
| 5,457,289 A | 10/1995 | Huang et al. |
| 5,495,077 A | 2/1996 | Miller et al. |
| 5,508,700 A | 4/1996 | Taylor et al. |
| 5,526,294 A | 6/1996 | Ono et al. |
| 5,531,002 A | 7/1996 | Okada |
| 5,594,222 A | 1/1997 | Caldwell |
| 5,760,715 A | 6/1998 | Senk et al. |
| 5,796,183 A | 8/1998 | Hourmand |
| 5,856,646 A | 1/1999 | Simon |
| 5,959,687 A | 9/1999 | Dinwiddie et al. |
| 5,973,623 A | 10/1999 | Gupta et al. |
| 6,219,035 B1 | 4/2001 | Skog |
| 6,268,753 B1 | 7/2001 | Sandusky |
| 6,310,611 B1 | 10/2001 | Caldwell |
| 6,320,282 B1 | 11/2001 | Caldwell |
| 6,530,283 B2 | 3/2003 | Okada et al. |
| 6,608,085 B1 | 8/2003 | Gillespie et al. |
| 6,621,029 B2 | 9/2003 | Galmiche et al. |
| 6,655,011 B1 | 12/2003 | Kornrumpf et al. |
| 6,677,843 B1 | 1/2004 | Monroe et al. |
| 6,713,897 B2 | 3/2004 | Caldwell |
| 6,867,680 B1 | 3/2005 | Kulle |
| 6,897,390 B2 | 5/2005 | Caldwell et al. |
| 6,989,677 B2 | 1/2006 | Morimoto |
| 6,990,867 B2 | 1/2006 | Okada |
| 7,242,393 B2 | 7/2007 | Caldwell |
| 7,260,438 B2 | 8/2007 | Caldwell et al. |
| 7,361,860 B2 | 4/2008 | Caldwell |
| 2008/0111428 A1 | 5/2008 | Baier et al. |

FOREIGN PATENT DOCUMENTS

| | | |
|---|---|---|
| DE | 3242621 | 5/1984 |
| EP | 0920042 | 6/1999 |
| EP | 1217743 | 6/2002 |
| EP | 1873609 | 1/2008 |
| GB | 1219074 | 1/1971 |
| GB | 1464094 | 2/1977 |
| GB | 2115553 | 9/1983 |
| GB | 2394775 | 5/2004 |
| WO | WO 98/26506 | 6/1998 |
| WO | WO 00/42628 | 6/2000 |
| WO | WO 2004/040606 | 5/2004 |
| WO | WO 2005/019766 | 3/2005 |

OTHER PUBLICATIONS

Office Action issued Sep. 25, 2009, in related application No. AU2005289529 (2009).

Office Action issued May 27, 2008, in related application No. EP05800122.3 (2008).

Office Action issued Feb. 17, 2010, in related application No. EP05800122.3 (2010).

Office Action issued May 13, 2009, in related application No. NZ554621 (2009).

Int'l Preliminary Report on Patentability issued Oct. 13, 2011, in application No. PCT/US2010/029651 (2011).

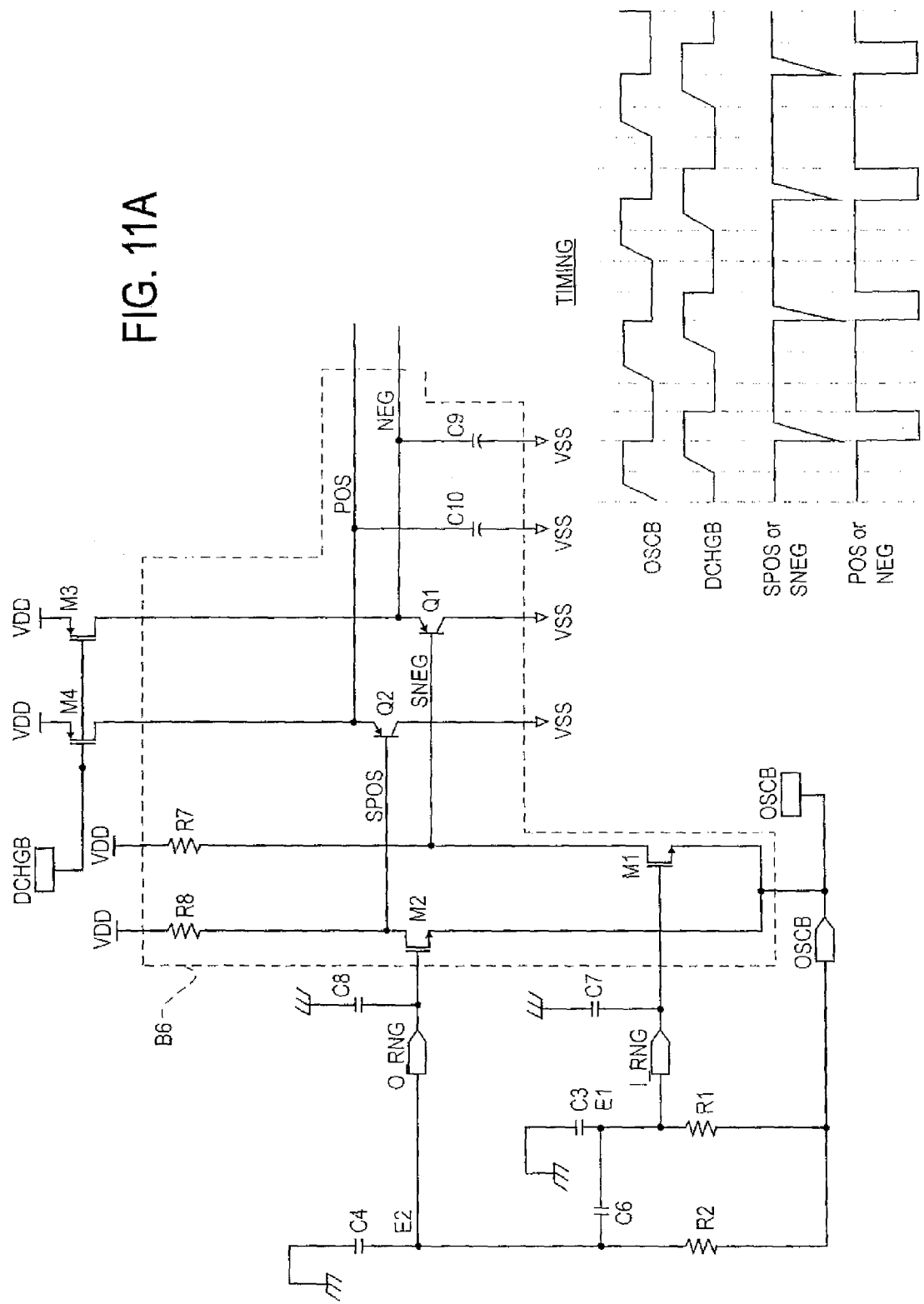

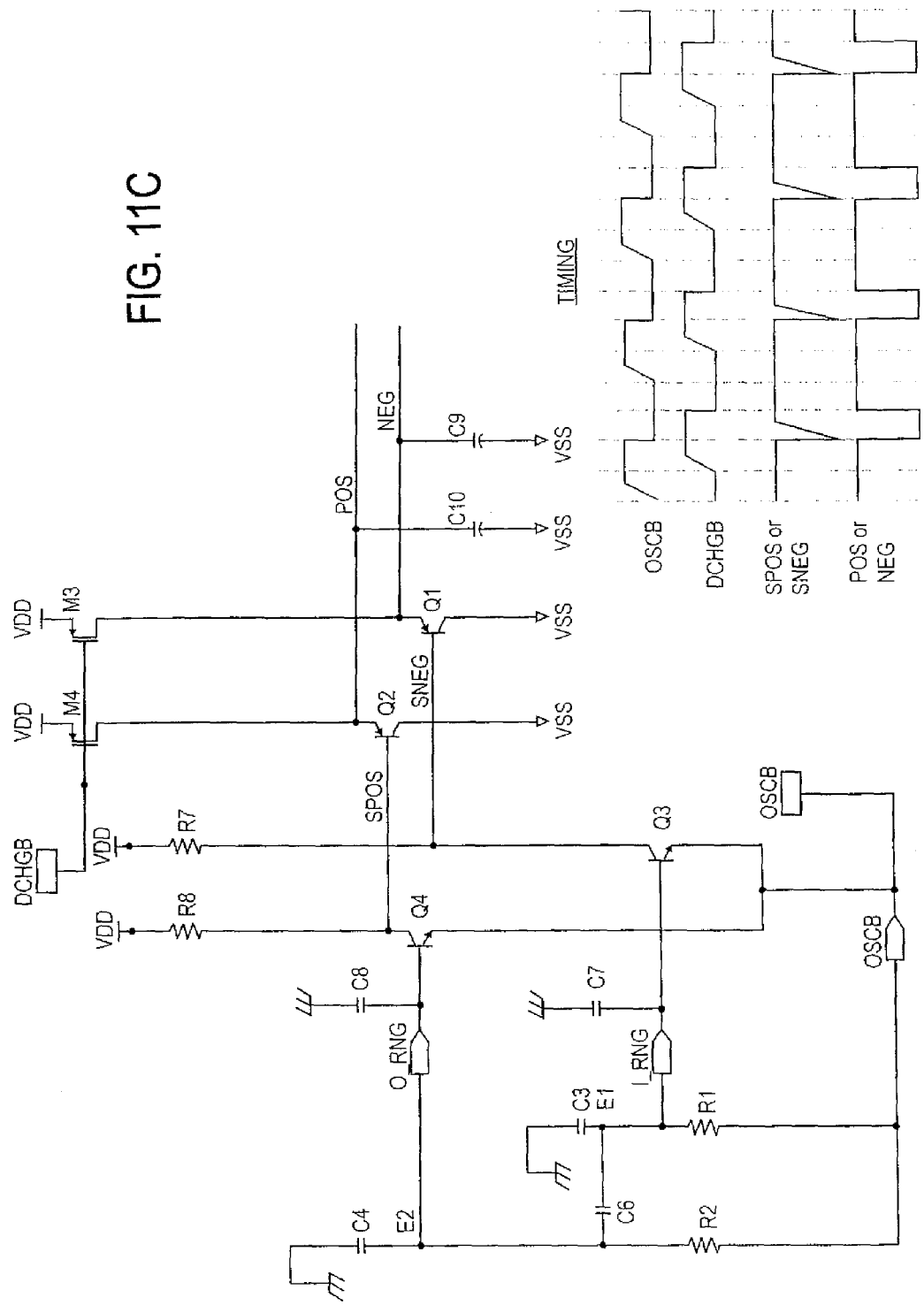

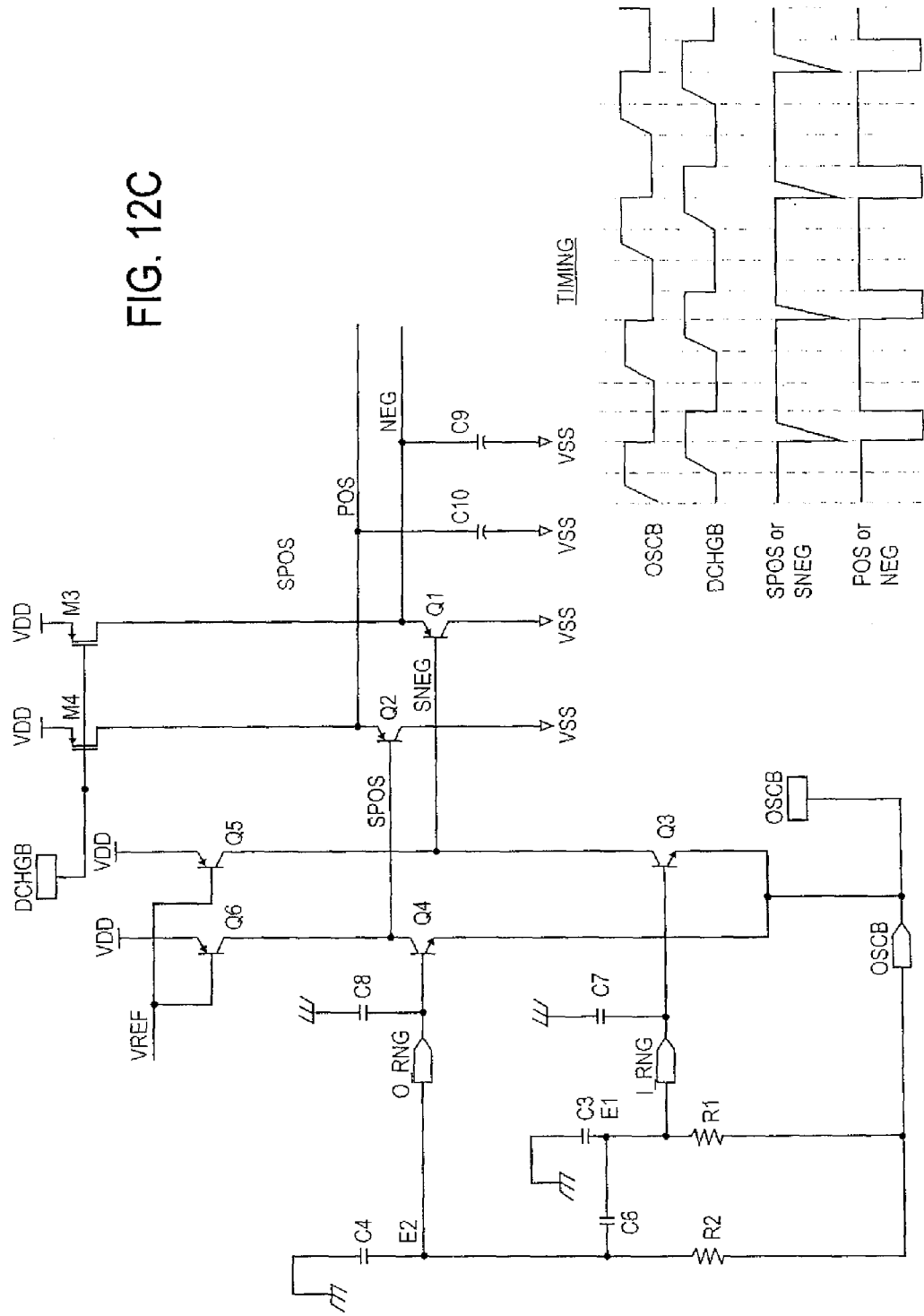

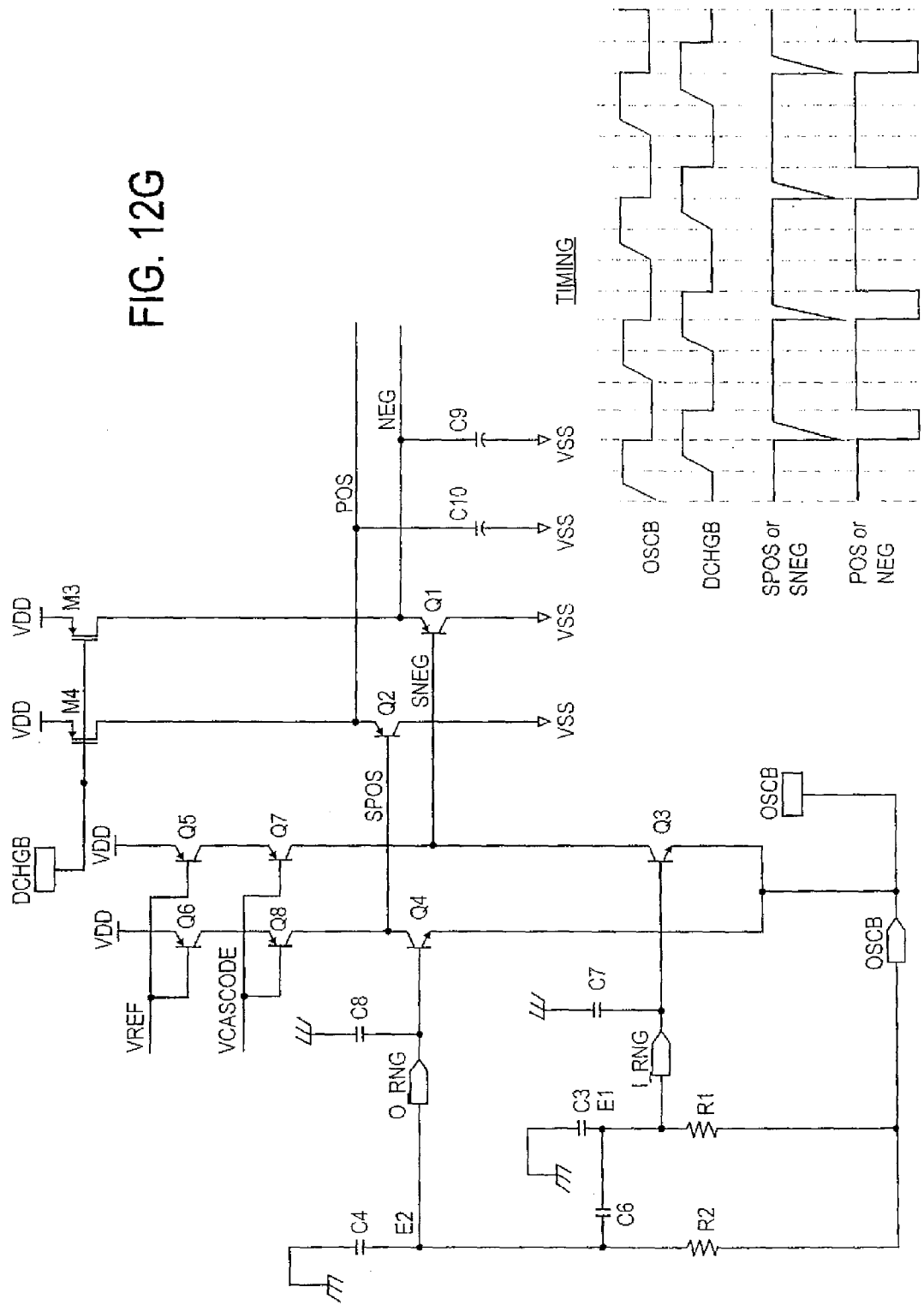

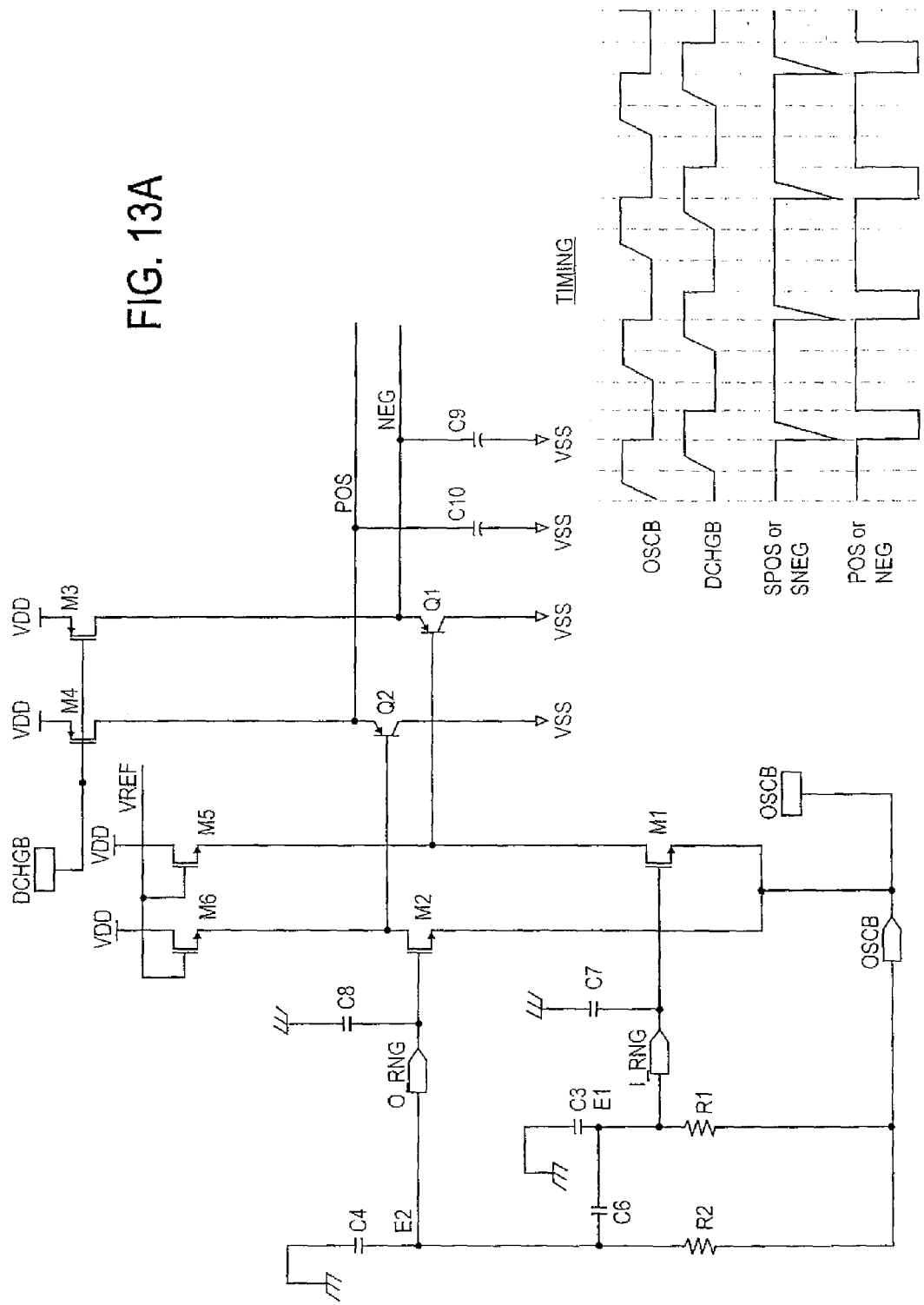

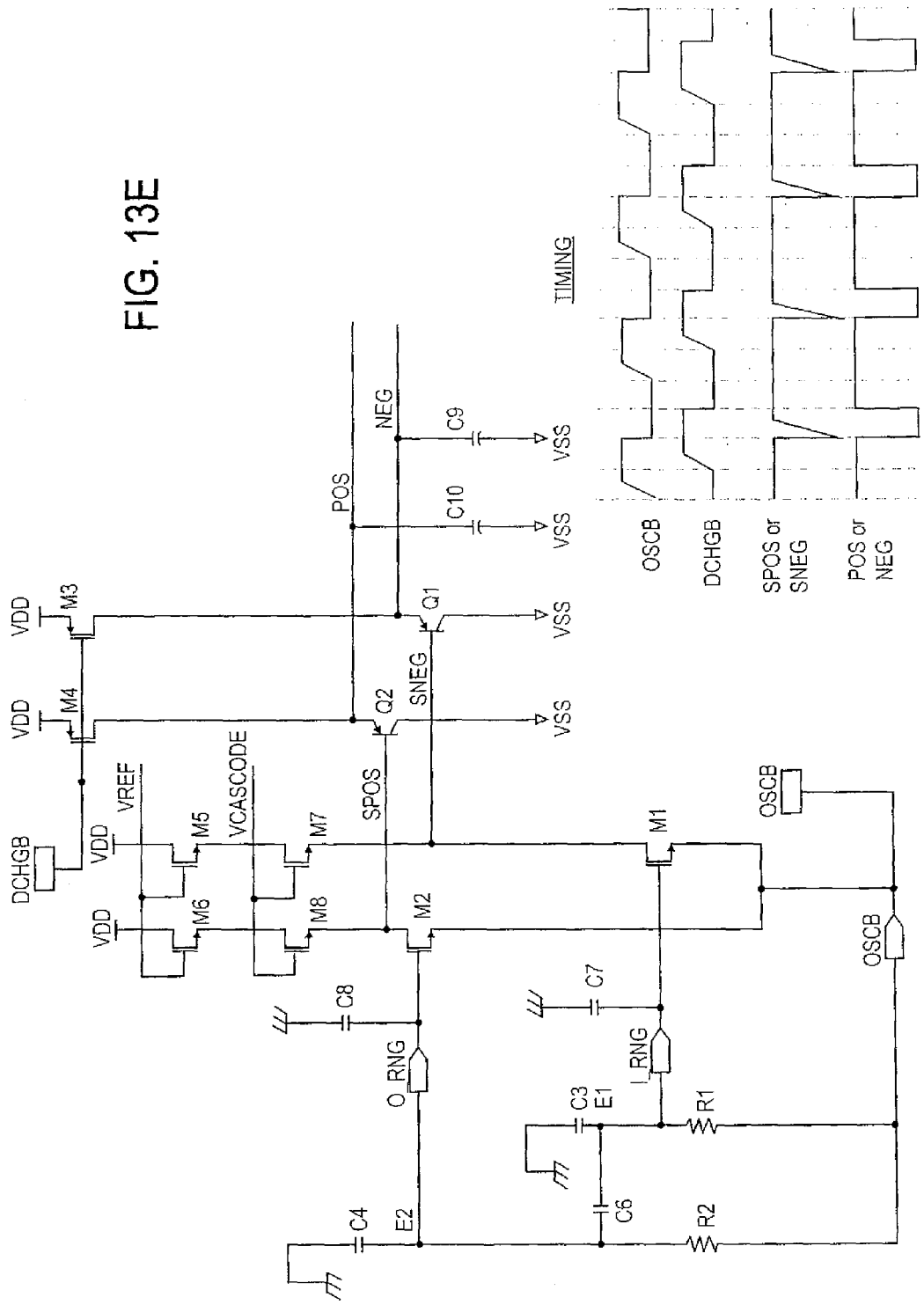

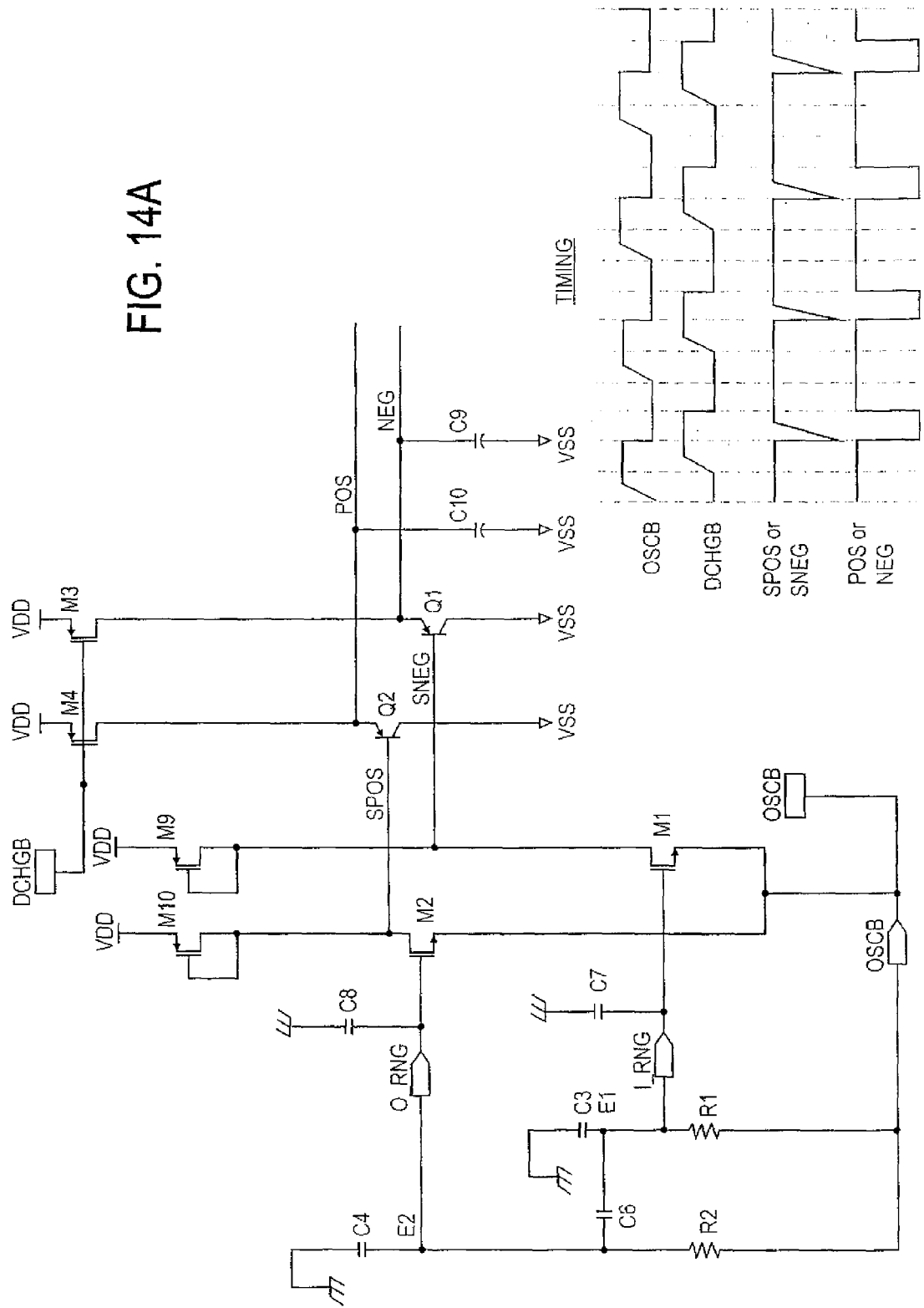

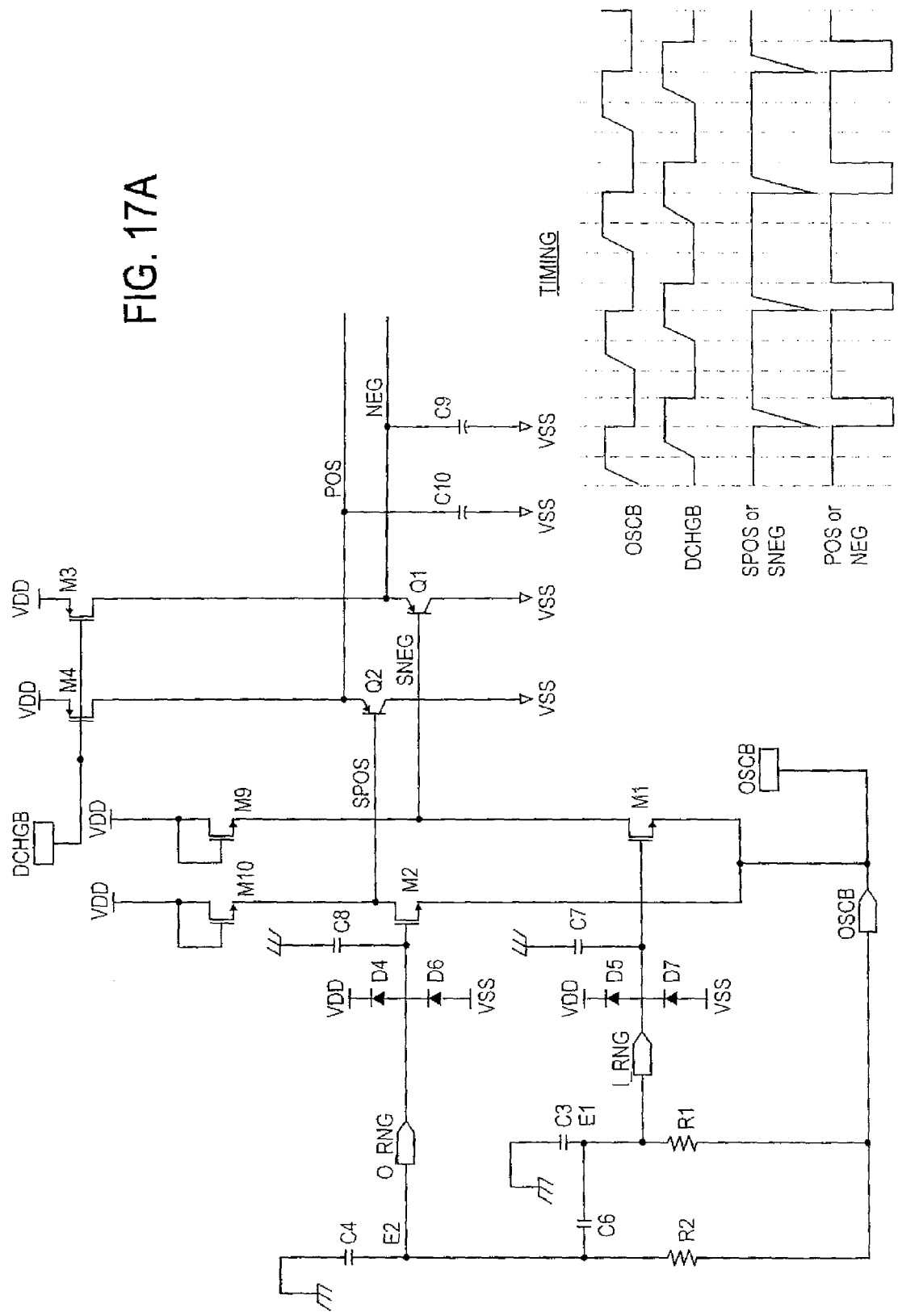

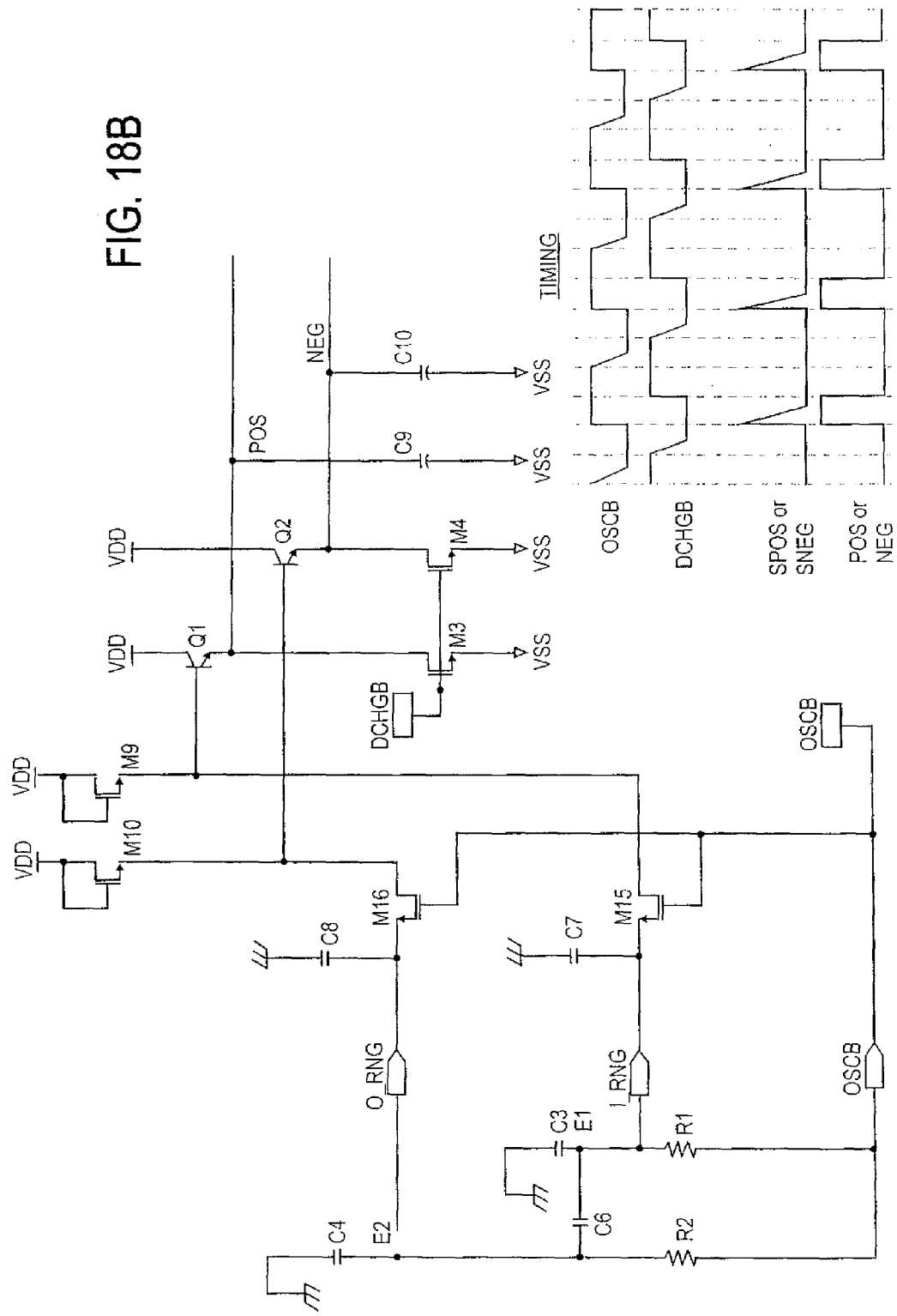

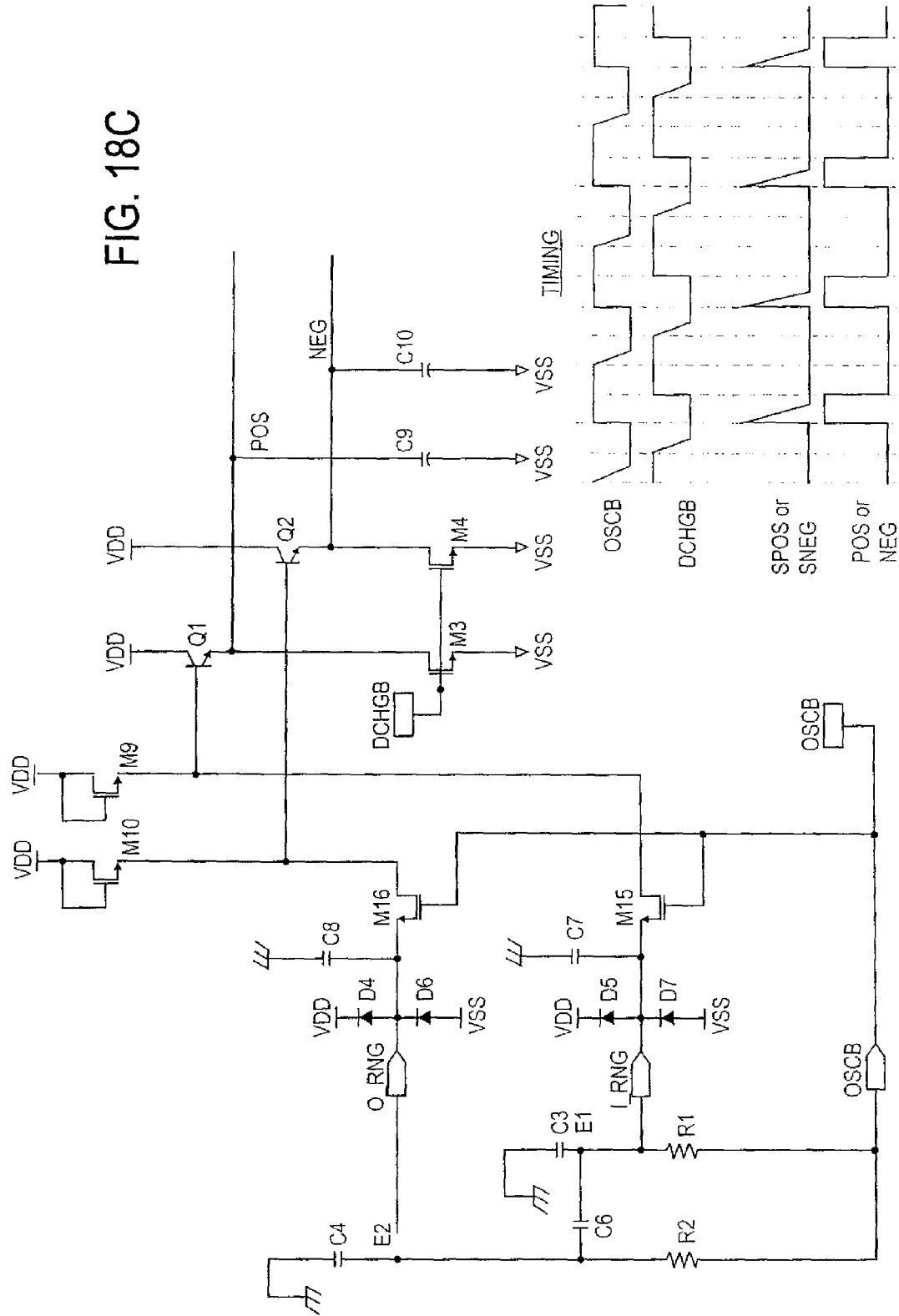

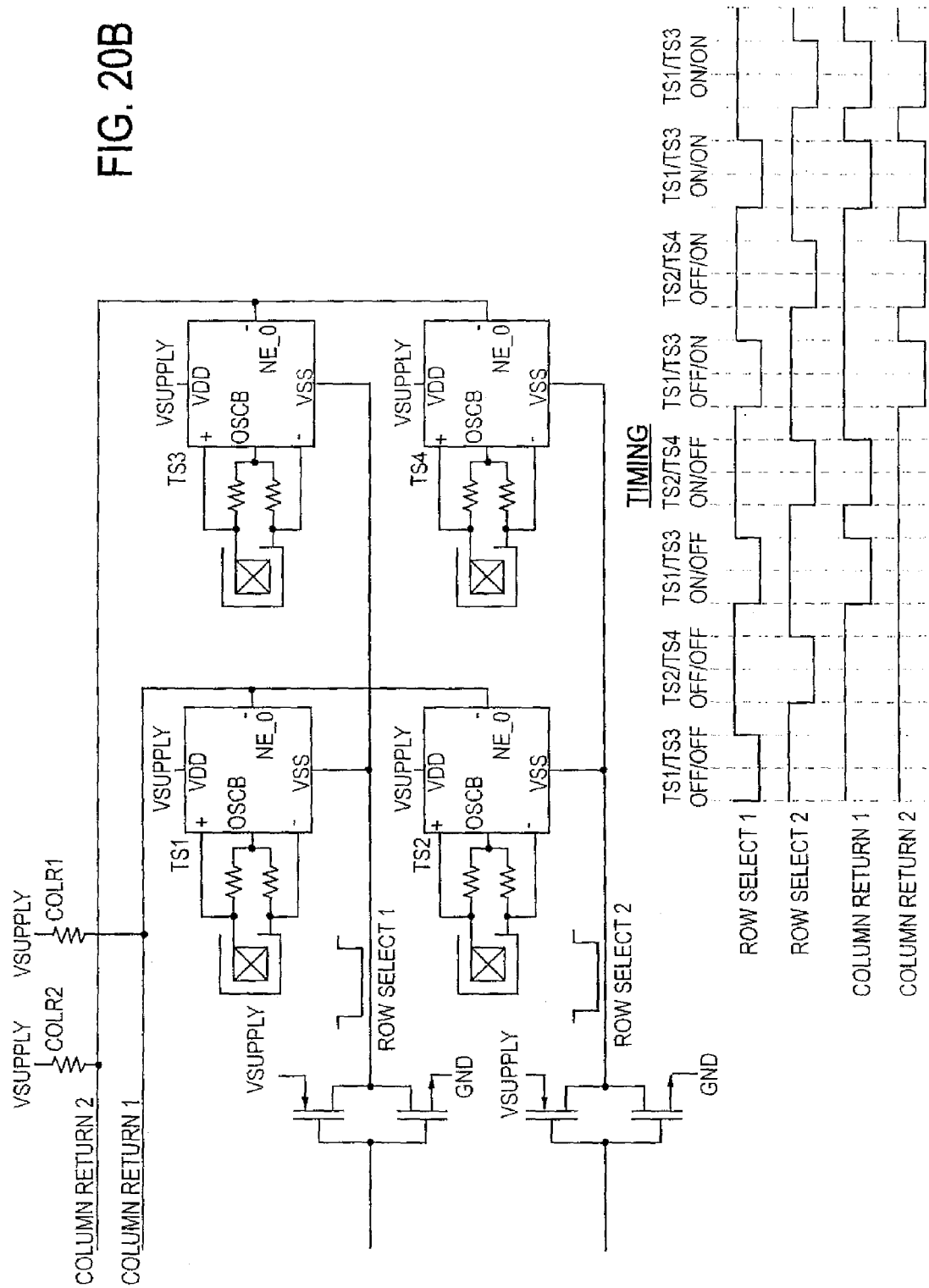

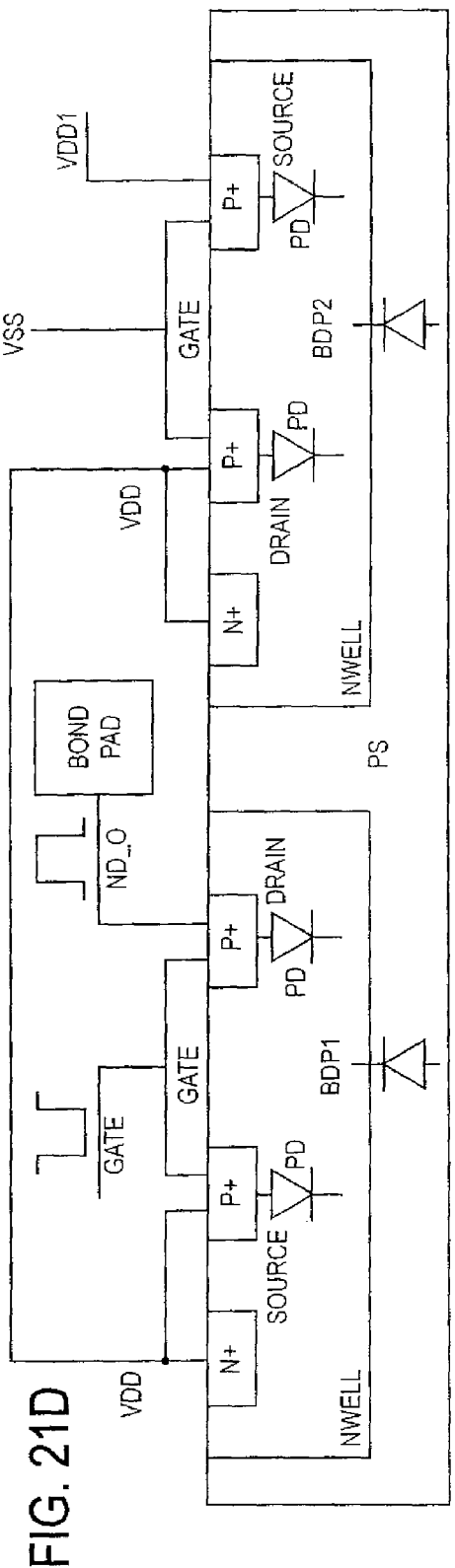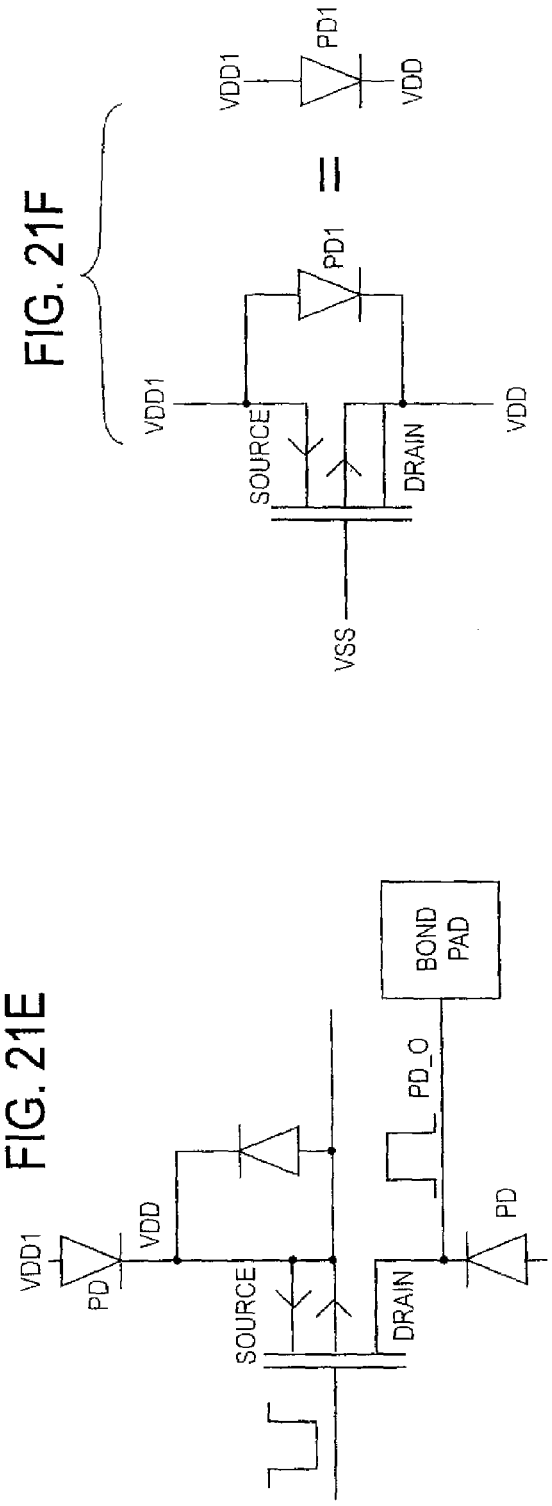
FIG. 21D
FIG. 21E
FIG. 21F $$C_{SENSE} = \frac{\varepsilon_o \varepsilon_r S}{d}$$

$\varepsilon_o$ = 8.854 × 10⁻¹² FARADS/METER $\varepsilon_r$ = RELATIVE DIELECTRIC CONSTANT

S = SURFACE AREA OF ELECTRODES (METERS²)

d = DISTANCE BETWEEN ELECTRODES (METERS)

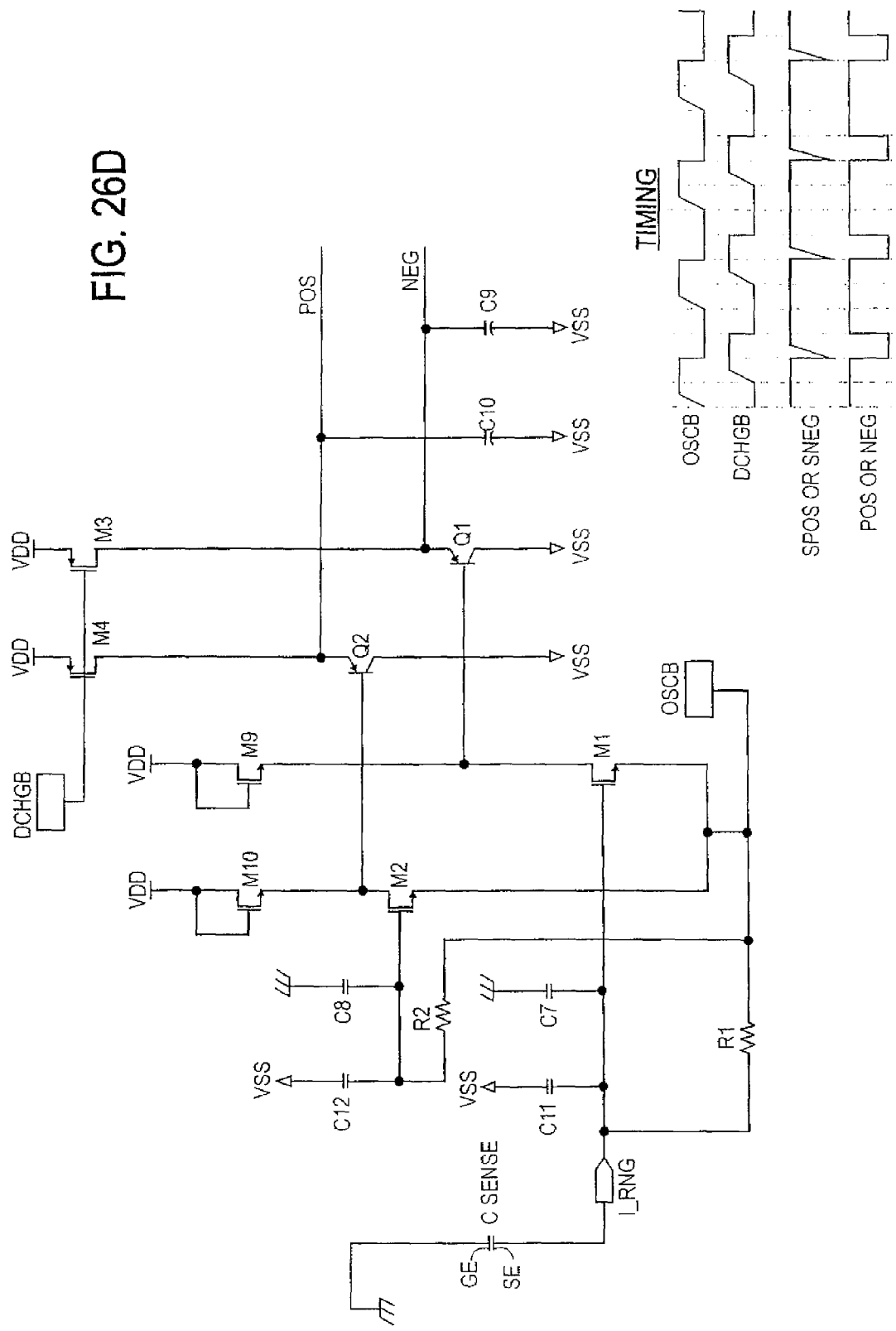

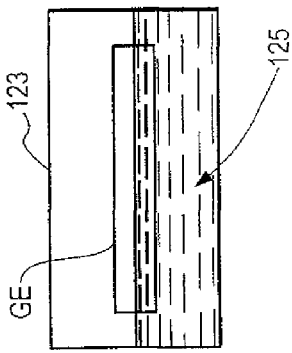
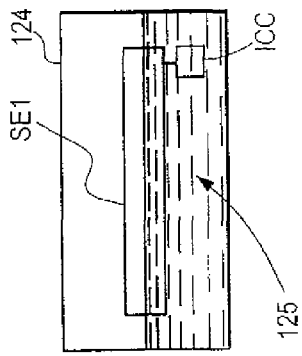
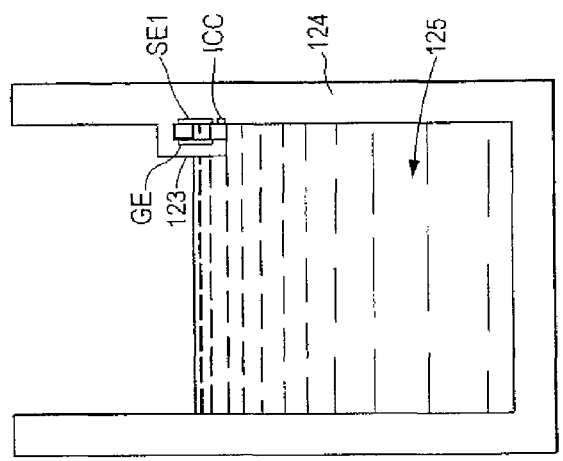
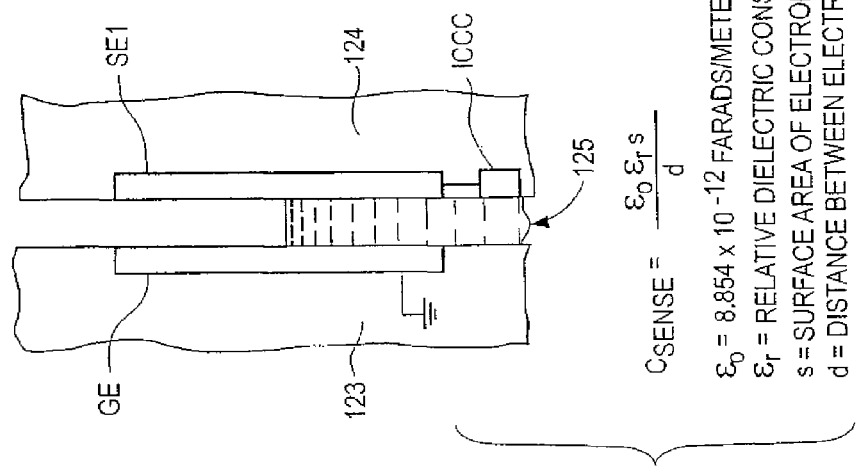
$$C_{SENSE} = \frac{\varepsilon_o \varepsilon_r s}{d}$$
$\varepsilon_o = 8.854 \times 10^{-12}$ FARADS/METER
$\varepsilon_r$ = RELATIVE DIELECTRIC CONSTANT
$s$ = SURFACE AREA OF ELECTRODES (METERS$^2$)
$d$ = DISTANCE BETWEEN ELECTRODES (METERS)

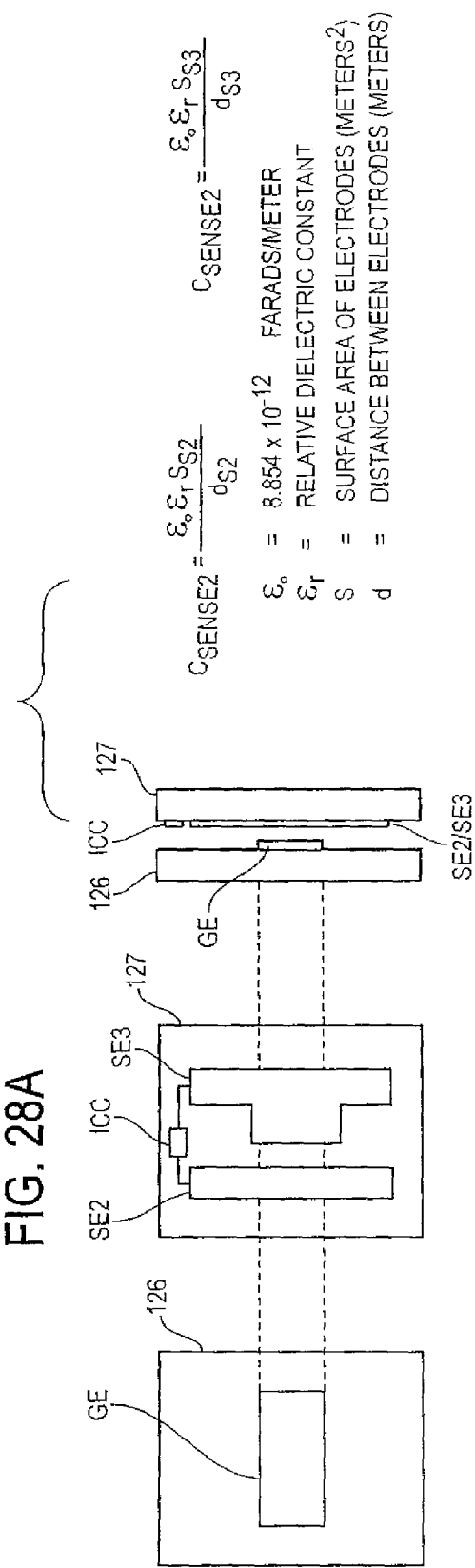
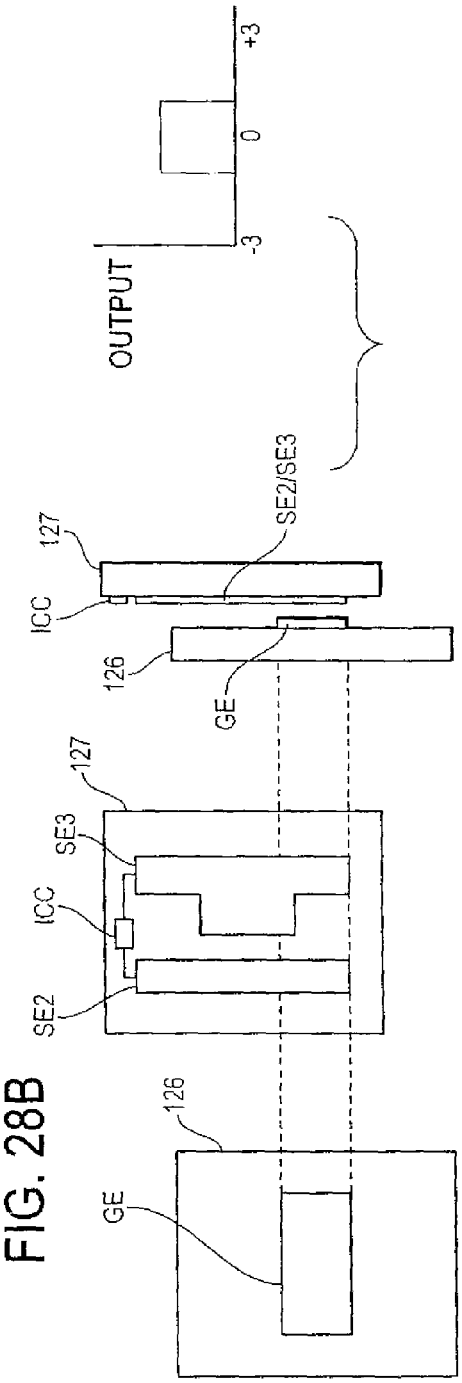
FIG. 28A
FIG. 28B

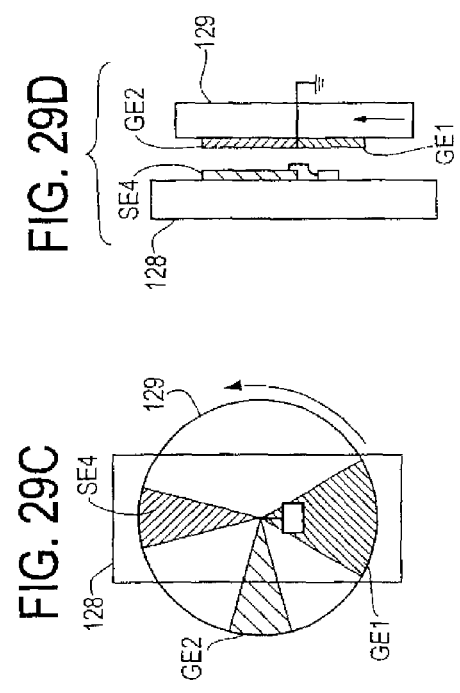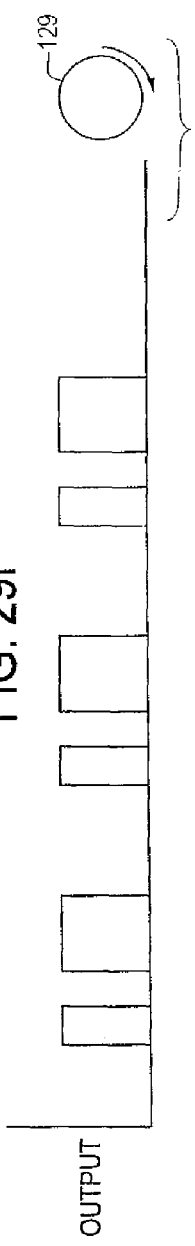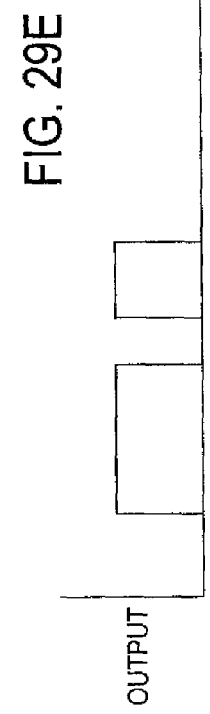

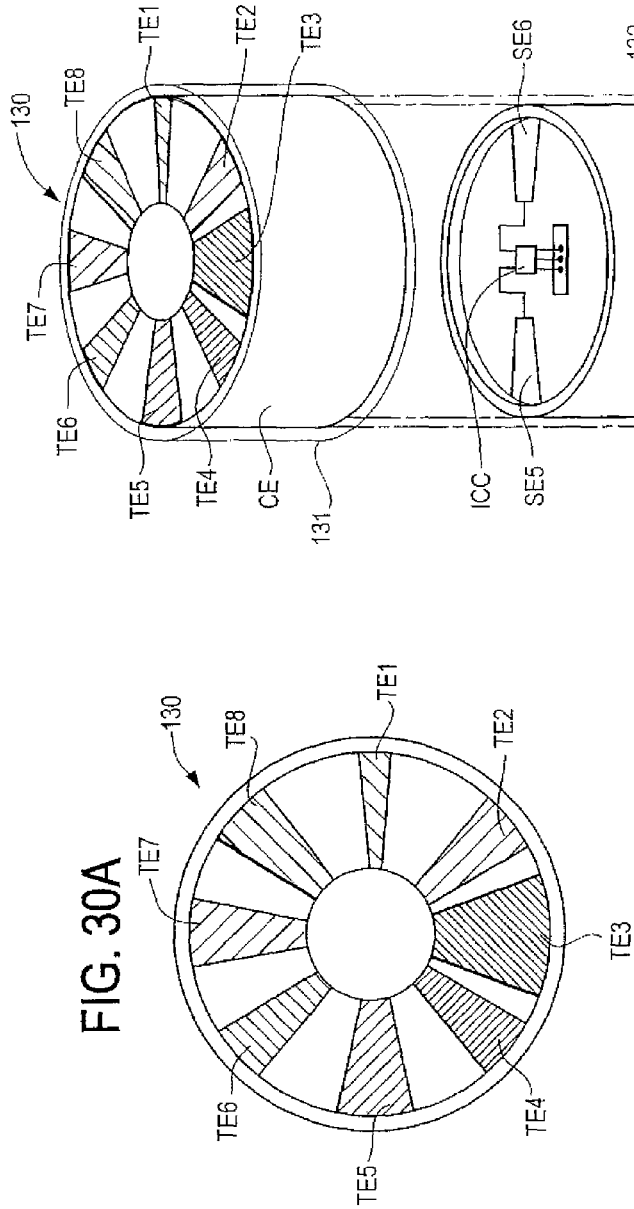
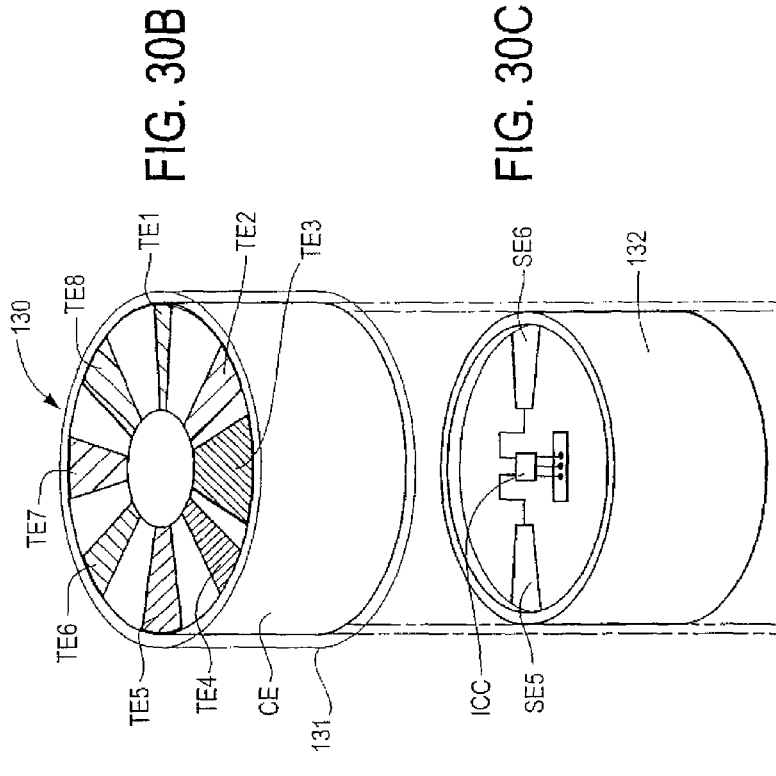
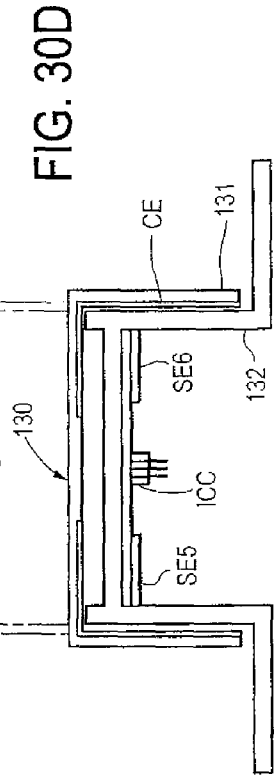

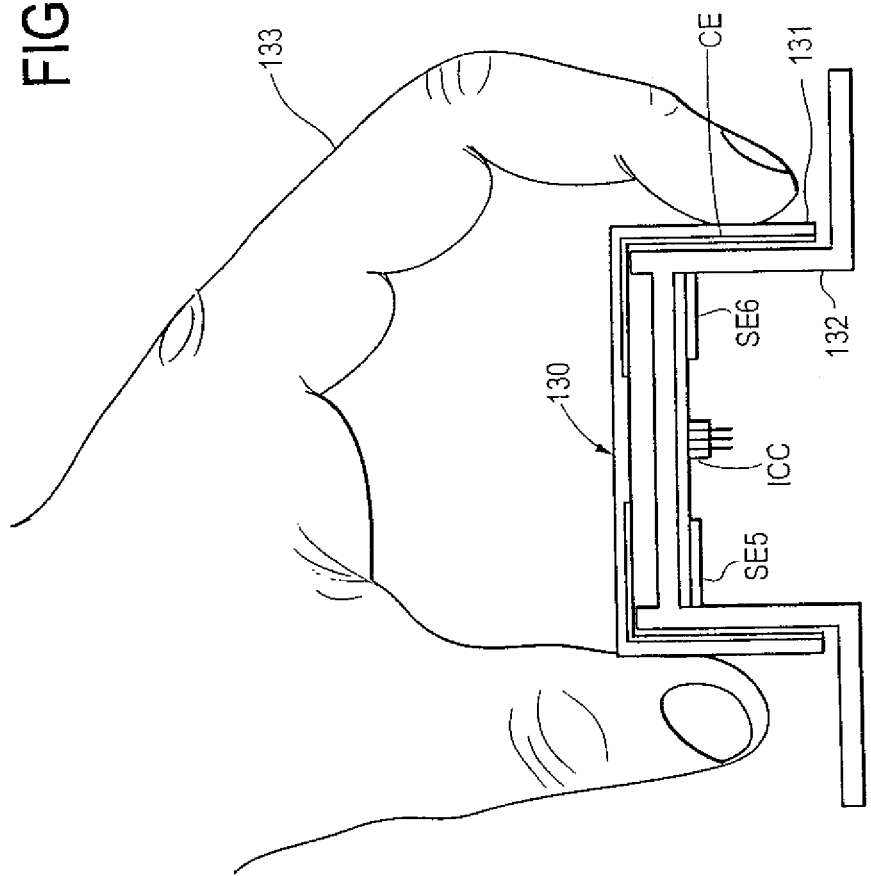

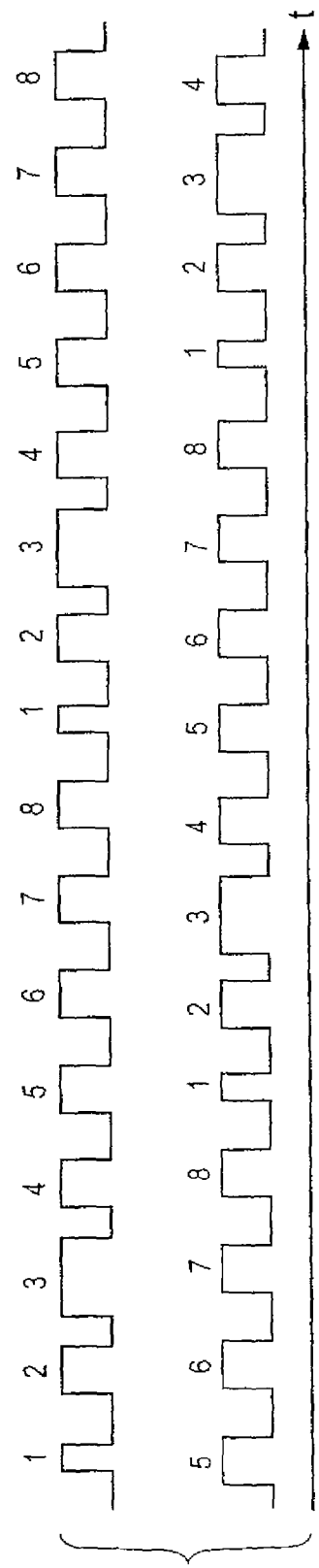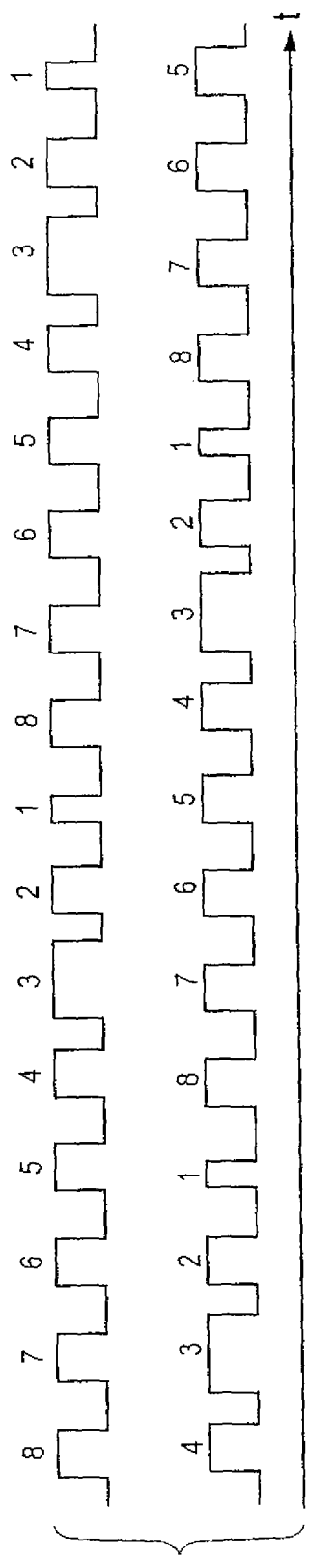

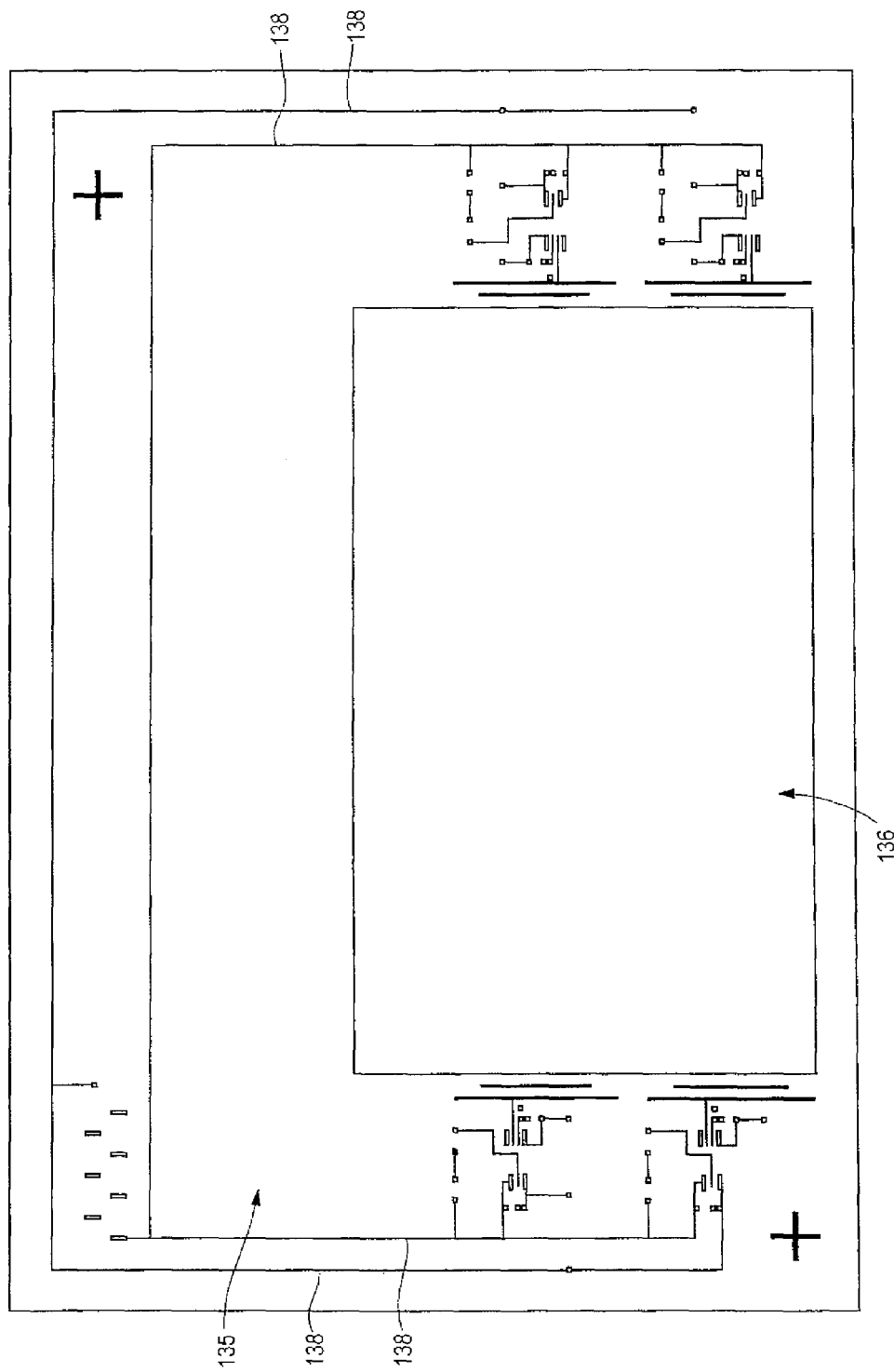

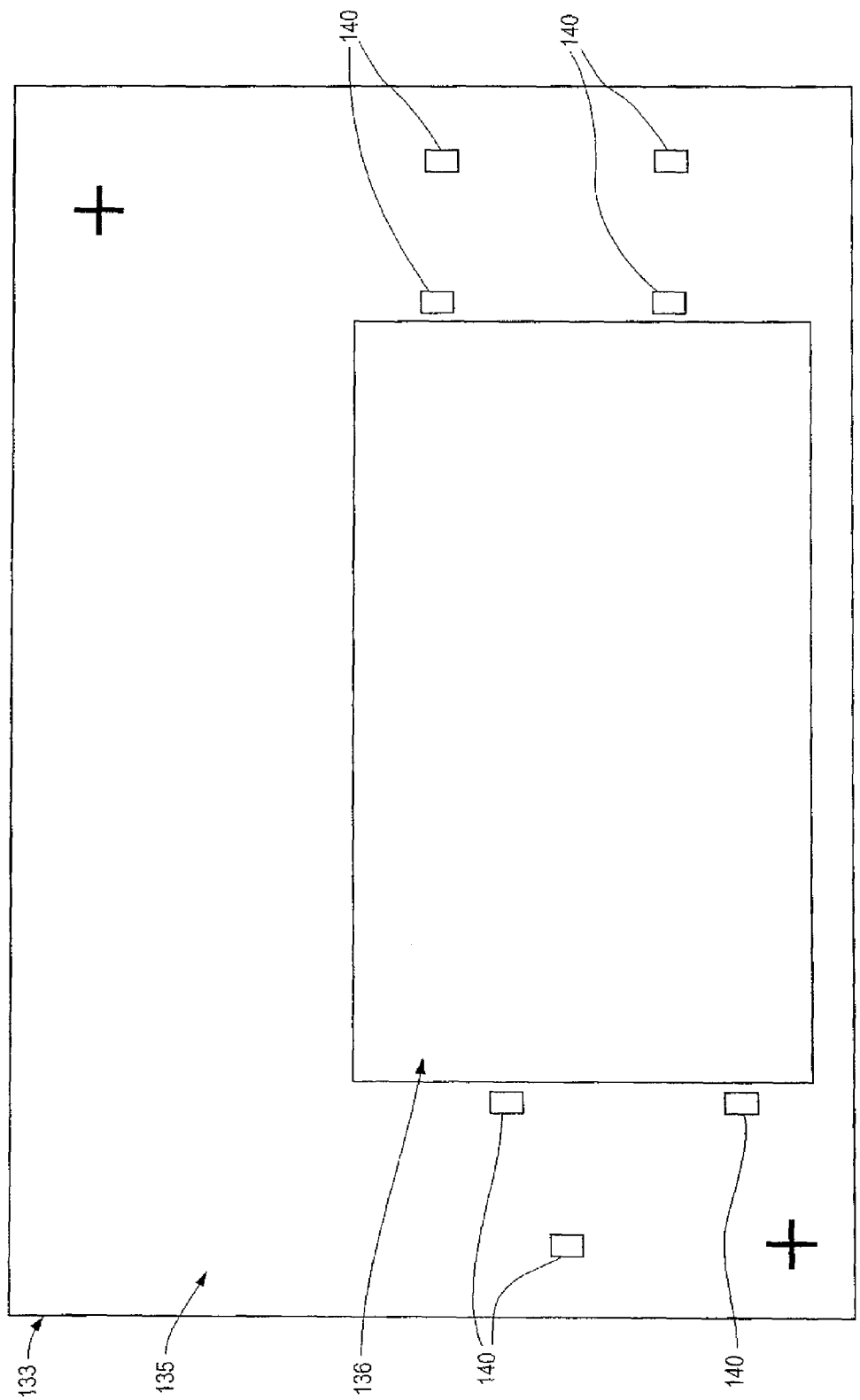

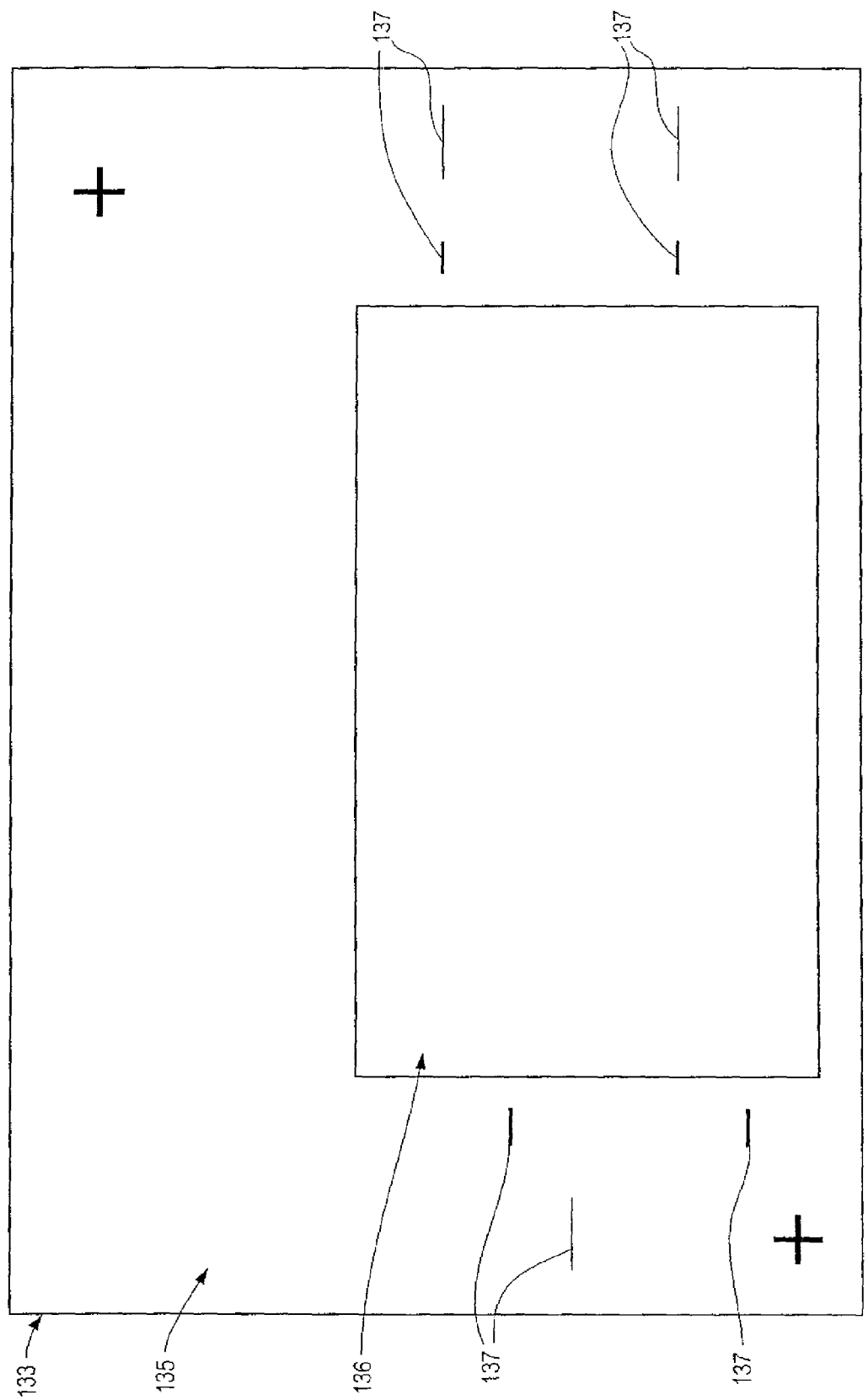

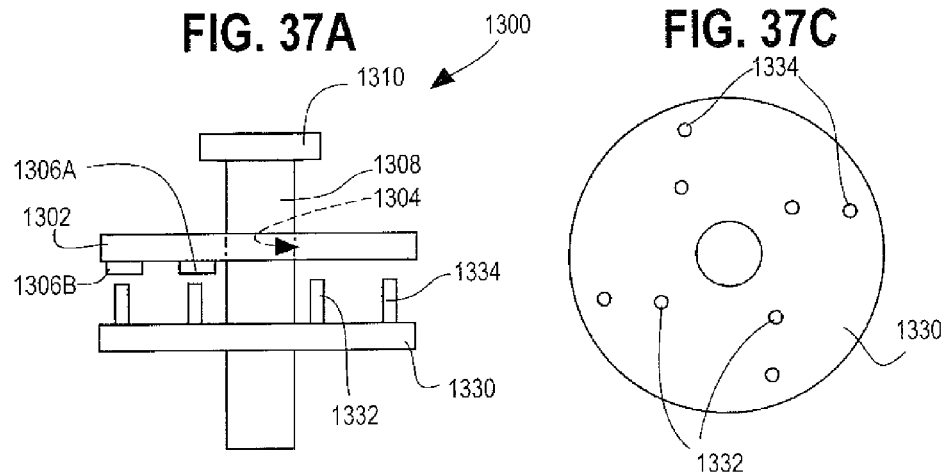
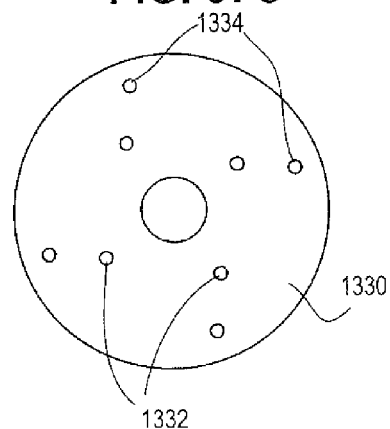
FIG. 37A
FIG. 37C
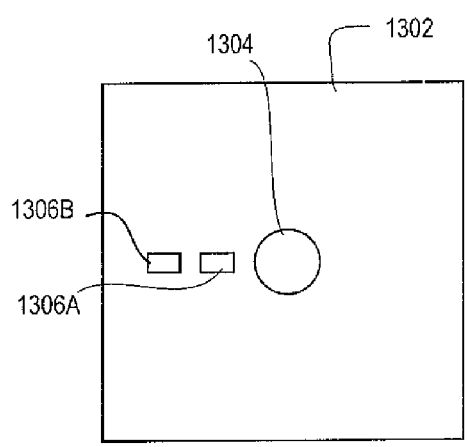
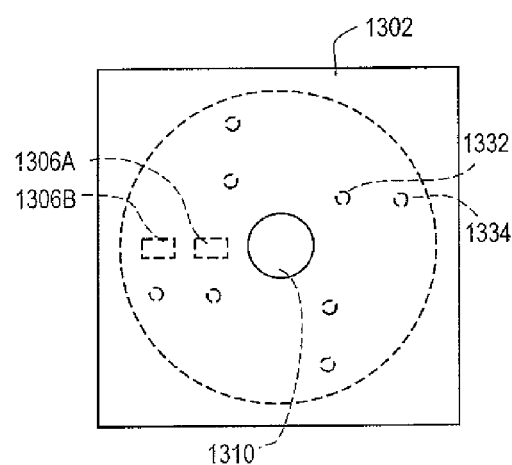
FIG. 37B
FIG. 37D
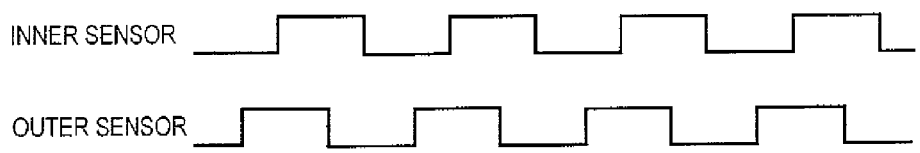
FIG. 37E

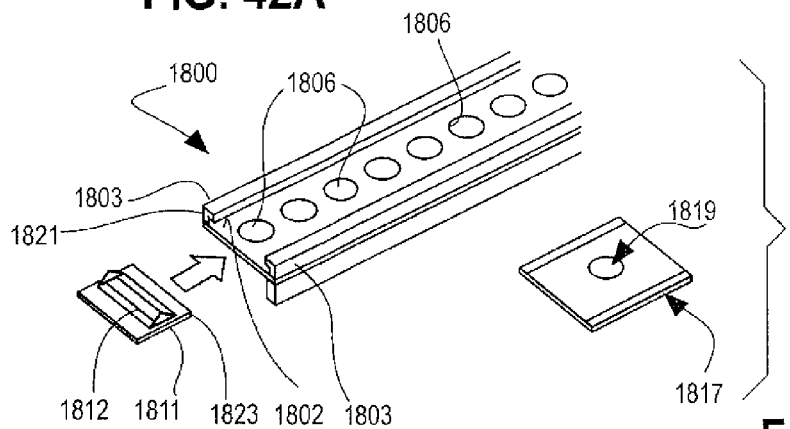
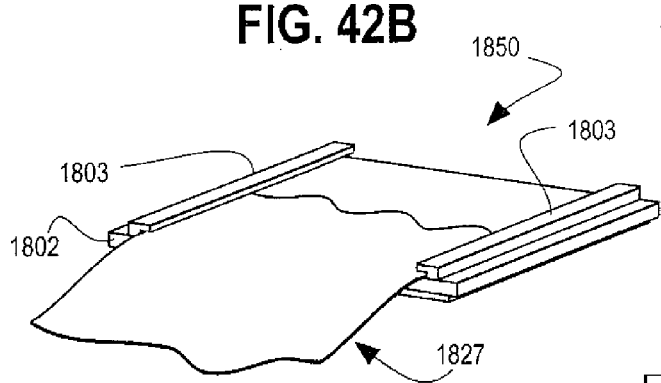
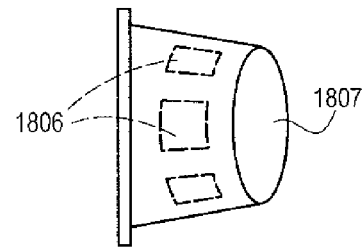
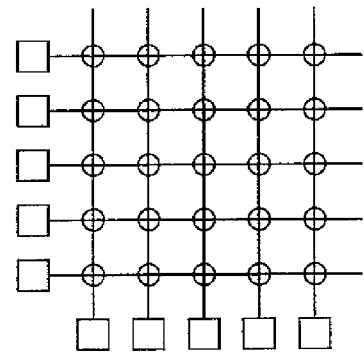
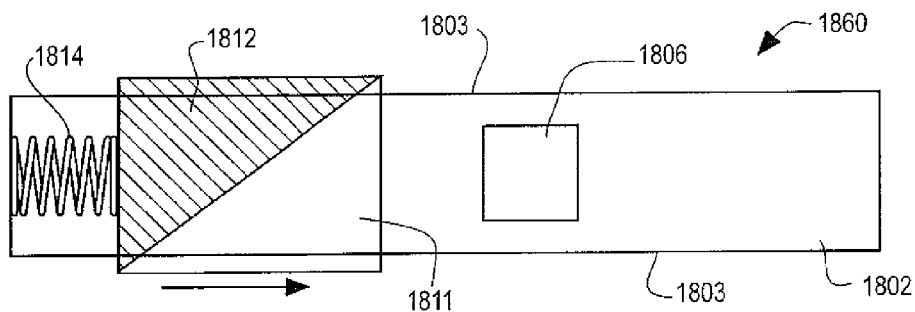
FIG. 42A
FIG. 42B
FIG. 42C
FIG. 42D
FIG. 42E

TOUCH SWITCHES AND PRACTICAL APPLICATIONS THEREFOR

CROSS-REFERENCE TO RELATED APPLICATIONS

This application is a continuation of U.S. patent application Ser. No. 11/236,077, filed on Sep. 26, 2005, which claims priority from U.S. Provisional Patent Application No. 60/613,073, filed on Sep. 24, 2004; which is a continuation-in-part of U.S. patent application Ser. No. 10/272,377, filed on Oct. 15, 2002, now U.S. Pat. No. 7,218,498, which claims priority from U.S. Provisional Patent Application No. 60/334,040, filed on Nov. 20, 2001, U.S. Provisional Patent Application. Nos. 60/341,350, 60/341,550, and 60/341,551, all filed on Dec. 18, 2001, and U.S. Provisional Patent Application No. 60/388,245, filed on Jun. 13, 2002; which is a continuation-in-part of U.S. patent application Ser. No. 10/027,884, filed on Oct. 25, 2001, now U.S. Pat. No. 6,713,897; which is a continuation of U.S. patent application Ser. No. 09/234,150, filed on Jan. 19, 1999, now U.S. Pat. No. 6,320,282. The disclosures of these references are incorporated herein by reference.

FIELD OF THE INVENTION

The present invention relates to touch switches (i.e., switches that are operated, for example, by touching a finger to or about a touch pad; also referred to herein as touch sensors or field effect sensors) and related control circuits and practical applications therefor.

BACKGROUND OF THE INVENTION

Mechanical switches have long been used to control apparatus of all types, including household appliances, machine tools, automobiles and related systems, and all sorts of other domestic and industrial equipment. Mechanical switches are typically mounted on a substrate and require some type of penetration through the substrate. These penetrations, as well as penetrations in the switch itself, can allow dirt, water and other contaminants to pass through the substrate or become trapped within the switch, thus leading to electrical shorts and other malfunctions.

Touch switches are often used to replace conventional mechanical switches. Unlike mechanical switches, touch switches contain no moving parts to break or wear out. Moreover, touch switches can be mounted or formed on a continuous substrate sheet, i.e. a switch panel, without the need for openings in the substrate. The use of touch switches in place of mechanical switches can therefore be advantageous, particularly in environments where contaminants are likely to be present. Touch switch panels are also easier to clean than typical mechanical switch panels because they can be made without openings in the substrate that would allow penetration of contaminants.

Known touch switches typically comprise a touch pad having one or more electrodes. The touch pads communicate with control or interface circuits which are often complicated and remote from the touch pads. A signal is usually provided to one or more of the electrodes comprising the touch pad, creating an electric field about the affected electrodes. The control/interface circuits detect disturbances to the electric fields and cause a response to be generated for use by a controlled device.

Although touch switches solve many problems associated with mechanical switches, known touch switch designs are not perfect. For example, many known touch switches can malfunction when contaminants such as water or other liquids are present on the substrate. The contaminant can act as a conductor for the electric fields created about the touch pads, causing unintended switch actuations. This presents a problem in areas where such contaminants are commonly found, such as a kitchen and some factory environments.

Existing touch switch designs can also suffer from problems associated with crosstalk, i.e., interference between the electric fields about adjacent touch pads. Crosstalk can cause the wrong touch switch to be actuated or can cause two switches to be actuated simultaneously by a touch proximate a single touch pad.

Many known touch switch designs are also susceptible to unintended actuations due to electrical noise or other interferences affecting a touch pad itself, or the leads extending from the touch pad to its associated control circuit. This problem can be aggravated in applications where the touch pad is a relatively large distance away from the control circuitry, as is frequently the case with conventional touch switch designs.

Existing touch switch designs commonly require complicated control circuits in order to interface with the devices they control. These control circuits are likely to be comprised of a large number of discrete components which occupy considerable space on a circuit board. Because of their physical size, the control circuits are typically located at a substantial distance from the touch pads themselves. The physical size of the control/interface circuits and their remoteness from the touch pads can aggravate many of the problems discussed above, such as crosstalk and susceptibility to electrical noise and interference. The size and remoteness also complicate the overall touch switch panel design, resulting in increased production cost and complexity.

Some known touch switch designs require a separate grounding lead from the touch pad to the interface/control circuit or to the controlled device. Certain apparatus utilizing conventional mechanical switches do not require, and may not readily accommodate, such grounding leads. Adapting such apparatus for use with such touch switches can require the addition of special grounding provisions, thus increasing design and production time, complexity, and cost. These ground lead requirements can preclude simple, direct replacement of conventional mechanical switch panels with touch switch panels.

Recent improvements in touch switch design include techniques which lower the input and output impedance of the touch switch itself, thereby making it highly immune to false actuations due to contaminants and external noise sources. U.S. Pat. No. 5,594,222 describes a low impedance touch switch design which is less susceptible to malfunction in the presence of contaminants and electrical noise than many previous designs. Even though this approach has several advantages over the prior art, there are some attributes that may limit its application. For instance, the resulting touch switch may be sensitive to temperature variations. As long as the temperature variations at the output are small relative to legitimate signal changes and are small relative to signal variations induced by transistor variations, then a single transistor or other amplifying device will be quite satisfactory. However, this technique may require the use of additional circuitry to interface with the controlled device, thus increasing cost and complexity to the overall touch switch design. In applications where there is little dynamic range to allow for compensation, and where temperature changes are significant relative to legitimate signal changes, a different approach may be better able to eliminate or reduce the effects of temperature.

Also, even though the low impedance approach of this technique can differentiate between contaminants with some finite amount of impedance and a human touch with some finite amount of impedance, this technique may not be enough to differentiate between extremely low levels of impedance. Such a situation could exist when an entire touch switch (i.e., both the inner and outer electrode) is covered with a large amount of contaminant. A similar, essentially zero-impedance, situation could exist when a conductive material, such as a metal pan, entirely covers a touch switch.

U.S. Pat. No. 6,310,611, assigned to the same assignee as the present application, and hereby incorporated by reference herein, discloses a touch switch apparatus having a differential measuring circuit which addresses many of the problems related to common mode disturbances affecting touch switches. For example, a touch switch having a two-electrode touch pad can be configured to generate an electric field about each electrode. A common mode disturbance, such as a contaminant substantially covering both electrodes, is likely to affect the electric field about each of the electrodes substantially equally. Each electrode provides a signal proportional to the disturbance to the differential measuring circuit. Since the signals from the electrodes are therefore contemplated to be substantially equal, the differential measuring circuit does not sense a differential and does not respond to the common mode disturbance. On the other hand, if the field about only one of the electrodes is disturbed, the signal provided by that electrode to the differential measuring circuit will likely be substantially different than that provided by the other, non-affected electrode. The differential circuit can respond by providing an output based on the different degrees of stimulation at the first and second electrodes, which can cause a switch actuation based upon the particular stimulation state of the electrodes or can provide information based on many stimulation states at the electrodes.

Although the differential measuring circuit approach addresses many problems known in the prior art, it is relatively complex and can be costly to design and manufacture. A differential measuring circuit typically comprises many more parts than a more conventional control circuit. The additional parts are likely to take up more space on a touch switch panel. As such, the control circuit is likely to be even farther from the touch pad than it might be with a non-differential circuit design, requiring long leads between the touch pad and its control circuit. This can actually aggravate concerns related to electrical interference. Furthermore, when building a differential measuring circuit, matching of components becomes important. Proper component matching presents an additional manufacturing burden and is likely to add cost. Also, when using differential sensing techniques, the resulting signals are relatively small compared to the dynamic range of absolute signal changes of the electrodes, especially in low impedance applications. The resulting signal therefore can be affected by noise and other environmental effects. Proper buffering of the differential signal would typically require the use of additional components to construct a switch or a buffer. Further, when a stimulus such as a pulse signal is applied from a remote control circuit, the pulse signal may be affected. Stimulus generating circuits such as pulse generating circuits typically require many components and occupy physical space that could interfere with the sensing electrodes. Therefore, the signal generating circuits need to be physically located remote from the sensing electrodes if they occupy physical space that can inadvertently affect or bias the sensing electrodes, which would effectively reduce the signal to noise ratio performance of the sensor.

Although the foregoing improvements can reduce unintended switch actuations as a result of crosstalk between switches and the effects of electrical interference on their control circuits, they do not eliminate these problems completely. Also, they do not address the need for separate grounding circuits in certain touch switch applications or resolve the concerns related thereto. Furthermore, it would be advantageous if the aforementioned features could be implemented using as small a physical structural form as possible.

Typically, actuation of a field effect sensor requires neither application of force nor physical displacement of a structural member by a user, as would be the case with, for example, a mechanical push button, toggle, or rotary switch. While this is a desirable attribute in many applications, in other applications it can be desirable for a user to apply force to or physically displace a switch member in order to give the user the physical perception that the switch has changed state. In certain application, it would be desirable to provide a switching mechanism having the advantages offered by field effect sensors, while retaining the mechanical feel of a conventional mechanical switch.

SUMMARY OF INVENTION

The present invention provides a touch switch apparatus comprising a touch pad and a control circuit located near the touch pad. The touch pad and control circuit may be mounted on a dielectric substrate. The control circuit is small compared to the overall size of the apparatus. In a preferred embodiment, the control circuit is substantially reduced to one or more integrated circuits. The physical compactness of the control circuit in the integrated circuit embodiment reduces the touch switch's susceptibility to common mode interference and to crosstalk and interference between adjacent touch switches. The integrated circuit approach also provides for better matching and balancing of the control circuit components.

The touch switch of the present invention can be configured in a variety of preferred embodiments. In some embodiments, the touch switch can emulate a conventional, maintained-contact type of mechanical switch. In other embodiments, the touch switch can emulate a momentary-contact type of mechanical switch. Also, in other embodiments the touch switch can provide multiple outputs relative to the sensing at the sensing electrodes.

In a preferred embodiment, the touch pad has a first electrode and a second electrode proximate the first electrode. At least one of the electrodes is electrically coupled to the local control circuit. The first and second electrodes and the local control circuit are typically placed on the same surface of a substrate, opposite the side of the substrate to be used as the touch surface. However, they need not be coplanar, and may be placed on opposite sides of a substrate.

In an alternate embodiment, the touch pad has a single electrode which is electrically coupled to the local control circuit. In other alternate embodiments, the touch pad can have more than two electrodes.

In a preferred embodiment, the control circuit includes means for generating a signal and providing it to the touch pad to create an electric field about one or more of the electrodes comprising the touch pad. Alternatively, such a signal may be generated elsewhere and provided to one or more of the electrodes to create one or more electric fields thereabout. The control circuit detects disturbances to the electric fields in response to stimuli thereto, such as a user's fingertip contacting or approaching the substrate adjacent the touch switch. The control circuit selectively responds to such field disturbances by generating a control signal for use by a controlled device, such as a household appliance or an industrial machine.

In a preferred embodiment, the control circuit detects and responds to differences in electrical potential between the first and second electrodes in response to the introduction of a stimulus in proximity to either the first electrode, the second electrode, or both. Such differential measuring circuit provides for the rejection of common mode signals (i.e., signals that would tend to affect both electrodes approximately equally) such as temperature, electrical noise, power supply variations, and other inputs. The differential measuring circuit also provides for the rejection of common mode signals resulting from the application of contaminants to the substrate adjacent the touch switch.

In a preferred embodiment, a signal is applied to a first electrode and to a second electrode. The signal may be generated from within the control circuit or from elsewhere. An electric potential is developed at each electrode, and, consequently, an electric field is generated about each of the electrodes. Two matched transistors are arranged in a differential measuring circuit, with the first transistor connected to the first electrode and the second transistor connected to the second electrode. Each transistor's output is connected to a peak detector circuit, and the output of each peak detector circuit is in turn provided to a decision circuit.

Each transistor's output is altered when the electric field about its corresponding electrode is altered, such as when the electrode is touched or approached by a user. The peak detector circuits respond to changes in the transistors' outputs and provide signals corresponding to the peak potentials from the transistors to the decision circuit. The decision circuit uses the peak potentials in a predetermined manner to provide an output for use by other portions of the control circuit.

In a preferred embodiment, the inner and outer electrodes are operably associated with the inputs to the decision circuit such that when a disturbance to an electric field about a first electrode is greater than the degree of disturbance of an electric field about a second electrode, the decision circuit will provide a high level output. Conversely, the decision circuit will provide a low level output when a disturbance to the electric field about the second electrode is greater than the degree of disturbance of an electric field about the first electrode. When the fields about both electrodes are disturbed more or less equally, the decision circuit will provide a low level output.

The first condition can be created, for example, when a fingertip substantially covers the first electrode but not the second electrode. The second condition can be created, for example, when a fingertip or contaminant substantially covers the second electrode but not the first electrode. The third condition can be created, for example, when a contaminant or an object, such as a metal pan, covers both the first and second electrodes.

The decision circuit output is provided to other circuit components, such as an electrical latch, which selectively cause a control signal to be output from the control circuit, depending on the decision circuit output state. In a preferred embodiment, a high level output from the decision circuit ultimately causes a control signal to be output from the control circuit, while no control signal will be output in response to a low level output. In an alternate embodiment, a low level output from the decision circuit causes a control signal to be output from the control circuit, while no control signal will be output in response to a high level output.

The touch switch apparatus of the present invention can be used to perform almost any function which can be performed by a mechanical switch, such as turning a device on or off, adjusting temperature, or setting a clock or timer. It can be used in place of, and solve problems associated with, existing touch switches. It can also be used as a direct replacement for mechanical membrane-type switches. The touch switch apparatus of the present invention is well suited for use in environments where temperature variations are extreme, where substantial amounts of contaminants can be present or where metal objects may be placed on or over the touch pad.

The present invention provides input circuit portions for more effectively communicating signals between touch pad electrodes and logic and decision circuits. In a preferred embodiment, these input portions of the control circuit include active devices and peak detection circuits in various configurations to convert high frequency transient pulses to DC signals. These embodiments can eliminate the need for more complicated AC processing circuitry and can allow for the use of DC processing circuitry which will reduce the size and cost of the integrated circuits of the touch switch assemblies. Also, these preferred embodiments can be capable of discharging the electric fields associated with the peak detection circuits, which correspond to the electric fields at the input electrodes.

In other preferred embodiments, the negative effects of stray capacitance caused by bonding pad and wire bonding configuration are compensated for by incorporating swamping capacitance in the input portions of the control circuits mentioned above. Swamping according to these embodiments of the present invention can eliminate imbalances in the differential measuring circuit caused by the stray capacitance and can thereby provide for more consistent electrical information going into the decision circuit.

In other preferred embodiments, protection of the control circuitry from damage caused by stray current and the sometimes high electrostatic potential of the input electrodes of the touch pad is provided by active blocking device configurations in the input portions of the control circuit.

Other preferred embodiments can provide for statistical filtering and sampling in high noise and other environments. Also, other preferred embodiments provide for the linearization of input signals sent to decision circuits using differential measuring techniques.

The present invention also provides dual connection latch circuits, which facilitate the direct replacement of membrane and other mechanical switches with touch sensing switches. In preferred embodiments, this latch circuit configuration can provide isolation from inherent leakage current paths that develop from the doped substrates used to fabricate the control and integrated circuits of touch switch assemblies. It is also an object of the present invention to provide for an analog output that exploits the advantages of the input configurations of the circuits utilized by the invention. It is a further object of the invention to provide ways to sense capacitive inputs.

The present invention also is directed to practical applications for touch switches. While the touch switches described herein are particularly well-suited for use in connection with many of the applications discussed herein, other touch switches and sensors, for example, capacitive sensors and field effect sensors as disclosed in U.S. Pat. Nos. 5,594,222 and 6,310,611, the disclosures of which are incorporated herein by reference, may be used in such applications as well.

BRIEF DESCRIPTION OF THE DRAWINGS

The various features, advantages and other uses of the present invention will become more apparent by referring to the following detailed description and drawings in which:

FIGS. 11A-11D are electrical schematic representations of input circuitry for touch switch control circuits that are compatible with the circuits depicted in FIGS. 4-7;

FIGS. 12A-12H are the electrical schematic representations of input circuitry for the touch switch control circuits of FIGS. 11A-11D where active devices serve as current sources;

FIGS. 13A-13H are the electrical schematic representations of input circuitry for the touch switch control circuits of FIGS. 12A-12H with different combinations of active devices;

FIGS. 14A-14D are the electrical schematic representations of input circuitry for the touch switch control circuits of FIGS. 11A-11D having active square root extraction devices;

FIG. 17A is an electrical schematic representation of input circuitry for the touch switch control circuit of FIG. 16 where swamping capacitance is provided by the depletion capacitance of diodes at the inputs;

FIG. 18B shows a common gate configuration with front end swamping capacitance and illustrates how the input configuration can be different from a common source configuration as shown all of the previous drawings;

FIG. 18C shows the configuration of FIG. 18B but with depletion diodes;

FIGS. 20A-20D are schematic representations of touch cell matrices for use with various operating modes;

FIGS. 21A-21F are schematic representations of MOSFET blocking devices;

FIG. 26D depicts a circuit according to the present invention for use with the application described with reference to FIGS. 26A-26C;

FIGS. 27A-27D show a liquid sensing capacitive switch apparatus for use with the integrated circuit of the present invention wherein the circuit depicted in FIG. 27E can respond to a change in the relative dielectric constant of an electrode;

FIGS. 28A-28B show a capacitive switch apparatus for use with the integrated circuit of the present invention wherein the circuit of FIG. 28C can respond to capacitance between two electrodes that changes owing to an effective change in the surface area of one electrode;

FIGS. 29A-29G show a capacitive switch apparatus that can function as a dialing device for use with the integrated circuit of the present invention (FIGS. 29A-29D show the electrode configuration of the apparatus at various input stages; FIGS. 29E-29F show the pulse output of two types of rotation of the device; and FIG. 29G shows a possible integrated circuit configuration for use with the device depicted in FIGS. 29A-29D);

FIGS. 30A-30E show another type of capacitive switch dial device for use with the integrated circuit of the present invention wherein an electrode is grounded by the user;

FIGS. 30E-30G show the pulse output of two types of rotation of the device;

FIGS. 31A-31F show the separate layers and construction of a touch switch with integrated control circuit two-by-two matrix assembled onto a substrate;

FIG. 37A is a side elevation view of a rotary switch emulation according to the present invention;

FIG. 37B is a bottom plan view of an embodiment of a portion of a rotary switch emulation according to the present invention;

FIG. 37C is a bottom plan view of another portion of an embodiment of a rotary switch emulation according to the present invention;

FIG. 37D is a bottom plan view of another portion of an embodiment of a rotary switch emulation according to the present invention;

FIG. 37E is a timing chart for an embodiment of a rotary switch emulation according to the present invention;

FIG. 42A is a side elevation view of an embodiment of a slide switch emulation according to the present invention;

FIG. 42B is a side elevation view of an alternate embodiment of a slide switch emulation according to the present invention;

FIG. 42C is a side elevation view of another alternate embodiment of a slide switch emulation according to the present invention;

FIG. 42D is a perspective view of an alternate embodiment of a rotary switch emulation according to the present invention;

FIG. 42E is a top plan view of an x-y position sensor according to the present invention;

DETAILED DESCRIPTION OF THE DRAWINGS

The disclosures of U.S. Pat. Nos. 5,594,222, 5,856,646, 6,310,611, 6,320,282, 6,713,897, and 6,897,390, and U.S. patent application Ser. No. 10/271,933 entitled Intelligent Shelving System, Ser. No. 10/272,047, entitled Touch Sensor with Integrated Decoration, and Ser. No. 10/850,272, entitled Integrated Touch Sensor and Light Apparatus, all filed on Oct. 15, 2002 all assigned to the assignee of the present invention, are hereby incorporated herein by reference.

The invention pertains to a touch switch apparatus comprising a touch pad having one or more electrodes and a control circuit. Many of the drawings illustrating the control circuit depict the circuit as large in relation to the touch pad for clarity. In typical applications, however, the control circuit may be small compared to the touch pad, and is preferably in the form of one or more integrated circuit chips.

Figure 1:
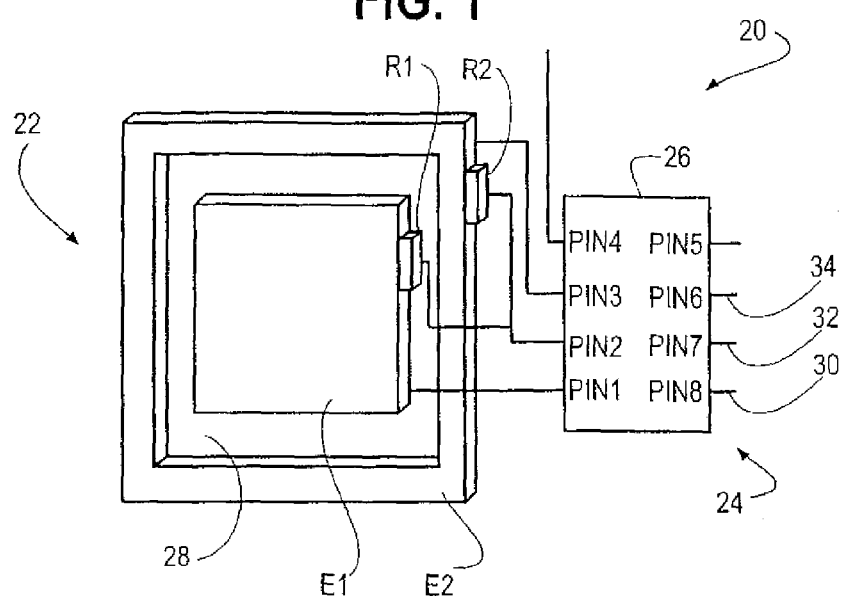
FIG. 1 is a perspective drawing of the components of a preferred embodiment of a touch switch of the present invention.

FIG. 1 is a perspective representation of one preferred embodiment of a touch switch apparatus 20 of the present invention. Touch switch apparatus 20 comprises a touch pad 22, a control circuit 24 comprising an integrated circuit (IC) chip 26 having eight output terminals PIN1-PIN8, and first and second resistors R1 and R2. In the embodiment shown, touch pad 22 comprises a first electrode E1 and a second electrode E2, although the touch pad may also be comprised of more or fewer than two electrodes. Although control circuit 24 could be fabricated using discrete electronic components, it is preferable to embody control circuit 24 in a single integrated circuit chip, such as IC chip 26.

Control circuit 24, via terminals PIN1-PIN8 of IC chip 26, is electrically coupled to, and communicates with, first and second resistors R1 and R2, first and second electrodes E1 and E2, and an input line 30 which is configured to supply a control and/or power signal from a remote device (not shown). Control circuit 24 also communicates with a remote device (not shown) using a first output line 32. In some embodiments, a second output line 34 is also used for communication with the remote device (not shown).

Figure 2:
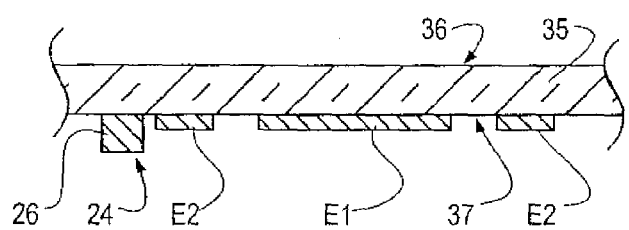
FIG. 2 is a cross-sectional view of a two-electrode touch pad and integrated circuit chip of the present invention.

FIG. 2 is a partial cross-sectional view of a typical touch switch 20 of the present invention in which the components comprising touch switch apparatus 20 are mounted on a dielectric substrate 35 having a front surface 36 and an opposing rear surface 37. In the embodiment shown, first and second electrodes E1 and E2 are mounted on rear surface 37 of substrate 35. IC chip 26 is also mounted on rear surface 37 of substrate 35, proximate first and second electrodes E1 and E2. As can be seen from both FIGS. 1 and 2, in the preferred embodiment it is contemplated that IC chip 26 comprising control circuit 24 be mounted in close proximity to touch pad 22.

Substrate 35 is typically comprised of a relatively rigid dielectric material, such as glass, plastic, ceramic, or any other suitable dielectric material. However, substrate 35 may also comprise any other suitable dielectric material, including flexible materials. Consolidated Graphics No. HS-500, Type 561, Level 2, a 0.005 inch thick polyester material, is an example of a suitable flexible substrate. In embodiments where the touch switch apparatus components are mounted on a flexible substrate, the flexible carrier is often subsequently applied to another, generally more rigid, substrate.

In a preferred embodiment, substrate 35 is made of glass having a uniform thickness of about 3 mm. In other embodiments, the thickness of substrate 35 may vary, depending on the type of material used, its mechanical and electrical properties, and the physical strength and electrical sensitivity required for a particular application. The maximum functional thickness for glass and plastic substrates is on the order of several inches. However, in most practical applications, glass substrates range in thickness from about 1.1 mm to about 5 mm, while plastic substrates can be even thinner.

In a preferred embodiment, as shown in FIGS. 1 and 2, second electrode E2 substantially surrounds first electrode E1. A space 28 is located between first electrode E1 and second electrode E2. First electrode E1 may be dimensioned such that it may be "covered" by a user's fingertip or other human appendage when the user touches the corresponding portion of front surface 36 of substrate 35. In one preferred embodiment, first electrode E1 is square and second electrode E2 is arranged in a square pattern about and conforming to the shape of first electrode E1.

Although the touch pad geometry illustrated in FIGS. 1 and 2 represents a preferred arrangement of first and second electrodes E1 and E2, it should be recognized that the electrode arrangement can be varied extensively to accommodate a wide variety of applications. For example, the electrode size, shape, and placement may be varied to accommodate the size of the appendage or other stimulus contemplated to actuate touch switch 20. For example, a particular application might require that a hand, rather than a finger, provide the stimulus to actuate touch switch 20. In such an application, first and second electrodes E1 and E2 would be much larger and spaced farther apart.

Figure 3:
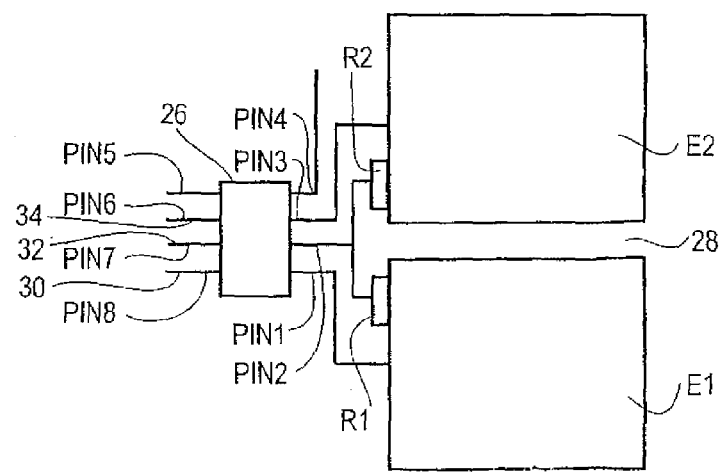
FIG. 3 is a plan view of an embodiment of a touch switch apparatus of the present invention.

First electrode E1 may take any number of different geometric shapes, including, but not limited to, rectangles, trapezoids, circles, ellipses, triangles, hexagons, and octagons. Regardless of the shape of first electrode E1, second electrode E2 can be configured to at least partially surround first electrode E1 in a spaced-apart relationship. However, it is not necessary for second electrode E1 to surround the first electrode even partially in order to obtain the benefits of the invention. For example, first and second electrodes E1 and E2 can be adjacent to each other, as shown in FIG. 3. In alternative embodiments, second electrode E2 may be omitted.

Figure 8:
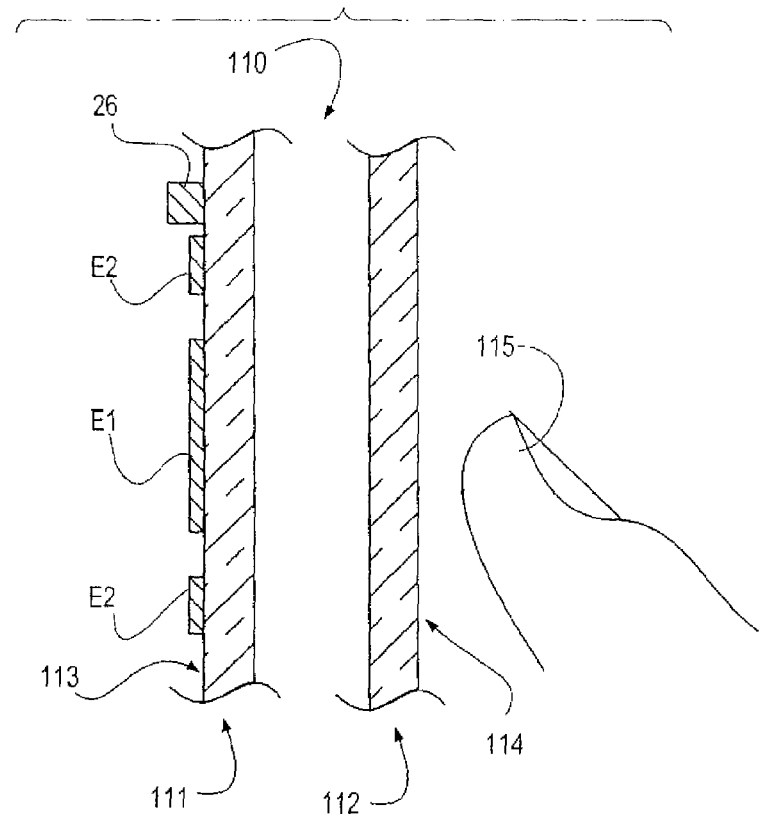
FIG. 8 is a cross-sectional view of an alternate embodiment of a touch pad of the present invention.

Furthermore, the electrode configuration need not be coplanar, but can be three dimensional to conform to a sphere, a cube, or other geometric shape. This design flexibility allows the invention to be used in a wide variety of applications, with substrates of varying shapes and composition. In some applications, it may not be necessary to actually touch substrate 35 upon or within which touch pad 22 and control circuit 24 are situated. For example, FIG. 8 illustrates a touch switch apparatus 20 wherein first and second electrodes E1 and E2 are mounted on an exterior surface 113 of a first pane 111 of a thermopane window 110 and which can be actuated by a user bringing a suitable stimulus 115 proximate an exterior surface 114 of an opposing pane 112 of the window.

Figure 9:
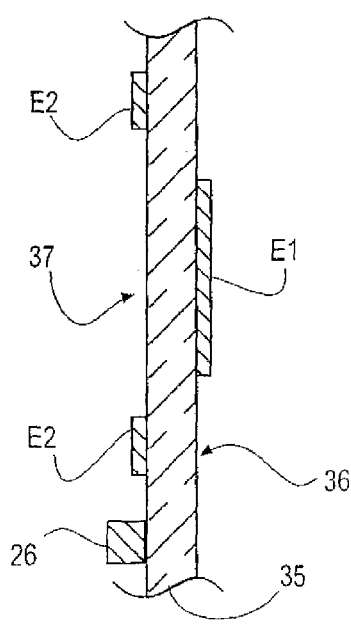
FIG. 9 is a cross-sectional view of another alternate embodiment of a touch pad of the present invention.

As noted above, first and second electrodes E1 and E2 need not be coplanar; they can be mounted on different sides or surfaces of a substrate, or on different substrates altogether. For example, FIG. 9 illustrates a touch switch apparatus 20 wherein first electrode E1 is mounted on a first surface 36 of a substrate 35 and second electrode E2 and IC chip 26 are mounted on a second, opposing surface 37 of substrate 35. In applications where first and second electrodes E1 and E2 are on the same side of a substrate, IC chip 26 can be mounted on the same side of the substrate as the electrodes, or on another side of the substrate. If the first and second electrodes are mounted on different surfaces of a substrate or on different substrates altogether, IC chip 26 can be mounted on the same surface as either of the electrodes, or on a different surface or substrate altogether. However, it is preferred that the IC chip 26 be mounted in close proximity to the electrodes.

Preferably, first electrode E1 is a solid conductor. However, first electrode E1 may also have a plurality of apertures or may have a mesh or grid pattern. In some embodiments, second electrode E2 will take the form of a narrow ribbon partially surrounding first electrode E2. In other embodiments, such as where first and second electrodes E1 and E2 are merely adjacent each other, second electrode E2 may also be a solid conductor or may have a mesh or grid pattern.

Control circuit 24 may be designed in many different ways, and it may be used with a variety of power sources, such as AC, periodically varying DC (such as a square wave), continuous DC, or others. FIGS. 4-7 illustrate a preferred control circuit design which may be easily adapted for use with a variety of power supplies, in a variety of operating modes. The FIG. 4 embodiment uses square wave DC power in a differential input, strobed mode of operation; the FIG. 5 embodiment uses continuous DC power in a differential input, continuous DC mode; the FIG. 6 embodiment uses square wave DC power in a single-ended input, strobed mode; and the FIG. 7 embodiment uses continuous DC power in a single-ended input, continuous DC mode.

It is apparent from FIGS. 4-7 that control circuit 24 can be readily adapted for various different operating modes. The foregoing four operating modes will be described in detail to demonstrate the design flexibility allowed by the invention. However, it should be recognized that the invention is by no means limited to these four operating modes. The particular operating mode and power source used in a specific application depends primarily on the requirements and specifications of the controlled device.

Boxed areas B1 and B2 on FIGS. 4-7 indicate the demarcation between components contemplated to be located on IC chip 26 and components located off of IC chip 26, such as electrodes E1 and E2, resistors R1 and R2, the controlled device (not shown), and input and output lines 30 and 32, respectively. The portions of FIGS. 4-7 which are outside boxed areas B1 and B2 are contemplated to be located on IC chip 26 and are identical for all four figures and operating modes depicted therein. Boxed area B6 contains the input portion of the control circuit. Various configurations of the input portion contained in boxed area B6 are discussed with reference to FIGS. 11A-18E, below.

FIGS. 4-7 illustrate a control circuit 24 comprising a startup and bias section 40, a pulse generator and logic section 50, a decision circuit section 60, and a self-holding latch section 70, the functions of which will be described below. Each of the foregoing circuit sections 40, 50, 60 and 70 may be designed in a number of different ways, as would be known to those skilled in the art of electronic integrated circuit design.

Control circuit 24 also comprises first, second, and third transistors P1, P2, and P3. In the embodiments described herein, transistors P1-P3 are P-MOS devices, although N-MOS devices, bipolar devices, or other transistor types can also be used. Control circuit 24 further comprises an inverter I1, first, second, and third diodes D1-D3, first and second capacitors C1 and C2, first, second, third, and fourth transistor switches SW1-SW4, and third and fourth resistors R3 and R4. It should be recognized that third and resistors R3 and R4 may be replaced with current sources or active loads.

In each of the embodiments illustrated in FIGS. 4-7, source terminal 77 of third transistor P3 and power input terminals 41, 51, 61, and 71 of startup and bias section 40, pulse generator and logic section 50, decision circuit 60, and self-holding latch section 70, respectively, are electrically coupled to terminal PIN8 of IC chip 26. Terminal PIN8 is in turn electrically coupled to control circuit 24 power input line 30, which is in turn electrically coupled to a power source 25. Typically, power source 25 is located at the controlled device (not shown).

A biasing output terminal 43 from startup and bias section 40 is electrically coupled to gate terminals G2 and G4 of second and fourth transistor switches SW2 and SW4, respectively. In the preferred embodiment and as described herein with respect to FIGS. 4-7, first through fourth transistor switches SW1-SW4 are N-MOS devices, although other transistor types and combinations may be used, as well, as shown in FIGS. 11A-18E.

A power-on reset output 44 from startup and bias section 40 is electrically coupled to a power on reset input 54 at pulse generator and logic section 50. Power on reset output 44 of startup and bias section 40 is also electrically coupled to gate terminals G1 and G3 of first and third transistor switches SW1 and SW3.

Internal ground reference output 42 from the startup and bias section 40 is electrically coupled to low potential plates 102 and 103 of first and second capacitors C1 and C2, source terminals S1, S2, S3, and S4 of first through fourth transistor switches SW1-SW4, respectively, internal ground reference output 52 of the pulse generator and logic section 50, internal ground reference output 62 of decision circuit 60, anode 98 of third diode D3, low potential ends 96 and 97 of third and fourth resistors R3 and R4, and to terminal PIN6 of IC chip 26. The node thus described will hereinafter sometimes be referred to as the internal ground reference CHIP VSS.

A pulse output 53 from pulse generator and logic section output 50 is electrically coupled to source terminals 80 and 81 of first and second transistors P1 and P2, respectively, and to terminal PIN2 of IC 26. Gate terminal 82 of first transistor P1 is electrically coupled to terminal P1N1 of IC 26. Gate terminal 83 of second transistor P2 is electrically coupled to terminal PIN3 of IC 26.

Drain terminal 84 of first transistor P1 is electrically coupled to anode 90 of first diode D1 and to high potential end 94 of third resistor R3. Drain terminal 85 of second transistor P2 is electrically coupled to anode 91 of second diode D2 and to high potential end 95 of fourth resistor R4.

Cathode 92 of first diode D1 is electrically coupled to PLUS input terminal 64 of decision circuit 60, to drain terminals 86 and 87 of first and second transistor switches SW1 and SW2, and to high potential plate 100 of first capacitor C1. Cathode 93 of second diode D2 is electrically coupled to MNUS input terminal 66 of decision circuit 60, to drain terminals 88 and 89 of third and fourth transistor switches SW3 and SW4, and to high potential plate 101 of second capacitor C2.

Logic output 63 of decision circuit 60 is electrically coupled to input 75 of inverter I1 and to latch trigger input 73 of self-holding latch section 70. Output 72 of self-holding latch section 70 is electrically coupled to terminal PIN4 of IC 26.

In the illustrated embodiments, decision circuit section 60 is designed so that its output 63 is at a low potential when its PLUS and MINUS inputs 64 and 66, respectively, are at substantially equal potentials or when MINUS input 66 is at a substantially higher potential than PLUS input 64. Decision circuit section 60 output 63 is at a high potential only when PLUS input 64, is at a substantially higher potential than MINUS input 66.

Self-holding latch section 70 is designed so that no current flows through latch section 70 from the control circuit 24 power supply 25 to internal ground reference CHIP VSS and through third diode D3 when decision circuit section 60 logic output 63 is at a low potential. However, when decision circuit 60 section logic output 63 is at a high potential, latch trigger input 73 is at a high potential, thus triggering latch circuit 70 and enabling current to flow through latch section 70 from control circuit 24 power supply 25 to internal ground reference CHIP VSS and through third diode D3, by way of latch 70 power input and output terminals 71 and 72, respectively. Once latch 70 has been triggered, it remains triggered, or sealed in, until power is removed from control circuit 24. The design and construction of a latch section which operates in this manner is known to those skilled in the art and need not be described in detail herein.

Output terminal 76 of inverter I1 is electrically coupled to gate terminal 78 of third transistor P3. Drain terminal 79 of third transistor P3 is electrically coupled to terminal PIN7 of IC 26.

Third diode D3 is provided to prevent back-biasing of control circuit 24 when touch switch apparatus 20 is used in multiplexed applications. It can be omitted in applications where only a single touch pad 22 is used, or where multiple touch pads 22 are used, but not multiplexed.

Figure 4:
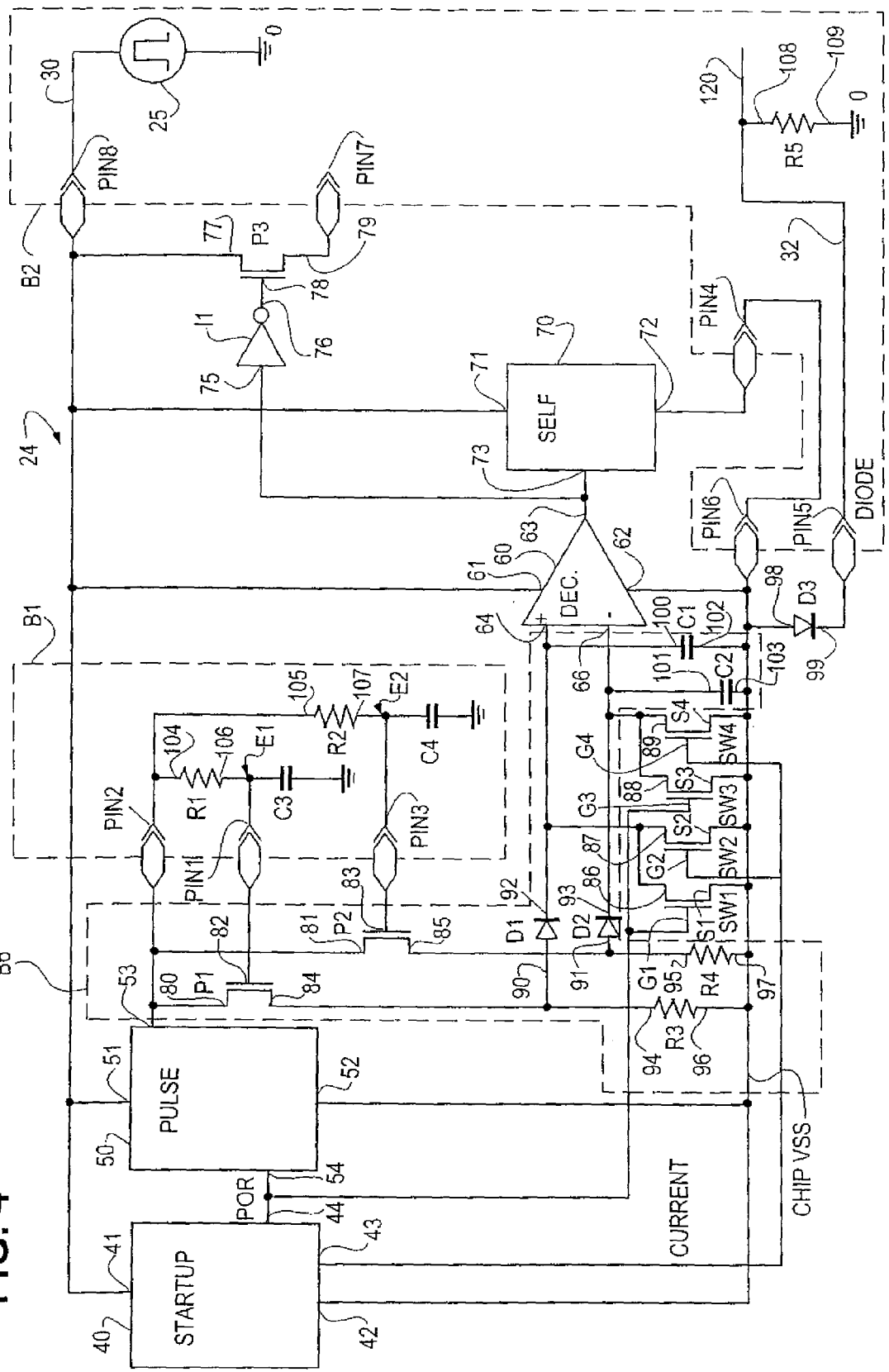
FIG. 4 is an electrical schematic representation of a touch switch control circuit configured for a preferred operating mode.

The foregoing description of the basic design of control circuit 24 is identical for each of the four operating modes depicted in FIGS. 4-7. The distinctions in overall apparatus configuration among the four operating modes lie primarily in the external terminal connections of IC 26, as will be described in detail below. FIG. 4 illustrates a touch switch apparatus 20 configured for operation in differential input strobed mode, as described below. Control circuit 24 for operation in this mode is configured as described hereinabove for FIGS. 4-7 generally. Terminal PIN2 of IC 26 is electrically coupled to high potential ends 104 and 105 of first and second resistors R1 and R2, respectively. Terminal PIN1 of IC 26 is electrically coupled to both low potential end 106 of first resistor R1 and to first electrode E1. Terminal PIN3 of IC 26 is electrically coupled to both low potential end 107 of second resistor R2 and to second electrode E2.

The circuit elements represented as C3 and C4 in FIGS. 4-7 are not discrete electrical components. Rather, reference characters C3 and C4 represent the capacitance-to-ground of first and second electrodes E1 and E2, respectively.

Terminal PIN8 of IC 26 is electrically coupled to input line 30, which is in turn electrically coupled to a power signal source 25 at, for example, the controlled device (not shown). Terminal PIN4 of IC 26 is electrically coupled to terminal PIN6 of IC 26, thereby electrically coupling output terminal 72 of latch 70 to the internal ground reference CHIP VSS and anode 98 of third diode D3. Terminal PINT of IC chip 26 is not externally terminated in this embodiment. Terminal PIN5 of IC 26 is electrically coupled to output line 32, which is in turn electrically coupled to high potential end 108 of fifth resistor R5 and to output line 120, which is connected to the controlled device (not shown), either directly or by way of a processor or other intermediate device (not shown). Low potential end 109 of resistor R5 is electrically coupled to the system ground. In a typical application, resistor R5 will be at a substantial distance from the other components comprising touch switch apparatus 20. That is, in the preferred embodiment, resistor R5 is contemplated not to be near touch pad 22 and control circuit 24.

Figure 5:
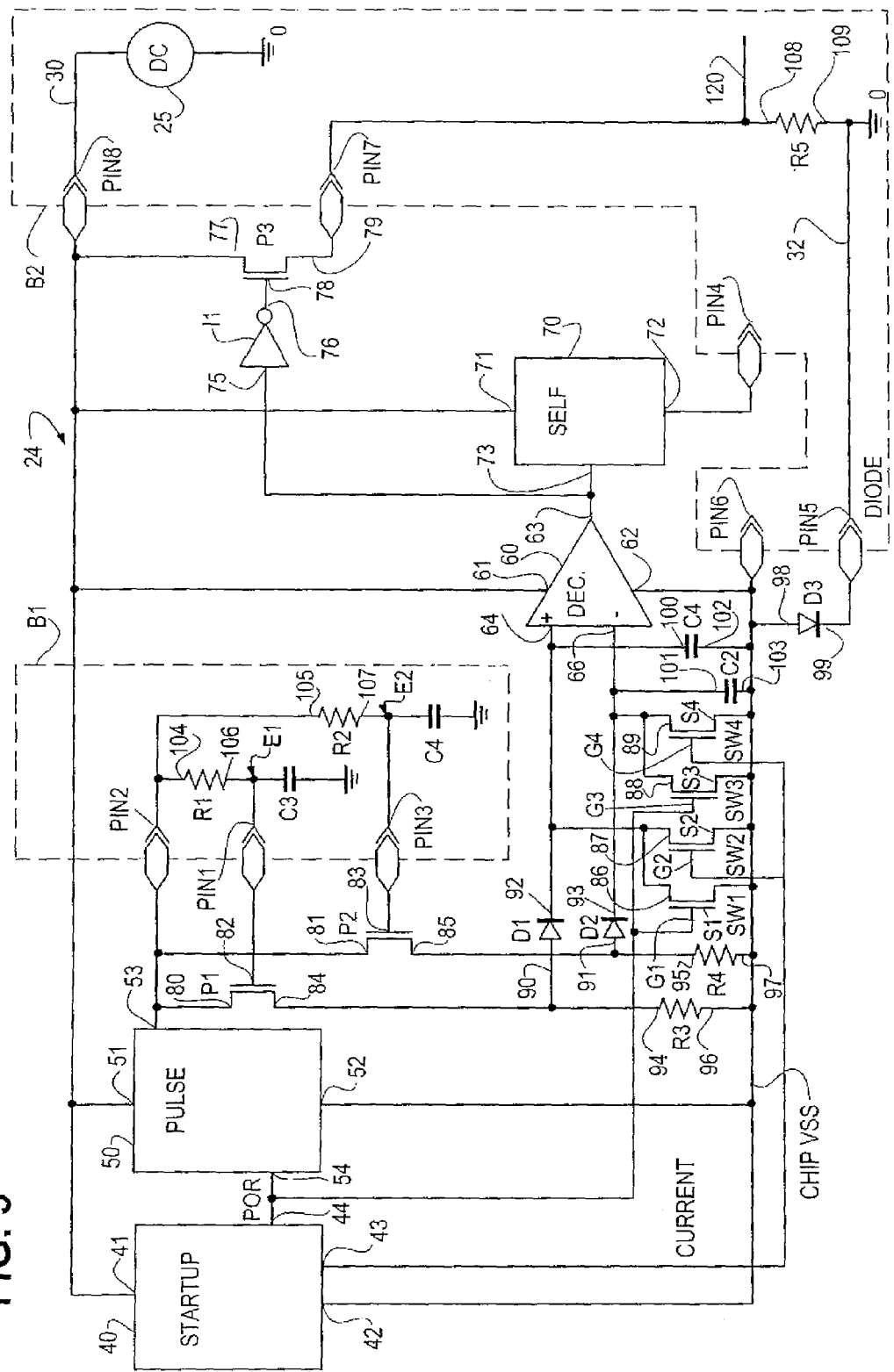
FIG. 5 is an electrical schematic representation of a touch switch control circuit configured for an alternate preferred operating mode.

FIG. 5 illustrates a typical touch switch control circuit 24 configured for operation in differential input continuous DC mode, as described below. The overall control circuit and apparatus is identical to that described for FIG. 4 hereinabove, with three exceptions. First, in the FIG. 5 embodiment, terminal PIN7 of IC 26 is electrically coupled to high potential end 108 of resistor R5 and to output line 120, which is connected to the controlled device (not shown) either directly or by way of a processor or other intermediate device (not shown), whereas terminal PIN7 is not externally terminated in the FIG. 4 embodiment. Second, in the FIG. 5 embodiment, terminals PIN4 and PING of IC 26 are not electrically coupled to each other or otherwise externally terminated, whereas they are in the FIG. 4 embodiment. Third, in the FIG. 5 embodiment, terminal PIN5 of IC 26 is electrically coupled to low potential end 109 of resistor R5, whereas in the FIG. 4 embodiment, terminal PIN5 of IC 26 is electrically coupled to high potential end 108 of fifth resistor and to the controlled device (not shown). As in the FIG. 4 embodiment, fifth resistor R5 will typically be at a substantial distance from the other components comprising touch switch apparatus 20.

Figure 6:
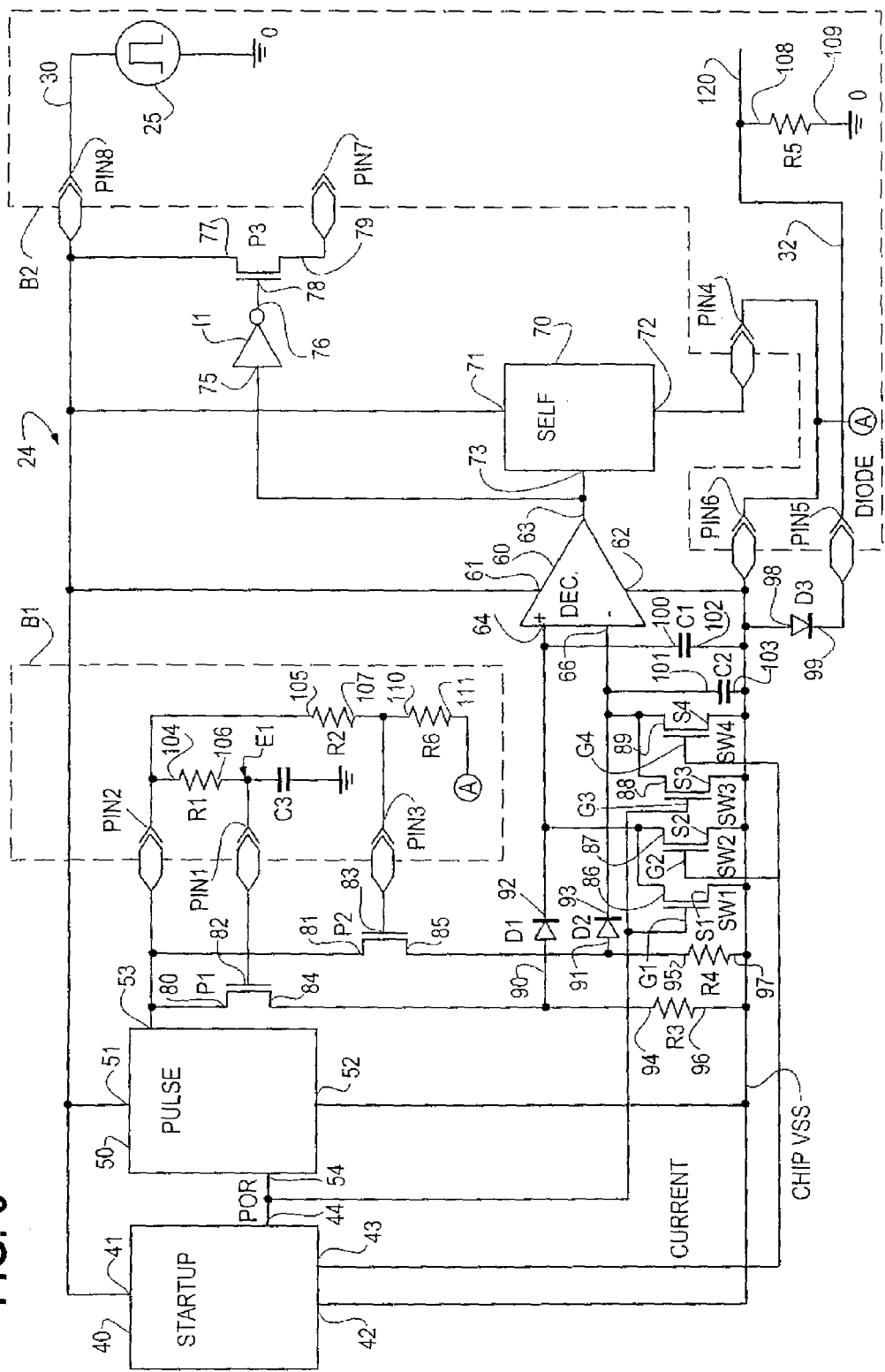
FIG. 6 is an electrical schematic representation of a touch switch control circuit configured for another alternate preferred operating mode.

FIG. 6 illustrates a typical touch switch control circuit configured for operation in single-ended input strobed mode, as described below. Control circuit 24 is configured as described hereinabove for FIGS. 4-7 generally. Terminal PIN2 of IC 26 is electrically coupled to high potential ends 104 and 105 of first and second resistors R1 and R2, respectively. Terminal PIN1 of IC 26 is electrically coupled to both low potential end 106 of first resistor R1 and to first electrode E1. Terminal PIN3 of IC 26 is electrically coupled to both low potential end 107 of second resistor R2 and to high potential end 110 of sixth resistor electrode R6, such that second resistor R2 and sixth resistor R6 form a voltage divider. Low potential end 111 of sixth resistor R6 is electrically coupled to internal ground reference CHIP VSS, typically at a point proximate terminal PIN5 of IC 26. In FIG. 6, the electrical connection of sixth resistor R6 to the internal ground reference CHIP VSS is represented by broken line "A-A" for clarity.

Terminal PIN8 of IC 26 is electrically coupled to input line 30, which is in turn electrically coupled to a power signal source 25. Terminal PIN5 of IC 26 is electrically coupled to output line 32, which is in turn electrically coupled to high potential end 108 of fifth resistor R5 and to output line 120. Output line 120 is electrically coupled to the controlled device (not shown), either directly or by way of a processor or other intermediate device. Terminal PIN4 of IC 26 is electrically coupled to terminal PIN6 of IC 26. Terminal PIN 7 of IC 26 is not externally terminated in this embodiment. In a typical application, fifth resistor R5 will be at a substantial distance from the other components comprising touch switch apparatus 20.

Figure 7:
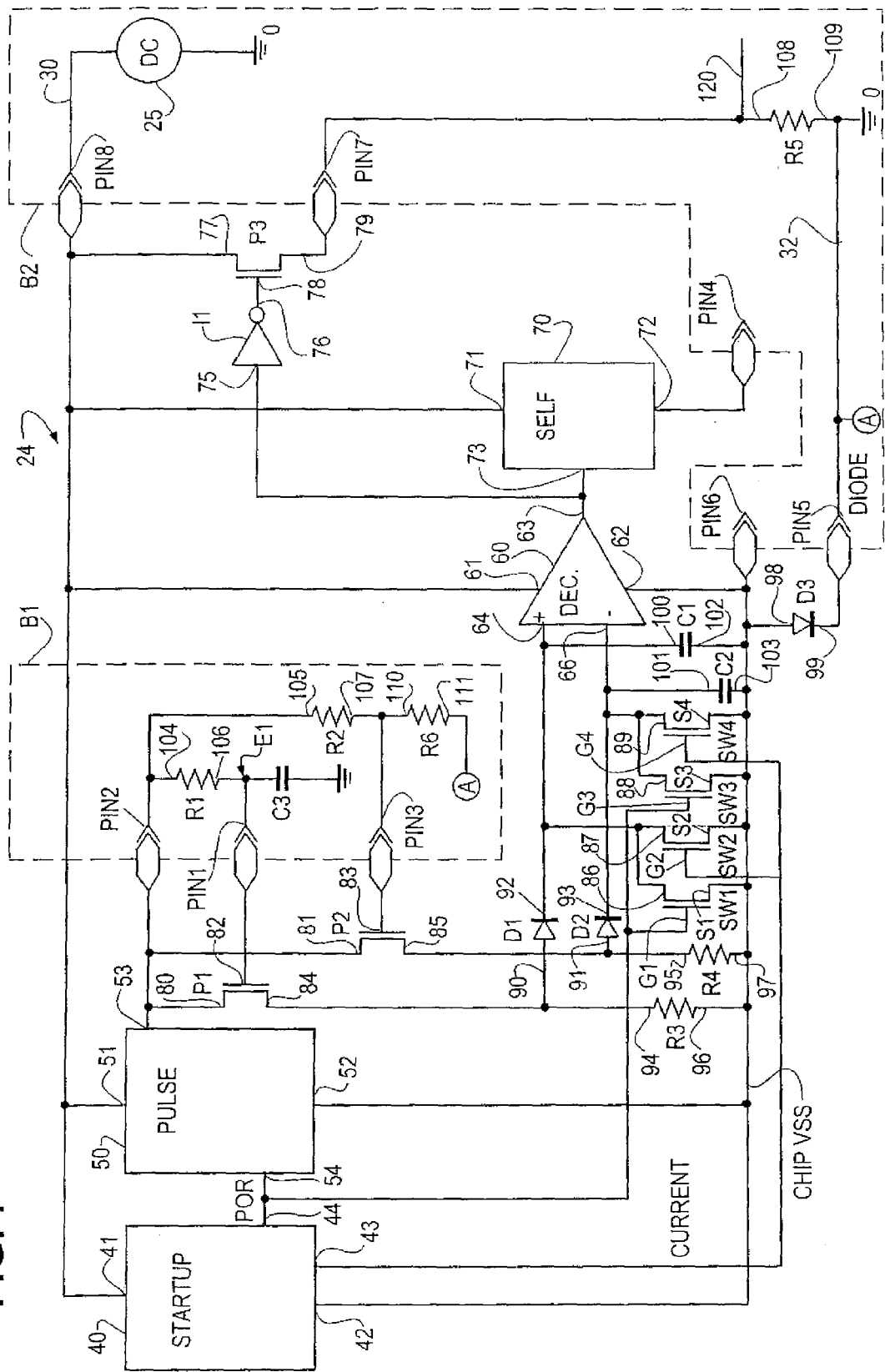
FIG. 7 is an electrical schematic representation of a touch switch control circuit configured for yet another alternate preferred operating mode.

FIG. 7 illustrates a typical touch switch control circuit configured for operation in single ended input continuous DC mode, as described below. Control circuit 24 is configured as described hereinabove for FIGS. 4-7 generally. The overall control circuit and apparatus is identical to that described for FIG. 6 hereinabove, with three exceptions. First, in the FIG. 7 embodiment, terminal PIN7 of IC 26 is electrically coupled to high potential end 108 of fifth resistor R5 and to output line 120, which is in turn connected to the controlled device (not shown), typically by way of a microprocessor or other controller (not shown). Terminal PIN7 of IC 26 is not externally terminated in the FIG. 6 embodiment. Second, in the FIG. 7 embodiment, terminals PIN4 and PIN6 of IC 26 are not electrically coupled or otherwise externally terminated, whereas they are in the FIG. 6 embodiment. Third, in the FIG. 7 embodiment, terminal PIN5 of IC 26 is electrically coupled to low potential end 109 of fifth resistor R5, whereas in the FIG. 6 embodiment, terminal PIN5 of IC 26 is electrically coupled to high potential end 108 of fifth resistor and to output line 120. In a typical application, fifth resistor R5 will be at a substantial distance from the other components comprising touch switch apparatus 20. In FIG. 7, the electrical connection of sixth resistor R6 to the internal ground reference CHIP VSS is represented by broken line "A-A" for clarity.

A touch switch apparatus 20 configured for the differential input strobed mode operates as follows. Referring to FIG. 4, a power/control signal 25 is provided to terminal PIN8 of IC 26 and, in turn, to power input terminals 41, 51, 61, and 71 of start up and bias section 40, pulse generator and logic section 50, decision circuit section 60, and self-holding latch section 70, respectively.

Upon becoming powered, and after a suitable delay interval to allow for stabilization (approximately 25 microseconds is sufficient but may be either shorter or longer depending on the application), start up and bias section 40 outputs a short duration power-on reset signal from output terminal 44 to gate terminals G1 and G3 of first transistor switch SW1 and third transistor switch SW3, respectively, causing first and third transistor switches SW1 and SW3 to turn on, and thus providing a current path from high potential plates 100 and 101 of first and second capacitors C1 and C2, respectively, to the internal ground reference CHIP VSS. The power on reset signal duration is sufficient to allow any charge present on first and second capacitors C1 and C2 to be substantially completely discharged to the internal ground reference CHIP VSS. In this manner, PLUS and MINUS inputs 64 and 66 to decision circuit section 60 attain an initial low-potential state.

At substantially the same time, start up and bias circuit 40 sends a power on reset signal from output 44 to input 54 of pulse generator and logic section 50, thus initializing it. After a suitable delay to allow pulse generator and logic section 50 to stabilize, pulse generator and logic section 50 generates a pulse and outputs it from pulse output terminal 53 to first and second electrodes E1 and E2 by way of first and second resistors R1 and R2, and to source terminals 80 and 81 of first and second transistors P1 and P2, respectively. The pulse may be of any suitable waveform, such as a square wave pulse.

Startup and bias circuit 40 also outputs a bias voltage from bias output 43 to gate terminals G2 and G4 of second and fourth transistor switches SW2 and SW4, respectively. The bias voltage is out of phase with the pulse output to first and second electrodes E1 and E2. That is, when the pulse output is at a high state, the bias voltage output is at a low state and when the pulse output is at a low state, the bias voltage output is at a high state.

When a pulse is applied to first and second electrodes E1 and E2 through first and second resistors R1 and R2, respectively, the voltage at gate terminals 82 and 83 of first and second transistors P1 and P2 is initially at a lower potential than that at source terminals 80 and 81 of first and second transistors P1 and P2, respectively, thus biasing first and second transistors P1 and P2 and causing them to turn on. With first and second transistors P1 and P2 turned on, current will flow through third and fourth resistors R3 and R4, thus creating a peak potential at anode terminals 90 and 91 of first and second diodes D1 and D2, respectively.

If the peak potential at anodes 90 and 91 of first and second diodes D1 and D2 is higher than the potential across first and second capacitors C1 and C2, a peak current is established through first and second diodes D1 and D2, causing first and second capacitors C1 and C2 to become charged, and establishing a peak potential at each of PLUS and MINUS inputs 64 and 66 to decision circuit section 60. This situation will occur, for example, following the first pulse after control circuit 24 has been initialized because first and second capacitors C1 and C2 will have become discharged upon startup, as described above.

As is evident to one skilled in the art, the biasing of first and second transistors P1 and P2, the current through third and fourth resistors R3 and R4, the peak potential created at anodes 90 and 91 of first and second diodes D1 and D2, and the peak potential created at each of PLUS and MINUS inputs 64 and 66 to decision circuit 60 are proportional to the condition of the electric field at first and second electrodes E1 and E2. The condition of the electric field proximate electrodes E1 and E2 will vary in response to stimuli present proximate the electrodes.

With control circuit 24 activated, as described above, and with no stimuli present proximate either first and second electrodes E1 and E2, the potentials at each of PLUS and MINUS inputs 64 and 66 to decision circuit 60 are in what may be termed a neutral state. In the neutral state, the potentials at each of PLUS and MINUS inputs 64 and 66 may be substantially equal. However, in order to prevent unintended actuations, it may be desirable to adjust control circuit 24 so that the neutral state of MINUS input 66 is at a somewhat higher potential than the neutral state of PLUS input 64. This adjustment may be effected by varying the configurations of first and second electrodes E1 and E2 and the values of first and second resistors R1 and R2 to achieve the desired neutral state potentials. Regardless of the neutral state potentials, it is contemplated that decision circuit 60 output 63 will be at a low potential unless PLUS input 64 is at a substantially higher potential than MINUS input 66.

With decision circuit 60 output 63 at a low potential, inverter I1 causes the potential at gate terminal 78 of third transistor P3 to be at a high level, substantially equal to the potential at source terminal 77. In this state, third transistor P3 is not biased and will remain turned off. However, in this embodiment, terminal PIN7 of IC 26 is not terminated. Drain terminal 79 of third transistor P3 is therefore in an open-circuit condition, and the state of third transistor P3 is of no consequence to the function of the apparatus. Also, with decision circuit 60 output 63, and consequently latch trigger input 73, at a low state, self holding latch circuit 70 will not be triggered, and no current will flow through latch 70 from power supply 25 to the internal ground reference CHIP VSS and through third diode D3.

Over a period of time which is determined by the pulse voltage, the values of first and second resistors R1 and R2, and the capacitance to ground of first and second electrodes E1 and E2 (represented in the figures as virtual capacitors C3 and C4), the potential at first and second electrodes E1 and E2 eventually rises to substantially equal the pulse voltage and thus the voltage at source terminals 80 and 81 of first and second transistors P1 and P2, thus unbiasing first and second transistors P1 and P2. When this state is reached, first and second transistors P1 and P2 turn off, and the potentials at anodes 90 and 91 of first and second diodes D1 and D2 begin to decrease at a substantially equal rate towards the internal ground reference CHIP VSS level. Eventually, the anode potential at each of first and second diodes D1 and D2 is likely to fall below the respective cathode potential. At this point, diodes D1 and D2 become reverse biased and prevent first and second capacitors C1 and C2 from discharging.

When the pulse on output 53 goes to a low state, the bias voltage output goes to a high state relative to the internal ground reference CHIP VSS, and applies the elevated bias voltage to gate terminals G2 and G4 of second and fourth transistor switches SW2 and SW4. In this state, second and fourth transistor switches SW2 and SW4 become slightly biased and turn on sufficiently to effect a slow, controlled discharge of first and second capacitors C1 and C2 to the internal ground reference CHIP VSS. When the pulse next goes to a high state, the bias voltage will return to a low state, second and fourth transistor switches SW2 and SW4 will turn off, and the circuit will respond as described initially.

If a stimulus is present at or near second electrode E2 when the pulse from pulse generator and logic section 50 goes to a high potential, first transistor P1 will operate as described hereinabove. That is, first transistor P1 will be initially biased and will allow some current to flow through third resistor R3, creating a peak potential at anode 90 of first diode D1, and allowing a peak current to flow through first diode D1, thereby charging first capacitor C1, and establishing a peak potential at PLUS input 64 to decision circuit 60. Once the voltage at first electrode E1 has stabilized in response to the incoming pulse, first transistor P1 will become unbiased and will turn off.

Second transistor P2 operates in much the same way, except that the presence of the stimulus proximate second electrode E2 will alter the RC time constant for that circuit segment, thus lengthening the time required for the potential at second electrode E2 to stabilize. As a consequence, second transistor P2 will remain biased on for a longer period of time than first transistor P1, allowing a greater peak current to flow through fourth resistor R4 than flows through third resistor R3, thus generating a peak potential at anode 91 of second diode D2 which is greater than the peak potential present at anode 90 of first diode D1. Consequently, a peak current will flow through second diode D2, causing second capacitor C2 to become charged, ultimately resulting in a peak potential at MINUS input 66 to decision circuit 60 which is greater than the peak potential at PLUS input 64 to decision circuit. Since decision circuit 60 is configured so that its output will be at a low potential when the potential at MINUS input 66 is greater than or substantially equal to the potential at the PLUS input 64, decision circuit 60 output terminal 63 will be at a low potential.

With decision circuit 60 output terminal 63, and consequently latch trigger input terminal 73, at a low potential, self holding latch 70 will not be triggered. Inverter I1 and third transistor P3 will operated as described previously, although, again, the state of third transistor P3 is inconsequential in this configuration.

In the event that a contaminant or foreign object, or other stimulus, substantially covers, or is applied to, both first and second electrodes E1 and E2, the system will respond much in the same way as it would when no stimulus is present at either the first electrode or second electrode. However, with contaminants or a foreign object present proximate both electrodes E1 and E2, the RC time constant for those segments of the circuit will be altered such that it will take longer for the voltage at both first and second electrodes E1 and E2, respectively, to substantially equalize with the pulse voltage. Consequently, both first and second transistors P1 and P2 will turn on and will allow more current to flow through third and fourth resistors R3 and R4 than they would in a condition where neither first nor the second electrode E1 or E2 is affected by a stimulus. However, first and second transistors P1 and P2 will be substantially equally biased. Therefore, a substantially equal peak potential will be developed at anodes 90 and 91 of both first and second diodes D1 and D2, causing a substantially equal peak current to flow through first and second diodes D1 and D2, charging first and second capacitors C1 and C2, and establishing a substantially equal peak potential at both PLUS and MINUS inputs 64 and 66 to decision circuit 60. In this state, decision circuit section 60 output terminal 63 will be at a low potential, latch trigger input terminal 73 of self holding latch 70 will be at a low potential, and latch 70 will remain untriggered. As previously described, the state of inverter I1 and third transistor P3 is inconsequential in this embodiment.

In the situation where a stimulus is applied proximate first electrode E1, but not second electrode, second transistor P2 will be initially biased and will turn on, establishing a current through fourth resistor R4, and generating a peak potential at anode terminal 90 of second diode D2. A peak current will flow through second diode D2, charging second capacitor C2, and establishing a peak potential at MINUS input 66 of decision circuit section 60. As the voltage at gate terminal 81 of second transistor P2 rises to the level of the pulse voltage, second transistor P2 will become unbiased and will turn off. Second diode D2 will then become reverse biased, and will prevent second capacitor C2 from discharging.

As is evident to one skilled in the art, the presence of a stimulus proximate first electrode E1 will lengthen the time required for the potential at first electrode E1 to stabilize. As a consequence, first transistor P1 will remain biased on for a longer period of time than second transistor P2, allowing a greater peak current to flow through third resistor R3 than through fourth resistor R4, thus generating a peak potential at anode 90 of first diode D1 which is greater than the potential present at anode 91 of second diode D2. Consequently, a peak current of greater magnitude and/or duration will flow through first diode D1 than through second diode D2, causing first capacitor C1 to become charged, ultimately resulting in a peak potential at PLUS input 64 to decision circuit 60 which is substantially greater than the peak potential at MINUS input 66 to decision circuit 60. Since decision circuit 60 is configured so that output terminal 63 will be at a high state when the potential at PLUS input 64 is greater than the potential at MINUS input 66, decision circuit 60 output 63 will be at a high potential.

With decision circuit 60 output 63 at a high potential, inverter I1 will cause potential at gate terminal 78 of third transistor P3 to be low relative to the potential at source terminal 77, thus biasing third transistor P3, and causing it to turn on. However, since terminal PIN7 of IC 26 is not terminated in this embodiment, the state of third transistor P3 is of no consequence.

With decision circuit 60 output terminal 63 at a high potential, self holding latch circuit 70 trigger input terminal 73 will also be at a high potential, thus triggering latch 70. When self holding latch 70 is triggered, a current path is established from power supply 25 to internal ground reference CHIP VSS and through third diode D3, effectively short circuiting the remainder of control circuit 24, including startup and bias section 40, pulse generator and logic section 50, and decision circuit section 60. In this state, those sections of control circuit 24 become substantially de-energized and cease to function.

Once triggered, self holding latch 70 will remain triggered, regardless of the subsequent state of stimuli proximate either or both of electrodes E1 and E2. Latch 70 will reset when the power from the power supply 25 goes to a near zero state, such as when the square wave strobe signal from power supply 25 of this example falls to zero.

While self holding latch 70 is in the triggered state, a steady state signal will be supplied through fifth resistor R5 and back to the controlled device (not shown). In this manner, touch switch apparatus 20 emulates the change of state associated with a maintained-contact mechanical switch.

Referring now to FIG. 5, the operation of a touch switch apparatus 20 configured for the differential input continuous DC mode is as follows. The control circuit 24, up to and including decision circuit 60, performs in substantially the same manner as when configured for the differential input strobed mode of operation, as described above with reference to FIG. 4. That is, with no stimulus present proximate either first or second electrodes E1 and E2, with a stimulus present proximate both first and second electrodes E1 and E2, or with a stimulus present proximate second electrode E2, but not first electrode E1, the decision circuit 60 output 63 will be at a low potential. With a stimulus present proximate first electrode E1, but not second electrode E2, the decision circuit 60 output 63 will be at a high level.

As can be readily seen in FIG. 5, self holding latch circuit 70 output 72 is not terminated in this embodiment, and the self holding latch 70 is therefore inoperative in differential input DC mode. However, drain terminal 79 of third transistor P3 is electrically coupled to internal ground reference CHIP VSS and to output line 32 in this embodiment, and it therefore becomes an operative part of control circuit 24. When decision circuit 60 output 63 is at a low potential, inverter I1 causes the potential at gate terminal 78 of third transistor P3 to be at a high potential, substantially equal to the potential source terminal 77. In this state, third transistor P3 is not biased and does not turn on. When decision circuit 60 output 63 is at a high potential, inverter I1 causes the potential at gate terminal 78 of third transistor P3 to be at a low potential compared to the potential at source terminal 77. In this state, third transistor P3 is biased and turns on, allowing current to be established through third transistor P3 and fifth resistor R5. Output line resistor R5 limits the current through third transistor P3 such that the balance of control circuit 24 is not short circuited and remains operative.

In the DC mode shown in FIG. 5, control circuit 24 also responds to the removal of the stimulus from the proximity of first electrode E1. So long as a stimulus remains present proximate first electrode E1, but not second electrode E2, each time the pulse goes to a high state, a peak potential will be created at anode 90 of first diode D1 which is higher than the peak potential at anode 91 of second diode D2. Consequently, the peak potential at PLUS input 64 to decision circuit 60 will be at a higher level than the peak potential at MINUS input 66 and control circuit 24 will behave as described above. When the stimulus is removed, however, and no stimulus is present proximate either first electrode E1 or second electrode E2, the charge on first capacitor C1 will eventually discharge to a neutral state by means of the biasing function of second transistor switch SW2. At this point, the potential at PLUS input 64 of decision circuit 60 will no longer be higher or substantially higher than the potential at MINUS input 66, and decision circuit 60 output 63 will return to a low state.

In this manner, touch switch apparatus 20 operating in differential input DC mode emulates a momentary contact, push-to-close and release-to-open, mechanical switch. It should be recognized that, with minor revisions, the control circuit could be configured to emulate a push-to-open and release-to-close mechanical switch.

Referring now to FIG. 6, touch switch apparatus 20 configured for the single ended input strobed mode of operation operates as follows. When a pulse is applied to first electrode E1 and first and second resistors R1 and R2, current flows through second resistor R2 and sixth resistor R6. Second and sixth resistors R2 and R6 are configured as a voltage divider; that is, when the pulse output is in a high state, gate terminal 83 of second transistor P2 will be at a lower potential than source terminal 81 of second transistor P2. Therefore, when pulse output 53 is in a high state, second transistor P2 will be continuously biased and will allow a constant current to flow through fourth resistor R4, thus creating a reference potential at anode 91 of second diode D2. The reference potential at anode 91 of second diode D2 will establish a current through second diode D2, causing second capacitor C2 to become charged, and thus creating a reference potential at MINUS input 66 to decision circuit 60. When the reference potential at MINUS input 66 becomes substantially equal to the reference potential at anode 91 of second diode D2, the current through second diode D2 will cease.

Concurrently, with no stimulus present at first electrode E1, the pulse applied to source terminal 80 of first transistor P1 and to first electrode E1 will initially cause first transistor P1 to become biased and to turn on. A current will thus be established through third resistor R3 and a peak potential will be created at anode 90 of first diode D1. The peak potential will establish a peak current through first diode D1, charging first capacitor C1 and creating a peak potential at PLUS input 64 of the decision circuit. Resistors R1, R2, R3, R4, and R6 are selected so that when no stimulus is present proximate first electrode E1, the reference potential at MINUS input 66 of decision circuit 60 will be greater than or equal to the peak potential at to PLUS terminal 64 of decision circuit 60.

In this state, output 63 of the decision circuit 60 will be at a low potential and self holding latch 70 will not be triggered. Also, inverter I1 will cause the potential at gate terminal 78 of third transistor P3 to be at a high state, substantially equal to the source terminal 77 potential, so that third transistor P3 is unbiased and remains turned off. However, this is of no consequence since drain terminal 79 of third transistor P3 is in an open-circuit condition in this embodiment.

This embodiment does not require a second electrode, although a two-electrode touch pad may be adapted for use in this mode. In the event a two-electrode touch pad is adapted for use in this mode of operation, the presence or absence of a stimulus proximate the second electrode has no effect on the operation of the circuit.

In the event that a stimulus is present proximate first electrode E1, the operation of second transistor P2 is the same as described hereinabove for this embodiment. However, the presence of the stimulus proximate first electrode E1 will cause a greater time to be required for the voltage at gate terminal 82 of first transistor P1 to become equalized with source terminal 80 potential at first transistor. Consequently, first transistor P1 will be turned on and will allow a relatively greater current to flow through third resistor R3, compared to the current that second transistor P2 allows to flow through fourth resistor R4. As a result, the peak potential at anode 90 of first diode D1 will be greater than the reference potential at anode 91 of second diode D2. As a result, the peak potential at PLUS input 64 of decision circuit 60 will be greater than the reference potential at MINUS input 66 of decision circuit 60, and output 63 from decision circuit 60 will therefore be at a high state. With output 63 of decision circuit 60 at a high state, inverter I1 causes the potential at gate terminal 78 of third transistor P3 to be at a low state, thus turning transistor P3 on. However, since drain terminal 79 of third transistor P3 is effectively not terminated, this is of no consequence.

With output 63 of decision circuit 60 at a high state, latch trigger input 73 is at a high state, and self holding latch 70 is triggered, thus establishing a current path through latch section 70, from power supply 25 to internal ground reference CHIP VSS and through third diode D3, thereby effectively short circuiting the balance of control circuit 24. Self holding latch 70 will remain in this state until power to latch input terminal 71 is removed. Until latch 70 is thus reset, a continuous digital control signal is output to the controlled device (not shown). In this manner, touch switch apparatus 20 emulates a change of state associated with a mechanical switch.

Referring now the FIG. 7, a touch switch apparatus 20 configured for operation in the single ended input continuous DC mode operates as follows. The operation and functionality of control circuit 24 is substantially the same as described for the single ended input, strobed mode as described hereinabove with reference to FIG. 6. However, in the single ended input, DC mode, self holding latch output 72 is open circuited and self holding latch 70 is therefore not operative.

With no stimulus applied to first electrode E1, output 63 of decision circuit 60 is at a low potential. Consequently, inverter I1 output 76 to gate terminal 78 of third transistor P3 is at a high potential. With gate terminal 78 of third transistor P3 at a high potential, similar to the potential at source terminal 77, third transistor P3 is unbiased and does not turn on, and therefore no current flows through third transistor P3 or through fifth resistor R5.

With a stimulus proximate first electrode E1, output 63 of decision circuit 60, and consequently input 75 to inverter I1, is at a high state. Inverter I1 changes the high level input to a low level output, and provides output 76 to gate terminal 78 potential of third transistor P3. With gate terminal 78 at a low potential compared to source terminal 77, third transistor P3 is biased, it turns on, and current flows through third transistor P3 and fifth resistor R5. This creates an elevated potential at anode 108 of fifth resistor R5 which may be used as an input to the controlled device (not shown) via output line 120.

In the continuous DC mode of FIG. 7, the control circuit responds to the removal of the stimulus from the proximity of first electrode E1. So long as the stimulus remains present proximate first electrode E1, each time the pulse goes to a high state, a peak potential will be created at anode 90 of first diode D1 which is higher than the reference potential at anode 91 of second diode D2. Consequently, the peak potential at PLUS input 64 to the decision circuit 60 will be at a higher level than the reference potential at the MINUS input 66 and control circuit 24 will behave as described above. When the stimulus is removed from first electrode E1, the charge on first capacitor C1 will eventually discharge to a neutral state by means of the biasing function of second transistor switch SW2. At this point, the peak potential at PLUS input 64 of decision circuit 60 will no longer be higher or substantially higher than the reference potential at MINUS input 66, and decision circuit 60 output 63 will return to a low state.

In this manner, touch switch apparatus 20 operating in single-ended input DC mode emulates a momentary contact mechanical switch. With minor revisions, the control circuit could be configured to emulate a push-to-open and release-to-close mechanical switch.

Figure 10:
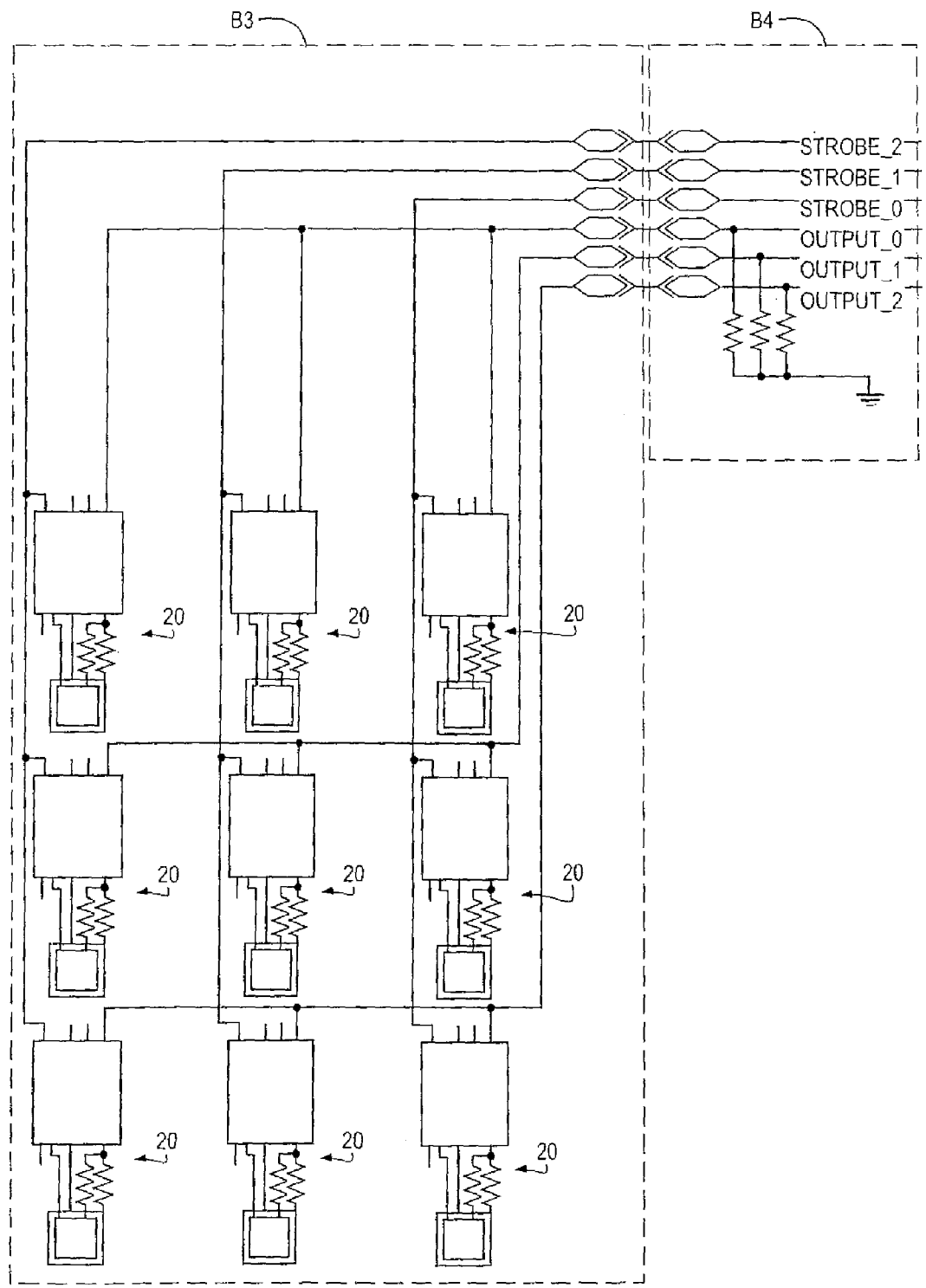
FIG. 10 is a diagrammatic representation of an embodiment of a touch switch panel using a plurality of touch switches in matrixed form.

Thus far, this specification has described the physical construction and operation of a single touch switch. Typical touch switch applications frequently involve a plurality of touch switches which are used to effect control over a device. FIG. 10 shows a switch panel comprising nine touch switches 20, where the nine touch switches 20 are arranged in a three-by-three matrix. Box B4 represents components at the touch panel, while box B5 represents components at the controlled device. Although any number of touch switches could theoretically be laid out in any manner, matrix layouts such as this one are readily multiplexable, reducing the number of necessary input and output lines from the controlled device, and are preferred.

Box B6 in FIG. 4 depicts an input portion of a touch switch control circuit, which includes active devices P1 and P2, diodes D1 and D2, resistors R3 and R4 and capacitors C1-C2. FIGS. 11A-18E depict other configurations for the input portion of a touch switch control circuit involving active devices and peak detector circuits that fulfill some of the above described objects of the present invention, including providing for low impedance buffering, reducing the size and cost of the integrated circuit, linearizing input signals, swamping stray capacitance and blocking damaging current paths. The configurations depicted in FIGS. 11A-18E correspond basically to the configuration in boxed area B6 of FIG. 4 as will be understood by those skilled in the art of circuit design. Specifically, active devices M1 and M2 in FIG. 11A, for instance, correspond to active devices P1 and P2 in FIG. 4; active devices Q1 and Q2 in FIGS. 11A-18E correspond to diodes D1 and D2 in FIG. 4; resistances R7 and R8 in FIG. 11A, for instance, correspond to resistors R3 and R4 in FIG. 4; and capacitances C9 and C10 in FIGS. 11A-18E correspond to capacitors C1 and C2 in FIG. 4. Further, electrodes E1 and E2 and resistors R1 and R2 are the same in FIG. 4 as in those of FIGS. 11A-18E where they occur. Pins OSCB, I_RNG and O_RNG in those of FIGS. 11A-18E where they occur correspond to pins PIN2, PIN1 and PIN3 of FIG. 4. Switches SW2 and SW4 in FIG. 4 correspond to active devices M3 and M4 in FIG. 11A, for instance. Discharge signal DSCHGB in FIGS. 11A-18E corresponds to current bias on trace 43 from startup and bias circuitry 40 of FIG. 4. Traces POS and NEG of FIGS. 11A-18E corresponds to traces 64 and 66 of FIG. 4, respectively. Finally, trace OSCB in FIGS. 11A-18E corresponds to trace 53 from pulse generator and logic circuitry 50 of FIG. 4. Thus, the input portions of FIGS. 11A-18E can be understood to be compatible with the circuit configurations described with reference to FIGS. 4-7.

FIG. 11A illustrates inner electrode E1 and outer electrode E2, electrically coupled to oscillating signal generator OSCB through pin OSCB and resistors R1 and R2, respectively. FIG. 11A further shows inter-electrode capacitance C6. Capacitances C7 and C8, which represent the bond pad and wiring bond capacitances inherent when electrical components are coupled to an integrated control circuit, are also shown. Capacitances C7 and C8 can also represent other capacitances owing to under-bump-metallization, redistribution traces and the like, in flip chip and other applications not involving bonding pad wires as would be known to those skilled in the art.

In FIG. 11A, electrodes E1 and E2 are electrically coupled to the input portion of the touch switch control circuit at the gates of active devices M1 and M2, respectively, through pins I_RNG and O_RNG, respectively. In FIG. 11A, active devices M1 and M2 are shown as N-type MOSFET devices. The drains of active devices M1 and M2 are electrically coupled to voltage source VDD through resistors R7 and R8, respectively and their sources to oscillating signal OSCB.

The drains of active devices M1 and M2 are also electrically coupled to respective peak detection circuits consisting of active devices M3, M4, Q1 and Q2 and capacitors C9 and C10, which, as discussed above, correspond to the peak detection circuits shown in FIG. 4, having components switches SW2 and SW4, diodes D1 and D2, and capacitors C1 and C2, except that, since the input active devices M1 and M2 are N-MOS active devices, where active devices P1 and P2 in FIG. 4 are P-MOS devices, capacitances C9 and C10 and the sources of active devices M1 and M2, through resistances R7 and R8, are coupled to signal VDD, instead of to voltage signal VSS. The peak detection circuit in FIG. 11A associated with active device M1 includes active device Q1, the base of which is electrically coupled to the source of active device M1 through trace SNEG and also, through resistor R7, to voltage signal VDD, the emitter of which is electrically coupled to the drain of active device M3 and to capacitor C9, and the collector of which is coupled to voltage signal VSS; capacitance C9, one terminal of which is electrically coupled to voltage source VSS and the other terminal of which is electrically coupled to the emitter of active device Q1 and the drain of active device M3; and active device M3, the drain of which is electrically coupled to the emitter of active device Q1, the source of which is coupled to voltage source VDD and the base of which is electrically coupled to discharge signal DCHGB. The configuration of the peak detection circuit associated with active device M2 is analogous and involves active devices Q2 and M4 and capacitance C10. In FIG. 11A, active devices Q1 and Q2 are P-type bipolar transistors, and active devices M3 and M4 are P-type MOSFET devices. The emitters of active devices Q1 and Q2 are electrically coupled as inputs to the decision circuit component (not shown) of the control circuit through traces NEG and POS, respectively. The operation of the decision circuit component is as described above with respect to FIGS. 4-7.

In FIG. 11A, resistors R7 and R8 serve to convert drain currents to voltages at the drains of active devices M1 and M2, respectively. These voltages are related to changes in the electric fields of electrodes E1 and E2 caused by touch or other stimuli. The voltage potential at the respective nodes of the drains of active devices M1 and M2 is communicated to the peak detectors through traces SNEG and SPOS, respectively. The peak detectors can convert the peak negative value of very fast transient pulses on traces SPOS and SNEG to DC signals on traces POS and NEG, respectively, which are easier for the decision circuit to process. Thus, FIG. 11A illustrates a dual input system having negative pulse peak detecting circuits. A similar positive pulse peak detecting system is described in U.S. Pat. No. 5,594,222 for a single channel. The sensing circuit that generates these negative pulses could include an N-type MOSFET device that would be capable of pulling low at a high rate and a current source pulling high in a softer manner.

Active devices M1 and M2 in FIG. 11A will be turned on and off, by oscillating signal OSCB communicated through both electrodes E1 and E2 and pins I_RNG and O_RNG, to provide transient, negative-going pulses on traces SNEG and SPOS, respectively. The negative maximum peak levels of these pulses will be proportional to the strength of the electric fields at input electrodes E1 and E2, which can change when electrodes E1 and E2 are stimulated by touch or otherwise.

The signals on traces SNEG and SPOS are then communicated to the respective bases of active devices Q1 and Q2 of the peak detection circuits corresponding to active devices M1 and M2. A low signal communicated to the bases of active devices Q1 and Q2 will bias them on and present the maximum negative voltage at the drains of active devices M1 and M2 to traces NEG and POS, respectively. Capacitors C9 and C10, initially charged at VDD, slow the rate of this voltage change on traces POS and NEG and thereby convert the transient pulses of traces SPOS and SNEG to DC pulses on traces POS and NEG, as shown in the timing diagram of FIG. 11A. Active devices Q1 and Q2 then isolate capacitors C9 and C10 from charging once the transient signal is over. Active devices M3 and M4, controlled by discharge signal DCHGB, can then reset the initial charge VDD of capacitors C9 and C10, respectively.

Using short duration pulses advantageously allows the touch sensor to maintain a low impedance. Also, the control circuit consumes low average power. For instance, the peak current through the input electrode capacitance may be as high as several milliamps. This would correspond to a very low impedance during the time period that the peak current persists. If each pulse were active for even 20 nanoseconds and were sampled once every 50 microseconds, then the continuous average current would be 0.8 microamps for each channel, and 1.6 microamps for both channels. In addition, the input portion provides statistical filtering and periodic sampling of the sensing signals when discharge signal DCHGB is not active.

These low impedance and low average power consumption characteristics can enhance the stimulus interpretation performance of the touch sensor, as described in U.S. Pat. No. 5,594,222 and can be advantageous when replacing mechanical switches, membrane switches and the like with touch sensing devices. Mechanical and other true switches do not allow current to pass when they are open. A low impedance and low power solid-state switch mimics this characteristic of true switches and can thereby allow for direct replacement of mechanical switches without risking the passage of unacceptable amounts, of leakage current through an "open" solid-state switch. Also, the peak detector circuits of low impedance and low average power touch switches are compatible with the use of relatively low gain and low bandwidth product amplifiers and op amps in the decision and other circuits and DC and relatively low gain and low bandwidth devices for the signal generating circuits.

Figure 11B:
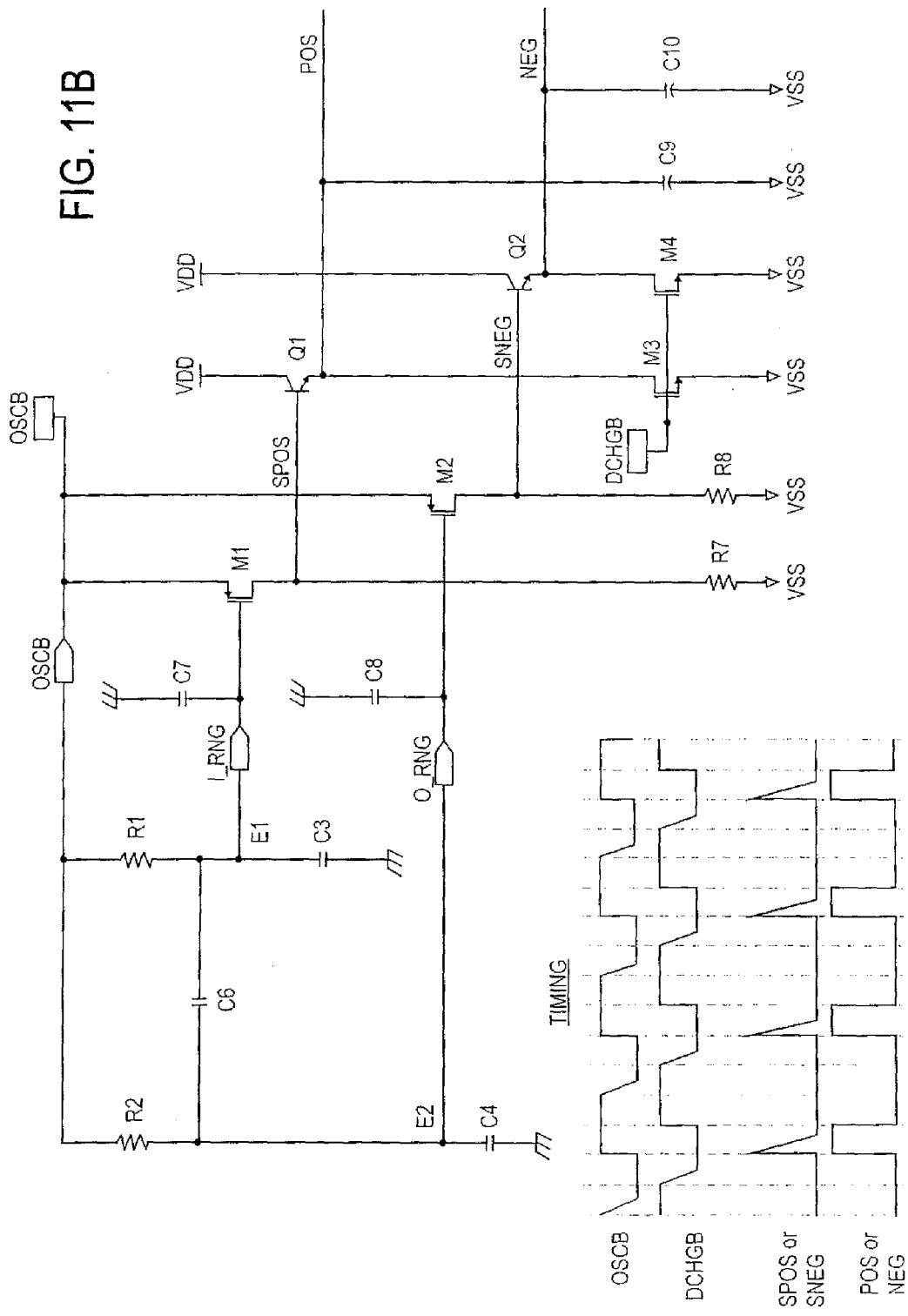
Figure 11D:
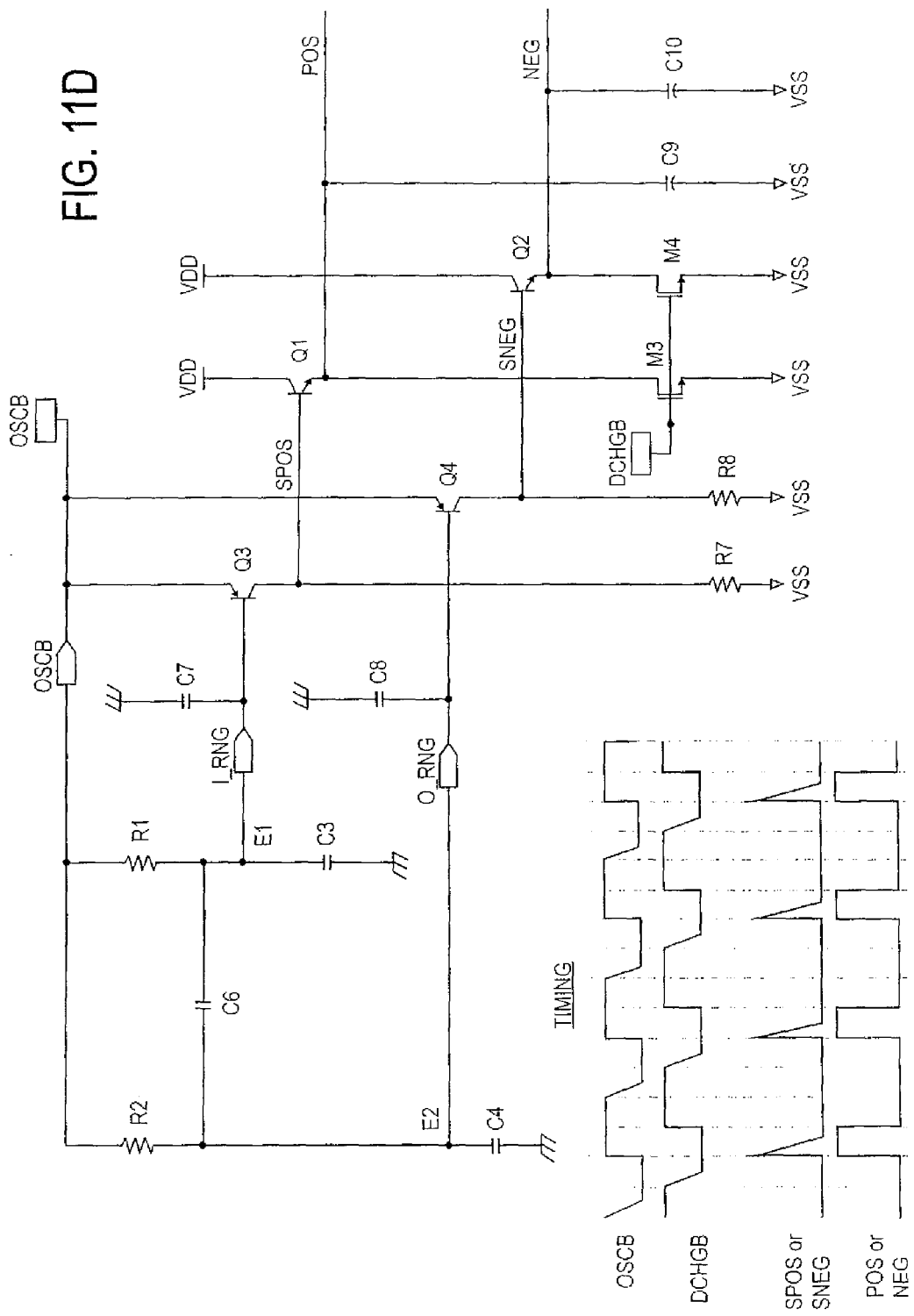

FIG. 11B shows an input portion of an integrated control circuit wherein active devices M1 and M2 are P-type MOSFET devices, active devices M3 and M4 are N-type MOSFET devices and active devices Q1 and Q2 are N-type bipolar devices. FIG. 11B otherwise has the same configuration of FIG. 11A, except that resistors R7 and R8 and the sources of active devices M3 and M4 are coupled to voltage signal VSS and the collectors of active devices Q1 and Q2 are coupled to voltage source VDD. FIG. 11B thus illustrates an embodiment using positive-going transient and DC pulses, as shown in the timing diagram of FIG. 11B. FIGS. 11C and 11D show input portions wherein the active devices M1 and M2 of FIG. 11A have been replaced by active devices Q3 and Q4, which are N-type in FIGS. 11C and P-type in FIG. 11D. FIG. 11C shows the peak detection circuit of FIG. 11A, which involves P-type active devices Q1, Q2, M3 and M4, and FIG. 11D shows the peak detection circuit of FIG. 11B, the active devices of which are all N-type devices. The operation of these input portion configurations parallel the operation described above with respect to FIG. 11A and will be understood by those skilled in the art of circuit design.

FIGS. 11A-11D all show the use of resistors R7 and R8 which provide for the conversion of drain or collector currents (of either active devices M1 and M2 or Q3 and Q4, respectively) to voltages proportional to the current at the drain or collector. Thus, in FIGS. 11A-11D, this drain or collector voltage will be equal to V-(I.sub.r)(R). Other ways to provide for this voltage conversion are shown in FIGS. 12A-15D. In these drawings, resistors R7 and R8 have been replaced with active devices.

Figure 12A:
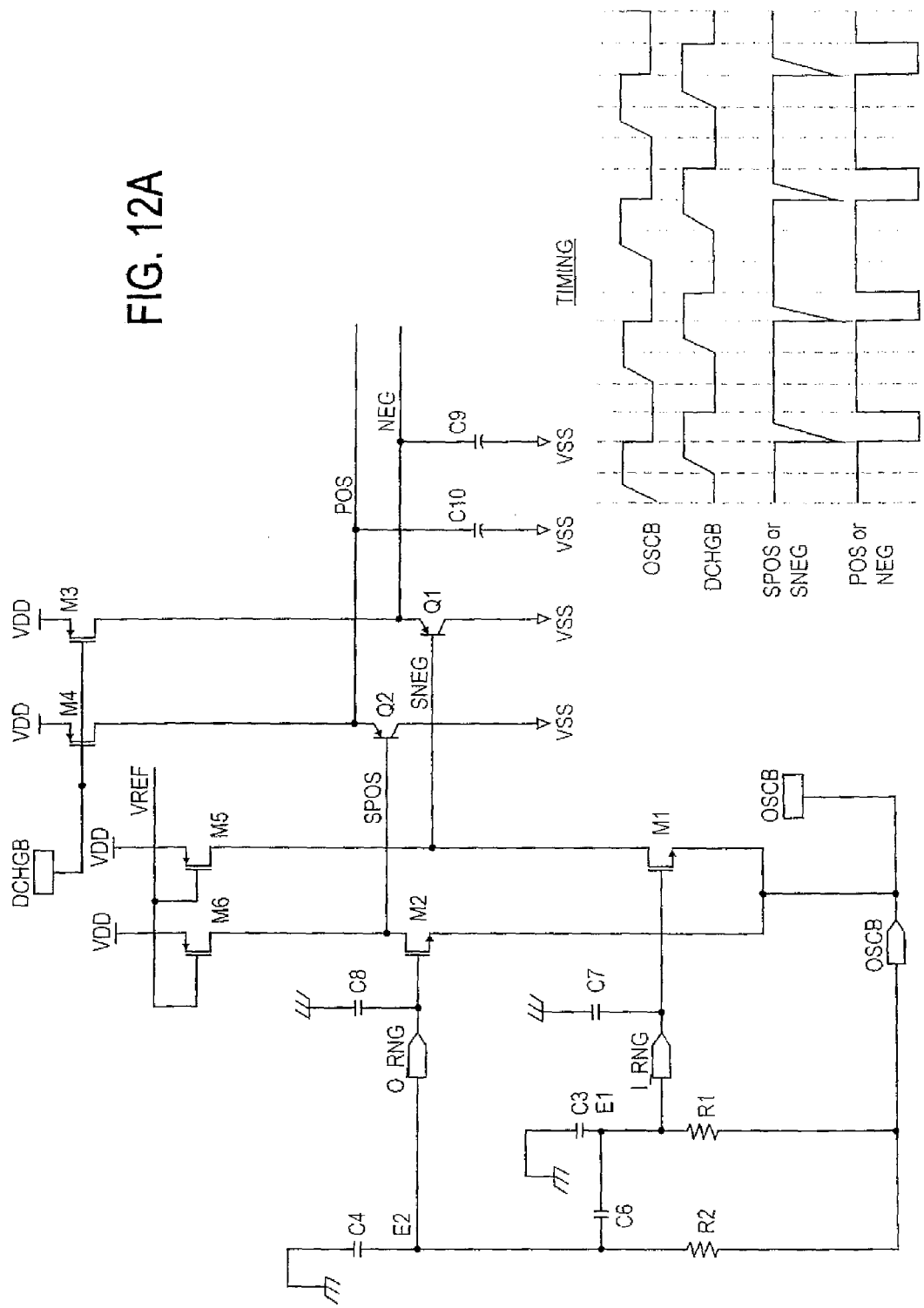
Figure 12B:
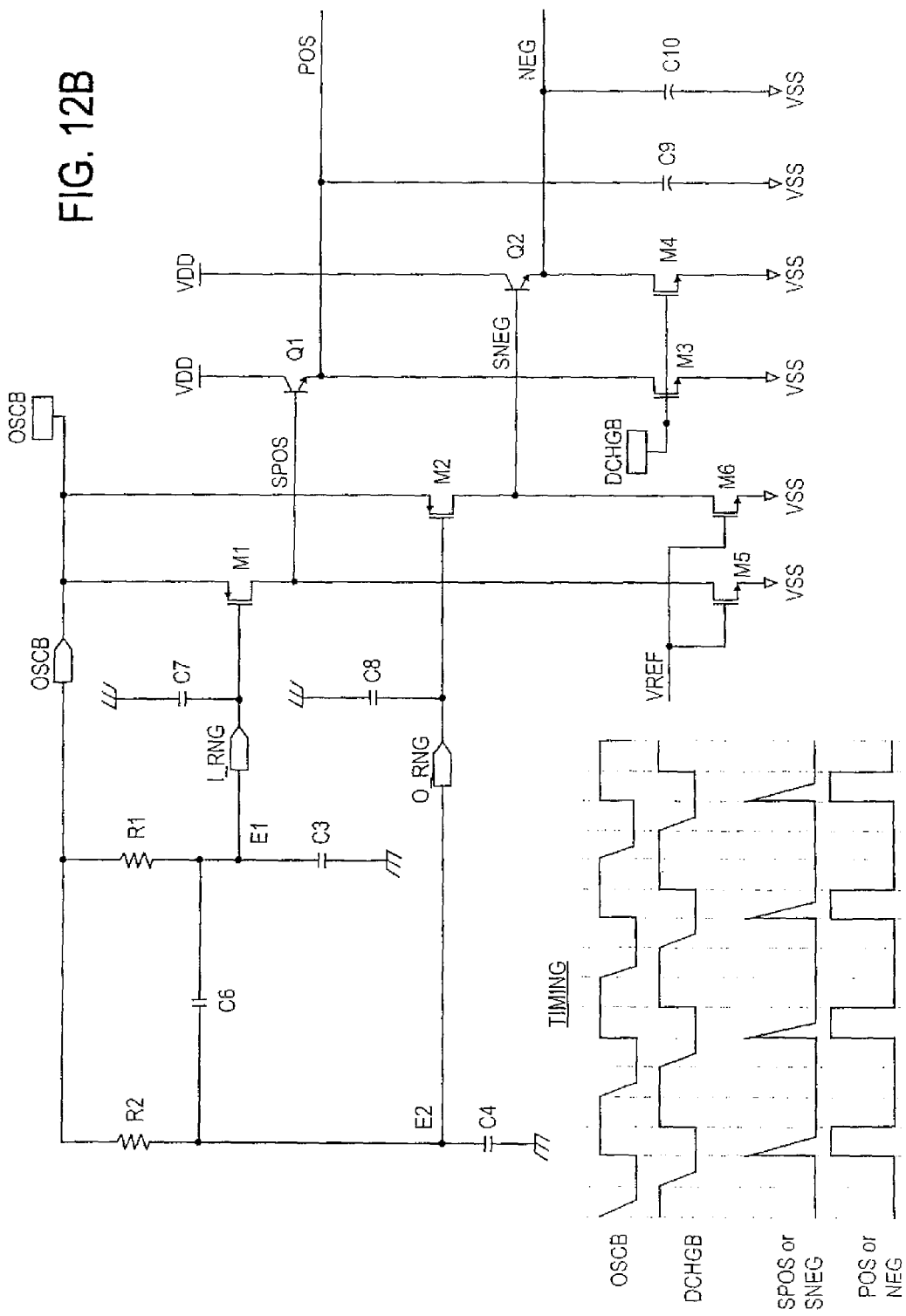
Figure 12D:
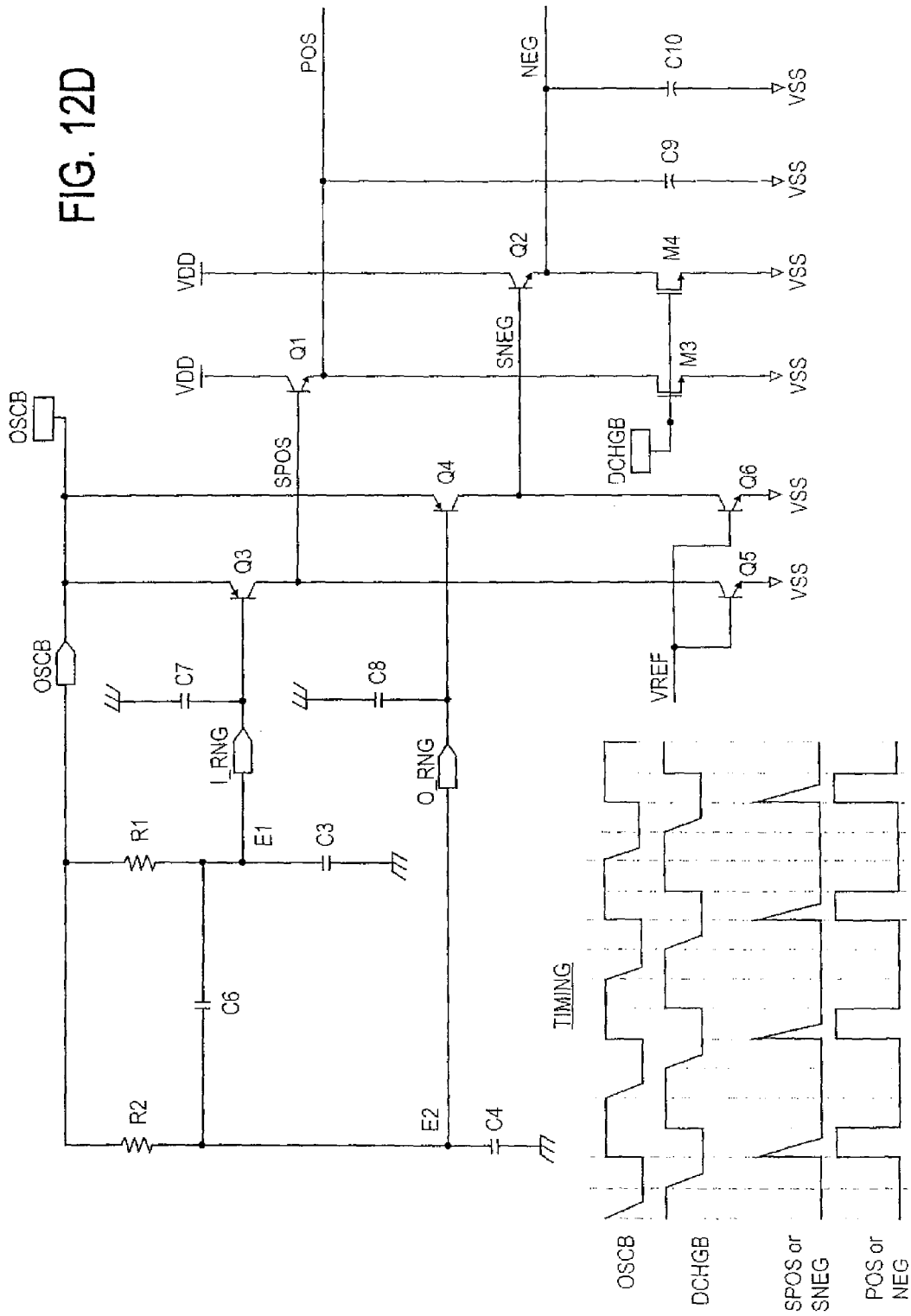
Figure 12E:
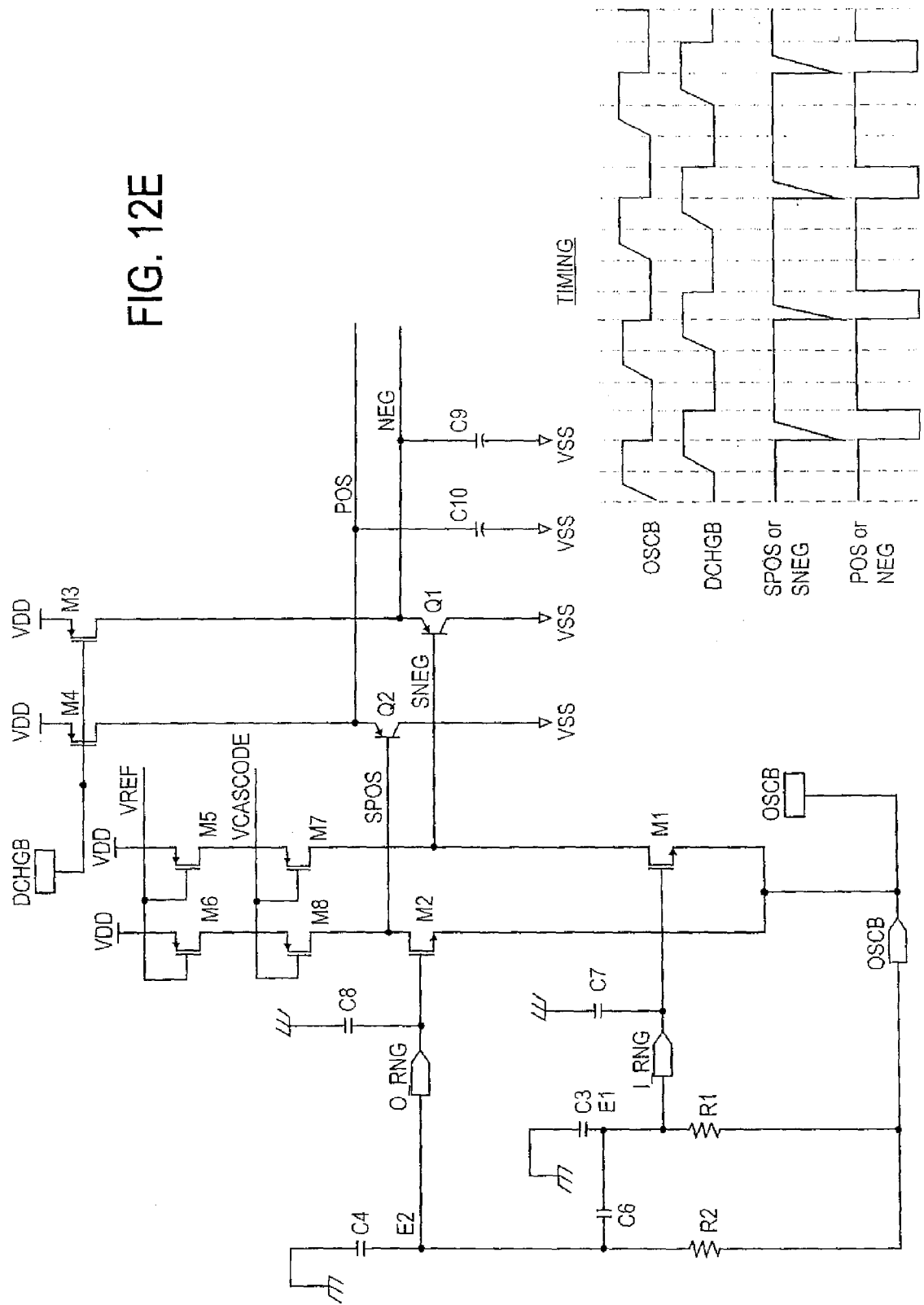
Figure 12F:
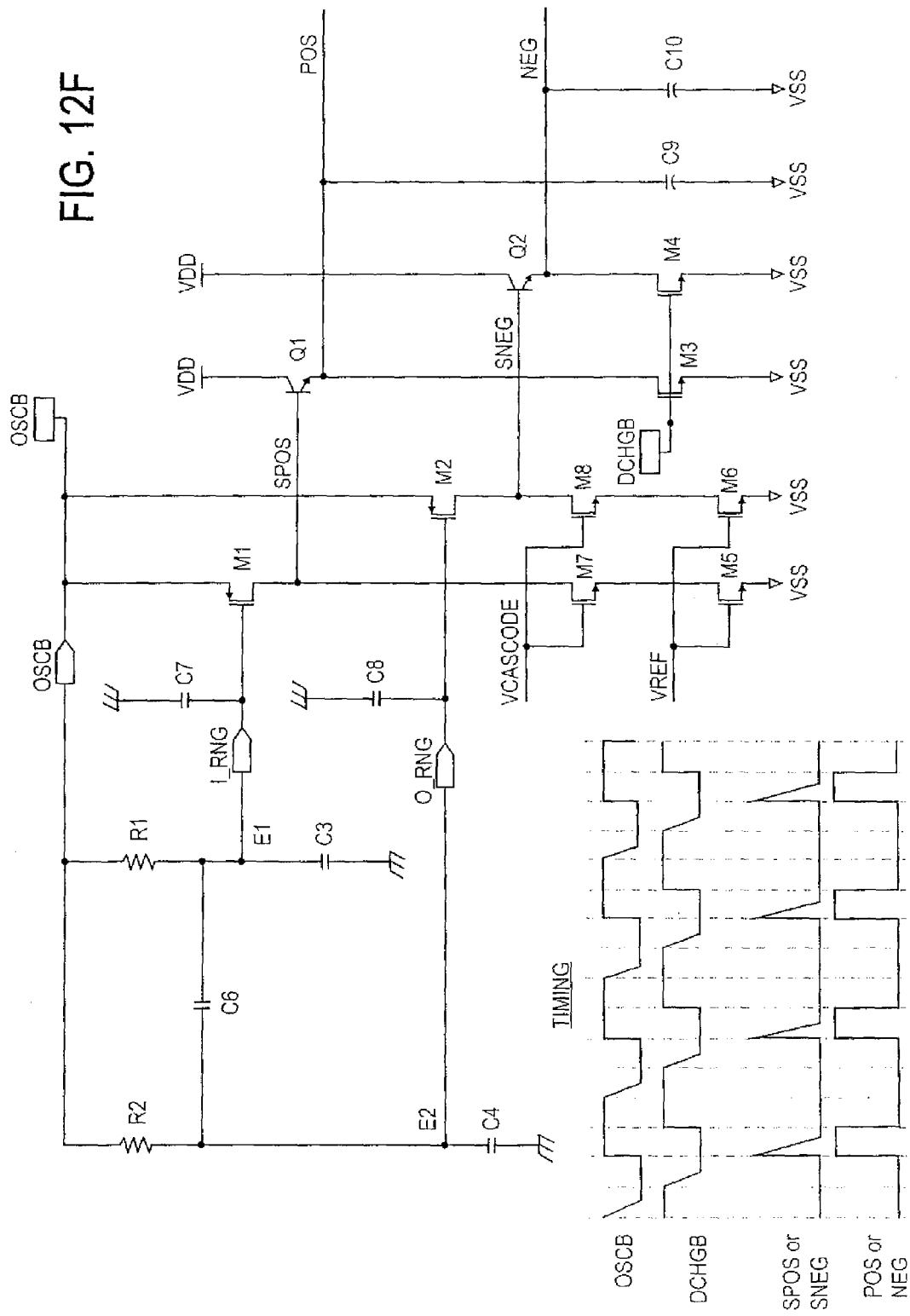
Figure 12H:
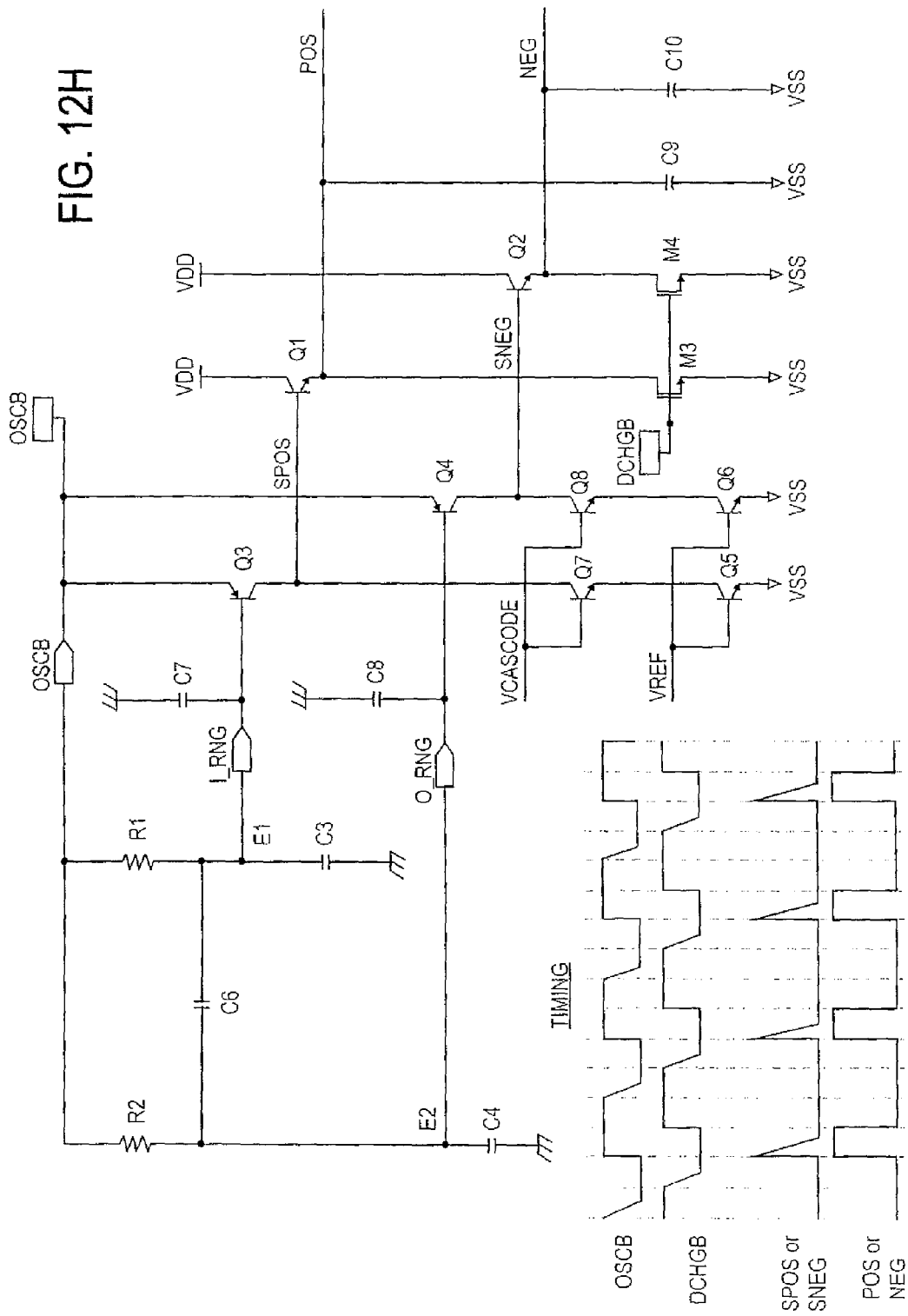
Figure 13B:
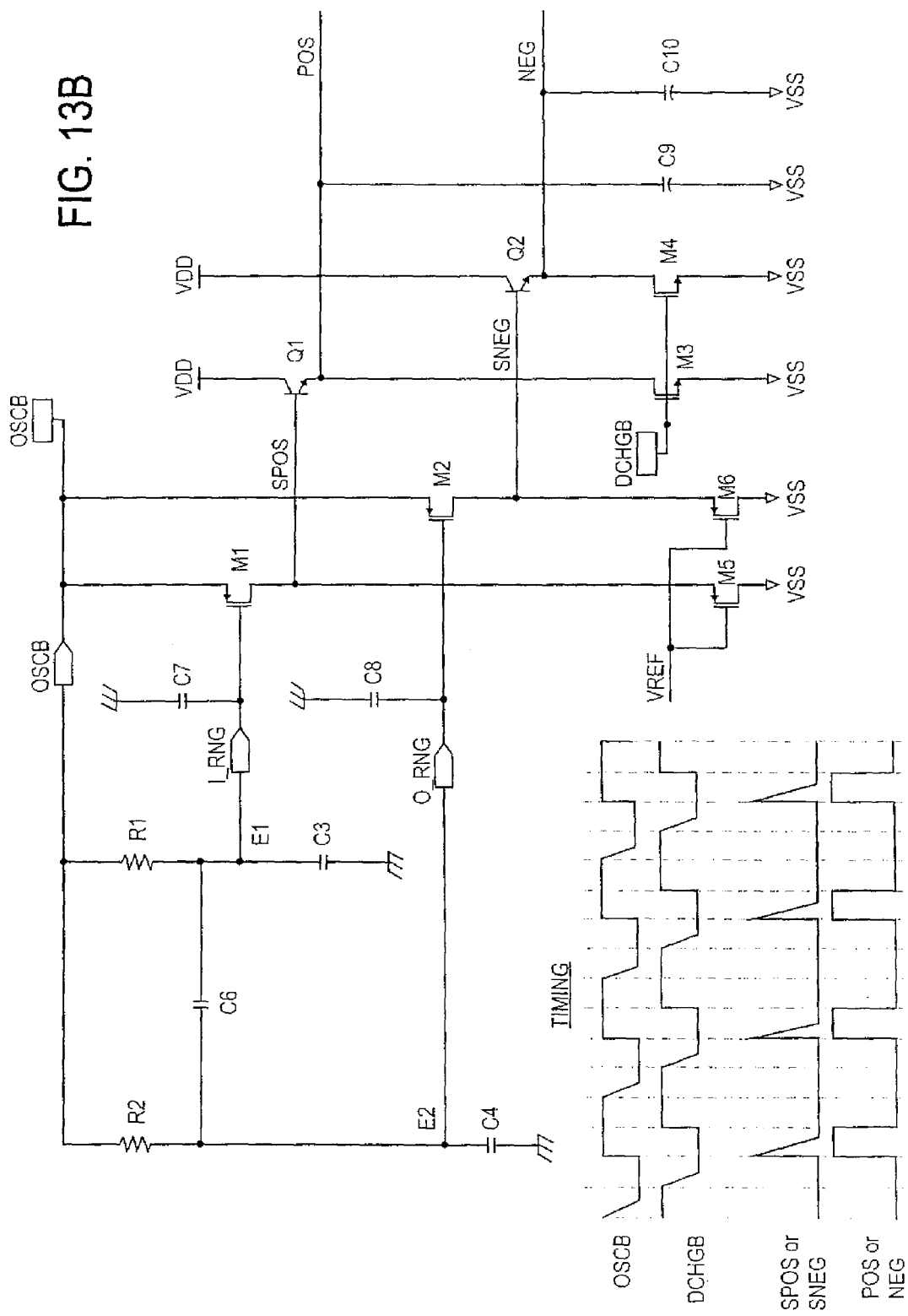
Figure 13C:
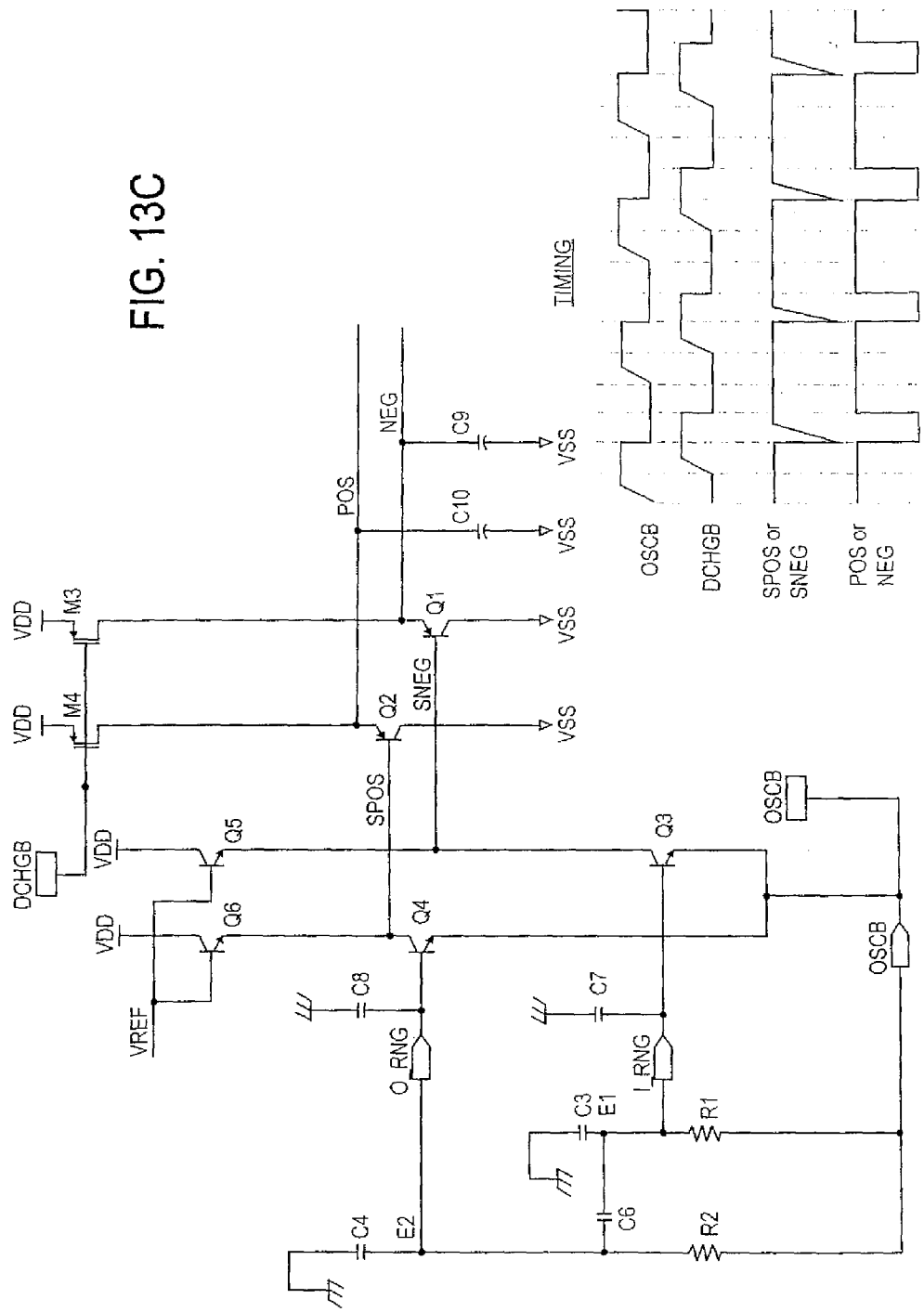
Figure 13D:
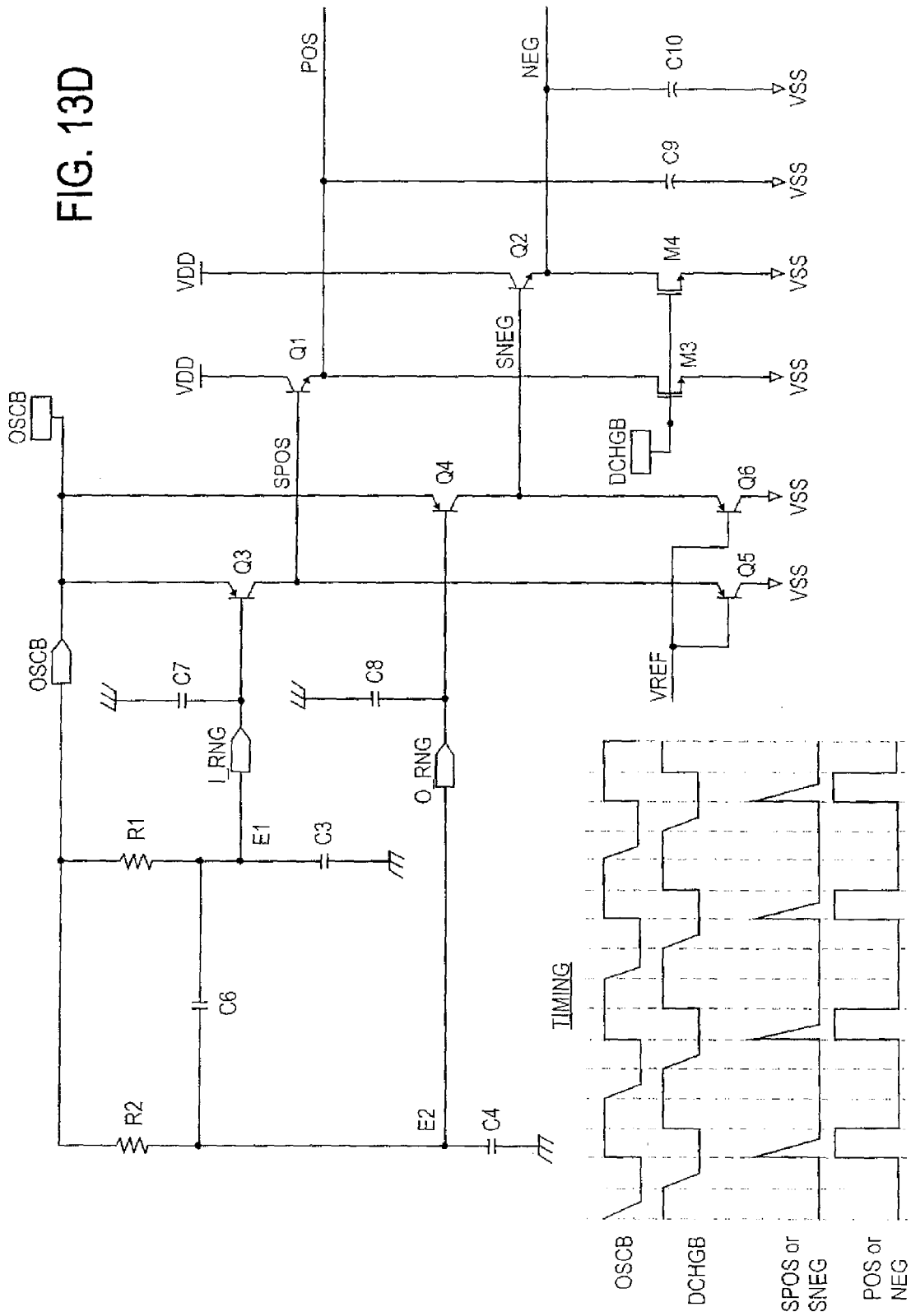
Figure 13F:
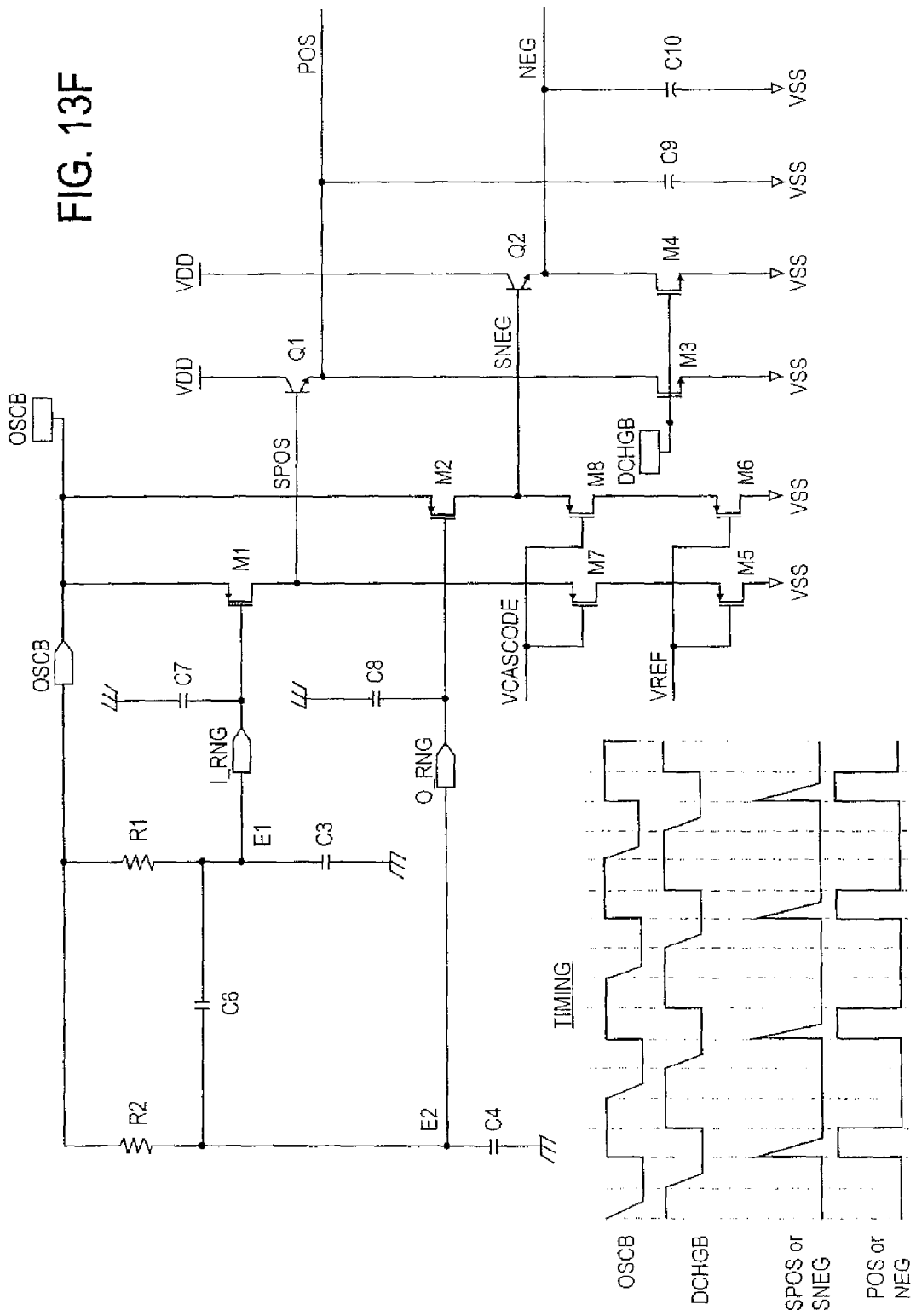
Figure 13G:
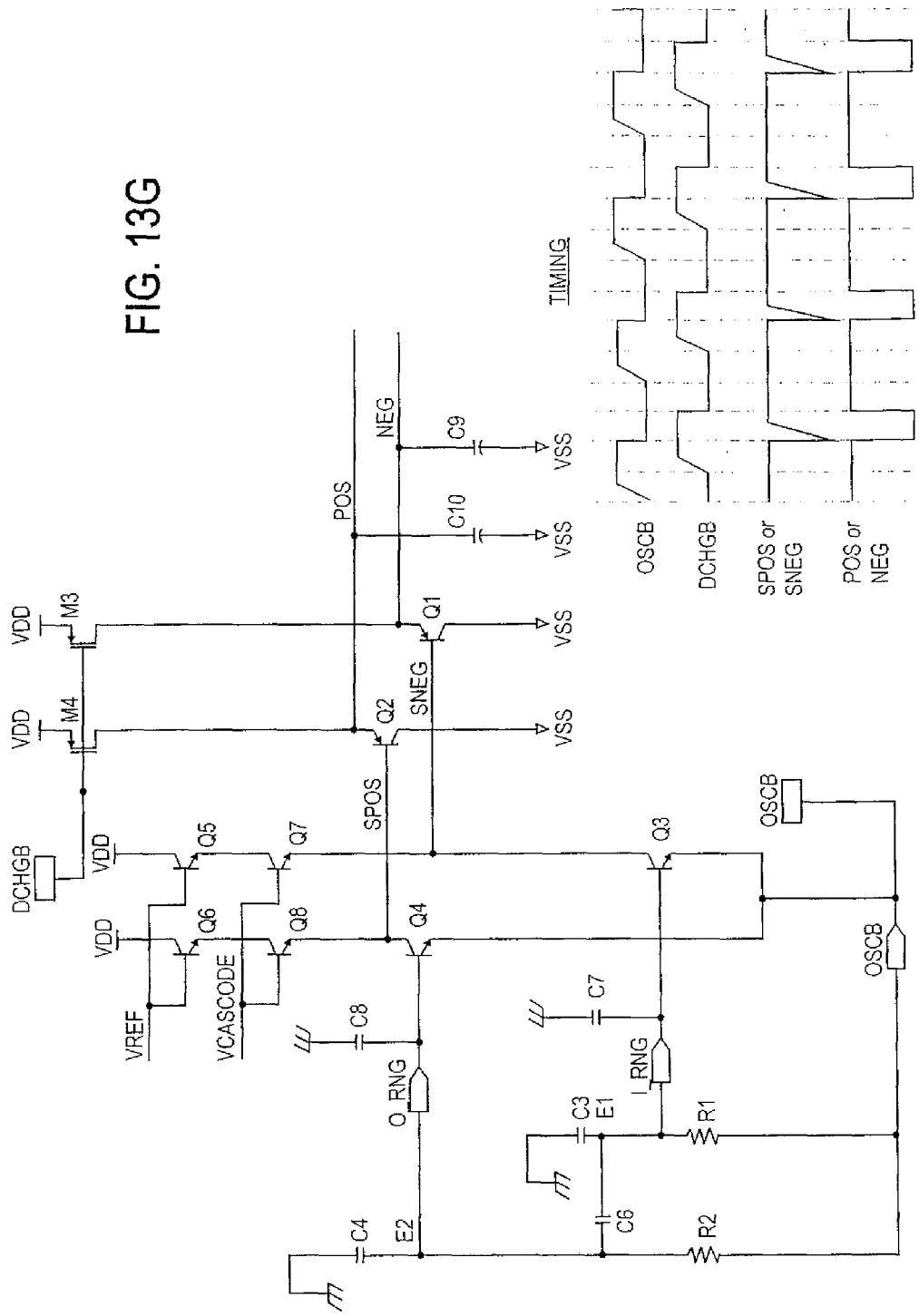
Figure 13H:
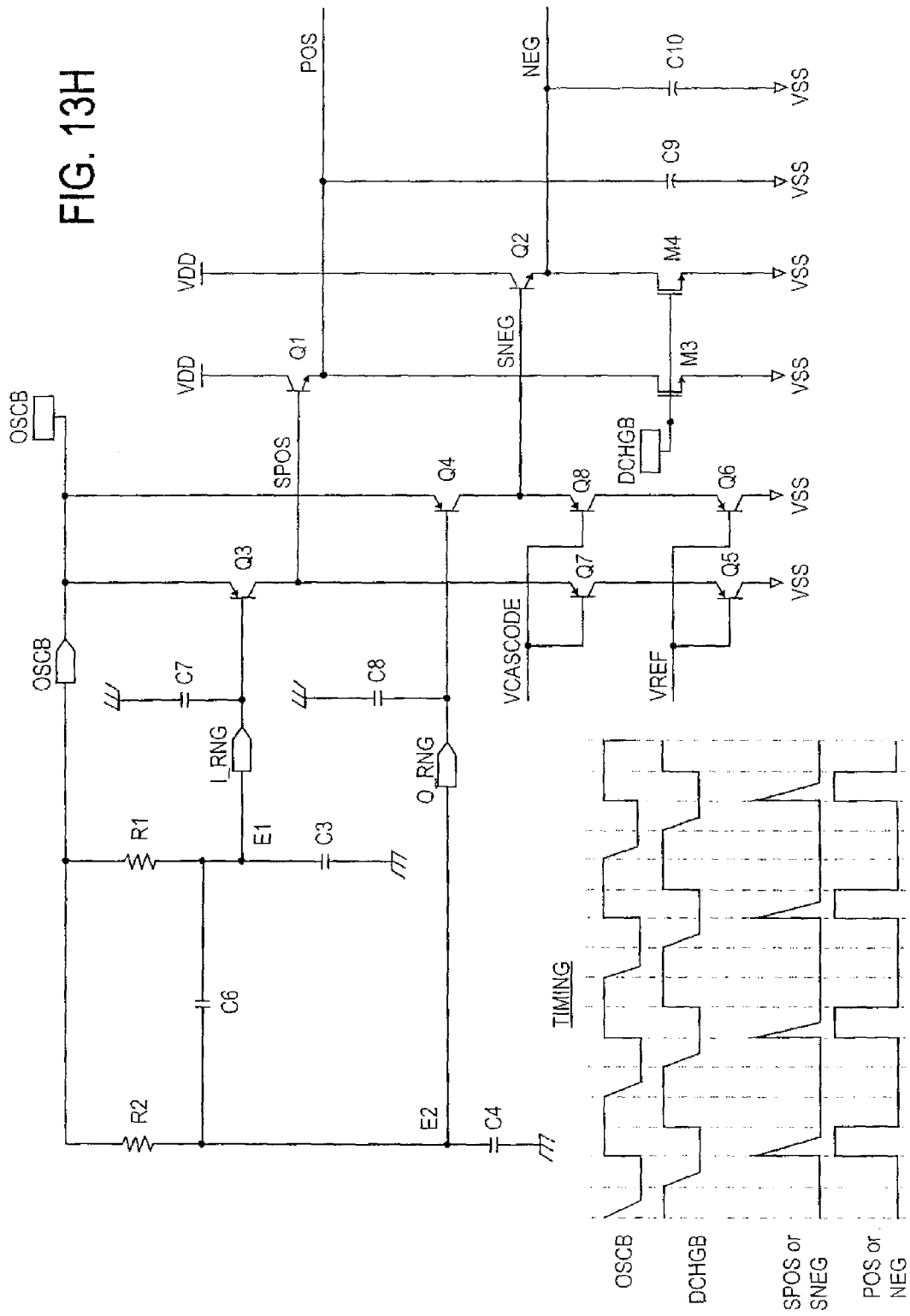

Use of active devices as current to voltage converters, as shown in FIGS. 12A-12D, for example, allows for high gain outputs with replacement of resistive components and conserves integrated circuit space. FIGS. 12A-12D generally correspond to FIGS. 11A-11D, respectively. In FIGS. 12A-12B, resistors R7 and R8 of FIGS. 11A-11B have been replaced by MOSFET devices M5 and M6, where in FIGS. 12C-12D, resistors R7 and R8 of FIGS. 11C-11D have been replaced by bipolar devices Q5 and Q6. FIGS. 13A-13D generally correspond to FIGS. 12A-12D except that the P-type active device current sources of FIGS. 12A-12D have been replaced with N-type active device current sources in FIGS. 13A-13D (and, similarly, the N-type active device current sources of FIGS. 12A-12D been replaced with P-type active device current sources in FIGS. 13A-13D). Since the active loads are the same type as the input devices in FIGS. 13A-13D, these active devices can be incorporated into the integrated circuit during the same manufacturing step. This provides for better matching. The output gain is determined by the size of the device and the voltage reference, Vref, used. Vref can be set by a bias circuit that allows for currents to be mirrored by scaling the sizes of gate widths, when using MOSFET devices, or emitter areas, when using bipolar devices.

In the embodiments depicted in FIGS. 12E-12H and 13E-13H, resistors R7 and R8 of FIGS. 11A-11D have been replaced with the active devices M5 and M6 (FIGS. 12E-12F and 13E-13F) or Q5 and Q6 (FIGS. 12G-12H and 13G-13H) as well as cascoding active devices M7 and M8 (FIGS. 12E-12F and 13E-13F) or Q7 and Q8 (FIGS. 12G-12H and 13G-13H). Cascode biasing in this manner helps immunize the control circuit against power supply and process variations.

Figure 14B:
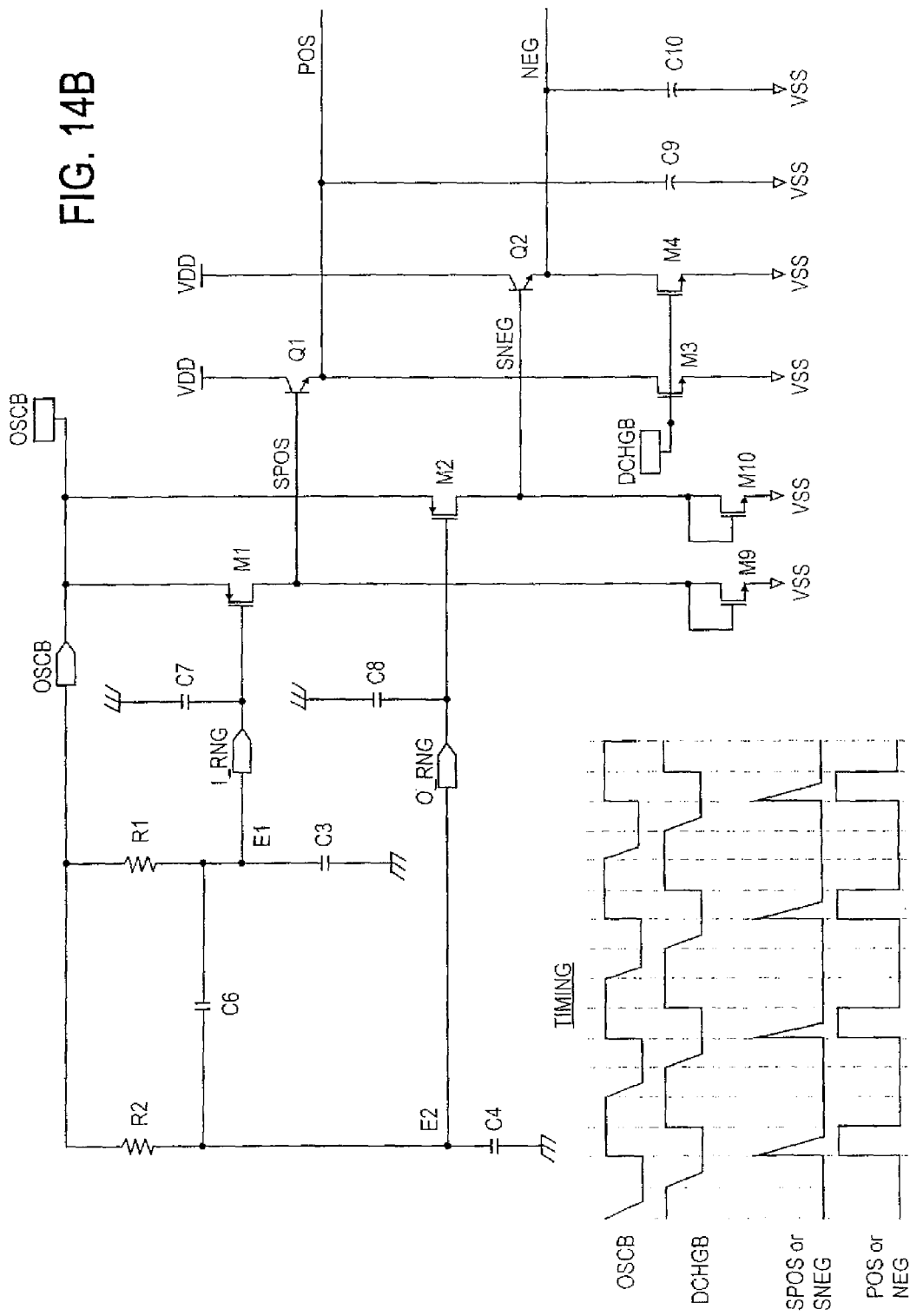
Figure 14C:
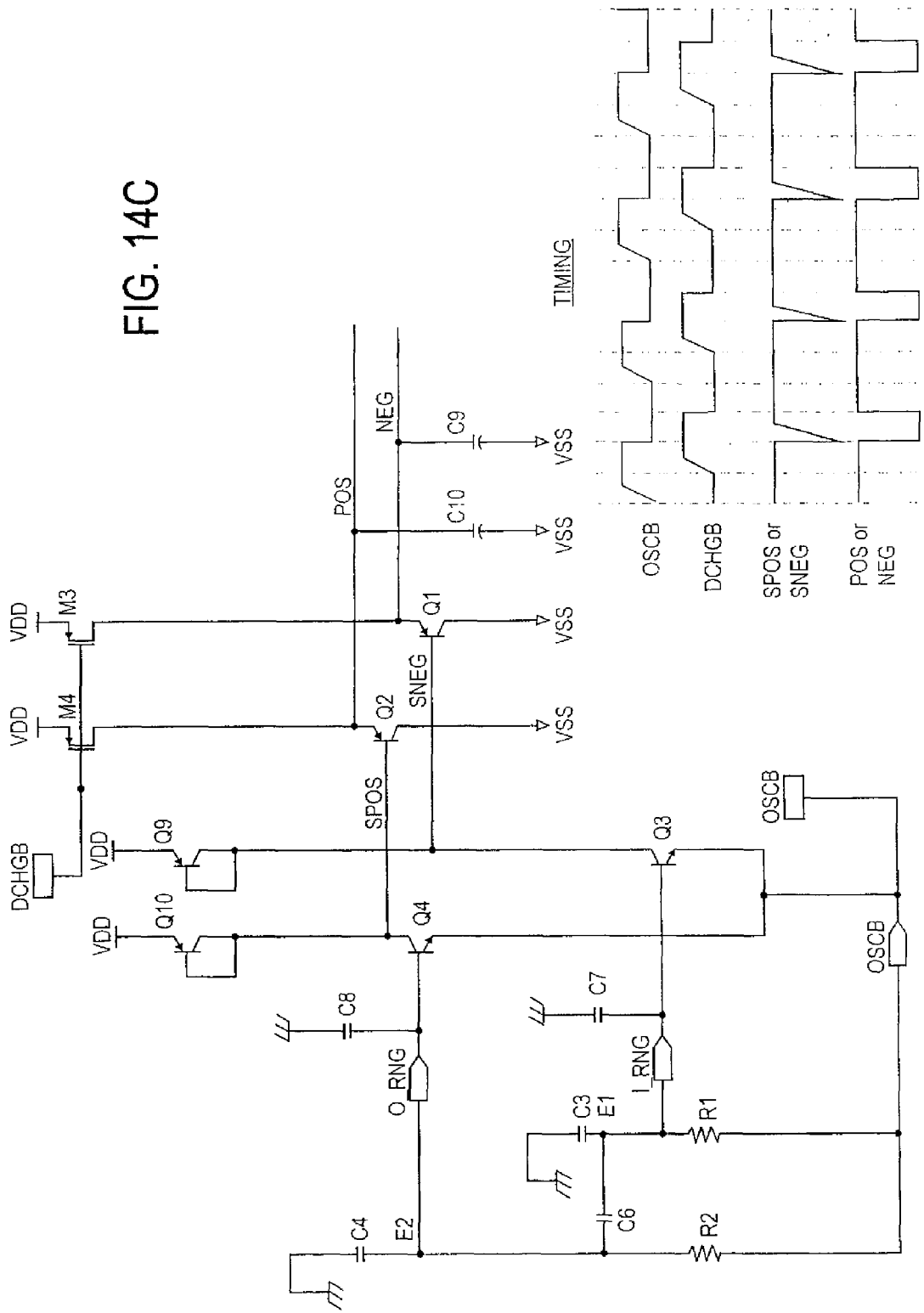
Figure 14D:
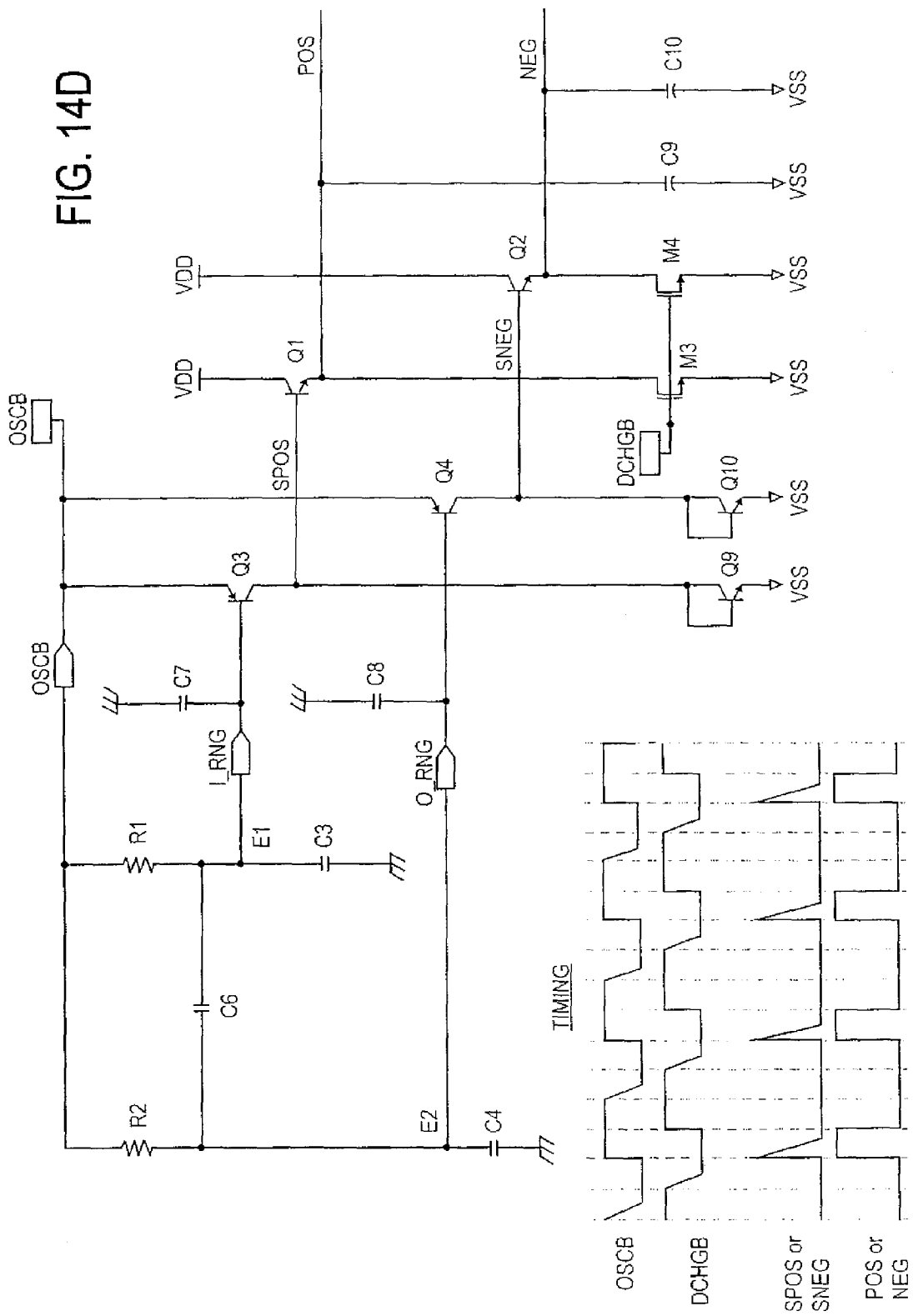
Figure 15A:
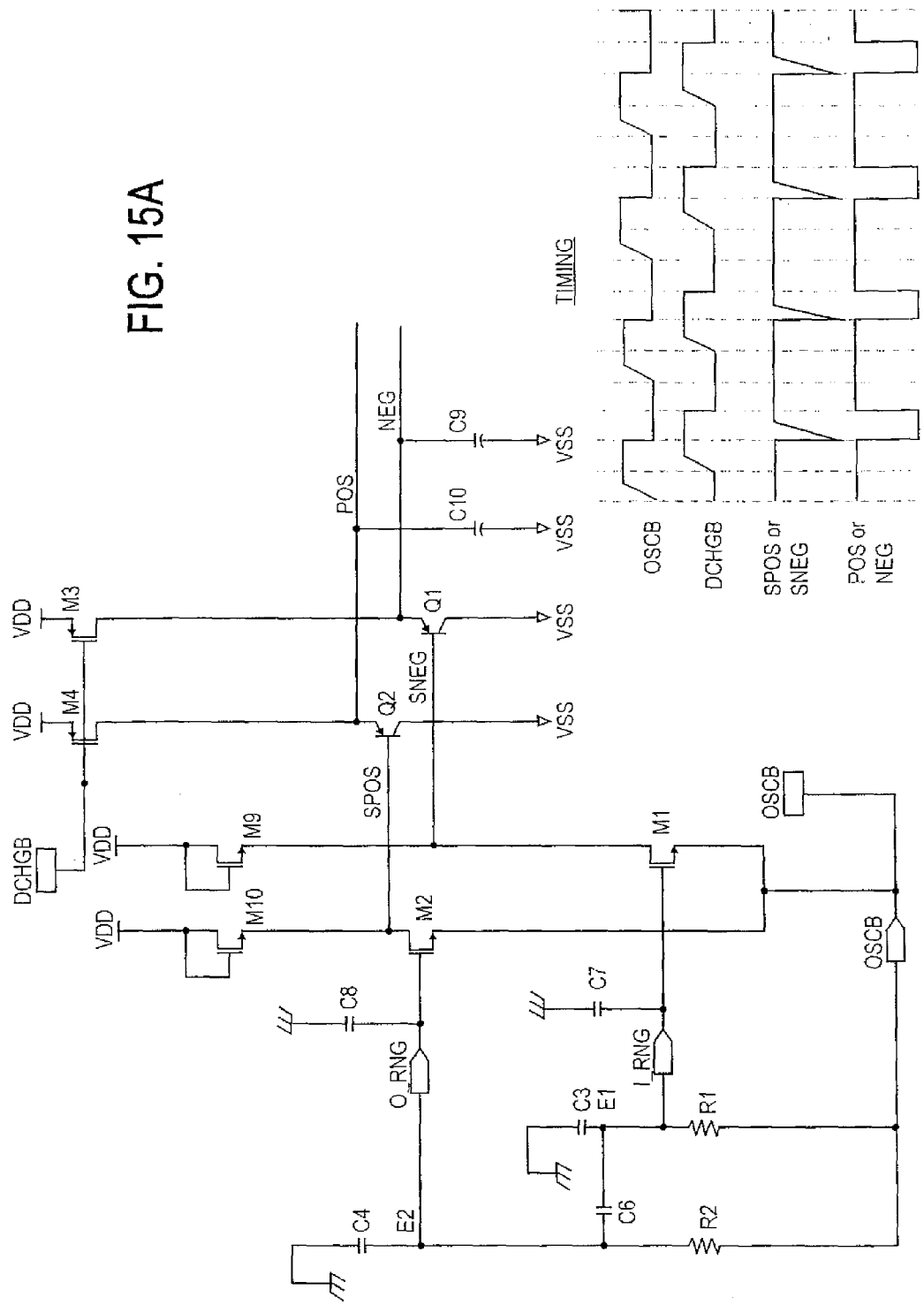
FIGS. 15A-15D are the electrical schematic representations of input circuitry for the touch switch control circuits of FIGS. 14A-14D having different active square root extraction devices.
Figure 15B:
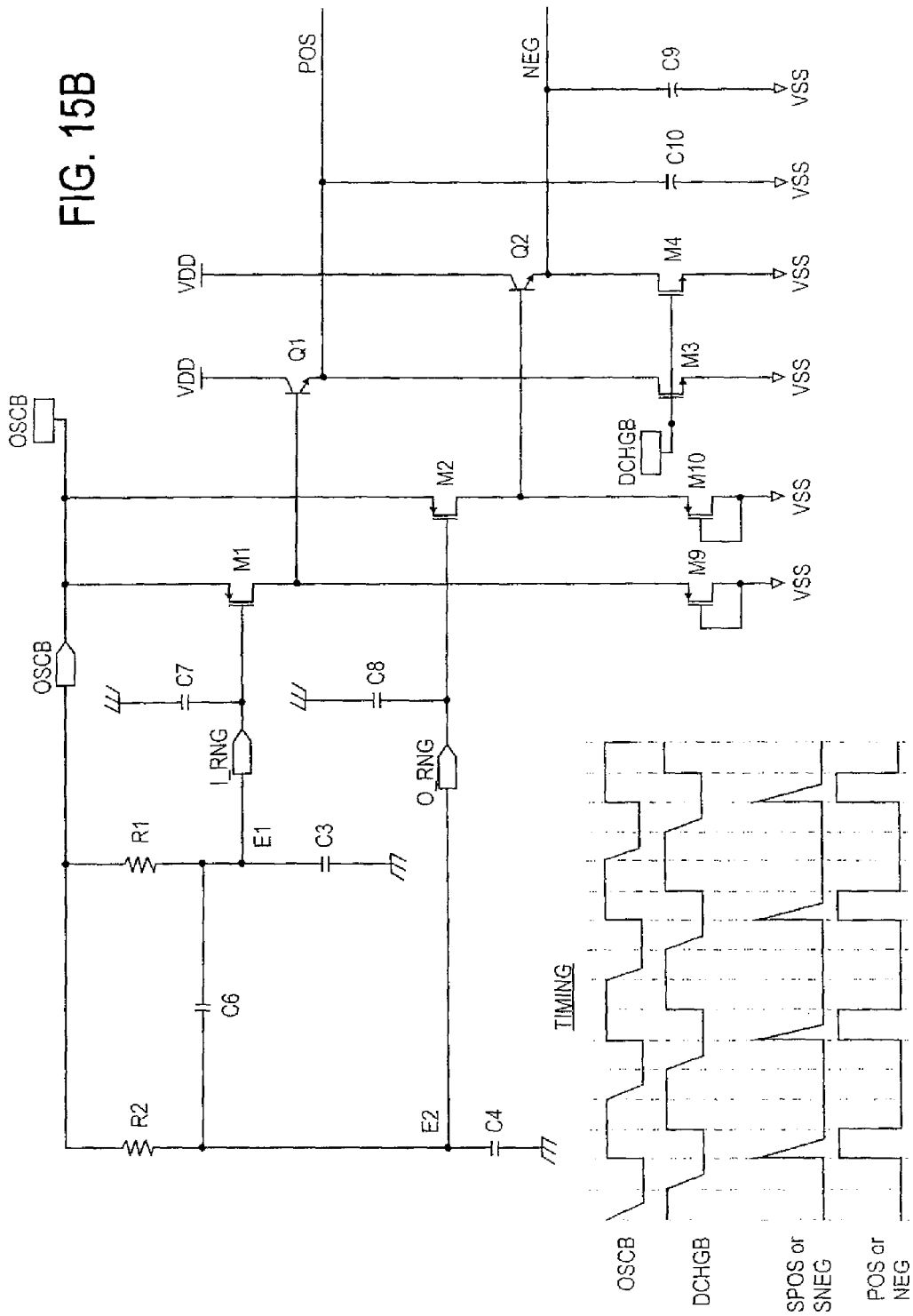
Figure 15C:
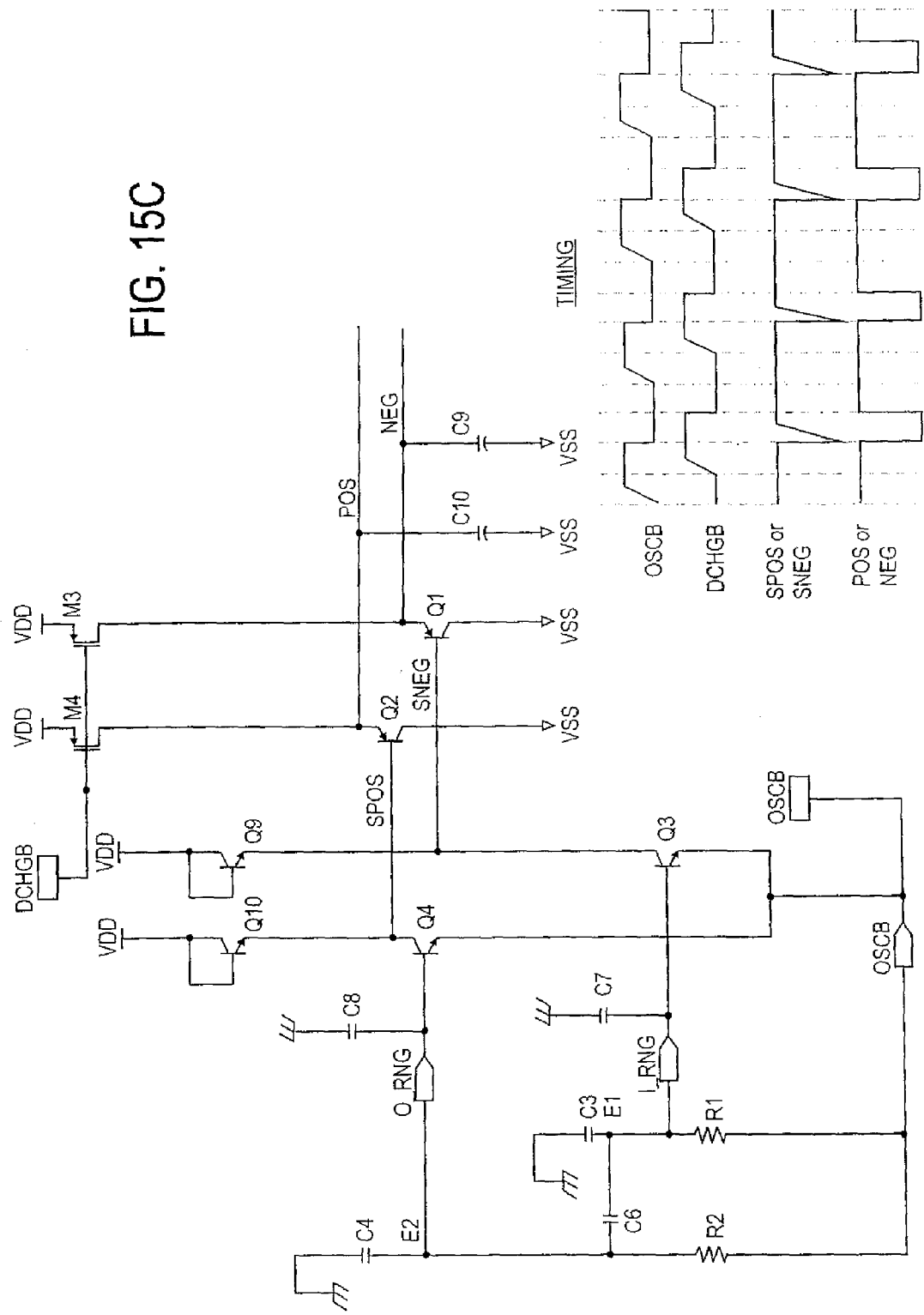
Figure 15D:
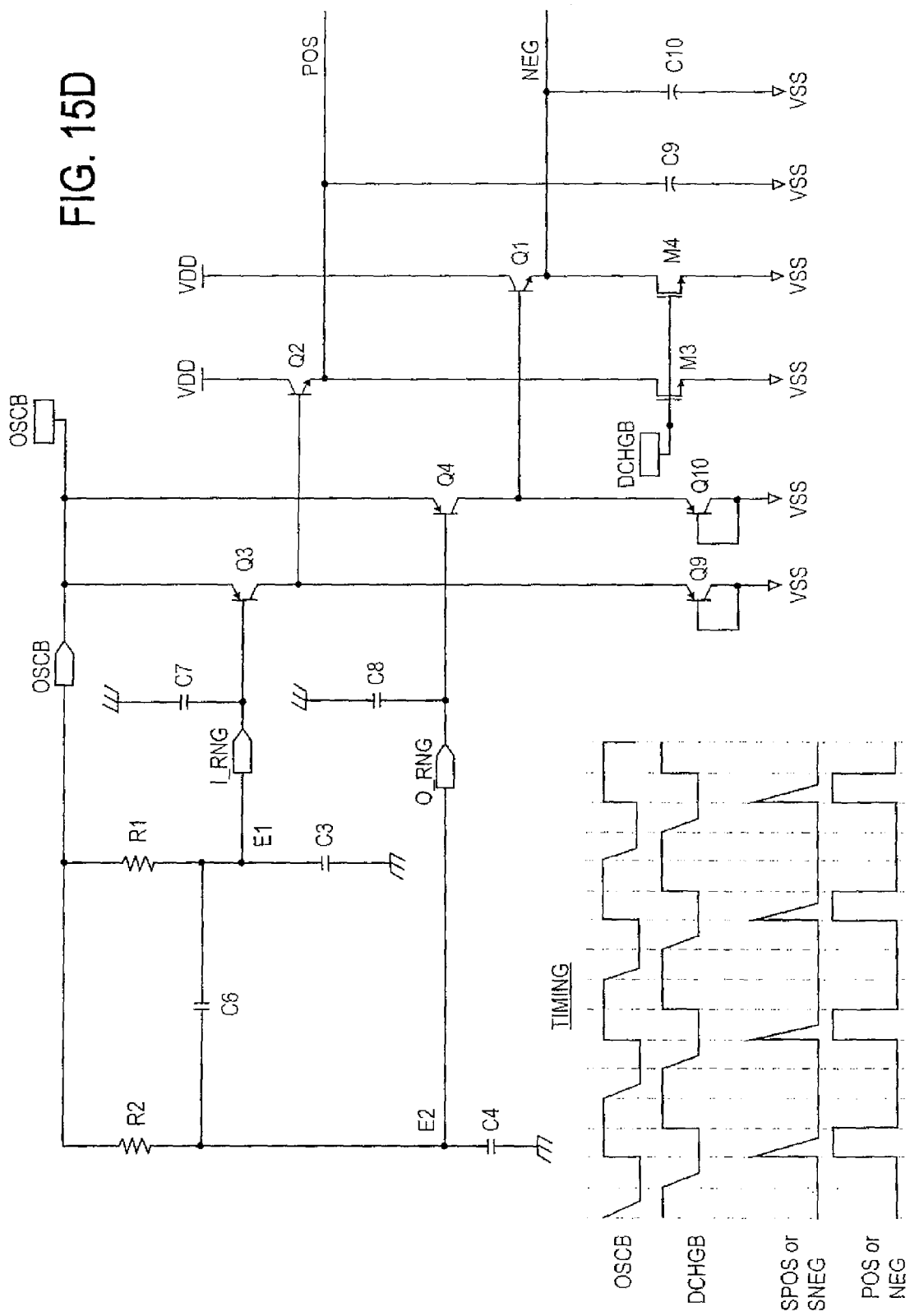

FIGS. 14A-14D show embodiments using complementary device types. For example, in FIG. 14A, the active square root extraction devices M9 and M10 are P-type MOSFET devices and the input active devices M1 and M2 are N-type MOSFET devices. FIGS. 14B-14D show embodiments using complementary device types which correspond to FIGS. 11B-11D. In FIGS. 14C-14D, active square root extraction devices Q9 and Q10 are bipolar devices. The embodiments depicted in FIGS. 14A-14D provide for better stability despite changes in temperature, power supply, common mode noise, and process variations during manufacturing of the integrated circuit. FIGS. 15A-15D depict embodiments using active square root extraction devices and active input devices of the same type. Thus, in FIG. 15A, active square root extraction devices M9 and M10 are N-type MOSFET devices, as are input devices M1 and M2. Similar configurations are shown in FIGS. 15B (using N-type MOSFET devices), 15C (using N-type bipolar devices) and 15D (using P-type bipolar devices). Output linearity can be maximized when matched MOSFET devices, i.e., MOSFET devices of the same type, are used for both the input and the active square root extraction devices, as shown in FIGS. 15A-15B.

Figure 16:
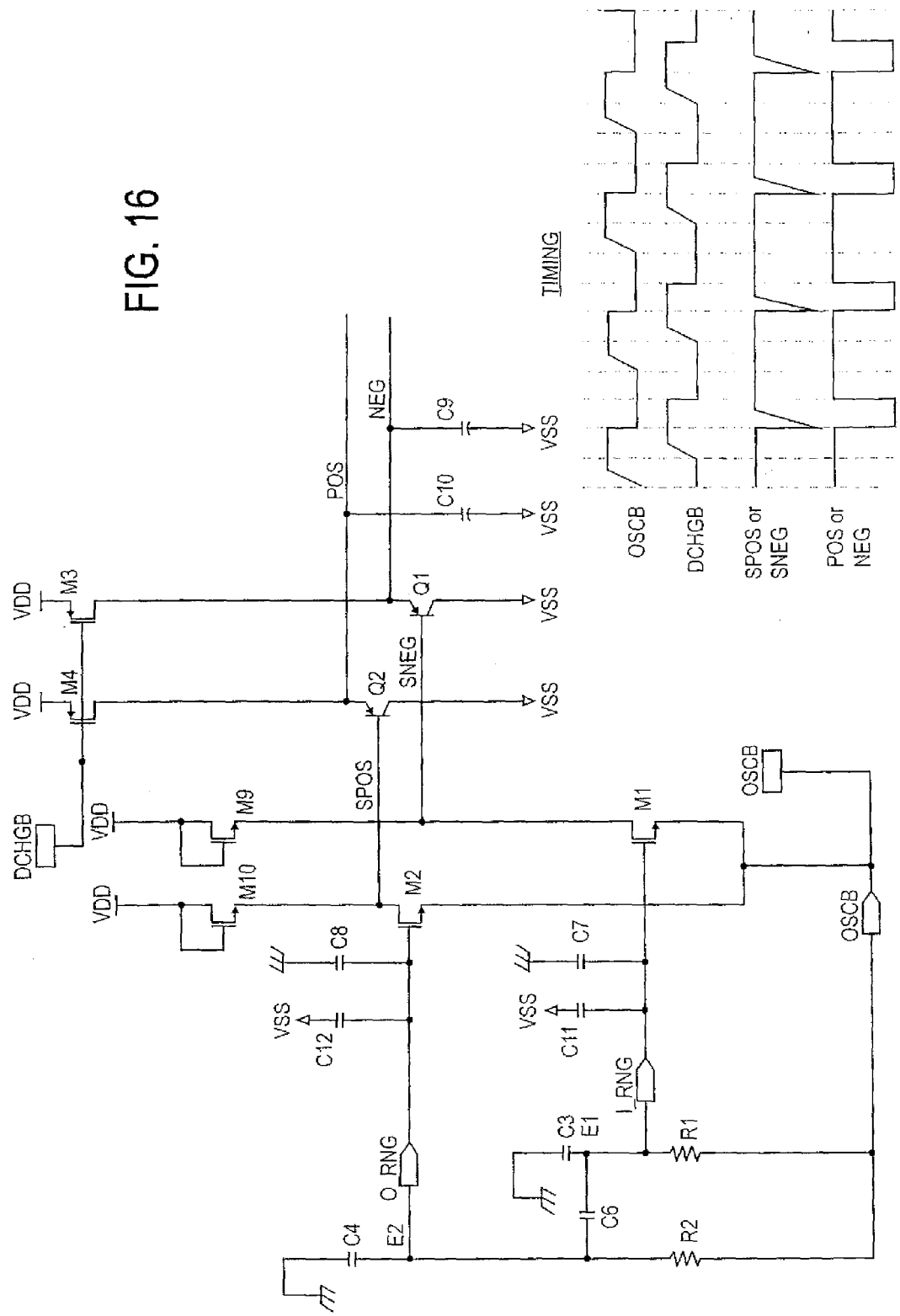
FIG. 16 is an electrical schematic representation of input circuitry for the touch switch control circuit of FIG. 15A having swamping capacitance provided by capacitors.

FIGS. 11A-15D all show input capacitances C7 and C8 on the integrated circuit pin input connections I_RNG and O_RNG. These input capacitances can vary from part to part owing to manufacturing tolerances and processes and the variations can compromise circuit performance. These variations tend to add to the electric field capacitance of the electrodes and can cause variations and offsets in the performance of the control circuit. Since typical applications often require the input detection circuit to resolve very small changes in the electric field at the electrodes where the input capacitance at the bonding pad input nodes can be relatively large compared to the input field effect capacitance signal level, minimizing stray capacitance C7 and C8 can be advantageous. One method to minimize the effects of this stray capacitance variation is to add "swamping" capacitors to the input circuit. While this may tend to desensitize the control circuit, it can stabilize the input against variations owing to the input capacitance associated with the bond wires, under-bump-metallization, redistribution traces in flip chip configurations and the like. Use of swamping capacitance is shown in FIG. 16, which generally corresponds to FIG. 15A. In FIG. 16, swamping capacitors C11 and C12 exist in parallel equivalent with stray capacitance C7 and C8, respectively, and are electrically coupled to voltage signal VSS. It will be understood that swamping capacitors C11 and C12 are compatible with all of the embodiments of the present invention described herein, and are not limited to use with the embodiment depicted in FIG. 16.

Figure 17B:
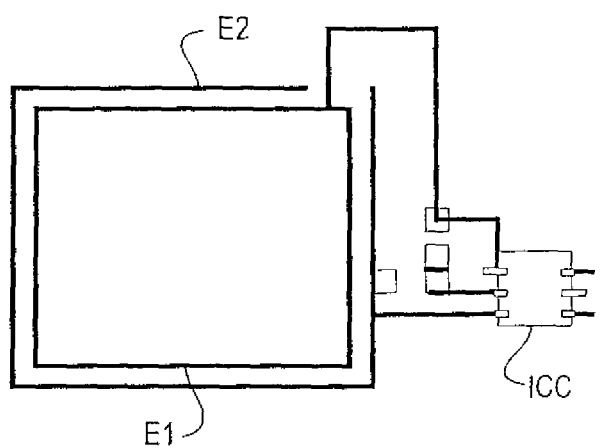
FIG. 17B is a diagram of a touch switch assembly showing one possible configuration wherein the electrodes are proximate the integrated circuit.

Though swamping capacitors C11 and C12 may improve the control circuit's performance, they will tend to require additional physical space. Space is conserved in the embodiment depicted in FIG. 17A, showing the addition of swamping capacitance that results from the depletion capacitance of diodes D4-D7 at the control circuit input, here, the gates of active devices M1 and M2. In FIG. 17A, diodes D4 and D6 replace swamping capacitor C12 of FIG. 16 and diodes D5 and D7 replace swamping capacitor C11 of FIG. 16. The amount of capacitance per unit surface area is much greater for diode configurations of the sort depicted in FIG. 17A compared to the capacitance per unit area of poly or metal type capacitors. Also, diodes D4-D7 can be used for protection of both positive and negative high voltage potential discharges. This protection is especially advantageous for touch input applications. Human input devices, such as keyboards, single input switches, and others, are exposed to electrostatic discharge transients and can include components, such as MOSFET and other devices, to protect their sensitive input circuits. This problem is aggravated when, as shown in FIG. 17B, sensing electrodes E1 and E2 are located very close to the input circuits ICC.

Figure 18A:
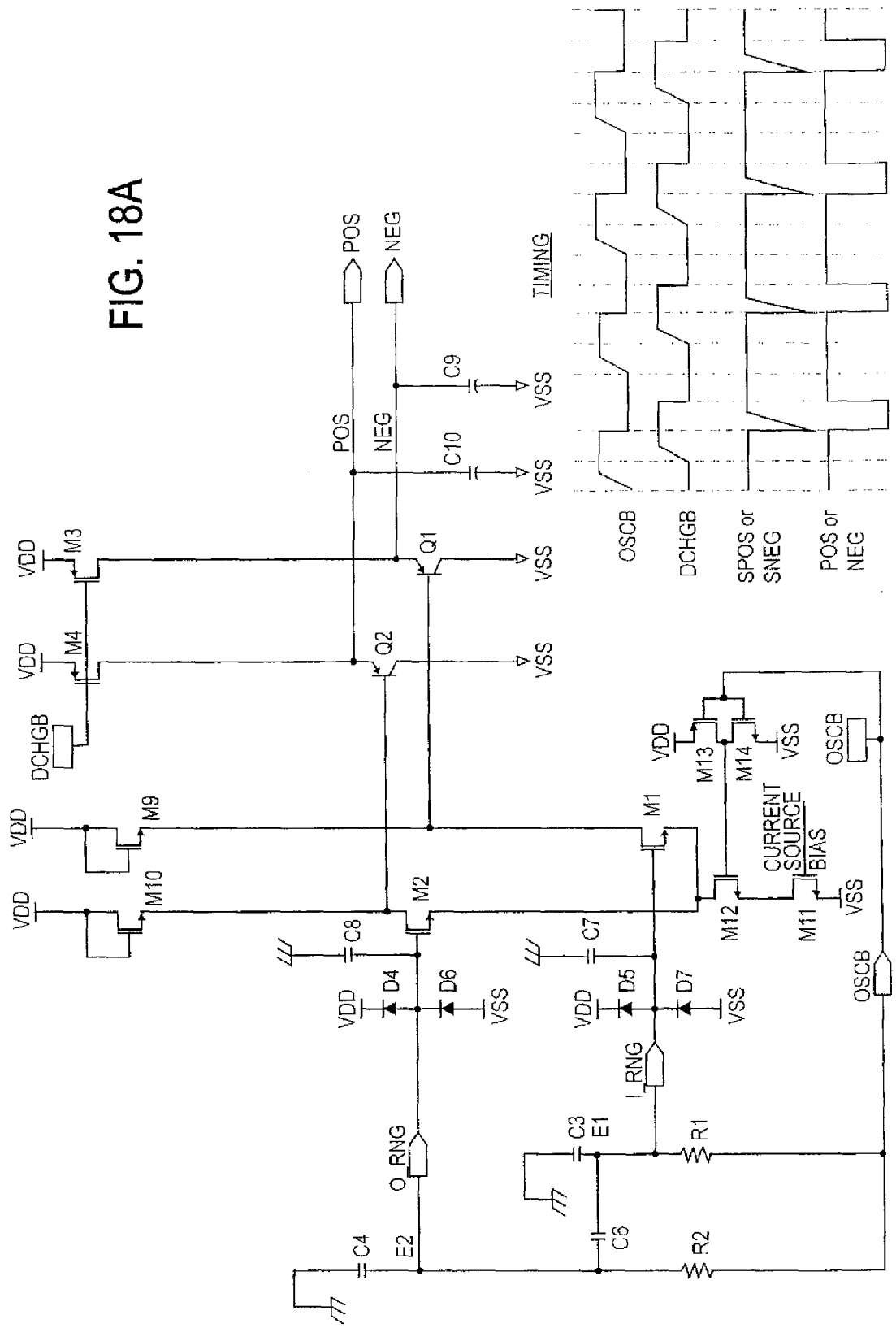
FIG. 18A shows a configuration that provides for negative feedback directly in the input circuit.

FIGS. 18A-18E show other possible configurations of the input circuitry for touch switches with integrated control circuits. FIGS. 18A-18C show various alternatives to the common mode stimulation of active devices M1 and M2. FIG. 18A shows generally the configuration of FIG. 17A and also includes active devices M1-M14. In FIG. 18A, active devices M11-M14 are electrically coupled to the sources of input active devices M1 and M2. The gates of active devices M13 and M14 are coupled to oscillating signal OSCB and their drains are coupled to the gate of active device M12. The gate of active device M11 is coupled to a current source bias signal CSBS and its drain is coupled to the source of active device M12. The configuration depicted in FIG. 18A can provide negative feedback at the input stage to active devices M1 and M2.

FIG. 18B shows an input circuit portion including active devices M15 and M16, here shown as N-type devices, the sources of which are electrically coupled to input pins I_RNG and O_RNG, respectively, and the gates of which are electrically coupled to oscillating signal OSCB. The drains of active devices M15 and M16 are coupled to the sources of active square root extraction devices M9 and M10, respectively, and to the bases of peak detection circuit active devices Q1 and Q2, respectively. In FIG. 18B, active devices M15 and M16, which are stimulated by oscillating signal OSCB through their gates and accept input signals through their sources, take the place of active devices M1 and M2, which have previously been depicted as being stimulated through their sources and accepting inputs through their gates.

FIG. 18C shows generally the configuration of FIG. 18B and also includes swamping diodes D4-D7 as also shown in FIG. 17A. The configuration of FIG. 18C can also be employed in single input mode with one electrode and can offer all the benefits of employing input diodes that provide depletion mode swamping capacitance.

Figure 18D:
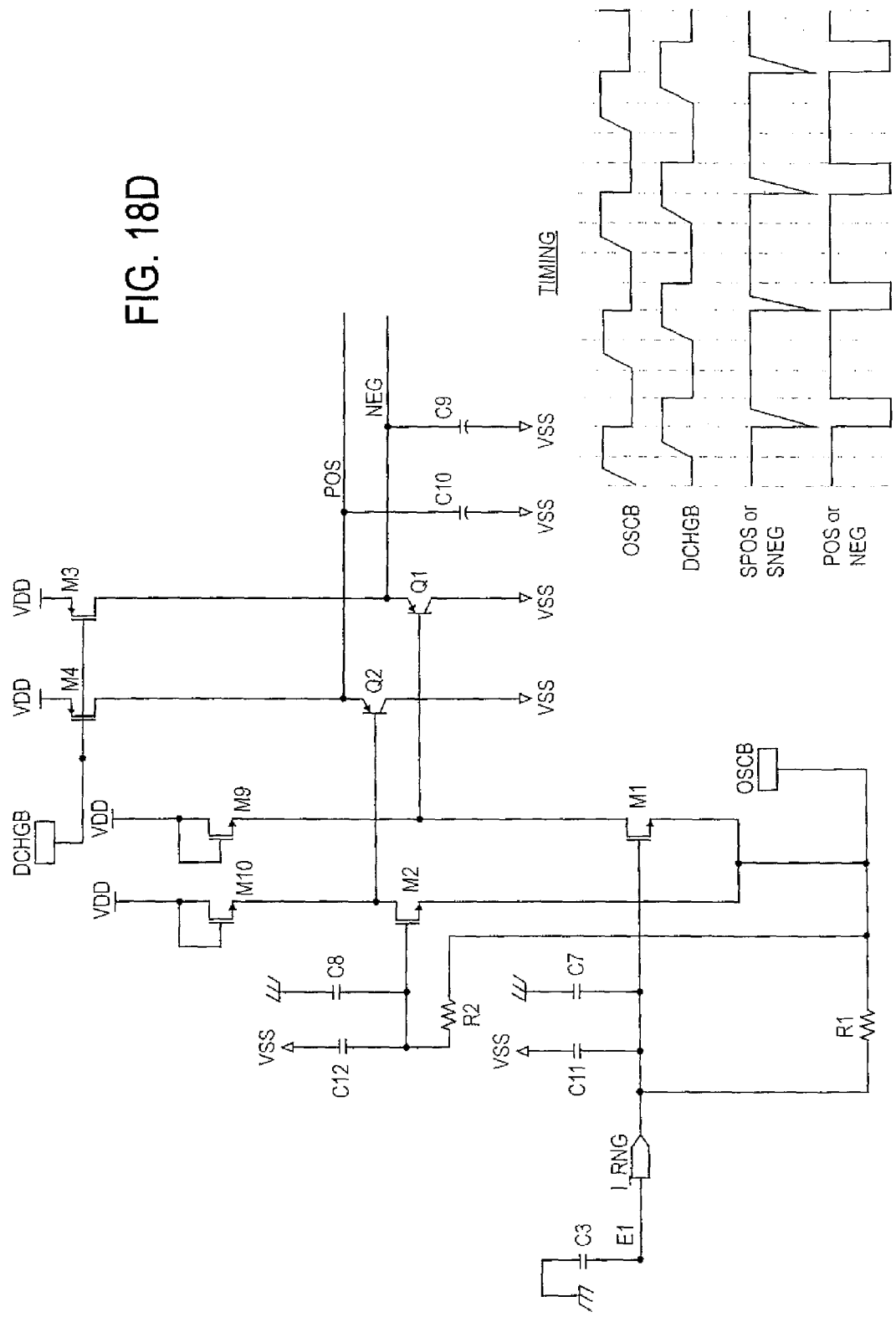
FIG. 18D shows the configuration of FIG. 18B but in single electrode format and utilizing two swamping capacitors and illustrates cost effective integrated circuit matching.
Figure 18E:
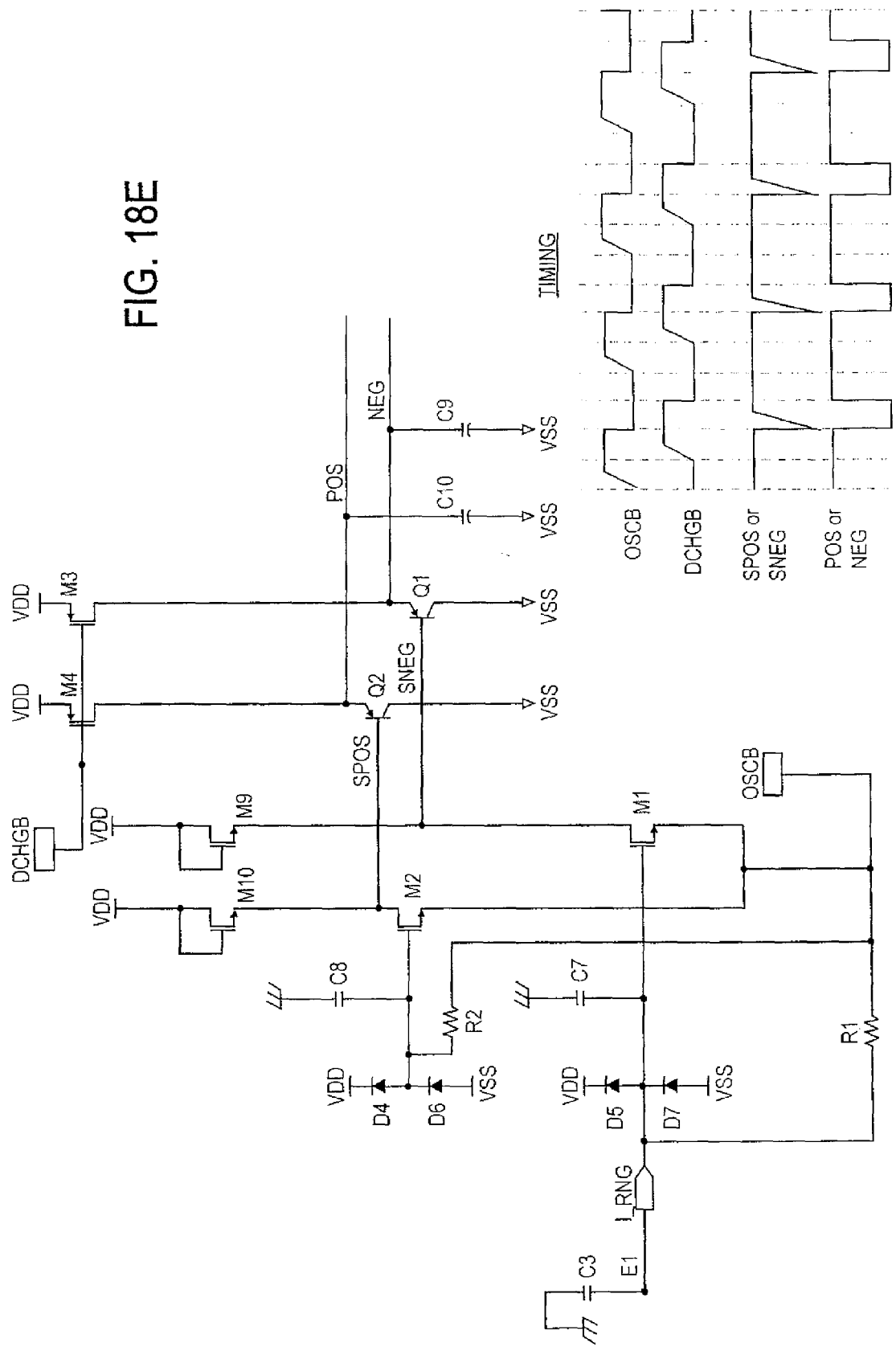
FIG. 18E shows the configuration of FIG. 18D but with depletion diodes.

FIG. 18D shows the configuration of FIG. 16, including swamping capacitors C11 and C12, which balance the inputs to active devices M1 and M2, but in single electrode mode with no outer electrode E2 or input pin O_RNG. FIG. 18E shows the configuration of FIG. 18D, except that swamping capacitance is provided by diodes D4-D7, as also shown in FIG. 17A, minimizing the space needed to provide the benefits of swamping capacitance, as discussed above.

Figure 19:
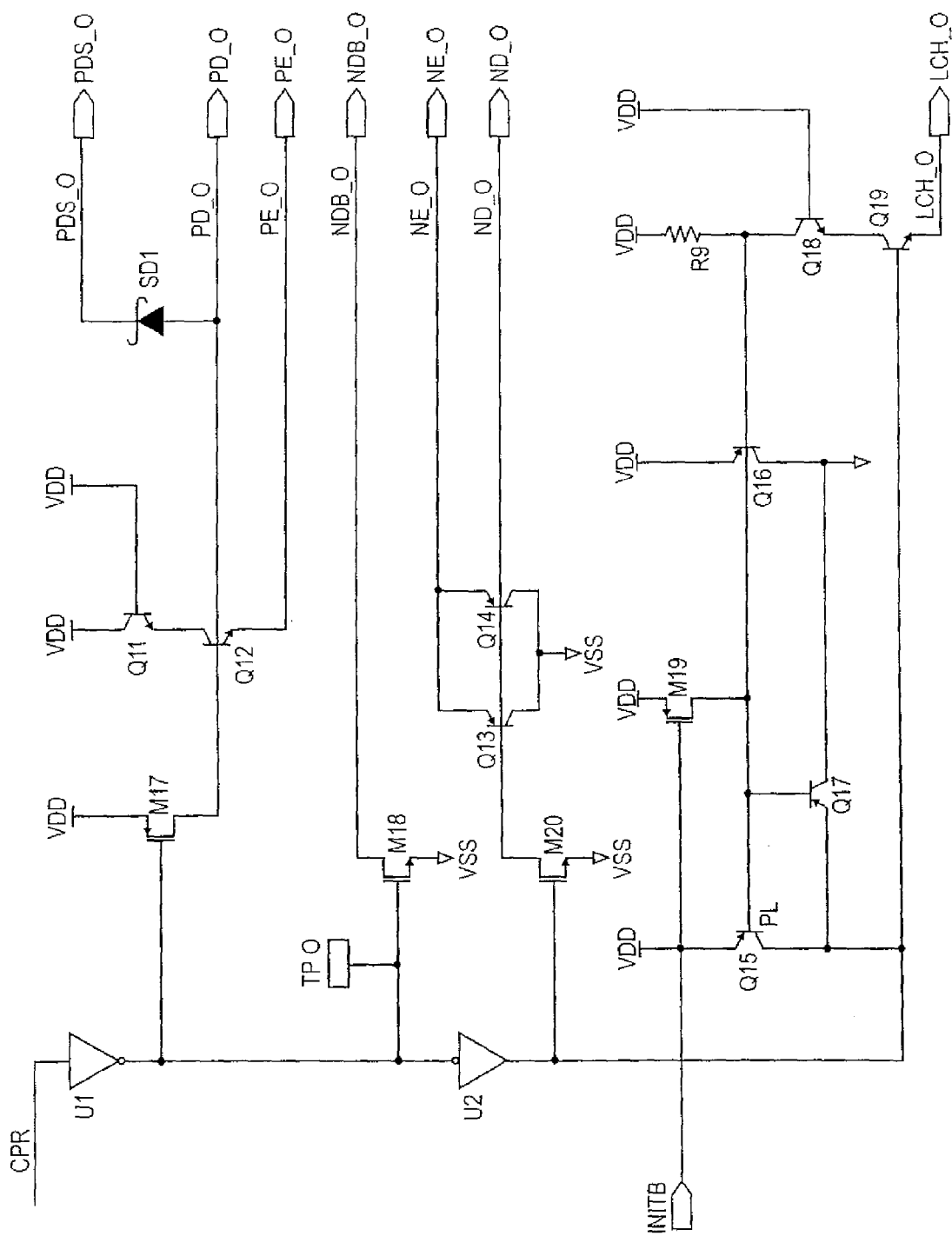
FIG. 19 is an electrical schematic representation of output circuitry for the integrated circuit of a touch switch control circuit.

FIG. 19 is an electrical schematic representation of a possible configuration for an output circuit portion of the integrated circuits of the present invention showing various output features and their possible configurations, including latch output LCH_O and its components, which can function as self-holding latch 70 in FIGS. 4-7. These output features allow the touch cell to duplicate the responses of conventional membrane or mechanical switches.

Output pins NDB_O, NE_O and ND_O are outputs of the touch cell and integrated circuit assembly that will pull the output electrically low through active devices. The integrated control circuit can be configured to pull the output electrically low through active devices when there is a stimulus applied (for example, a human touch stimulus) or can be configured to pull the output electrically low through active devices when there is a lack of stimulus (for example, no human touch stimulus).

As shown in FIG. 19, output pin NDB_O is electrically coupled to the drain of active device M18, whose source is coupled to voltage signal VSS and whose gate is coupled to the input of inverter U2, the output of inverter U2, the gate of active device M17 and voltage signal TP_O. Output pin NE_O is electrically coupled to the emitters of active devices Q13 and Q14, the bases of which are coupled to the drain of active device M20 and the collectors of which are coupled to voltage signal VSS. Active device M20 is in turn coupled at its gate to the output of inverter U2 and at its source to voltage signal VSS. Output pin ND_O is electrically coupled to the bases of active devices Q13 and Q14 and to the drain of active device M20. Active device M20 can act as a negative pull down device for output NE_O and can bias on the gates of active devices Q13 and Q14 for output ND_O.

Output pins PDS_O, PD_O and PE_O are outputs of the touch cell and integrated circuit assembly that will pull the output electrically high through active devices. The integrated control circuit can be configured to pull the output electrically high through the active devices when the there is stimulus applied (for example, a human touch stimulus) or can be configured to pull the output electrically high through the active devices when there is a lack of stimulus (for example, no human touch stimulus).

In FIG. 19, output pin PDS_O is electrically coupled to Schotky diode SD1, which is in turn coupled to output pin PD_O. Output pin PD_O is electrically coupled to the base of active device Q12 and the drain of active device M17, whose source is coupled to voltage signal VDD and whose gate is coupled to the output of inverter U1 and the input of inverter U2. The collector of active device Q12 is coupled to the emitter of active device Q11, whose collector and base both are coupled to voltage signal VDD. Also shown in FIG. 19, the emitter of active device Q12 is coupled to output pin PE_O.

Figure 20A:
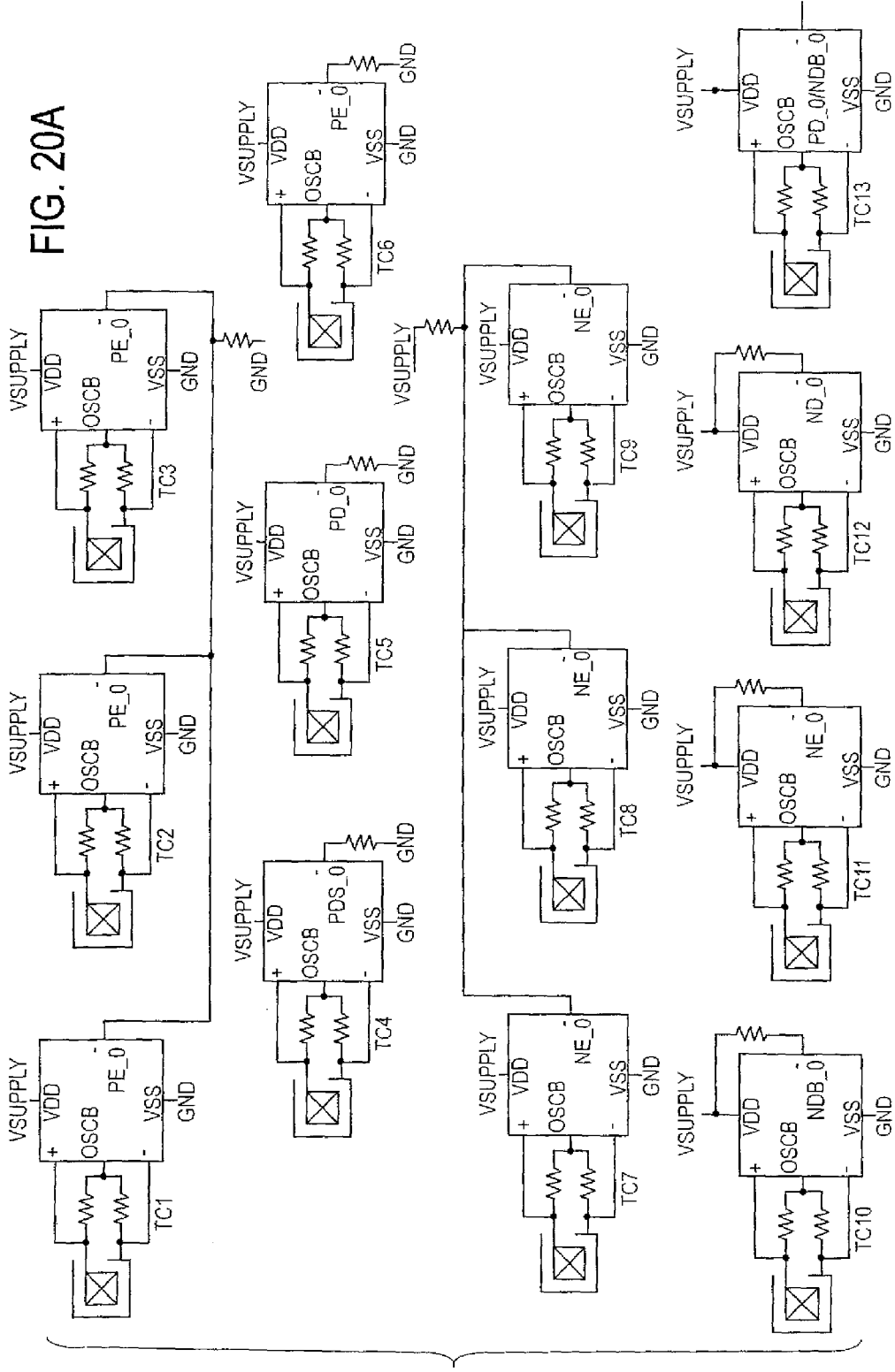

The integrated control circuit can be applied in conventional DC mode, DC matrix, pulsed DC matrix mode or latch matrix mode. FIG. 20A illustrates applications where the integrated control circuit is applied in touch cell configurations for DC mode. In all applications using DC mode, each integrated control circuit is continuously connected to system voltage signals VDD and VSS. In some cases, the outputs of several touch cells are connected in electrical OR logic (for example, touch cells TC1-TC3 using PE_O outputs and TC7-TC9 using NE_O outputs). The rest of the touch cells (TC4-TC6 and TC10-TC13) show the use of the various outputs, namely, PD_S, PD_O, PD_E, NDB_O, NE_O and ND_O. For touch cells TC4-TC6, which can pull electrically high outputs, output pins are coupled through a resistor to ground, where for touch cells TC10-TC13, which can pull electrically low outputs, output pins are coupled through a resistor to voltage signal VDD.

FIG. 20B illustrates the application of touch sensors in negative pulsed DC matrix mode. Each touch cell's integrated control circuit has its voltage signal VDD connected to system voltage supply V.sub.supply. Also shown are the VSS connections of each touch cell's integrated control circuit to a row select signal, ROW SELECT 1 or ROW SELECT 2. In FIG. 20B, output pins NE_O of each touch cell's integrated control circuit connect to a column return, either COLUMN RETURN 1 (touch sensors TS1 and TS2) or COLUMN RETURN 2 (touch sensors TS3 and TS4). As can be seen from FIG. 20B, ROW SELECTS and COLUMN RETURNS can activate a single touch sensor, a row of touch sensors or a column of touch sensors. This is also illustrated in the timing diagram of FIG. 20B.

P-type active devices Q13 and Q14, shown in FIG. 19, will pull NE_O low when there is an active stimulus applied to the associated input. The input can also be configured such that these P-type active devices on the output will pull NE_O low when there is no stimulus applied to the associated input. The emitter base junction of active devices Q13 and Q14 will block current back through VSS to other devices in the matrix when any one device goes active low. Whenever any one particular touch cell's integrated control circuit pulls low, there will be a reduced output (as measured from V.sub.supply to NE_O) to the forward biased voltage drop of the base-emitter junction of the output active devices Q13 and Q14. One device can be used in place of or in lieu of the two active devices Q13 and Q14, depending on the application.

Figure 20C:
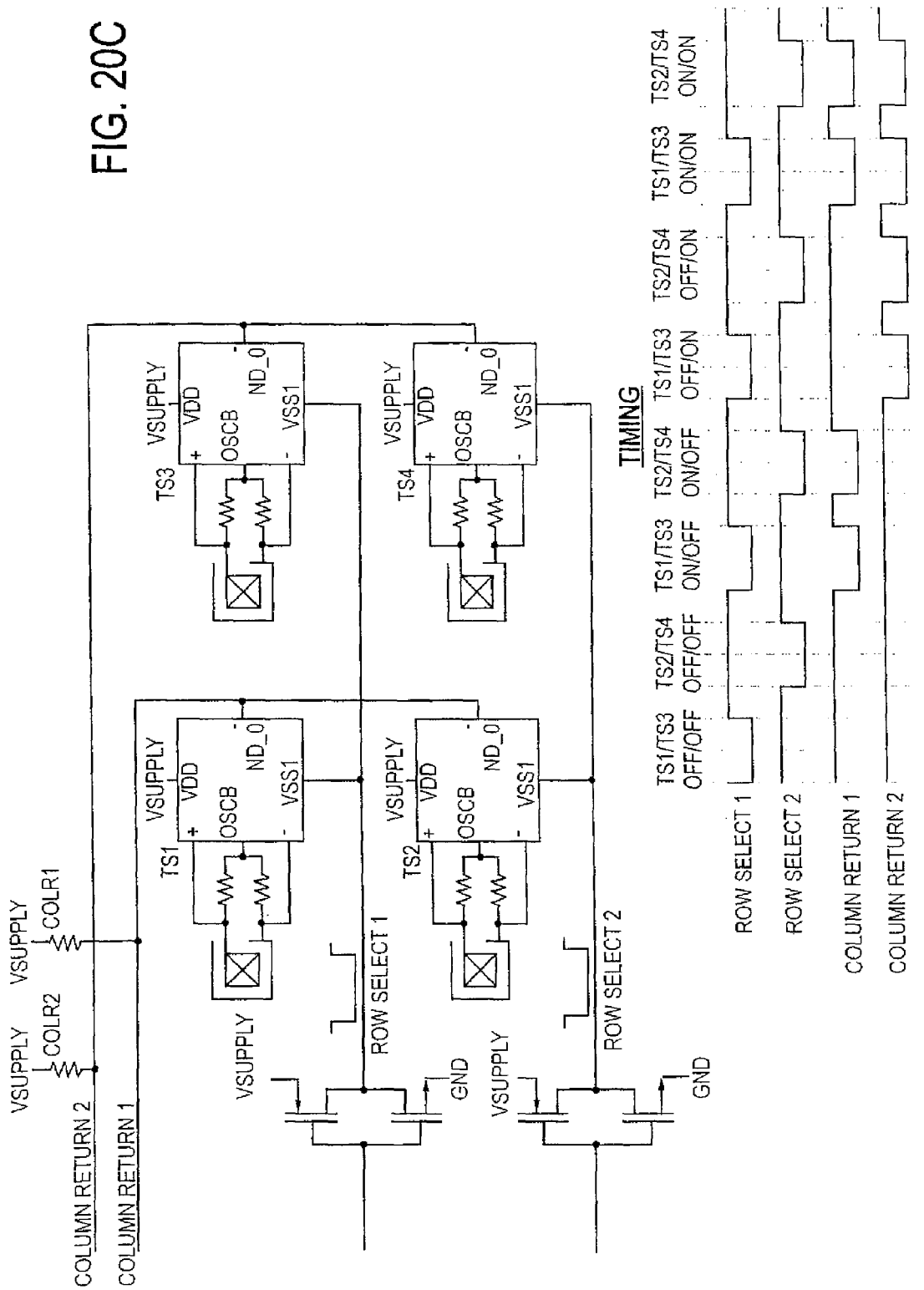
Figure 20D:
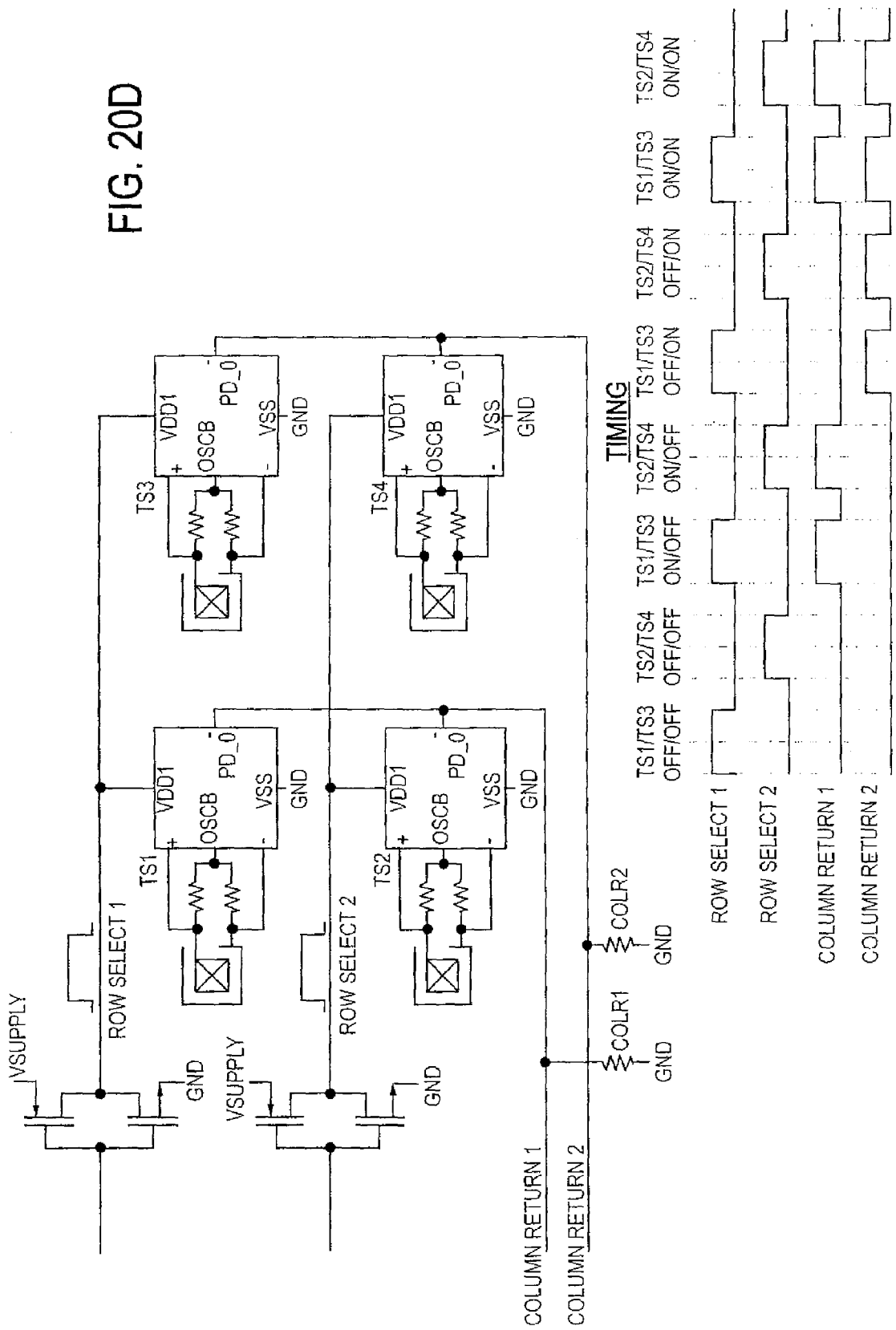

When it is desirable to avoid the V.sub.be drop of the P-type device or devices, then the NDB_O or ND_O outputs, which employ MOSFET devices as shown in FIG. 19, can be used. A negative pulsed DC matrix mode configuration of touch sensors with ND_O outputs is shown in FIG. 20C and is substantially similar to that shown in FIG. 10B. The voltage drop across the N-type MOSFET devices M18 or M20 will be relatively low at low current levels and is dependent on the RDSon resistance multiplied by the current through the MOSFET device channel. This current will therefore be predominantly set by the external load resistance. At lower current levels, the voltage drop will be less, relative to the corresponding voltage drop for P-type bipolar transistors. On the other hand, at higher current levels the bipolar transistors will tend to drop the forward bias of the base emitter junction (0.6 to 0.7 volts) while the N-type MOSFET devices will tend to have an increased voltage drop owing to the approximate linear relationship of RDS on to drain current: V.sub.drop= (RDSon)(I.sub.drain). Thus, in typical logic circuits where lower current levels are present, an N-type MOSFET output will tend to drop less voltage than would a bipolar device. This makes MOSFET devices more generically appropriate for other logic circuits. FIG. 20D shows a positive pulsed DC matrix configuration with touch sensors having PD_O outputs using P-type MOSFET device M17, as shown in FIG. 19, to which these observations also apply.

Figure 21A:
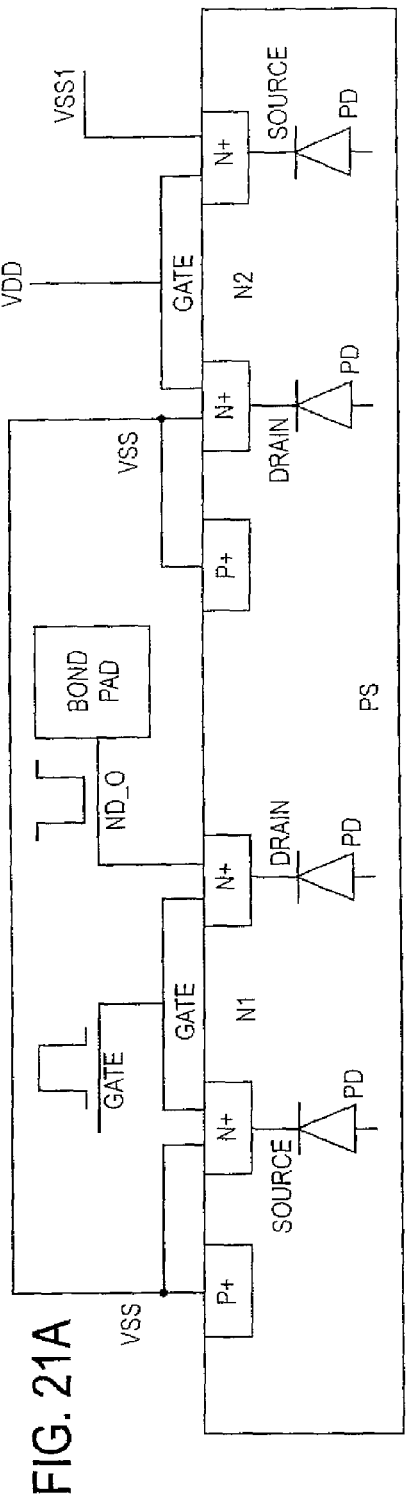
Figure 21C:
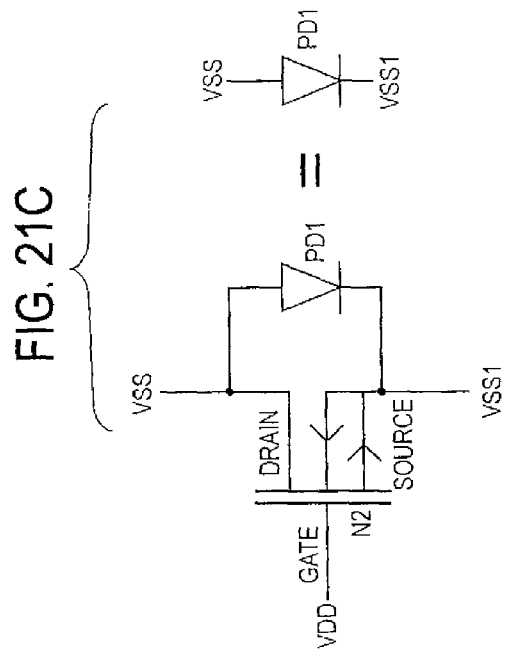
Figure 21B:
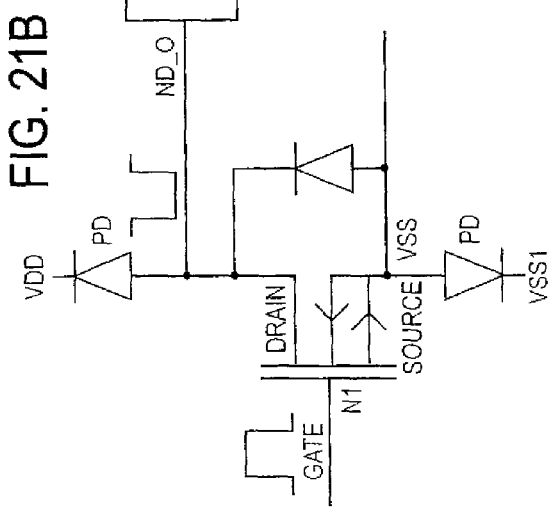

MOSFET devices, however, do not have any inherent blocking features as do bipolar devices. FIG. 21A illustrates a cross sectional view of a typical P-type substrate with doped N and P type materials used in the construction of typical CMOS circuits. FIG. 21B is a schematic representations of an N-type MOSFET device, N1, which can be used as an output pull down device for output pin NBD_O (active device M18 in FIG. 19) or for output pin ND_O (active device M20 in FIG. 19). FIG. 21C is a schematic representation of a blocking device, N2, connected in series with the output device N1 to prevent the development of leakage currents from parasitic devices associated with N1, which can occur as an unintended consequence of MOSFET device construction because of the depletion regions that surround the device.

FIGS. 21A-21C illustrate how the construction of an N-type MOSFET device results in the creation of a parasitic drain to source bipolar diode PD1 and how to block leakage current from VSS to the substrate. Typical CMOS integrated circuits make use of P or N type substrates. These substrates are typically electrically connected to the integrated circuit VSS or VDD. In the case of P type substrates, the substrate is tied to VSS and in the case of N type substrates, the substrate is tied to VDD. Note that, in FIG. 21B, the source of N-type MOSFET device N1 is tied to voltage signal VSS and that the anode of parasitic diode PD1 is also tied to the source node of device N1. The cathode of parasitic diode PD1 is tied to the drain of device N1. As a result of this, when the integrated control circuit is implemented in negative pulsed DC matrix mode with active electrical pull down, using N-type MOSFET devices (as shown in FIG. 20C, with ND_O outputs), there exists an inherent path for reverse current through parasitic diode PD1 through the P substrate. When the pulses for the strobe rows are applied to the matrix and are at a potential that is greater than the potential at the output of ND_O, a current will flow through parasitic diode PD1 from VSS to ND_O. This current path will affect the operation of the matrix and the power supply; and this low current path will provide a low impedance path that connects VSS to VDD through the strobe drivers. A bipolar diode connected in series with the N-type MOSFET pull down device will prevent reverse current flow but would also negate the advantage of the N-type MOSFET pull down device, namely, low voltage drop at the output. A bipolar diode would also tend to drop the V.sub.be of a base emitter junction. To block this unwanted current path, a way to implement a blocking device is needed that preferably is compatible with conventional integrated circuit manufacturing and has a minimum voltage drop. By making appropriate connections between the N-type MOSFET devices N1 and N2, the leakage current path can be blocked such that the P substrate and voltage signal VSS are isolated from leakage paths of current through the ND_O device N1; at the same time the voltage drop of the control circuit output is minimized.

Device N2 in FIG. 21A is the blocking device and is represented schematically in FIG. 21C. The drain and source of blocking device N2 are connected to VSS and VSS1, respectively, as shown in FIGS. 21A and 21C. The gate of blocking device N2 is coupled to voltage signal VDD, which can, but need not, be 3-5 volts so as to be compatible with most microprocessors. When the source of device N2 is at a low potential, such as ground, the channel resistance will be very low so long as the gate voltage is slightly higher than the threshold voltage of the device. Since the gate of device N2 is at VDD, which can be on the order of 3 to 5 volts (V.sub.supply), its source is at zero volts during the active pulse period, and its threshold voltage is less than a volt, the channel resistance will be very low and therefore the channel drop of the device will also be very low (i.e., less than a standard bipolar diode). When the source of device N2 is at a voltage equal to (or higher than) VDD, the gate to source voltage (VGS) will be less than the threshold voltage of the device. This will cause the channel resistance to increase significantly, thereby blocking substantial current through the channel. Also, the voltage across the depletion junction of the source of device N2 to parasitic diodes PD of substrate PS will be less than the barrier potential (about 0.6 to 0.7 volts) of the source-drain parasitic diode PD1. Parasitic diode PD1 will therefore block substantial current through the substrate.

Also, blocking device N2 can be used for reverse voltage protection in standard integrated circuit applications and provide all of the benefits stated above. When used in this way, blocking device N2 would be connected to the integrated circuit's VSS in the same way as described and would protect the circuit from reverse current or voltage damage.

FIGS. 21D-21F depict a blocking device BDP2 for the electrically high pull devices having outputs PDS_O, PD_O and PE_O, shown in FIG. 19. The device depicted in FIGS. 21D-21F is complementary to the device depicted in FIGS. 21A-21C and will be understood by those skilled in the art in light of the discussion referencing FIGS. 21A-21C. In all DC mode configurations described, there are three connections to each touch cell's integrated control circuit. VDD and VSS for each touch cell's integrated control circuit need to be connected to a source of power for some amount of time, in order to process the input stimuli. The output of the integrated control circuit is found at PDS_O, PD_O, PE_O NDB_O, ND_O, and NE_O, depending on the configuration desired. These outputs form the third connection required by the integrated control circuit. In some cases, however, it would be advantageous to have an integrated circuit requiring only two connections. For example, since typically only two connections per switch are used in applications involving membrane switches, having a touch sensing switch and integrated control circuit requiring only two connections would facilitate direct replacement of the membrane switches with touch switches.

Figure 22:
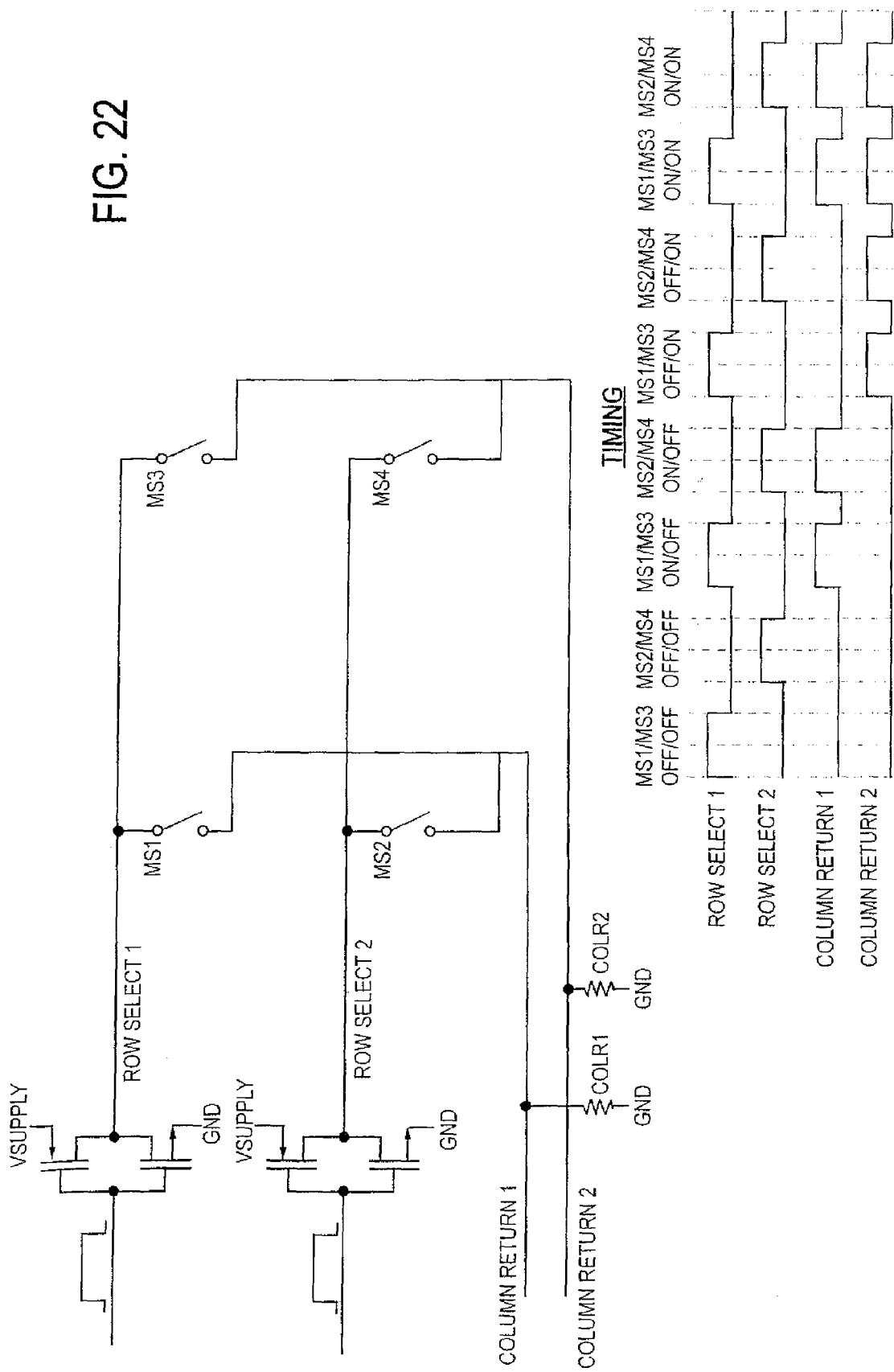
FIG. 22 is a schematic of one way to configure a matrix of membrane or other mechanical switches and the addressing and timing therefor.

A schematic representation of a matrix of two-terminal membrane switches MS1-MS4 is shown in FIG. 22. FIG. 22 shows one way to address and read switches within a matrix. The matrix of FIG. 22 could, of course, also be modified to include more rows, more columns, more switches, and alternative connections. In all cases, the interface to each switch typically would include two types of signal lines: ROW SELECT and COLUMN RETURN. Each ROW SELECT line is a source of potential to allow current to flow through each switch MS1-MS4 as they are closed (in the case of membrane switches, by finger pressure causing closure) through the COLUMN RETURN lines. The terminating resistors COLR1 and COLR2 on the COLUMN RETURN lines 1 and 2, respectively, are used to develop the voltage to be processed by return logic circuits and for limiting current through the switch devices. The strobe lines can be sequenced in such a manner that only one row of switches (MS1 and MS3 or MS2 and MS4) is active at a given time. When a particular row is selected, the voltage generated through each terminating resistor COLR will indicate which switches on the selected row are electrically closed. The COLUMN RETURN lines are generally processed simultaneously. Matrix schemes are efficient in terms of the number of interconnections used to process the number of switch inputs. For example, sixty four switches can be read with an eight by eight matrix using eight ROW SELECT lines and eight COLUMN RETURN lines. Typically, some sort of logic device is connected to the strobe and return lines to determine the status of all the switches over a short period of time. This is a typical matrix scheme that one skilled in the art would know how to implement. It can be used in controllers, keyboards for computers, telephones, and other devices that are widely available in the market.

Figure 23:
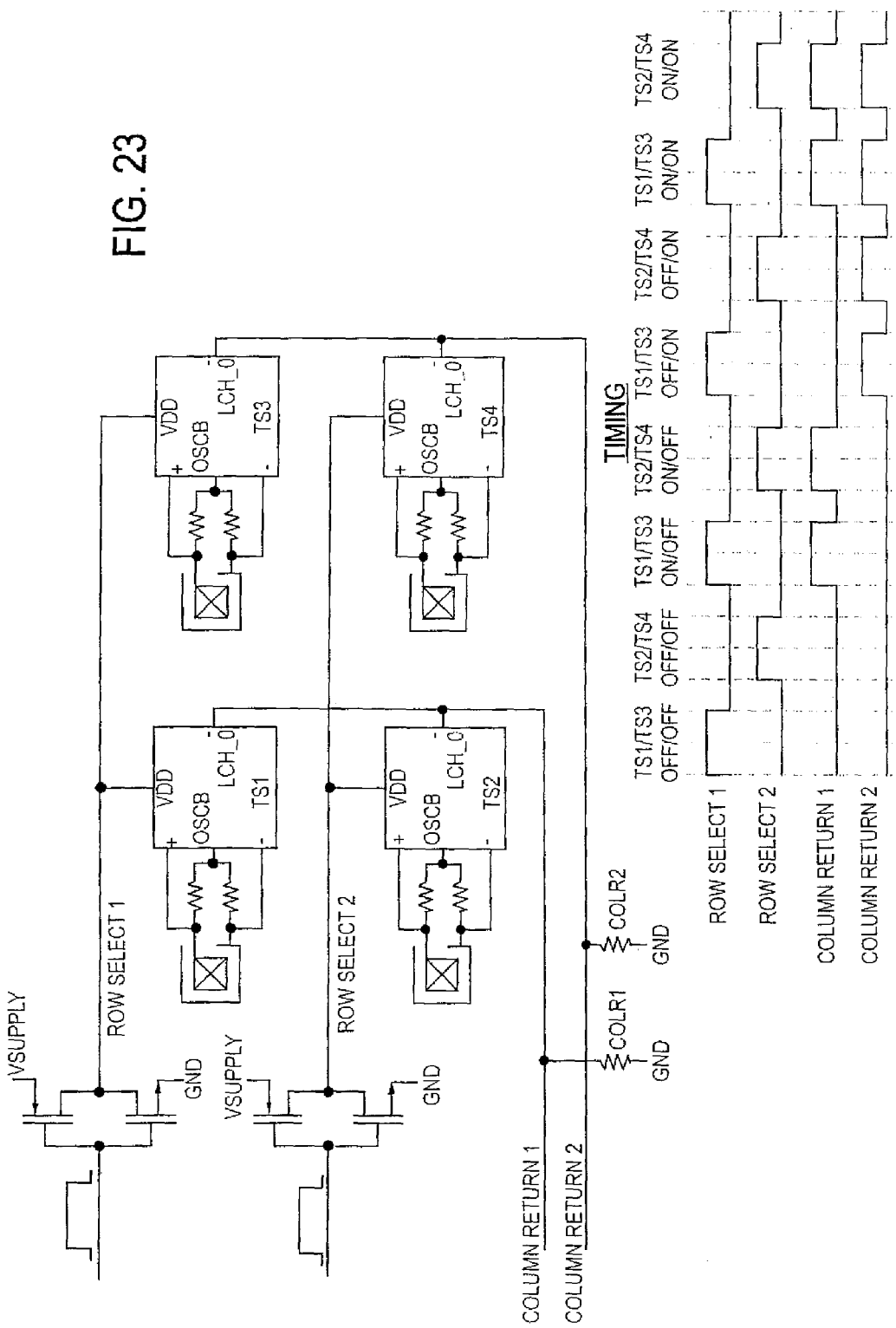
FIG. 23 is the schematic of FIG. 22 wherein the switches are touch switch assemblies having two connections to the address lines of the matrix configuration.

A solid-state type sensing device that can detect stimuli and act as a two-terminal switch could be advantageous in that it would allow conventional matrix strobe and read circuits to be built without additional software, logic circuits, and/or microprocessors, which are susceptible to resets and other failures. FIG. 23 illustrates the implementation of such devices, arranged in a matrix and having only two integrated circuit connections. Thus, the touch sensors TS1-TS4 of FIG. 23 have replaced the membrane switches MS1-MS4 of FIG. 22. In FIG. 23, each touch sensor TS1-TS4 senses electric field potential differences. According to the presence or absence of an appropriate stimulus, the device (depending on the specific application) will move from a high impedance state (open switch equivalent) to a low impedance state (closed switch equivalent), thereby mimicking a conventional membrane or other mechanical switch. The chief advantage of these devices is their ability to mimic the attributes of two terminal switches.

Figure 24A:
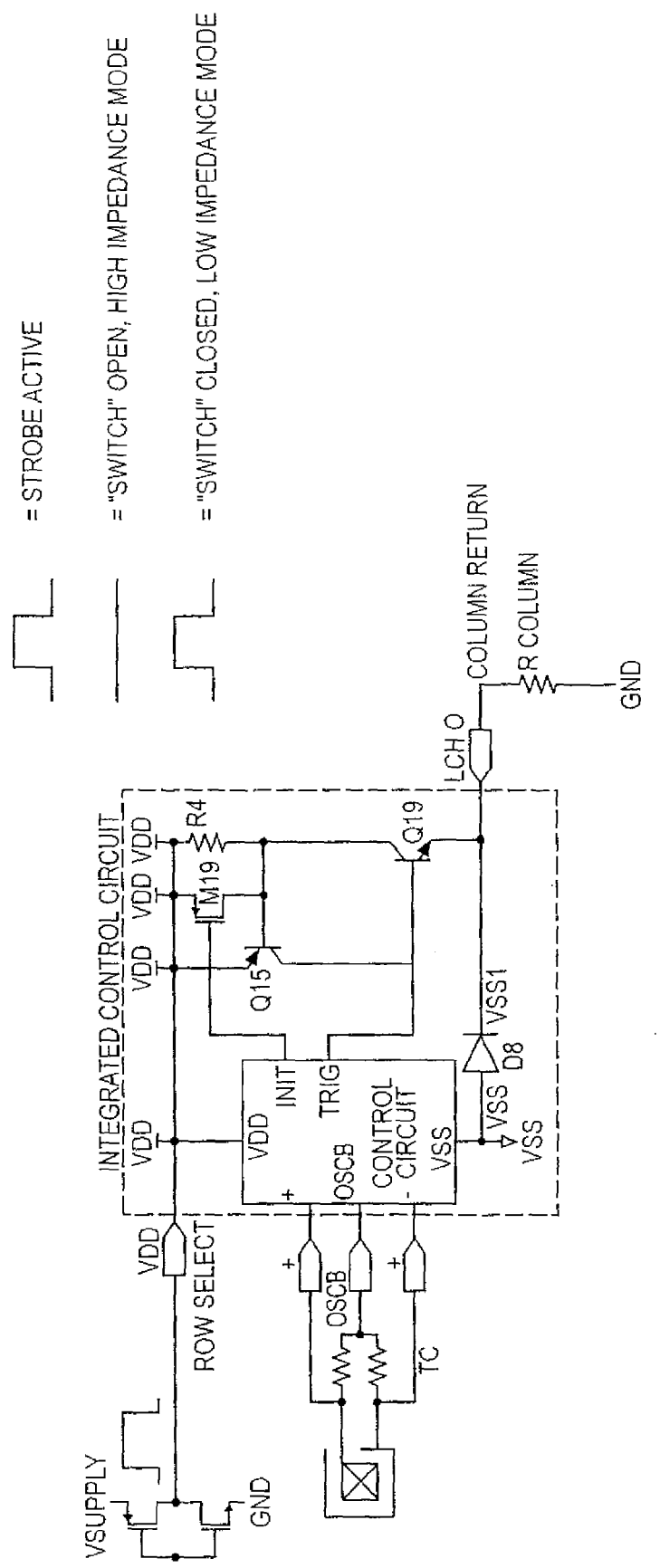
FIGS. 24A-24B are electrical schematic representations of certain features of the output circuit depicted in FIG. 9 communicating with a touch switch control circuit.
Figure 24B:
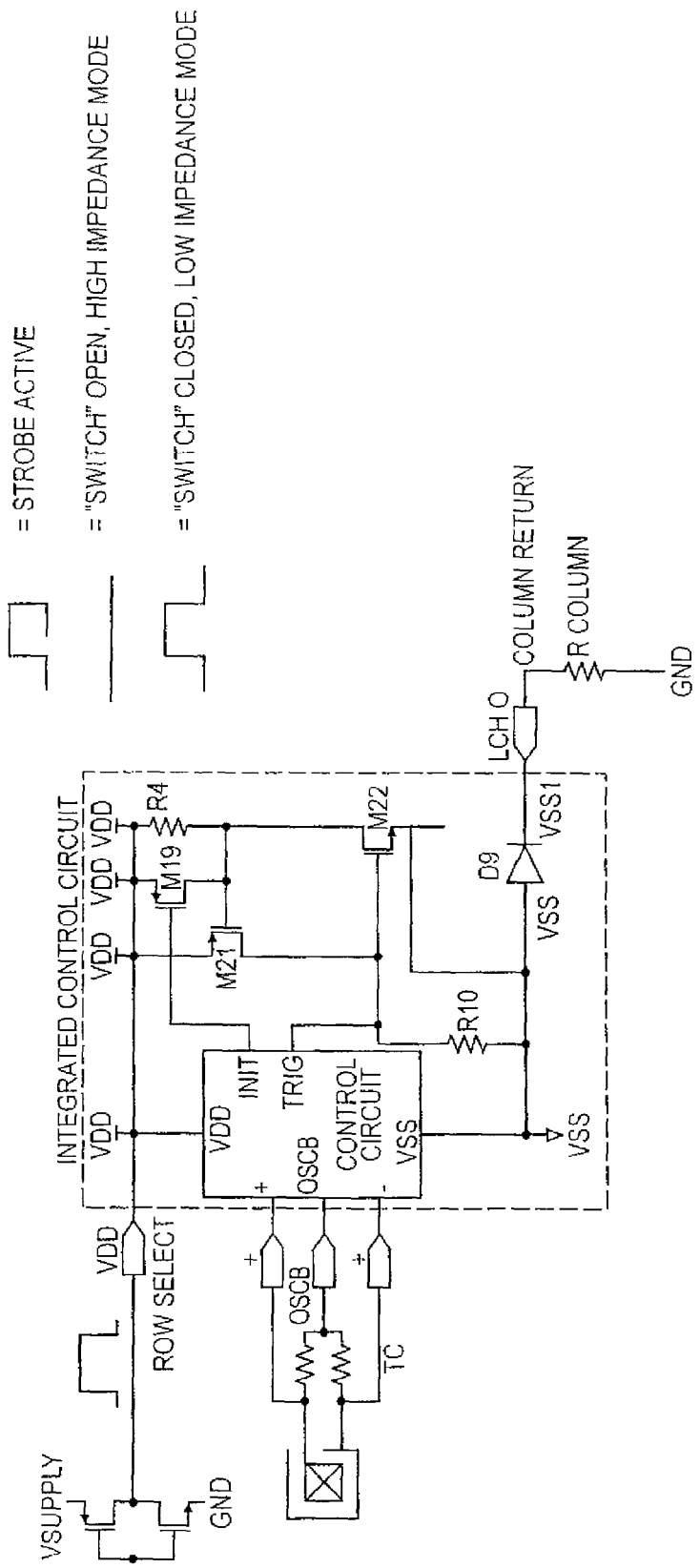

FIGS. 24A and 24B show possible circuitry for the touch sensors TS1-TS4 of FIG. 23. The circuits depicted in FIGS. 24A and 24B are based on the latch circuit portion of the circuit depicted in FIG. 19. In FIG. 19, the latch circuit depicted includes active devices M19 and Q15-Q19 as well a resistor R9. Latch circuit output pin LCH_O is shown coupled to the emitter of active device Q19. Active device Q19 is in turn coupled at its base to the output of inverter U2, to the drain of active device Q15 and the gate of active device M20; and at its collector to the emitter of active device Q18, whose base is coupled to voltage signal VDD and whose collector is coupled to resistor R9, which in turn is coupled to voltage signal VDD. The collector of active device Q18 is also shown coupled to the bases of active device Q15 and Q16, the emitters of which are coupled to voltage signal VDD, and the base of active device Q17, the collector of which is coupled to voltage signal VSS and the emitter of which is coupled to the collector of active device Q15. The collector of active device Q18 is also coupled to the drain of active device M19, the gate of which is coupled to output pin INITB of the control circuit and the source of which is coupled to voltage signal VDD.

FIGS. 24A and 24B show various embodiments of the latch circuit of FIG. 19. Both of these embodiments omit optional active devices Q16-Q18. FIG. 24A shows the implementation of bipolar components Q15 and Q19 in the latch circuit, as shown in FIG. 19, and FIG. 24B shows the implementation of MOSFET components in the latch circuit. Other configurations can be implemented in keeping with the spirit and functionality of a two terminal device.

FIG. 24A shows a bipolar latch circuit operating in conjunction with a control circuit, which provides the functions needed to detect an input stimulus, make decisions, and trigger the bipolar latch circuit. The control circuit can also provide for power on reset functions, initializing and sequencing of various internal blocks and features. Inputs into the control circuit include those associated with the input sensing connections, namely, OSCB, + (PLUS), and − (NEGATIVE); those associated with the power supply of the control circuit, namely, voltage signals VDD and VSS; and those associated with the latch circuit, namely, INIT and TRIGGER. The latch output is through output pin LCH_O.

When there exists a path for current from a system V.sub.supply to GND through the active pull P-type MOSFET device on the ROW SELECT line, the strobe line ROW SELECT in FIG. 24A is active. With power supplied, the control circuit would be operational. When the strobe pulse is first applied, the control circuit would apply a gate signal, via the INIT line, to turn on active device M19. This will ensure that the base emitter voltage of active device Q15 is essentially at zero volts, keeping it from conducting (except for leakage current). With Q15 off, there is no current available for the base of Q19 and, therefore, Q19 will also be off. With Q19 off, the voltage at the base of Q15 would be essentially VDD, even after the INIT signal is removed and M19 is off. With the latch essentially off (i.e., no current flow), the control circuit will be allowed to operate. When operational, the integrated control circuit is in the high impedance mode and simulates an open switch. The output voltage developed across resistor R.sub.column is equal to V.sub.supply.times.R(integrated control circuit)/([R(integrated control circuit)+R.sub.column]. The greater the effective resistance of the integrated control circuit, the less the percentage of V.sub.supply that will be dropped across R.sub.column, and the greater the percentage that will be dropped across integrated control circuit.

A perfect switch would have infinite resistance and zero current when open and therefore V.sub.supply would be dropped across the switch during a strobe pulse and zero voltage would be dropped across R.sub.column because of zero current flow. Since an integrated circuit is not a switch, it is important to design the integrated control circuit to have as little current as possible when V.sub.supply is applied by the strobe pulse to more accurately replicate an open switch's characteristics.

An input electrode can be configured to cause the integrated control circuit to stay in this high impedance mode with a stimulus applied or without a stimulus applied. When the integrated control circuit is in the high impedance mode, most of V.sub.supply will be applied across the integrated control circuit. This will allow the circuit to operate in a floating mode since the internal VDD and VSS is sufficient to operate the integrated circuit as a whole and the internal control circuit as well. The electrode configuration can also be such as to cause the control circuit to generate a trigger pulse to the latch circuit when a stimulus is applied or, alternatively, when a stimulus is not applied. When the control circuit generates a trigger pulse, the latch will turn on. The trigger pulse in FIG. 24A would be a positive pulse moving towards VDD from VSS. This trigger pulse would be allowed after the INIT signal resets, causing M19 to turn off. This positive pulse would forward bias the base emitter junction of N-type bipolar device Q19, causing it to turn on. With the flow of base current and the gain transfer of active device Q19, current will flow at the collector of active device Q19 and therefore through resistor R9. The current flow across resistor R9 will generate a voltage potential that will cause the base of active device Q15 to drop towards VSS—enough to forward bias the emitter base junction of active device Q15 to cause it to turn on. The current gain of active device Q15 will cause substantial current to flow at the collector of active device Q15 and will also cause the voltage to increase at the base of active device Q19 sufficiently to forward bias the emitter base junction of active device Q19, even after the removal of the trigger pulse. The trigger pulse will be removed, owing to the voltage drop across the control circuit, sufficiently to disable the operation of the control circuit. The latch current will stay on after the trigger pulse is removed owing to the positive current feedback loop between the Q15 and Q19. The voltage drop of the latch will be determined by the saturation voltage, the junction resistances, the gains of active devices Q15 and Q19 and the resistance of R.sub.column. The latch circuit inside the integrated control circuit has to stay on once the trigger is removed since the control circuit is inoperable and it is important that the latch drop as little voltage as possible across a range of currents. In this low impedance mode, it is desirable to obtain these attributes as much as possible to replicate a closed switch. A perfect closed switch would pass infinite current and drop zero volts at all current levels. To best replicate a perfect switch, e.g., one with a low voltage drop, the latch circuit can preferably make use of bipolar transistors with increased emitter areas and low V.sub.be drops and MOSFETS with high W/L channel ratios, low thresholds and devices with high gains.

FIG. 24B shows the latch circuit of FIG. 24A where the bipolar active devices Q15 and Q19 have been replaced by MOSFET devices M21 and M22. The operation of the integrated control circuit in FIG. 24B parallels the operation of the integrated control circuit of FIG. 24A. The operation of the latch portion depicted in FIG. 14B is described below.

When the INIT pulse is applied, active device M19 is turned on. This will allow VDD to be applied to the gate of active device M21. In this condition, the gate source voltage of active device M21 will be less than the threshold voltage of the P-type MOSFET device M21, essentially zero volts, and, therefore, active device M21 will be off. With the drain current of active device M21 at essentially zero amps (other than leakage current), there will be no voltage developed across resistor R10. With the gate of active device M22 at essentially zero volts, its gate source voltage will be substantially less than the threshold voltage of the device. The drain current of active device M22 will be essentially zero with its gate source voltage well below the threshold voltage. The zero current through resistor R9 will cause the voltage on the gate of active device M21 to be at, or very close to, VDD, and, therefore, the gate source voltage of active device M21 will be essentially zero also, even after the INIT signal is removed. This condition will place the latch circuit in the high impedance state. When a trigger pulse approaching VDD is applied to the gate of active device M22, after removal of the INIT pulse, its gate source voltage will exceed the threshold voltage of active device M22, causing M22 to turn on. The drain current of active device M22 will increase, developing a voltage drop across resistor R9. With voltage drop across resistor R9, the gate source voltage of active device M21 will exceed its threshold voltage, causing active device M21 to turn on. The drain current of active device M21 will increase also causing the voltage drop across resistor R10 to increase above the threshold voltage of active device M22, even after the trigger pulse is removed. The latch will therefore move into a low impedance state and the voltage drop across it will be dependent on the characteristics of active devices M21 and M22, values of resistors R9 and R10, and the resistance of R.sub.column. The rest of the operation of the integrated control circuit in FIG. 24B is similar to that of the integrated control circuit of FIG. 24A. Also shown in both FIGS. are the blocking diodes of FIGS. 21A-21C, labeled D8 and D9 in FIGS. 24A and 24B, respectively.

Figure 25A:
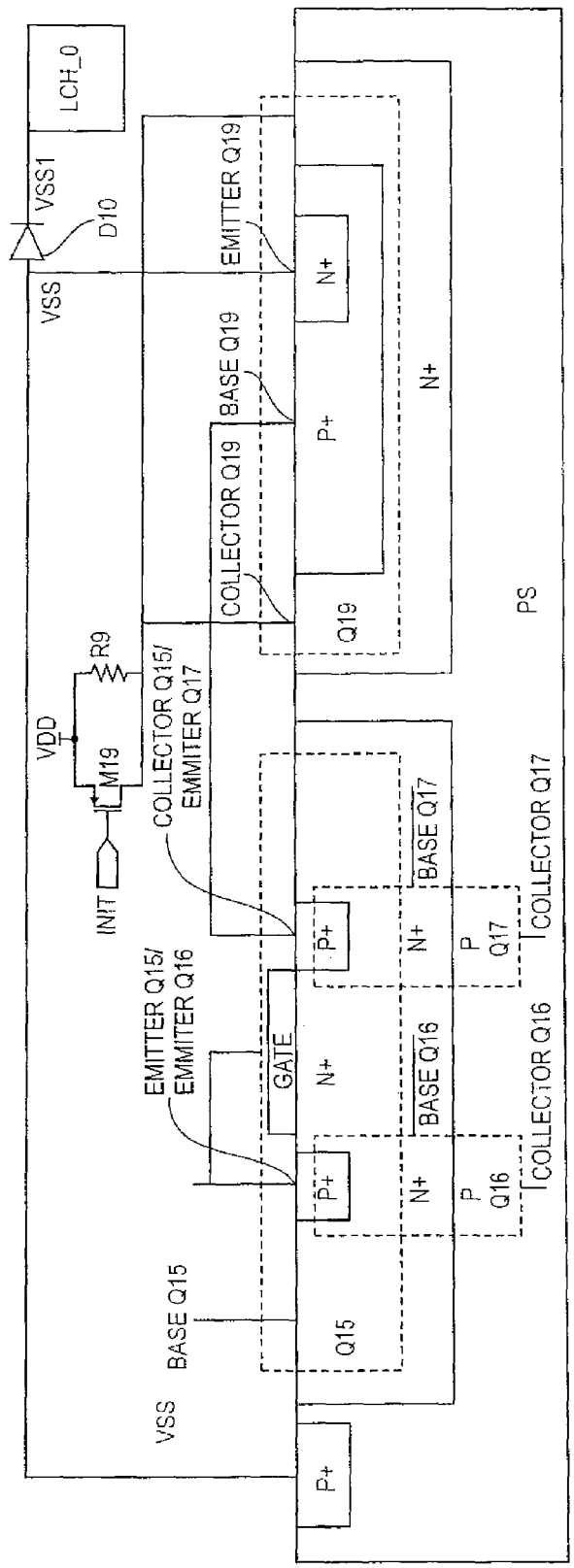
FIG. 25A shows a possible configuration of the active devices that make up a latch circuit according to the present invention.
Figure 25B:
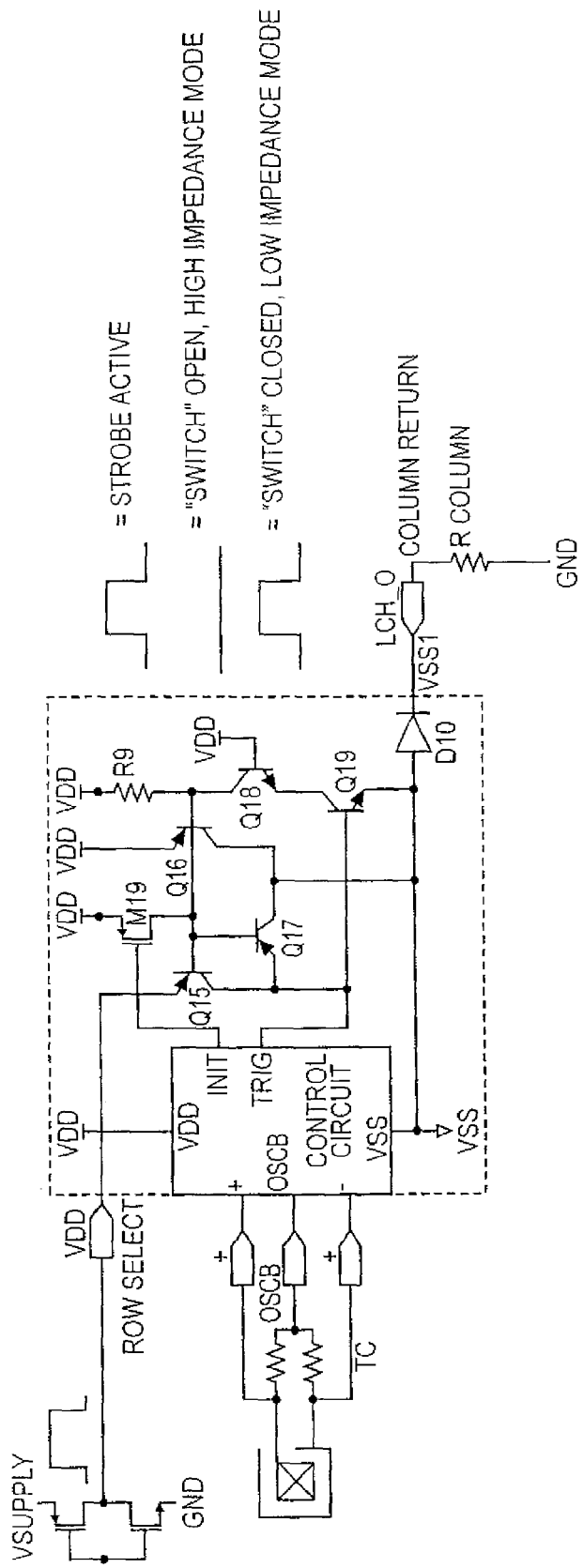
FIGS. 25B-25C are schematic representations of a latch circuit according to the present invention.
Figure 25C:
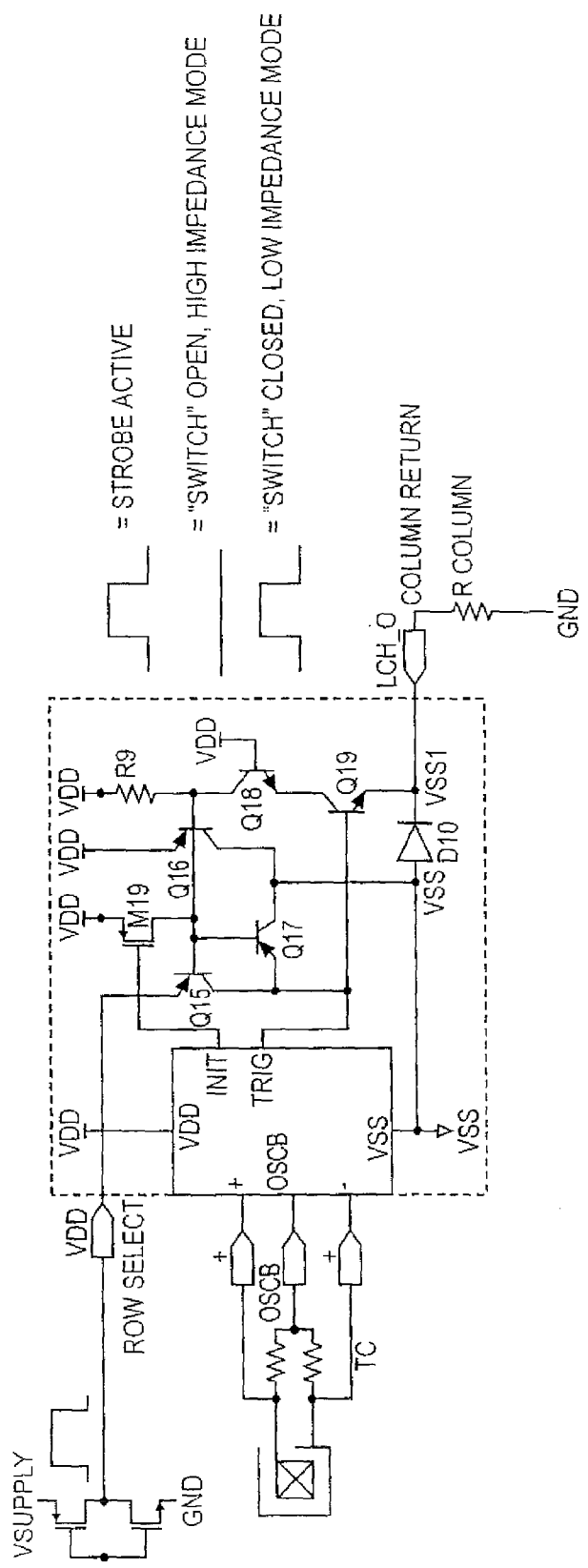

FIG. 25A illustrates the latch circuit portion of FIG. 19 comprising active devices Q15-Q19 in a possible configuration built into substrate PS. FIG. 25B shows the latch circuit portion schematically. In FIG. 25A, active devices Q15 and Q16 share a P-doped well EMITTERQ15/EMITTERQ16 as an emitter and the collector of active device Q15 and emitter of active device Q17 are the same P-doped well COLLECTORQ15/EMITTERQ17, which is coupled to the gate of active device Q15. Active devices Q15, Q16 and Q17 also share the same N-doped well as their bases BASEQ15, BASEQ16 and BASEQ17, respectively. Substrate PS forms the collectors of active devices Q16 and Q17, COLLECTORQ16 and COLLECTORQ17, respectively. Active device Q19 is shown in a separate N-doped well in substrate PS, and is coupled at its N-doped well collector COLLECTORQ19 to resistance R9, at its P-doped well base BASEQ19 to P-doped well COLLECTORQ15/EMITTERQ17, and at its N-doped well emitter EMITTERQ19 to voltage signal VSS at the anode of diode D10. In FIG. 25A, active device M19 is coupled in parallel with resistance R9. Operation of the configuration depicted in FIGS. 25A and 25B will be understood by those skilled in the art of active device and circuit design and from the discussion of the latch circuit with reference to FIG. 24A. Active devices Q16-Q18 will enhance the signal delivered to output LCH_O. The configuration shown in FIG. 25A will benefit from a reduced latch ON voltage drop, as compared with the voltage drop associated with a standard latch, owing to the dynamic impedance of active device Q17 and the shunting of VSS current through substrate PS. Diode D10, coupled at its cathode to output LCH_O and at its anode to the emitter of active device Q19 and to voltage signal VSS, can prevent feedback into the latch portion of the integrated circuit depicted in FIG. 25B. FIG. 25C shows diode D10 coupled at it anode to voltage signal VSS and the collectors of active devices Q17 and Q18 and at its cathode to the emitter of active device Q19 and output LCH_O. The configuration in FIG. 25C thus changes the voltage signal on the emitter of active device Q19, which can be biased on by output TRIG, from VSS, in FIG. 25B, to VSS1. This latch circuit configuration can advantageously reduce the voltage drop since, in this case, the voltage drop across diode D10 is not in series with the base emitter voltage of active device Q19. Optional active device Q18 in FIGS. 25B and 25C is useful to increase the reverse breakdown voltage of the latch circuit.

Figure 26A:
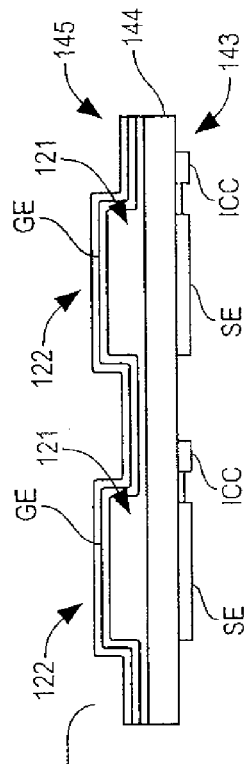
FIGS. 26A-26C show a capacitive switch apparatus for use with the integrated circuit of the present invention wherein the circuit depicted in FIG. 26D can respond to capacitance between two electrodes that changes owing to a change in the distance between therebetween.
Figure 26C:
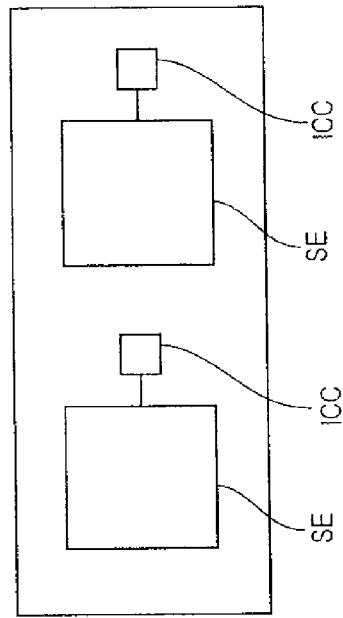
Figure 26B:
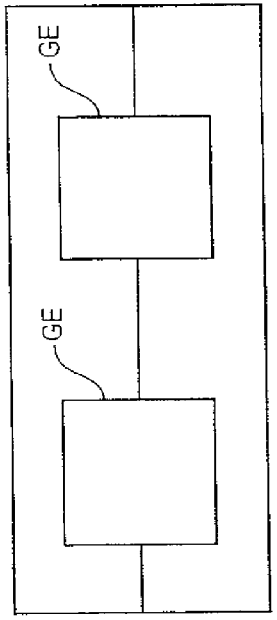

The integrated circuits of the present invention can respond to capacitive inputs that change in a variety of ways. For example, FIGS. 26A-26C show a capacitive input sensing apparatus compatible with the integrated circuit of the present invention, wherein the capacitive input changes as a result of a change in the distance d between electrodes GE and SE that form capacitance C.sub.sense, shown schematically in FIG. 26D. Capacitance C.sub.sense is a function of the capacitive constant of the electrodes E.sub.o, relative dielectric constant E.sub.r, surface area of the electrodes s and the distance between them d. The apparatus depicted in FIG. 26A, having sensor electrodes SE and integrated control circuit ICC on one side 143 of substrate 144 and grounded electrode GE configured into buttons 122 creating cavities 121 on the other side 145. FIGS. 26B and 26B show the separate layers of the apparatus shown in FIG. 26A. Cavities 121 in FIG. 26A allow buttons 122 to be depressed, for instance, by a human finger or other probe, so as to alter the distance d between electrodes GE and SE. The control circuit depicted in FIG. 26D, can respond to the changed capacitance that results from the changed distance d. The control circuit of FIG. 26D corresponds to the control circuit depicted in FIG. 18D, except that capacitance C3 in FIG. 18D has been renamed C.sub.sense in FIG. 26D.

Thus far, this specification generally has described various preferred embodiments of touch sensors (or field effect sensors) according to the present invention. Following are descriptions of various preferred embodiments of practical applications for such sensors. Although it generally is preferred that these applications be practiced using the touch sensors described above, these applications generally also may be practiced using other types of touch sensors, for example, the sensors described in U.S. Pat. Nos. 5,594,222 and 6,310,611, conventional capacitive sensors, and other types of sensors, as would be known to one skilled in the art.

Figure 27E:
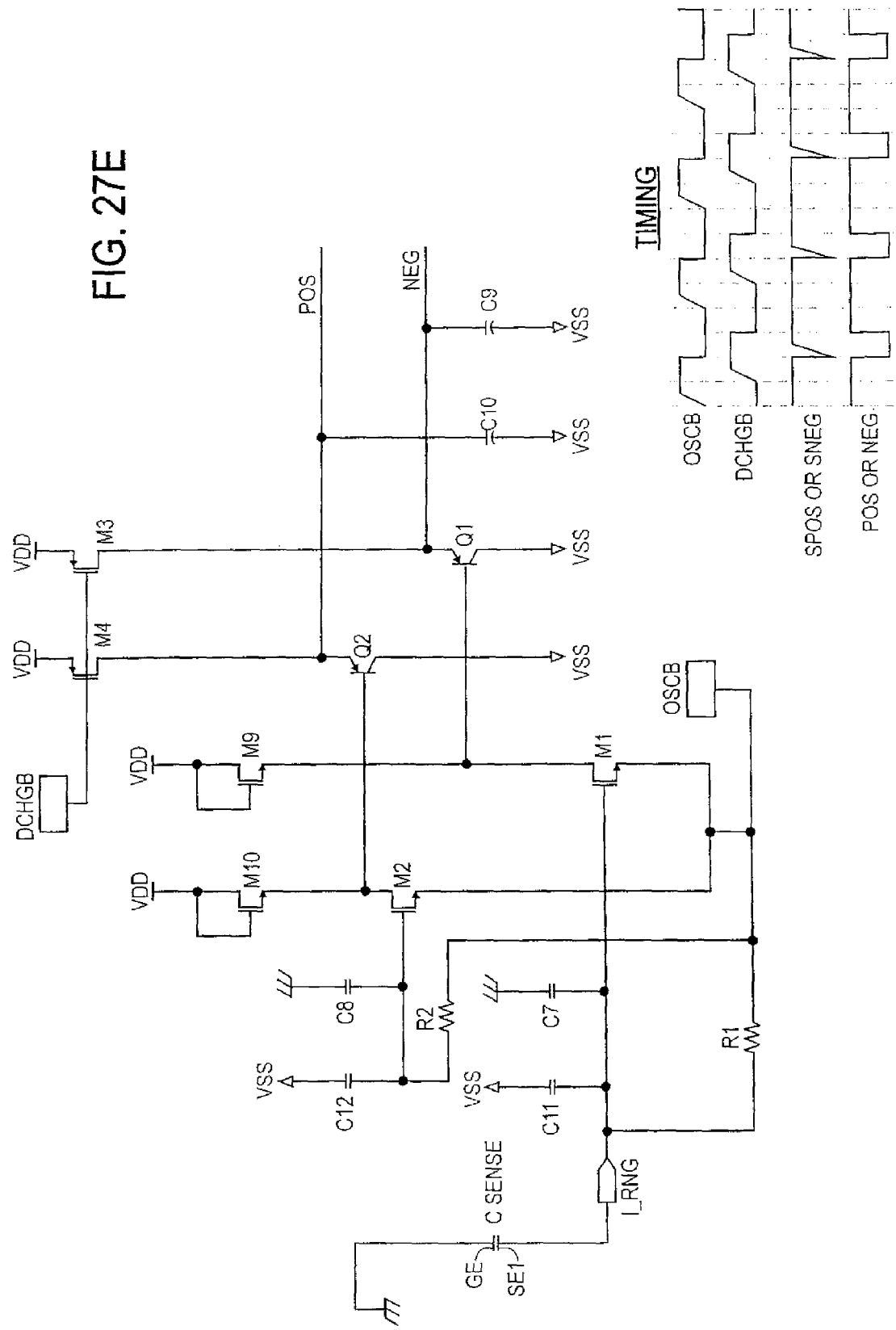
FIG. 27E depicts a circuit according to the present invention for use with the application described with reference to FIGS. 27A-27D.

FIGS. 27A-27D show a capacitive input liquid level sensing apparatus compatible with the integrated circuit of the present invention, wherein the capacitive input changes as a result of a change in the dielectric constant E.sub.r between two electrodes. This change can occur, for instance, when liquid replaces air between two electrodes GE and SE1 forming capacitance C.sub.sense. Thus, in FIG. 27A, grounded electrode GE on substrate 123 is separated from sensor electrode SE1 through an air gap that can be filled by liquid 125. FIG. 27B shows substrate 124 forming a reservoir for liquid 125 and substrate 123 adapted to allow liquid 125 to fill the air gap between grounded electrode GE and sensor electrode SE1 when liquid 125 reaches a certain level. FIGS. 27C and 27D illustrate one possible advantageous configuration of grounded electrode GE and sensor electrode SE1, coupled to integrated control circuit ICC. In both FIGS. 27C and 27D, electrodes GE and SE1 are long and disposed horizontally, i.e., with their longitudinal axes parallel with the surface of liquid 125, such that a small increase in the level of liquid 125 will significantly change capacitance C.sub.sense, shown schematically in FIG. 27D. The control circuit shown in FIG. 27E is the same as that shown in FIG. 26D, and it is equally compatible with the apparatus depicted in FIG. 27A-27D.

Figure 28C:
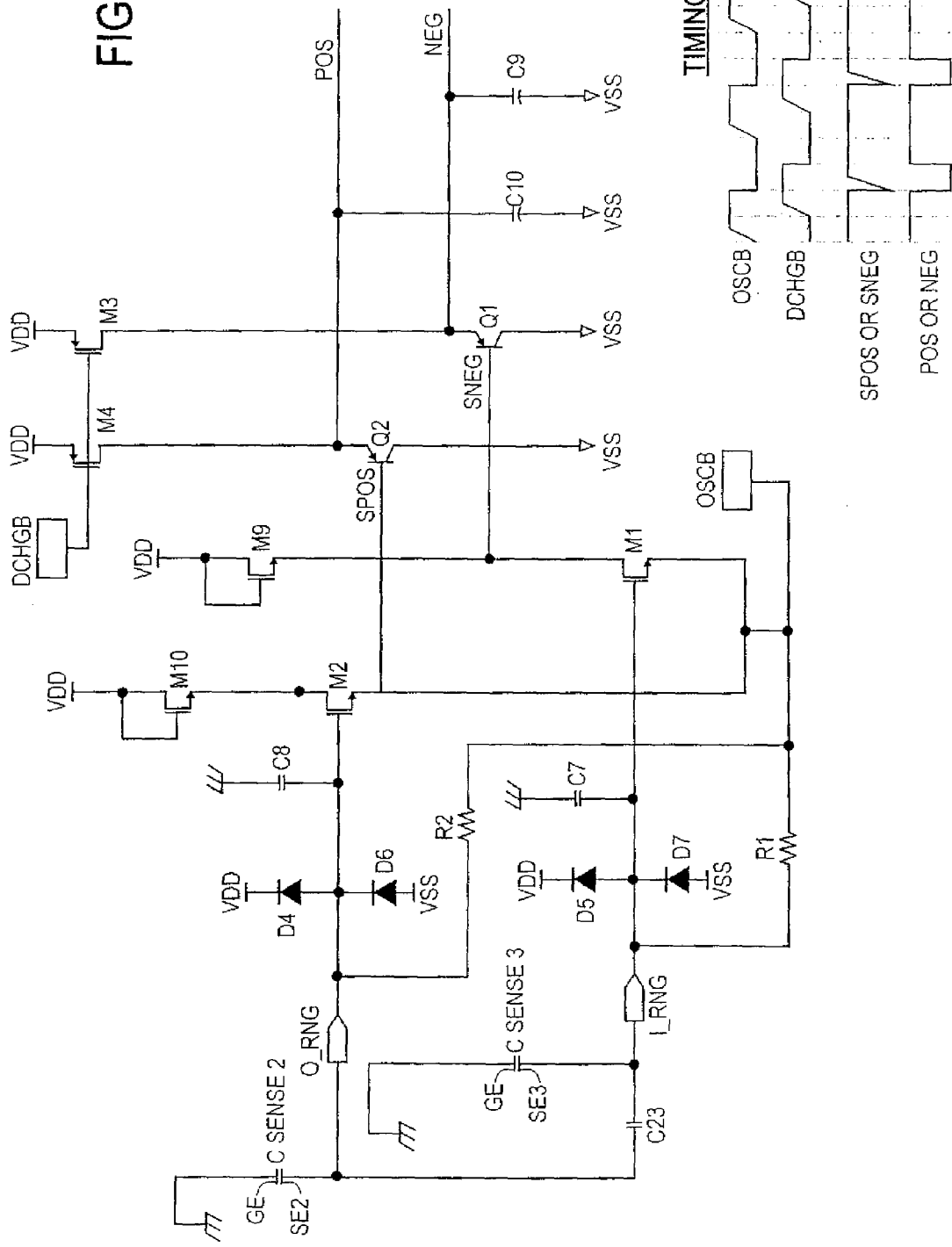
FIG. 28C depicts a circuit according to the present invention for use with the application described with reference to FIGS. 28A-28B.

FIGS. 28A-28B show a capacitive input sensing apparatus compatible with the integrated circuit of the present invention, wherein the capacitive input changes as a result of a change in the surface area s.sub.s3 of sensor electrode SE3. In FIG. 28A, substrate 126 bears a grounded electrode GE and movable substrate 127 bears two sensors electrodes SE2 and SE3 coupled to integrated control circuit ICC. Sensor electrode SE3 has a surface area s.sub.s2 that varies along the direction in which substrate 127 is adapted to be moved. Thus, FIG. 28B shows substrate 127 moved upward relative to its position in FIG. 28A. Surface area s.sub.s3 of sensor electrode SE3 seen by grounded electrode GE therefore decreases. This change in surface area corresponds to a change in capacitance C.sub.sense3, which is shown schematically in FIG. 28C. The control circuit depicted in FIG.

28C is similar to the circuit depicted in FIG. 18E, but has the dual electrode structure depicted in FIG. 11A, where electrodes E1 and E2 have been renamed sensor electrodes SE2 and SE3 and capacitance C6 has been renamed capacitance C23. The operation of the circuit will be understood by those skilled in the art and from the preceding discussion of FIGS. 11A and 18E.

Figure 29G:
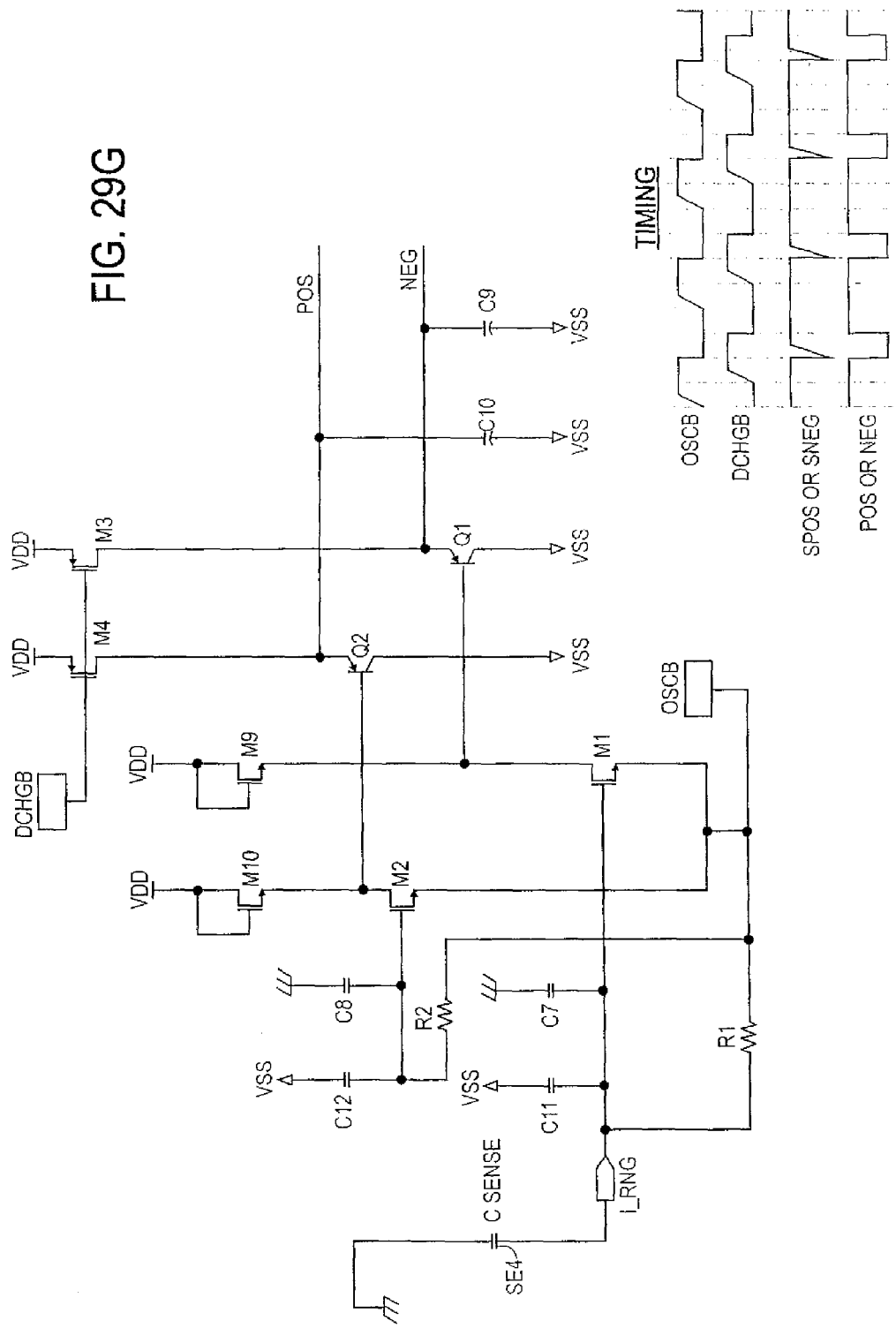

FIGS. 29A-29D show a capacitive input sensing dial apparatus compatible with the integrated circuit of the present invention, wherein input pulse widths and sequence can determine the integrated control circuit response. FIGS. 29A-29D show sensor electrode SE4 coupled to integrated control circuit ICC on substrate 128 and grounded electrodes GE1 and GE2 on rotating disc 129. In FIGS. 29A-29D, grounded electrodes GE1 and GE2 (including the space between them) together occupy only about one half the area of rotating disc 129 and are spaced apart. This, and other, similar configurations, can allow a control circuit to distinguish between clockwise and counterclockwise rotation of the dial device. FIGS. 29B-29C show the movement of rotating disc 129 relative to stationary substrate 128. FIGS. 29E and 29F show the output pulses of the dial apparatus depicted in FIGS. 29A-29D, which can create a response in an input portion of an integrated control circuit, as shown in FIG. 29G. FIG. 29E shows the relatively wide and spaced apart input pulses that result from counterclockwise rotation of rotating disc 129 at one speed and FIG. 29F shows the relatively narrow and close input pulses that result from clockwise rotation of rotating disc 129 at a faster speed. Changes in capacitance C.sub.sense, formed between electrodes SE4 and either GE1 and GE2 and shown schematically in FIG. 29G (which is similar to the configuration shown in FIG. 27E), can be detected by embodiments of the integrated control circuits of the present invention.

Figure 30H:
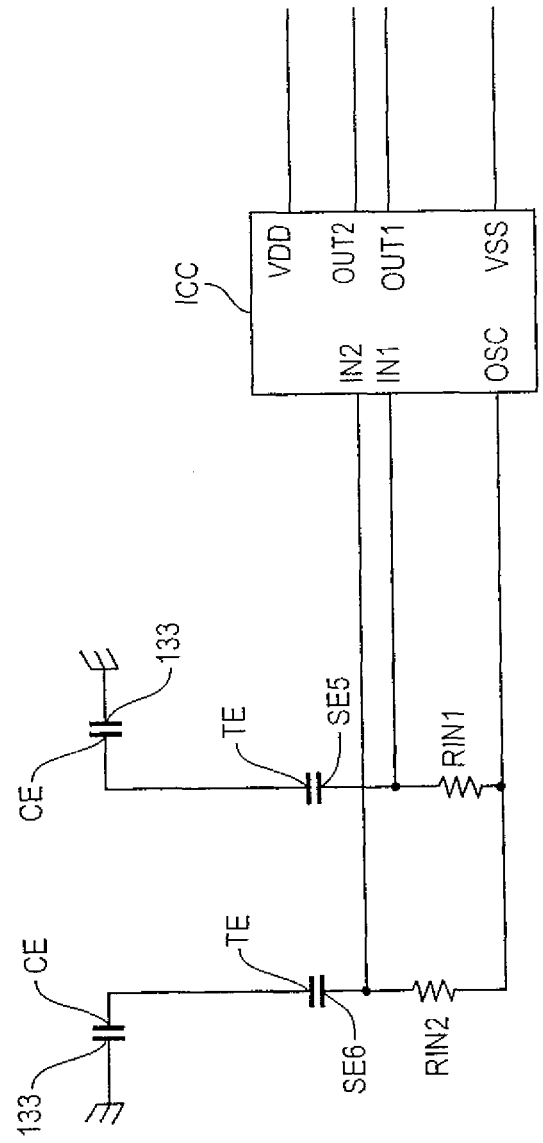
FIG. 30H shows a schematic of the input connections between the device of FIGS. 30A-30E and an integrated circuit for use with that device.

FIGS. 30A-30E show another capacitive sensing dial apparatus compatible with the integrated circuit of the present invention, wherein a coupling to ground is provided by the user. FIG. 30A shows rotating disc 130 having transfer electrodes TE1-TE8 of various sizes, which can correspond to input pulse widths of various sizes when they are coupled to ground. FIG. 30B shows the transfer electrodes TE1-TE8 of rotating disc 130 coupled to coupling electrode CE borne on cylinder 131. FIG. 30C shows cylinder 132, adapted to fit within cylinder 131 of FIG. 30B, having sensor electrodes SE5 and SE6 coupled to integrated control circuit ICC. FIG. 30D shows the components depicted in FIGS. 30A-30C assembled together as a rotary capacitive input device. FIG. 30E shows hand 133 grasping cylinder 131. Hand 133 couples coupling electrode CE and transfer electrodes TE1-TE8 to a virtual ground. Each sensor electrode SE5 and SE6, as shown in FIG. 30C, is adapted to receive capacitive input from one transfer electrode at a time. As shown in FIGS. 30E-30H, two input pulses can be fed to integrated control circuit ICC at a time. Both the direction and arc length of a user's turn of the dial comprising rotating disc 130 and cylinder 131 can be determined from the inputs shown in FIGS. 30F and 30G. FIG. 30F shows the pulse train resulting from two full turns of the dial device in a counterclockwise direction, where FIG. 30G shows the pulse train resulting from two turns in a clockwise direction. FIG. 30H shows a schematic representation of the dial device of FIG. 30E, including grounding hand 133, coupling electrode CE connected to transfer electrodes TE, which form a capacitance with sensor electrodes SE5 and SE6, coupled to resistances RIN1 and RIN2, respectively. Integrated control circuit ICC provides oscillating signal OSC to sensor electrodes SE5 and SE6 through resistances RIN1 and RIN2, respectively, and provides outputs OUT1 and OUT2 to a decision circuit (not shown). The various components of the dial device, including rotating disc 130 and cylinders 131 and 132 can be formed according to the invention described in U.S. Pat. No. 6,897,390, entitled Molded/Integrated Touch Switch/Control Panel Assembly and Method for Making Same, or in other ways.

Figure 31A:
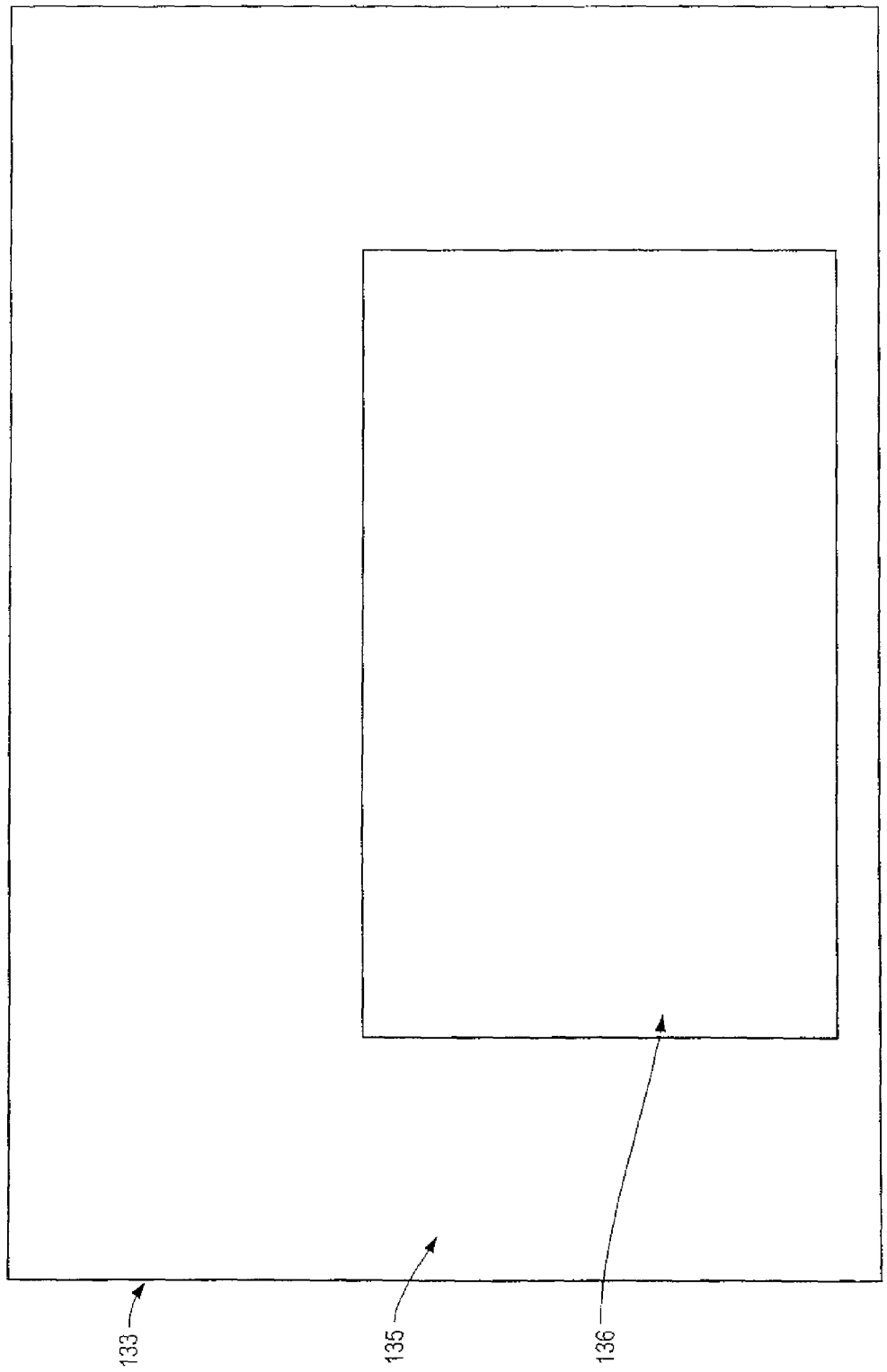
Figure 31B:
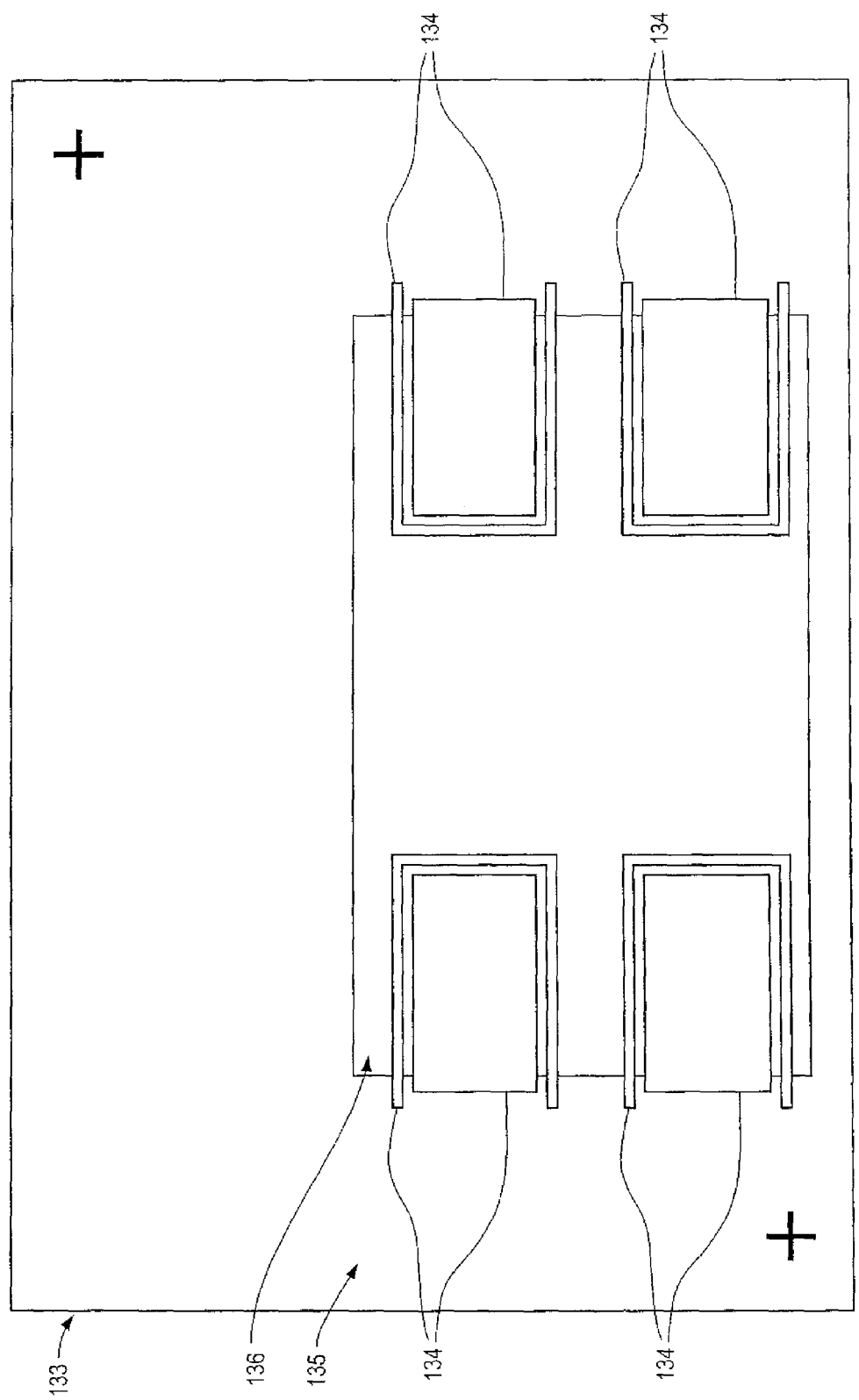
Figure 31F:
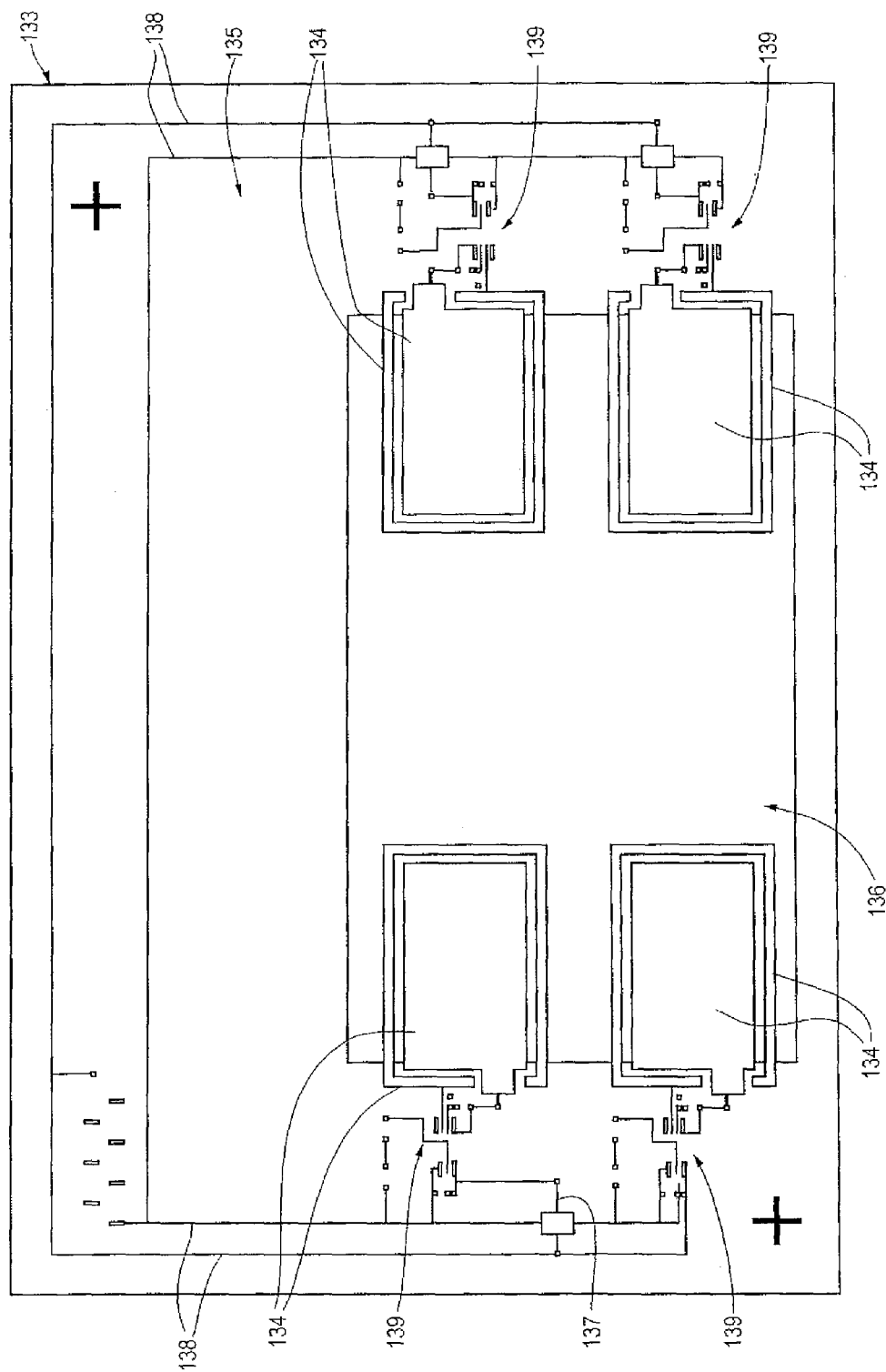

FIGS. 31A-31F show the separate layers and construction of a touch switch assembly having an integrated control circuit according to the present invention. FIGS. 31A-31E show the individual layers of the assembled touch switch depicted in FIG. 31F. FIG. 31A shows the backside of substrate 133 including opaque area 135 and window area 136. Opaque area 135 can be decorative frit, decorative epoxy, ultraviolet cured ink or any other decorative layer material. FIG. 31B shows the electrodes 134 of the touch switch borne on the backside of substrate 133 at window area 136. Electrodes 134 are shown overlapping opaque area 135 and can be composed of a transparent conductive material including indium tin oxide or other suitable material. FIG. 31C shows the bottom conductive layer of the touch switch assembly, as viewed from the backside, including circuit traces 138, which can be composed of silver loaded frit, silver epoxies, copper epoxies, electroplated conductors, and the like, as well as combinations of the above. FIG. 31D shows the dielectric layer of the touch switch having dielectric layer areas 140, which can be insulated ceramic frits, ultraviolet inks, epoxies and the like. FIG. 31E shows the crossover layer of the touch switch assembly, as viewed from the backside, including crossover conductors 137, which can be composed of the materials described with reference to FIG. 31C. FIG. 31F shows the separate layers depicted in FIGS. 31A-31E assembled together as a finished touch switch assembly. FIG. 31F provides a view from the backside of the assembly as well.

Figure 32:
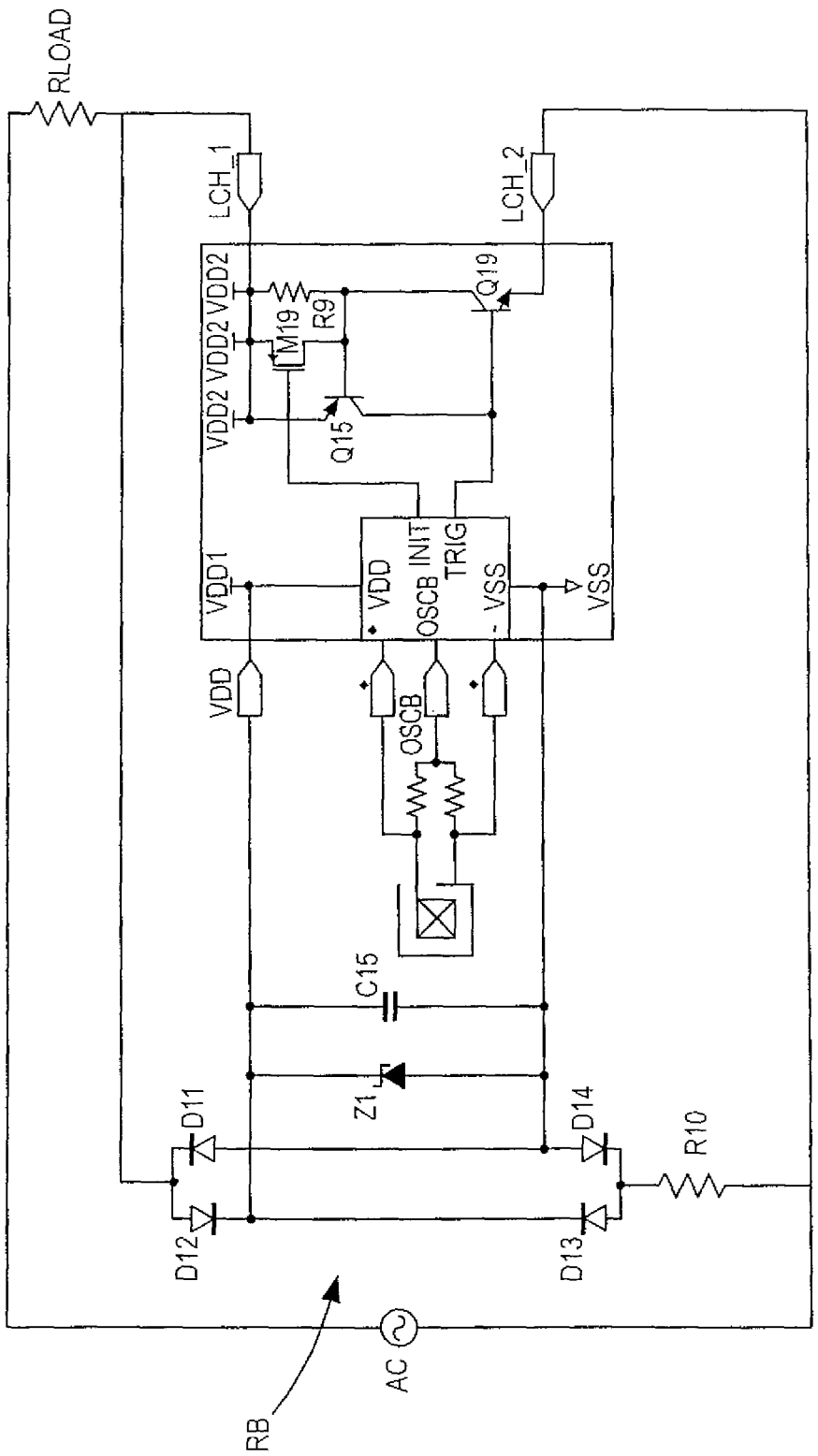
FIG. 32 shows an embodiment of the integrated circuit of the present invention using AC input and low current.

While the embodiments depicted above have been described as being in DC mode, the integrated control circuits of the present invention are also compatible with AC inputs and can therefore also operate in AC mode. The AC situation is depicted in FIG. 32. FIG. 32 shows a touch switch with integrated control circuit adapted to receive an AC input. In FIG. 32, AC signal AC is coupled to rectifier bridge RB, including diodes D11-D14, through resistances R10 and RLOAD. Rectifier bridge RB diodes D11-D14 are coupled in parallel with zener diode Z1 and capacitance C15. AC signal AC can stimulate the touch switch with integrated control circuit, including the latch portion shown in FIG. 24A with diode D8 removed. This configuration can be advantageous in that the integrated circuit can be designed to draw relatively little current and in that the circuit is characterized by low sensing impedance, which provides for a floating circuit that is not so ground dependent.

Figure 33A:
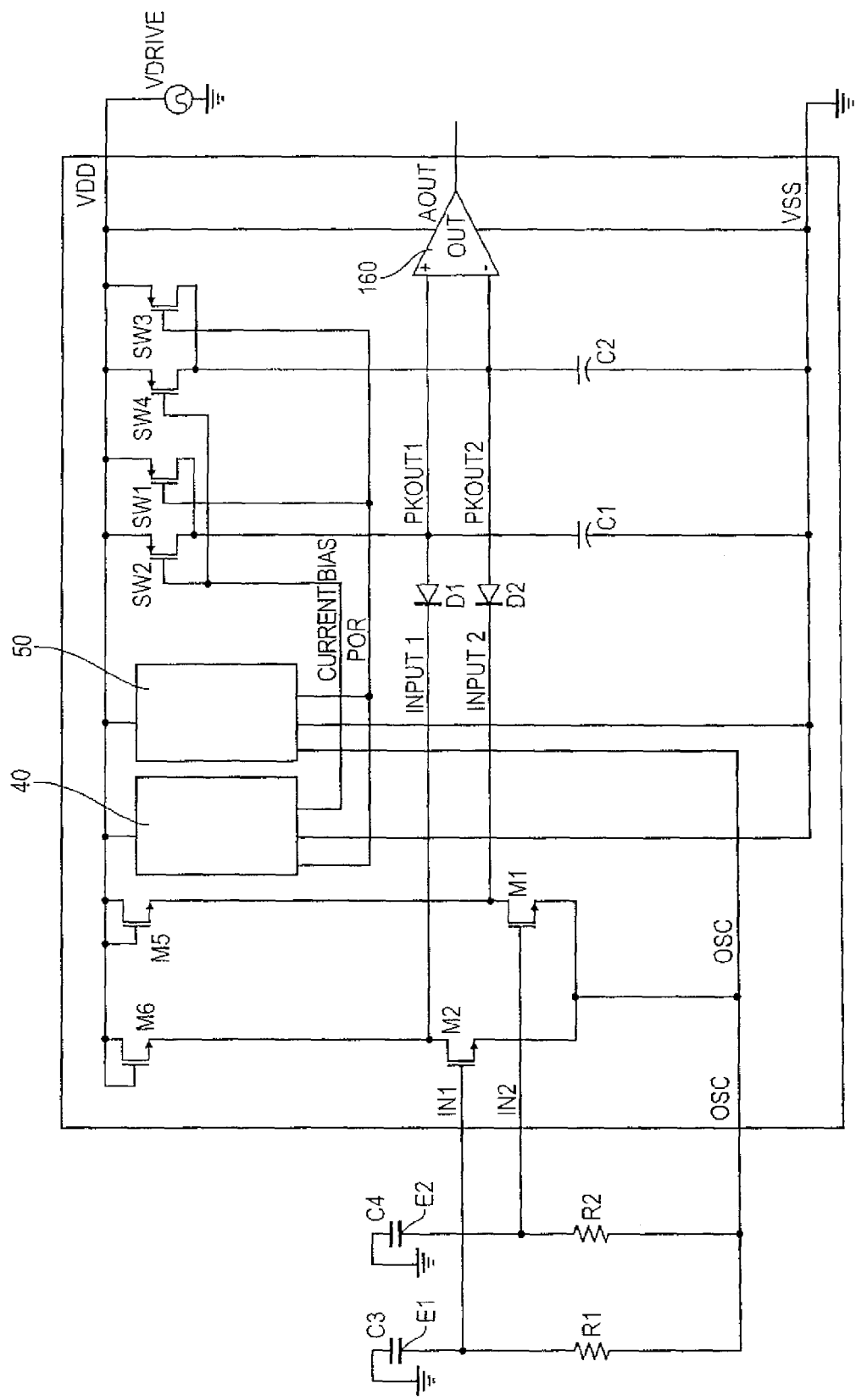
FIG. 33A shows the input and other portions of an embodiment of the integrated circuit of the present invention for use with electric field sensing applications that has an analog output.
Figure 33B:
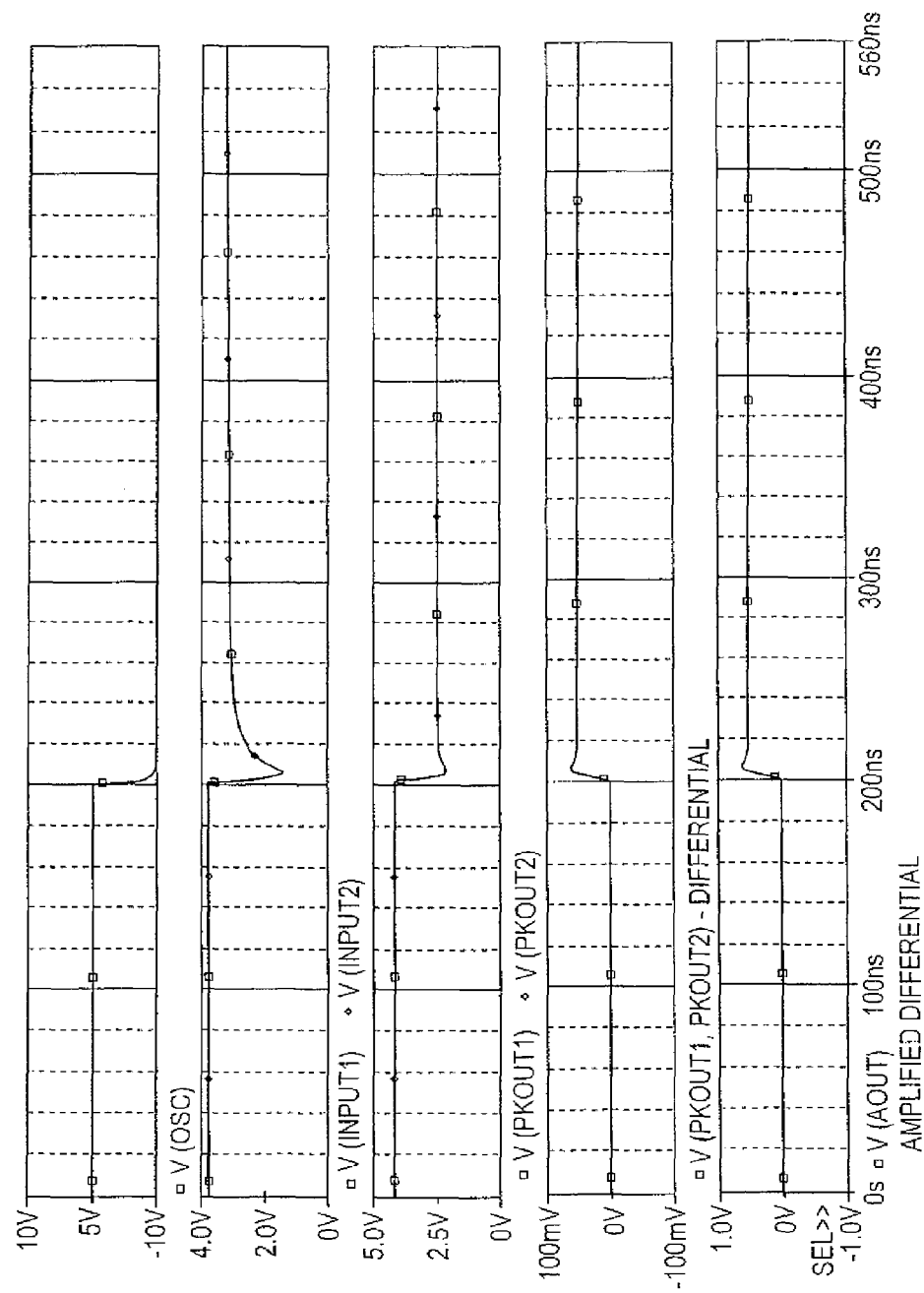
FIGS. 33B-33C show timing diagrams for the integrated circuit depicted in FIG. 33A.
Figure 33C:
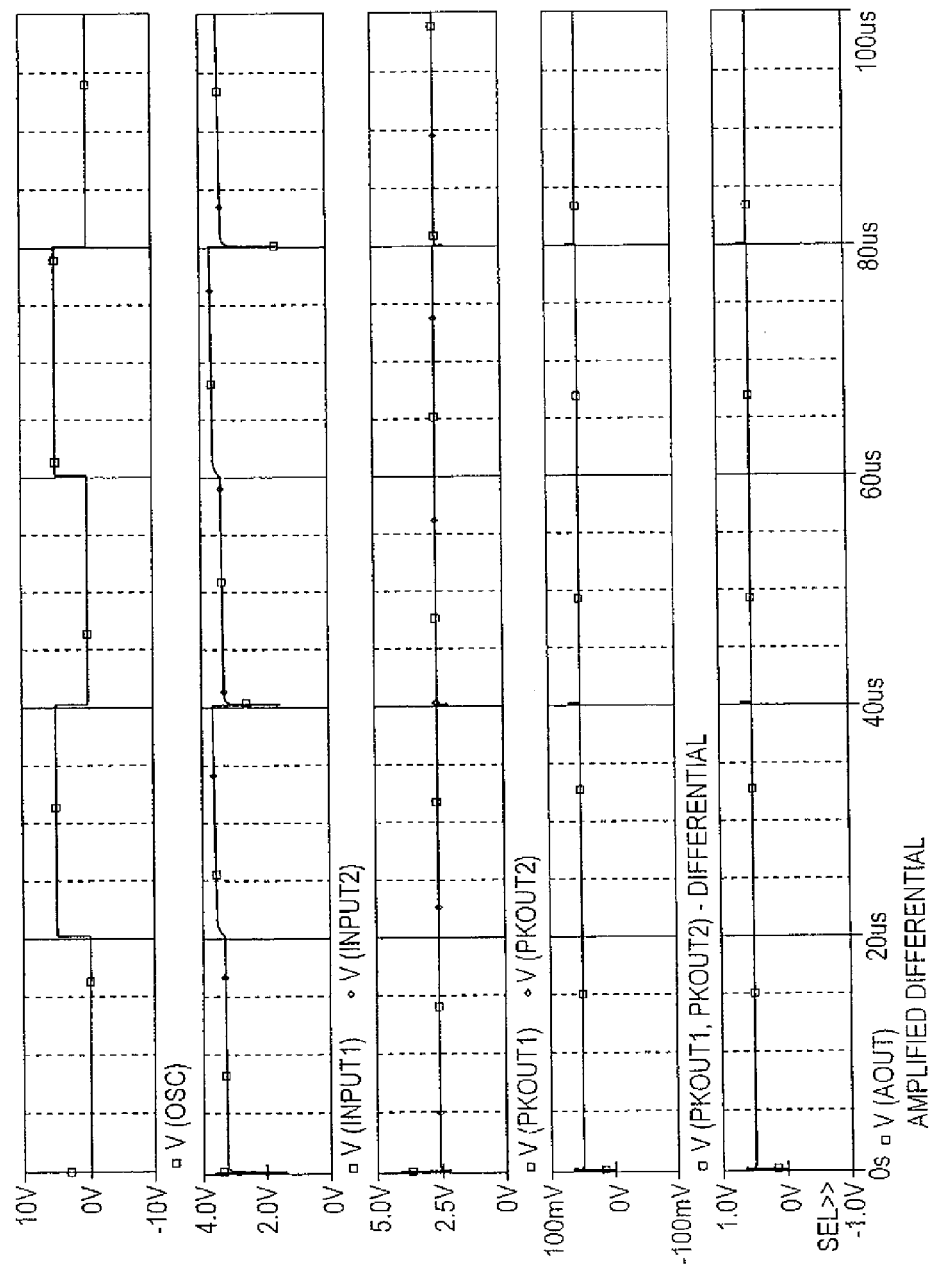

Although the embodiments of the present invention described above have been described as providing a digital output, many of the benefits of the touch switch with integrated control circuit configurations described above can also accrue where the integrated control circuit provides an analog output. In the digital output situation, the output reflects information provided by input to the electrodes for only two states, e.g., stimulated or not stimulated. In some applications it is desirable to provide output that can correspond to more than two states. For example, in liquid sensing applications, similar to the situation described with reference to FIGS. 27A-27D, it can be desirable to provide output that reflects not two states, but many states that can correspond to many liquid levels. An analog output can correspond to many input states. FIG. 33A shows possible circuitry for an analog electric field sensor with integrated control circuit. The circuit configuration of FIG. 33A corresponds to the circuit depicted in FIG. 4, and includes startup and bias circuit 40 providing a current bias to the gates of switches SW2 and SW4 and pulse generator and logic circuitry providing a power on reset signal POR to the gates of switches SW1 and SW3. The configuration of FIG. 33A also includes an input portion, including active devices M1, M2, M5 and M6, similar to the input portion described with reference to FIG. 12A. The drains of active devices M1 and M2 are coupled to traces INPUT1 and INPUT2 and, through diodes D1 and D2 to traces PKOUT1 and PKOUT2, which provide input to differential amplifying circuit 160. The operation of this circuit can be understood from the description provided with reference to FIGS. 4-7. The configuration depicted in FIG. 33A can provide the benefits of the configurations depicted in FIGS. 4-7, including sensor electrode and strobe signal buffering, common mode rejection of electrical interference at the electrodes and circuitry, temperature stability and the like. FIGS. 33B and 33C show timing diagrams for the circuitry depicted in FIG. 33A. FIGS. 33B and 33C show the oscillating signal OSC and the signals provided on traces N1, IN2, INPUT1 and INPUT2. FIG. 33B shows the signals as a function of time in microseconds and FIG. 33C shows the signals as a function of time in nanoseconds.

Figure 34:
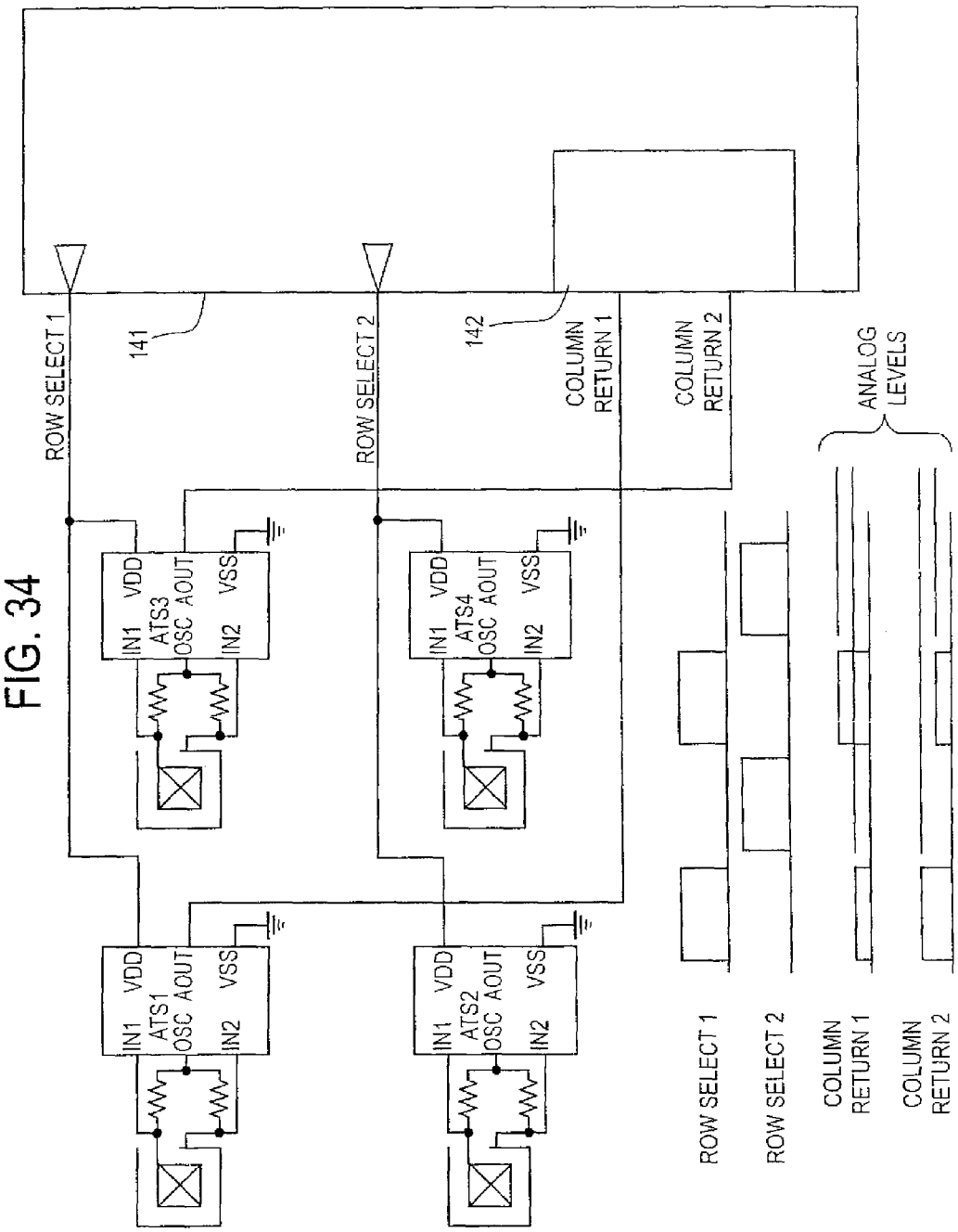
FIG. 34 shows a matrix of analog output sensors.

FIG. 34 shows a two-by-two matrix of the field sensors of FIG. 33A that accept analog input and provide analog output. The multiplexed system of FIG. 34 is similar to that shown in FIG. 10. Trace ROWSELECT1, having a signal provided by control circuit 141, will go high for a time period in which analog switches ATS1 and ATS3 have power applied to them. Analog outputs AOUT of analog switches ATS1 and ATS 3 will provide an output, provided to trace COLUMNRETURN1 and fed into analog interface circuit 142, that is proportional to the stimulus provided at the electrodes of analog switches ATS1 and ATS3. These outputs will be temperature stable, exhibit good signal to noise performance characteristics owing to the low impedance of the circuitry, and exhibit common mode rejection properties, as well. The analog signals could be processed in a manner similar to that described in U.S. Pat. No. 5,594,222, or using other analog processing techniques as will be understood by those skilled in the art of electrical circuit design.

Figure 35A:
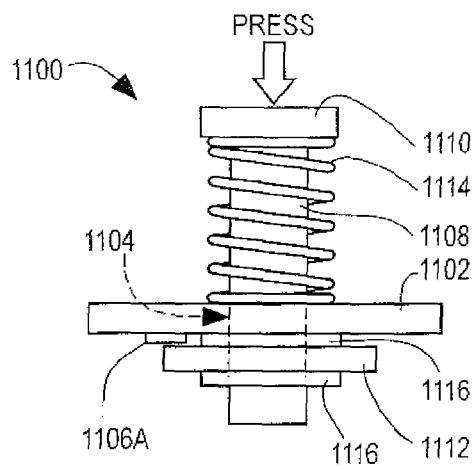
FIG. 35A is a side elevation view of an embodiment of a push button switch emulation according to the present invention.
Figure 35C:
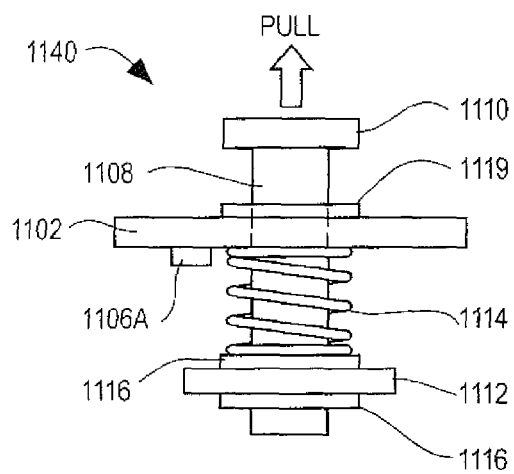
FIG. 35C is a side elevation view of an alternate embodiment of a push button switch emulation according to the present invention.
Figure 35B:
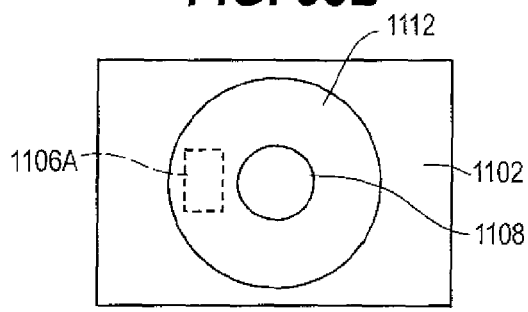
FIG. 35B is a bottom plan view of an embodiment of a push button switch emulation according to the present invention.

FIGS. 35A-35B illustrate an embodiment 1100 of the present invention wherein a field effect sensor is used in connection with other structure to emulate a mechanical pushbutton switch. Embodiment 1100 includes dielectric substrate 1102, which can be embodied in any suitable form. Preferably, substrate 1102 is substantially rigid. For example, substrate 1102 can be a conventional printed wiring board or a panel or portion of a larger assembly or component, for example, the door panel or dashboard of an automobile or an interior panel of a refrigerator. Alternatively, substrate 1102 can be a flexible circuit carrier. In such an embodiment, the flexible circuit carrier preferably is applied to a substantially rigid secondary substrate (not shown). Substrate 1102 can take any other suitable form, as would be recognized by one skilled in the art.

Substrate 1102 defines aperture 1104. Field effect sensor 1106A is disposed on substrate 1102, in proximity to aperture 1104. Field effect sensor 1106A is shown in FIG. 35A as disposed on one side of substrate 1102. Alternatively, field effect sensor 1106A could be disposed on the other side of substrate 1102. Further, in embodiments where field effect sensor 1106A includes two or more electrodes, one or more such electrodes can be disposed on one side of substrate 1102 and the other electrode(s) can be disposed on the other side of substrate 1102. In other embodiments, field effect sensor 1106A can be encapsulated within substrate 1102, as shown with respect to field effect sensor 1106E in FIG. 1D, discussed further below.

Shaft 1108 is inserted in sliding engagement through aperture 1104. A sleeve, bushing, or the like (not shown) can be provided in connection with aperture 1104 to better enable shaft 1108 to slide through aperture 1104 without wobbling. Shaft 1108 preferably includes knob 1110. In the illustrated embodiment, shaft 1108 is a threaded plastic bolt, the head of which forms knob 1110. In other embodiments, shaft 1108 can take any suitable form and can be made of any suitable material, as would be recognized by one skilled in the art. Preferably, shaft 1108 is made of a non-conductive material, such as plastic or resin.

Electric field stimulator 1112 is attached to shaft 1108 at a predetermined location. Electric field stimulator 1112 is made of a material that readily stimulates or disturbs an electric field, as discussed above. Preferably, electric field stimulator 1112 is made of metal or other conductive material, but other materials are suitable as well, as would be known to one skilled in the art. In the FIG. 35A embodiment, electric field stimulator 1112 is a metal washer secured to shaft 1108 with a threaded plastic washers 1116 on each side of electric field stimulator 1112. In other embodiments, electric field stimulator 1112 can take other forms, be made of other materials, and be attached to shaft 1108 by any suitable means, as would be known to one skilled in the art.

Plastic washer 1116 installed between substrate 1102 and electric field stimulator 1112 preferably is sufficiently thick to prevent electric field stimulator 1112 from contacting the electrode(s) of field effect sensor 1106A. Alternatively, other structures (not shown) can be provided to prevent electric field stimulator 1112 from making contact with the electrode(s) of field effect sensor 1106A, as would be known to one skilled in the art.

FIG. 35A shows electric field stimulator 1112 located on the same side of substrate 1102 as field effect sensor 1106A and on the opposite side of substrate 1102 as head 1110. Alternatively, electric field stimulator 1112 and field effect sensor 1106A can be located on opposite sides of substrate 1102, and electric field stimulator 1112 and head 1110 can be located on the same side of substrate 1102.

Shaft 1108 is biased longitudinally so that electric field stimulator 1112 normally is in a predetermined position relative to field effect sensor 1106A. Shaft 1108 and, therefore, electric field stimulator 1112, can be displaced from their normal positions by applying an appropriate force to head 1110. In the FIG. 35A embodiment, biasing is provided by coil spring 1114 installed about shaft 1108 between knob 1110 and a corresponding surface of substrate 1102, such that electric field stimulator 1112 is normally near field effect sensor 1106A. Electric field stimulator 1112 is displaced away from field effect sensor 1106A when a longitudinal force is applied to shaft 1108. In alternative embodiments, shaft 1108 can be biased so that electric field stimulator 1112 normally is distant from field effect sensor 1106A and is displaced nearer field effect sensor 1106A when a suitable force is applied to shaft 1108, as would be recognized by one skilled in the art. In further alternative embodiments, coil spring 1114 can be replaced with any suitable structure for biasing shaft 1108. For example, a layer of flexible and/or resilient material (not shown) might be disposed on substrate 1102 about aperture 1104, or substrate 1102 itself might be comprised of a flexible and/or resilient material that deforms when knob 1110 is pressed against it and returns to its original position when released, thus returning knob 1110, shaft 1108 and electric field stimulator 1112 to their original positions.

Any number of other structures can be used to bias shaft 1108, as would be known to one skilled in the art In operation, an electric field is generated about field effect sensor 1106A, as discussed above. With shaft 1108 in the normal position as shown in FIG. 35A, electric field stimulator 1112 is coupled to this electric field. Detection circuitry (not shown) associated with field effect sensor 1106A detects this coupling, as discussed above. When shaft 1108 is displaced longitudinally in response to, for example, a user pressing down on knob 1110, electric field stimulator 1112 moves away from field effect sensor 1106A and decouples from the electric field about field effect sensor 1106A. The corresponding detection circuitry (not shown) detects this decoupling and provides a signal to a control circuit, which, in turn, can provide a control signal to a controlled device, as discussed above. In this manner, embodiment 1100 emulates a mechanical pushbutton switch.

FIG. 35C illustrates an alternate embodiment 1140 of the present invention emulating a mechanical pull switch. Embodiment 1140 is structurally similar to embodiment 1100, except that shaft 1108 is biased so that electric field stimulator 1112 normally is positioned at a predetermined distance from field effect sensor 1106A. As such, electric field stimulator 1112 normally is decoupled from the electric field about field effect sensor 1106A. In order to actuate field effect sensor 1106A, a user would pull on knob 1110, thus drawing electric field stimulator 1112 near field effect sensor 1106A and causing electric field stimulator 1112 to couple with the electric field about field effect sensor 1106A. Preferably, a mechanical stop, for example, mechanical stop 1119 attached to shaft 1108 at a predetermined location, is provided to limit the travel of shaft 1108 by coil spring 1114 or other biasing means.

Figure 35D:
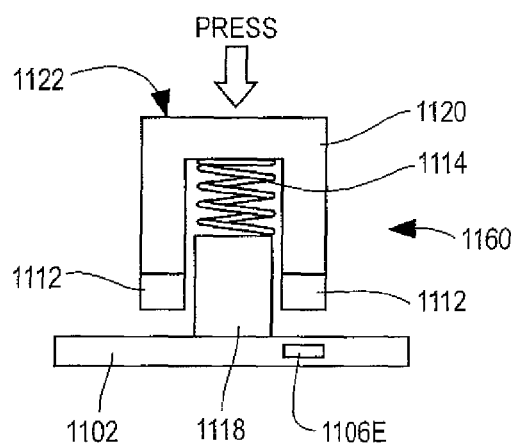
FIG. 35D is a side elevation view of another alternate embodiment of a push button switch emulation according to the present invention.

FIG. 35D illustrates another alternate embodiment 1160 of the present invention emulating a mechanical pushbutton switch. Embodiment 1160 includes post 1118 disposed on substrate 1102. Field effect sensor 1106E is encapsulated within substrate 1102 in proximity to post 1118. In other embodiments, field effect sensor 1106E can be disposed on either surface of substrate 1102 in the manner of field effect sensor 1106A, as illustrated in and discussed in connection with FIG. 35A.

Push button 1120 having a bearing surface 1122 is slidingly engaged with post 1118. Electric field stimulator 1112 is associated with a lower portion of push button 1120 nearest substrate 1102. Push button 1120 and electric field stimulator 1112 can, but need not be, separate structures. Indeed, push button 1120 and electric field stimulator 1112 can be embodied as a single, monolithic structure.

Coil spring 1114 biases push button 1120 so that field effect stimulator 1112 normally is located at a predetermined distance from field effect sensor 1106E. Application of an appropriate force to bearing surface 1122 displaces field effect stimulator 1112 toward field effect sensor 1106E. Field effect sensor 1106E and the associated detection circuitry respond as discussed above. Significantly, this embodiment 1160 does not include an aperture in substrate 1102. As such, embodiment 1160 may be particularly preferable for use in applications where it is desirable to preclude intrusion of fluids or contaminants through substrate 1102. Embodiment 1160 readily could be modified to function as a pull switch, as would be recognized by one skilled in the art.

Figure 35E:
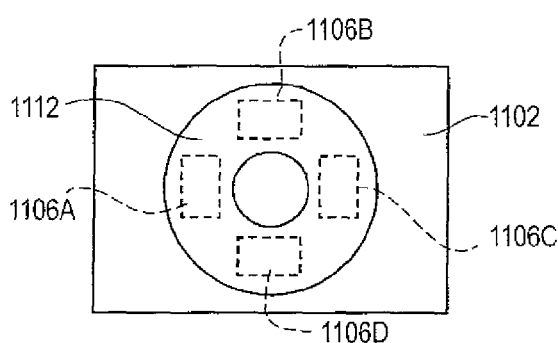
FIG. 35E is a bottom plan view of yet another alternate embodiment of a push button switch emulation according to the present invention.

More than one field effect sensor can be used in connection with any of the foregoing embodiments. FIG. 35E illustrates an embodiment using four field effect sensors 1106A-1106D arranged about aperture 1104 of embodiments 1100 and 1140. Embodiment 1160 could be similarly modified. Other embodiments could use more or fewer than four field effects sensors.

In embodiments using plural field effect sensors 1106A-1106n, the sensors and corresponding detection and control circuits can be configured so that electric field stimulator 1112 couples to or decouples from the electric field or fields about each individual field effect sensor 1106i substantially simultaneously as electric field stimulator 1112 is moved toward or away from the field effect sensors 1106A-1106n. Alternatively, such embodiments can be configured (through, for example, sensor and/or stimulator geometry) so that electric field stimulator 1112 couples to or decouples from the electric field or fields about each field effect sensor 1106i as electric field stimulator 1112 reaches different points in its travel toward or away from field effect sensors 1106A-1106n.

Other modifications to the foregoing embodiments are possible. For example, the biasing means could be omitted from any of the foregoing embodiments so that shaft 1108 or push button 1120 remain in the last position in which placed by a user. Also, while shaft 1108 and post 1118 are shown as substantially perpendicular to substrate 1102, shaft 1108 and post 1118 could be configured at other angles to substrate 1102, as would be known to one skilled in the art.

Figure 36A:
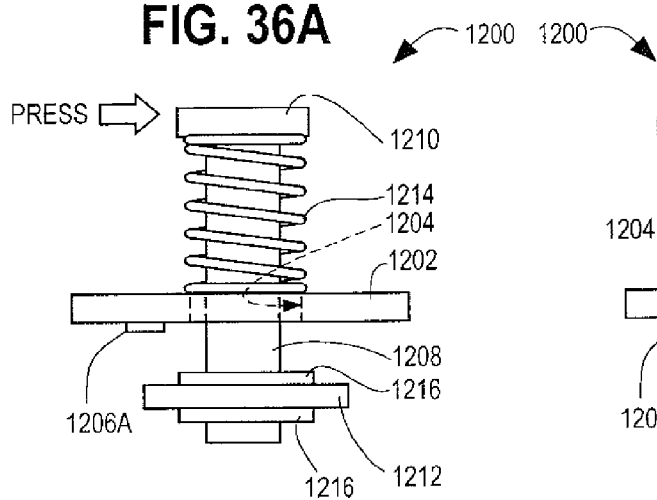
FIG. 36A is a side elevation view of an embodiment of a toggle switch emulation according to the present invention.
Figure 36B:
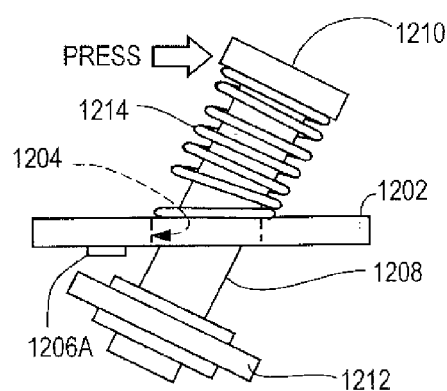
FIG. 36B is a side elevation view of an embodiment of a toggle switch emulation according to the present invention.

FIGS. 36A-36B illustrate an embodiment 1200 of the present invention emulating a mechanical toggle switch. Embodiment 1200 includes substrate 1202 defining aperture 1204. Field effect sensor 1206A is disposed on substrate 1202 in proximity to aperture 1204. Shaft 1208 extends through and is pivotally connected to substrate 1202 at aperture 1204. Shaft 1208 can, but need not, include knob 1210. A bearing (not shown), for example, a cylindrical or spherical bearing, or other means (not shown) can be provided at aperture 1204 to provide support for and/or restrict the degree and direction of movement of shaft 1208. For example, in an embodiment intended for use as a simple on-off switch, it might be desirable to restrict shaft 1208 so that it can be moved only in a single plane, for example, to the left and right in the FIG. 36A embodiment.

Electric field stimulator 1212 is attached to shaft 1208 at a predetermined location, as discussed above in connection with embodiment 1100. In the FIGS. 36A-36B embodiment, coil spring 1214 is inserted between head 1210 and substrate 1202, biasing shaft 1208 to a centered position where shaft 1208 is substantially perpendicular to substrate 1202. In other embodiments, other means can be used to bias shaft 1208 to a centered position or another desired position, as would be recognized by one skilled in the art. Alternatively, such biasing means can be omitted so that shaft 1208 normally rests in the last position to which it was moved.

In operation, an electric field is generated about field effect sensor 1206A, as discussed above. With shaft 1208 in the centered position, electric field stimulator 1212 is sufficiently removed from this electric field so that electric field stimulator 1212 does not disturb this electric field. When shaft 1208 is displaced, for example, by a user applying a perpendicular force to shaft 1208, electric field stimulator 1212 is displaced so that at least a portion of electric field stimulator 1212 moves closer to field effect sensor 1206A, thus disturbing the electric field about field effect sensor 1206A. Detection circuitry associated with field effect sensor 1206A detects this disturbance and, in turn, sends an output signal to corresponding control circuitry, as discussed above.

Embodiment 1200 can be readily modified to yield a combination toggle/pushbutton embodiment (not shown) by adapting the connection between shaft 1208 and aperture 1204 such that shaft 1208 can both toggle about and slide through aperture 1204, as would be understood by one skilled in the art.

Figure 36C:
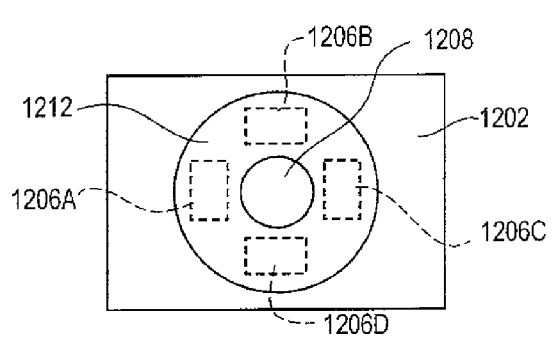
FIG. 36C is a bottom plan view of an embodiment of a toggle switch emulation according to the present invention.

FIG. 36C illustrates an alternate embodiment including four field effect sensors 1206A-1206D located in proximity to aperture 1204 and spaced from each other about aperture 1204 at 90.degree. intervals. Each field effect sensor 1206A-1206D includes corresponding field generation and detection circuitry. A particular field effect sensor 1206i is actuated when, in response to toggling of shaft 1208, electric field stimulator 1212 comes sufficiently close to such field effect sensor 1206i as to disturb the electric field about field effect sensor 1206i. Typically, only one field effect sensor 1206i is actuated at any time. However, field effect sensors 1206A-1206D (and their corresponding field generation and detection circuits) can be adapted so that two (or more) adjacent field effect sensors 1206i are simultaneously actuated when electric field stimulator 1212 is positioned near them. For example, in the FIG. 36C embodiment, electric field stimulator 1212 could couple to both field effect sensors 1206A and 1206B when shaft 1208 is toggled in a manner that positions at least a portion of electric field stimulator 1212 between field effect sensors 1206A and 1206B. In alternate embodiments, more or fewer than four field effect sensors can be arranged on substrate 1202 about aperture 1204 in any desired arrangement, as would be recognized by one skilled in the art.

Figure 36D:
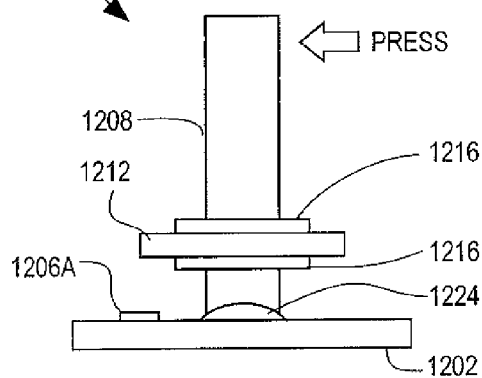
FIG. 36D is a side elevation view of an alternate embodiment of a toggle switch emulation according to the present invention.

FIG. 36D illustrates another embodiment 1240 of the present invention emulating a mechanical toggle switch. Embodiment 1240 includes shaft 1208 connected to substrate 1202 at pivot point 1224. In this embodiment, shaft 208 does not penetrate substrate 1202. Electric field stimulator 1212 is attached to shaft 1208 at a predetermined distance from pivot point 1224. Biasing means (not shown) can be provided to bias shaft 1208 to any desired position.

FIGS. 37A-37D illustrate an embodiment 1300 of the present invention emulating a mechanical rotary switch. Substrate 1302 defines aperture 1304. Inner field effect sensor 1306A and outer field effect sensor 1306B are disposed on a surface of substrate 1302 at first and second predetermined distances, respectively, from aperture 1304. Shaft 1308 is inserted through and free to rotate within aperture 1304. A bushing, bearing, or other means (not shown) can be provided to better enable shaft 1308 to rotate within aperture 1304 and preclude shaft 1308 from sliding through aperture 1304. Preferably, shaft 1308 includes knob 1310 to facilitate grasping and rotation of shaft 1308 by a user.

Electric field stimulator mounting plate 1330 is attached to shaft 1308 at a predetermined distance from substrate 1302 by any suitable means, as would be known to one skilled in the art. Inner electric field stimulators 1332 are mounted on electric field stimulator mounting plate 1330 in an annular arrangement at a predetermined distance from the center of electric field stimulator mounting plate 1330. This predetermined distance corresponds to and preferably is equal to the predetermined distance from the center of aperture 1304 to inner field effect sensor 1306A. Similarly, outer electric field stimulators 1334 are mounted on electric field stimulator mounting plate 1330 in an annular arrangement at a predetermined distance from the center of electric field stimulator mounting plate 1330 corresponding to and preferably equal to the predetermined distance from the center of aperture 1304 to outer field effect sensor 1306B. Preferably, the angular spacing between adjacent inner electric field stimulators 1332 is equal. Similarly, the angular spacing between adjacent outer electric field stimulators 1334 also preferably is equal.

In operation, a user rotates knob 1310, in turn rotating shaft 1308 and electric field stimulator mounting plate 1330. As electric field stimulator mounting plate 1330 rotates, each inner electric field stimulator 1332 alternately couples with and decouples from the electric field about inner field effect sensor 1306A. Similarly, each outer electric field stimulator 1334 alternately couples with and decouples from the electric field about outer field effect sensor 1306BA. Detection circuits associated with field effect sensors 1306A, 1306B detect this coupling and decoupling and provide corresponding output signals to a control circuit (not shown). The control circuit can be adapted to recognize the degree and rate of rotation of knob 1310 based on these signals.

Preferably, inner electric field stimulators 1332 are neither radially aligned with nor angularly centered between adjacent outer electric field stimulators 1334. As such, inner electric field stimulators 1332 will couple to and decouple from the electric field about inner field effect sensor 1306A at certain angular displacements of knob 1310 and outer electric field stimulators 1334 will couple to and decouple from the electric field about outer field effect sensor 1306B at different angular displacements of knob 1310. FIG. 37E illustrates typical streams of output signals from the detection circuits associated with field effect sensors 1306A,1306B as knob 1310 is turned in a particular direction. Based on these signals, a microprocessor can determine whether knob 1310 is being turned clockwise or counterclockwise, as would be recognized by one skilled in the art.

In alternate embodiments, one of inner field effect sensor 1306A and outer field effect sensor 1306B can be omitted. In such embodiments, the corresponding inner electric field stimulators 1332 or outer electric field stimulators 1334 preferably also would be omitted.

In other alternate embodiments, shaft 1308 can be adapted to slide longitudinally through, as well as rotate within, aperture 1304, and means can be provided to bias shaft 1308 longitudinally, as discussed above in connection with the mechanical pushbutton switch emulation embodiments, thus yielding a combination rotary/push and/or pull switch emulation embodiment. Such embodiments can include one or more additional field effect sensors and/or electric field stimulators to facilitate such push and/or pull switch functionality, as would be understood by one skilled in the art.

Figure 37F:
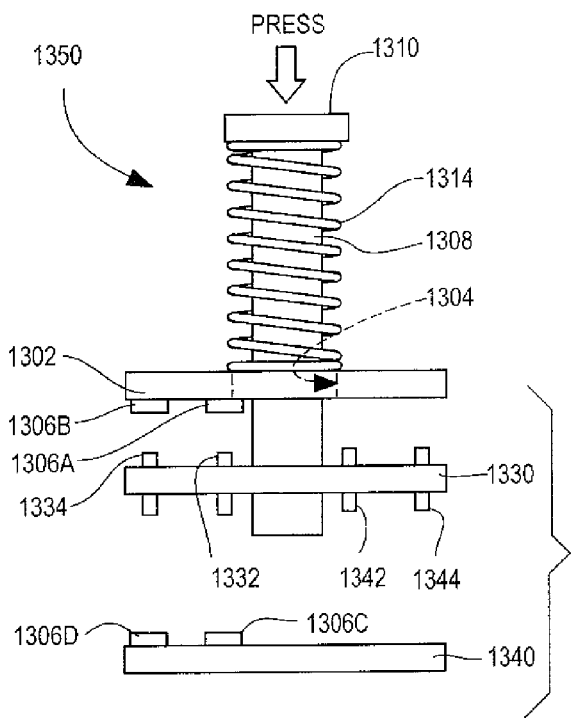
FIG. 37F is a side elevation view of an alternate embodiment of a rotary switch emulation according to the present invention.

FIG. 37F illustrates an alternate rotary switch emulation embodiment 1350 of the present invention. Embodiment 1350 includes a second substrate 1340 in predetermined spatial relationship with substrate 1302. Second inner and outer field effect sensors 1306C,1306D are disposed on second substrate 1340. Second inner and outer electric field stimulators 1342,1344 are disposed on a second surface of electric field stimulator mounting plate 1330, opposite the surface on which inner and outer electric field stimulators 1332,1334 are disposed. Shaft 1308 is free to slide through, as well as rotate within, aperture 1304.

FIG. 37F illustrates electric field stimulator mounting plate 1330 in a first position where inner and outer electric field stimulators 1332,1334 are in relatively close proximity to substrate 1302 (and, therefore, the annuli in which inner and outer field effect sensors 1306A, 1306B are located) and second inner and outer electric field stimulators 1342,1344 are relatively far from second substrate 1340. In this position, rotation of knob 1310 causes inner and outer electric field stimulators 1332,1334 to alternately couple to and decouple from the electric fields about inner and outer field effect sensors 1306A,1306B, respectively. In this position, second inner and outer electric field stimulators 1332,1334 remain sufficiently far from second inner and outer field effect sensors 1306C,1306D so that second inner and outer electric field stimulators 1342,1344 do not couple to and decouple from the electric fields about respective field effect sensors 1306C,1306D.

By pressing on knob 1310, a user can displace electric field stimulator mounting plate 1330 to a second position where inner and outer electric field stimulators 1332,1334 are relatively far from substrate 1302 and second inner and outer electric field stimulators 1332,1334 are in relatively close proximity to second substrate 1340 (and, therefore, the annuli in which second inner and outer field effect sensors 1306C, 1306D are located). In this position, rotation of knob 1310 causes second inner and outer electric field stimulators 1342, 1344 to alternately couple to and decouple from the electric fields about second inner and outer field effect sensors 1306C, 1306D, respectively. In this position, inner and outer electric field stimulators 1332,1334 remain sufficiently far from inner and outer field effect sensors 1306A,1306B so that inner and outer field effect sensors 1306A,1306B do not couple to and decouple from the electric fields about respective field effect sensors 1306A,1306B.

Coil spring 1314 can be provided to-bias electric field stimulator mounting plate 1330 to a "normal" position, as illustrated in FIG. 37F. In other embodiments, electric field stimulator mounting plate 1330 can be biased to a different "normal" position. In further embodiments, coil spring 1314 can be omitted, so that electric field stimulator mounting plate 1330 remains in any desired position between substrate 1302 and second substrate 1340. Further, embodiment 1350 can be adapted so that both sets of inner and outer electric field stimulators 1332,1334 and 1342,1344 can couple to the electric fields about respective field effect sensors 1306A,1306B, 1306C,1306D when electric field stimulator mounting plate 1330 is positioned substantially midway between substrate 1302 and second substrate 1340. Alternatively, embodiment 1350 can be adapted so that no electric field stimulator can couple to its respective field effect sensor when electric field stimulator mounting plate is so positioned.

Figure 37G:
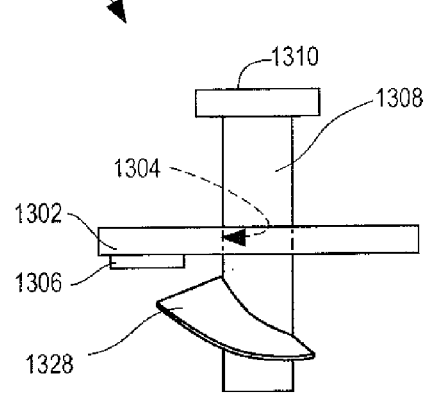
FIG. 37G is a side elevation view of another alternate embodiment of a rotary switch emulation according to the present invention.

All of the foregoing embodiments are suitable for use in connection with analog or digital detection and control circuitry, as would be understood by one skilled in the art. FIG. 37G illustrates an alternate embodiment 1360 of the present invention emulating a mechanical rotary switch that is particularly well-suited for use in connection with analog detection and control circuitry. Embodiment 1360 includes substrate 1302 defining aperture 1304. Field effect sensor 1306 is disposed on substrate 1302 in proximity to aperture 1304. Shaft 1308 is inserted through and free to rotate within aperture 1304. In the illustrated embodiment, shaft 1308 is fixed longitudinally. In other embodiments, shaft 1308 can be adapted to slide through aperture 1304. Shaft 1308 preferably includes knob 1310 at one end. Electric field stimulator 1328 is attached to shaft 1308 at a predetermined distance from substrate 1302. Electric field stimulator 1328 preferably is tapered like a propeller blade so that the distance between field effect sensor 1306 and electric field stimulator 1328 varies with rotation of knob 1310 and shaft 1308. Alternatively, electric field stimulator 1328 could be substantially planar and parallel to substrate 1302, and having a width or thickness that varies with distance from shaft 1308, as illustrated in FIG. 37I. As such, the degree of coupling of electric field stimulator 1328 with the electric field about field effect sensor 1306 varies with rotation of knob 1310 as a function of the distance between electric field stimulator 1328 and field effect sensor 1306 and/or the effective area of electric field stimulator 1328 in proximity to field effect sensor 1306. Through use of appropriate analog detection and control circuitry, embodiment 1360 could emulate, for example, a potentiometer.

Figure 37H:
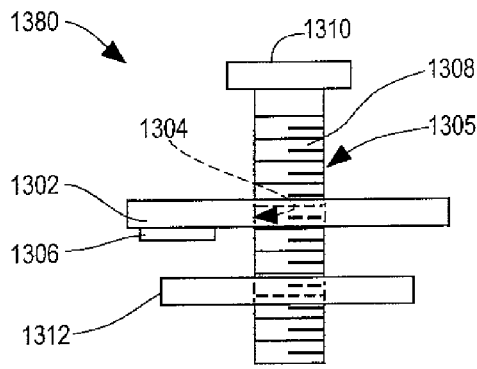
FIG. 37H is a side elevation view of yet another alternate embodiment of a rotary switch emulation according to the present invention.
Figure 37I:
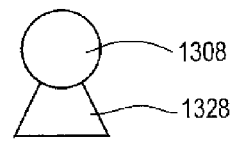
FIG. 37I is a top plan view of a portion of still another alternate embodiment of a rotary switch emulation according to the present invention.

FIG. 37H illustrates another alternate embodiment 1380 of the present invention that is particularly well-suited for use in connection with analog detection and control circuitry. Embodiment 1380 includes substrate 1302 defining aperture 1304 having internal threads 1305. Field effect sensor 1306 is disposed on substrate 1302 in proximity to aperture 1304. Threaded shaft 1308 having knob 1310 at one end is screwed into aperture 1304. Electric field stimulator 1312 is attached to shaft 1308 at a predetermined location. As knob 1310 is rotated clockwise, electric field stimulator 1312 moves farther away from field effect sensor 1306. Conversely, as knob 1310 is rotated counter-clockwise, electric field stimulator 1312 moves closer to field effect sensor 1306. As such, rotation of knob 1310 affectively changes the coupling between electric field stimulator 1312 and field effect sensor 1306. These coupling changes readily can be detected and processed by analog detection and control circuitry, as would be known to one skilled in the art.

Figure 38A:
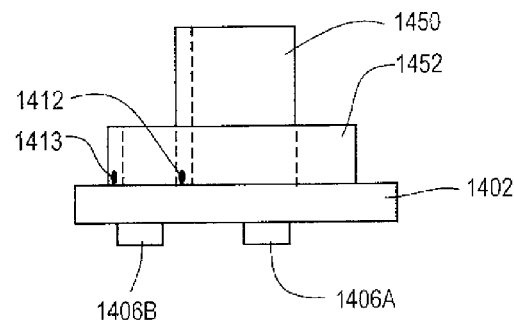
FIG. 38A is a side elevation view of a further alternate embodiment of a rotary switch emulation according to the present invention.
Figure 38C:
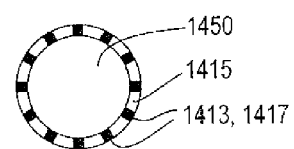
FIG. 38C is a bottom plan view of a portion of a further alternate embodiment of a rotary switch emulation according to the present invention.
Figure 38B:
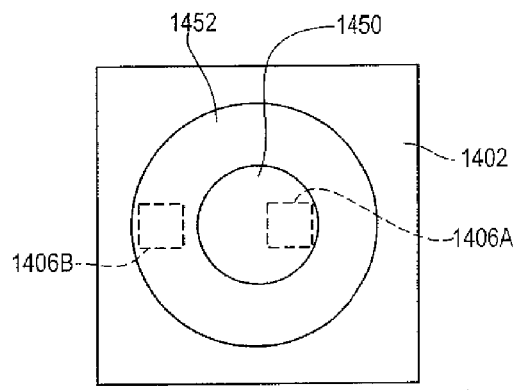
FIG. 38B is a top plan view of a further alternate embodiment of a rotary switch emulation according to the present invention.
Figure 38D:
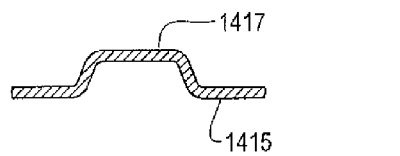
FIG. 38D is a partial cross-sectional view of a portion of a further alternate embodiment of a rotary switch emulation according to the present invention.

FIGS. 38A-38D illustrate yet another embodiment 1400 of the present invention emulating a rotary switch. Embodiment 1400 includes substrate 1402. Inner and outer knobs 1450, 1452 are attached to substrate 1402 by any suitable means such that each knob 1450,1452 can rotate about an axis substantially perpendicular to substrate 1402, as would be recognized by one skilled in the art. One or more electric field stimulators 1412 are disposed in the base of each of inner and outer knobs 1450,1452. Inner and outer field effect sensors 1406A,1406B are disposed on substrate 1402 substantially in alignment with electric field stimulators 1412 disposed in respective inner and outer knobs 1450,1452 so that each electric field stimulator 1412 alternately couples to and decouples from the electric field about respective field effect sensor 1406A,1406B upon rotation of respective inner or outer knob 1450,1452. Electric field stimulators 1412 can be embodied in various ways. For example, each electric field stimulator 1412 could be a conductive mass 1413, for example, a ball bearing, set into the bottom of respective knob 1450,1452. Alternatively, each electric field stimulator 1412 could be a bump 1417 in a ring 1415 inset into the bottom of respective knob 1450,1452, as shown in FIG. 38D. In a preferred embodiment, ring 1415 is made of beryllium copper having stamped bumps 1517.

Figure 39B:
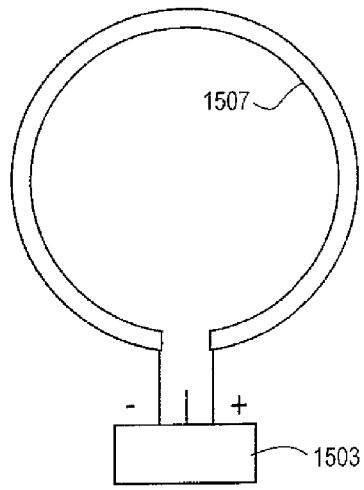
FIG. 39B is a schematic representation of an alternate electrode structure for use in connection with the embodiment illustrated in FIG. 39A.
Figure 39A:
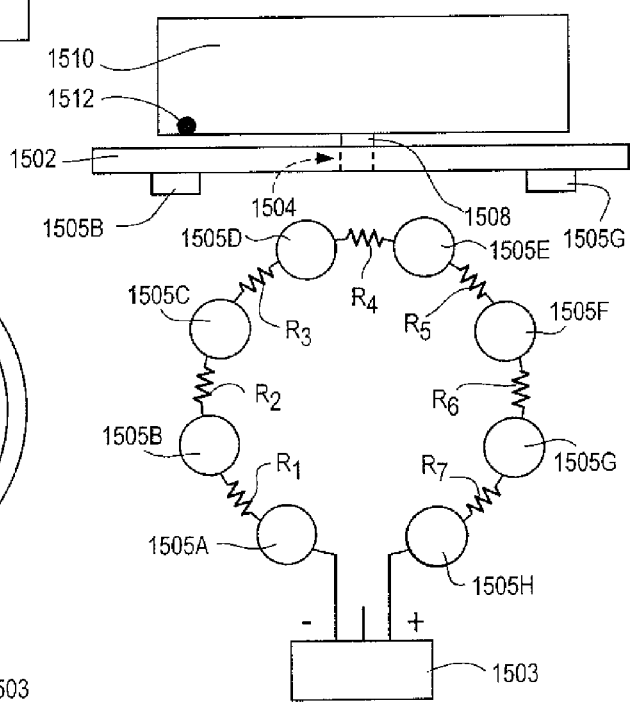
FIG. 39A is a side elevation view of an embodiment of a rotary switch emulation and/or angular position sensor according to the present invention and a schematic representation of electrode structure for use in connection therewith.

FIGS. 39A-39B illustrate an alternate embodiment 1500 of the present invention emulating a rotary switch. This embodiment is particularly well-suited for angular position sensing applications. These embodiment uses a single field effect sensor with multiple sensing electrodes. This embodiment includes substrate 1502 onto which are disposed in a generally circular arrangement detection 1503 and a string of sensing electrodes 1505A-1505H interspersed with resistors R1-R7. In alternate embodiments, detection circuit 1503 can be located remotely and more or fewer sensing electrodes and resistors than shown can be used.

Knob 1510 is connected to substrate 1502 such that knob 1510 can rotate about an axis substantially perpendicular to substrate 1502. In the FIG. 39A embodiment, shaft 1508 is inserted into and free to rotate within aperture 1504 defined by substrate 1502, and knob 1510 is fixed to shaft 1508. In other embodiments, shaft 1508 could be fixed to substrate 1502 and knob 1510 could rotate about shaft 1508. Field effect stimulator 1512 is embedded within or otherwise associated with knob 1510 such that field effect stimulator 1512 rotates with knob 1510 through an arc that substantially corresponds to the circular arrangement in which electrodes 1505A-1505H and resistors R1-R7 are disposed on substrate 1502.

In operation, as a user rotates knob 1510, electric field stimulator 1512 alternately couples to and decouples from the electric fields about corresponding electrodes 1505A-1505H. Analog detection circuitry could be adapted to determine the extent, rate, and direction of rotation of knob 1510, as would be understood by one skilled in the art. In a preferred embodiment, detection circuit 1503 can take the form shown in FIG. 33A, with electrodes 1505A and 1505H of the FIG. 39A embodiment taking the place of electrodes E2 and E1, respectively, shown in FIG. 33A. The strengths of the signals at the (+) and (−) inputs, and, therefore, the output of, summer 160 will have unique, predetermined values for each position of electric field stimulator 1512 with respect to electrodes 1505A-1505H, as would be recognized by one skilled in the art. (A detection circuit of the form shown in FIG. 33A also could be used to detect variations in distance between two conductive sheets, as would be recognized by one skilled in the art. As such, the FIG. 33A detection circuit could be used in connection with a pair of conductive sheets arranged as a vibration sensor, sound pressure sensor, air pressure sensor, position sensor, and the like. In certain embodiments, a layer of conductive foam could be disposed between the conductive sheets.)

Conductor 1507 having varying impedance over its length, as shown in FIG. 39B, can be used in place of the electrode-resistor string shown in FIG. 39A. The continuously varying impedance of conductor 1507 provides a continuously varying output to detection circuit 1503 as field effect stimulator 1512 changes position in response to rotation of knob 1510. As such, use of conductor 1507 might be preferred where fine resolution of, for example, angular position is required.

The FIGS. 39A-39B embodiment can easily be adapted for use as an angular position sensor, as would be recognized y one skilled in the art. The principles of the FIGS. 39A-39B embodiment can easily be adapted to provide a slide switch or slide potentiometer by simply arranging field effect sensors 1505A-1505H and resistors R1-R7 linearly and replacing knob 1510 with a slide, as shown in, for example, FIG. 42A. These principles can be further extended to detect position of a stimulus in an x-y array by creating an array of detection circuit and electrode-resistor strings, as shown FIG. 42E.

Figure 40:
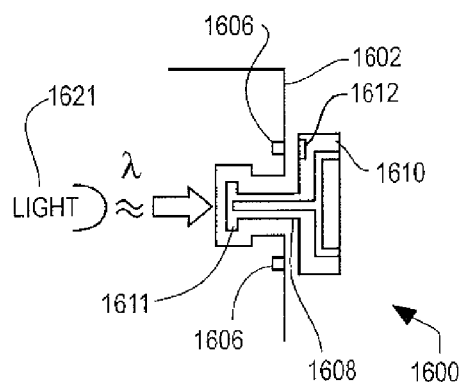
FIG. 40 is a side elevation view of still another further alternate embodiment of a rotary switch emulation according to the present invention.

FIG. 40 illustrates yet another embodiment 1600 of the invention emulating a rotary switch. Embodiment 1600 includes substrate 1602 and shaft 1608 having a outer knob 1610 and inner knob 1611. Substrate 1602 is formed, for example, by molding, to capture inner knob 1611 and encapsulate field effect sensor 1606. Electric field coupling element 1612 is encapsulated or otherwise embedded within outer knob 1610. Alternatively, electric field coupling element 1612 could be encapsulated or otherwise embedded within inner knob 1611. Light emitting device 1621 can be encapsulated within substrate 1602. By selecting transparent or translucent materials for at least portions of substrate 1602, inner and outer knobs 1610,1611, and shaft 1608, light emitting device 1621 can be used to selectively illuminate at least a portion of outer knob 1610.

Figure 41A:
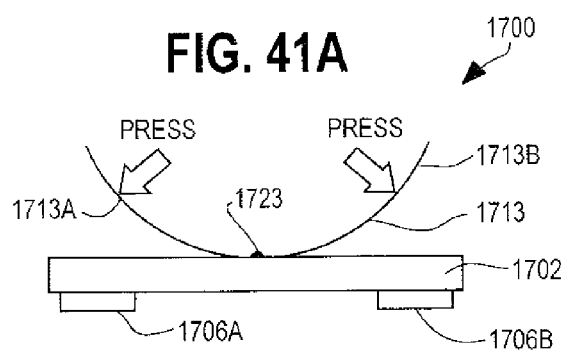
FIG. 41A is a side elevation view of an embodiment of a rocker switch emulation according to the present invention.

FIG. 41A illustrates an embodiment 1700 of the present invention emulating a mechanical rocker switch. Embodiment 1700 includes a substrate 1702, two field effect sensors 1706A,1706B disposed on a surface of substrate 1702, and electric field stimulators 1713A,1713B in the form of rocker 1713 attached to substrate 1702. In the illustrated embodiment, rocker 1713 is a piece of curved spring steel fixed to substrate 1702, and electric field stimulators 1713A,1713B are monolithic portions of rocker 1713. In alternate embodiments, rocker 1713 can be made of other materials and take other forms, and electric field stimulators 1713A,1713B could be separate elements, for example, ball bearings, embedded within rocker 1713, as would be recognized by one skilled in the art.

In operation, a user depresses either electric field stimulator 1713A corresponding to the left side of rocker 1713 or electric field stimulator 1713B corresponding to the right side of rocker 1713 toward substrate 1702. As electric field stimulator 1713A,1713B approaches or contacts substrate 1702, electric field stimulator 1713A,1713B couples to corresponding field effect sensor 1706A,1706B. In the illustrated embodiment, both electric field stimulators 1713A,1713B could be moved toward substrate 1702 at the same time. Preferably, rocker 1713 is configured so that only one of electric field stimulators 1713A,1713B can be moved toward substrate 1702 at any time.

Figure 41B:
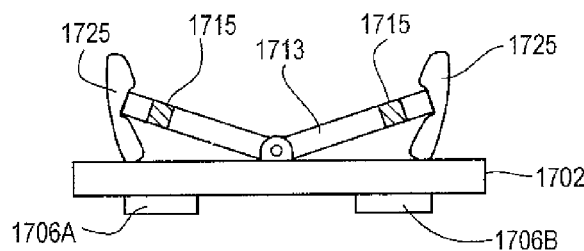
FIG. 41B is a side elevation view of an alternate embodiment of a rocker switch emulation according to the present invention.

FIG. 41B illustrates another embodiment 1750 of the present invention emulating a mechanical rocker switch. Embodiment 1750 is similar to embodiment 1700, except that embodiment 1750 uses a rigid rocker 1713. In certain embodiments, rocker 1713 might be made of a material that does not provide sufficient coupling to field effect sensors 1706A,1706B when depressed. In such embodiments, conductive masses 1715 can be embedded at appropriate locations in rocker 1713 to enhance such coupling, as would be recognized by one skilled in the art. In other embodiments, rocker 1713 can be shaped and sized so that a user's finger on rocker 1713 provides coupling to the electric field about field effect sensor 1706A,1706B when the user presses the corresponding portion of rocker 1713 towards substrate 1702.

Biasing means can be provided to bias rocker 1713 to a predetermined "normal" position. In FIG. 41B, the biasing means is embodied as a pair of plastic tabs 1725 attached to substrate 1702. Plastic tabs 1725 are sufficiently flexible to deflect when rocker 1713 is pressed, and sufficiently resilient to return rocker 1713 to the "normal" position when rocker 1713 is released. Any other suitable biasing means could be used, as would be recognized by one skilled in the art.

Figure 41C:
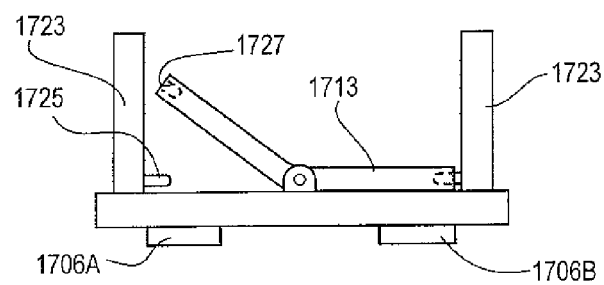
FIG. 41C is a side elevation view of another alternate embodiment of a rocker switch emulation according to the present invention.

Alternatively, as illustrated in FIG. 41C, rocker 1713 and tabs can be adapted to secure rocker 1713 in a particular position until repositioned by a user. In such an embodiment, tabs 1725 preferably include nubs 1725 projecting toward the ends of rocker 1713 and rocker 1713 preferably includes concavities 1727 at its ends for receiving nubs 1725.

FIG. 42A illustrates an embodiment 1800 of the present invention emulating a mechanical slide switch. Embodiment 1800 includes substrate 1802. One or more field effect sensors 1806 are disposed on substrate 1802. Electric field stimulator 1812, for example, a conductive cylinder or ball bearing, is attached to slide 1811. Slide 1811 engages with rails 1803 attached to substrate 1802. In operation, a user slides slide 1811 back and forth along substrate 1802. As electric field stimulator 1812 comes into proximity with a particular field effect sensor 1806, electric field stimulator 1812 couples to the electric field about such field effect sensor 1806. Likewise, when electric field stimulator 1812 is moved away from a particular field effect sensor 1806, electric field stimulator 1812 decouples from the electric field about such field effect sensor 1806.

In an alternate embodiment, slide 1811 can be replaced with slide 1817 having a cutout 1819 designed to accommodate a user's finger. In this embodiment, the user's finger functions as electric field stimulator 1812. In a further alternate embodiment, slide 1811 can be eliminated altogether. The same principles can be applied to a rotary switch emulation by arranging field effect sensors 1806 about the periphery of a cylinder (not shown) or frustum of a cone 1807, as illustrated in FIG. 42D.

In certain embodiments, portions of slide 1811 can be illuminated. Such embodiments preferably include light pipe 1821 and a light source (not shown) for illuminating light pipe 1821 in connection with substrate 1802, such that light channel 1823 disposed on slide 1811 can receive light from light pipe 1821. In other embodiments, other means can be used to illuminate slide 1811 or portions thereof.

FIG. 42B illustrates another embodiment 1850 of the present invention emulating a slide switch. Embodiment 1850 is similar to embodiment 1800, except that embodiment eliminates slider 1811 altogether. Flexible sheet 1827 under rails 1803 so as to overlay substrate 1802. Preferably, sheet 1827 is easily replaceable and can include graphics indicating, for example, the location of field effect sensors (not shown) disposed on substrate 1802 beneath sheet 1827. Normally, an air gap exists between sheet 1827 and a field effect sensor (not shown) disposed on substrate 1802 beneath sheet 1827. When a user touches sheet 1827 to actuate such field effect sensor, the air is displaced from this air gap, allowing and enhancing coupling of the user's finger to the electric field about the field effect sensor.

FIG. 42C illustrates an alternate embodiment 1860 of the present invention emulating a slide switch. Field effect sensor 1806 is disposed on substrate 1802. Substrate 1802 includes rails 1803. Slide 1811 is slidingly engaged with substrate 1802 via rails 1803. Electric field stimulator 1812 preferably is a conductive mass disposed on slide 1811. In the FIG. 41C embodiment, the cross sectional area of electric field stimulator 1812 varies from one end of slide 1811 to the other. With slide 1811 in the position shown in FIG. 42C, electric field stimulator 1812 is distant from field effect sensor 1806 and does not couple to the electric field about field effect sensor 1806. As slide 1811 is moved to the right by, for example, a user's finger, electric field stimulator eventually moves sufficiently close to field effect sensor 1806 to couple to the electric field about field effect sensor 1806. Initially, such coupling is small due to the small area of electric field stimulator 1812 that is in proximity to field effect sensor 1806 and the corresponding electric field. As slide 1811 is moved farther to the right, a greater portion of electric field stimulator 1812 comes into proximity with field effect sensor 1806 and the corresponding electric field and the coupling of electric field stimulator 1812 to the electric field increases. Analog detection circuitry can discern the varying state of coupling and provide a corresponding analog output to a corresponding control circuit. Biasing means, for example, coil spring 1814, can be provided to maintain slide 1811 in a "normal" position in the absence of a force displacing slide 1811 from such "normal" position.

Figure 43:
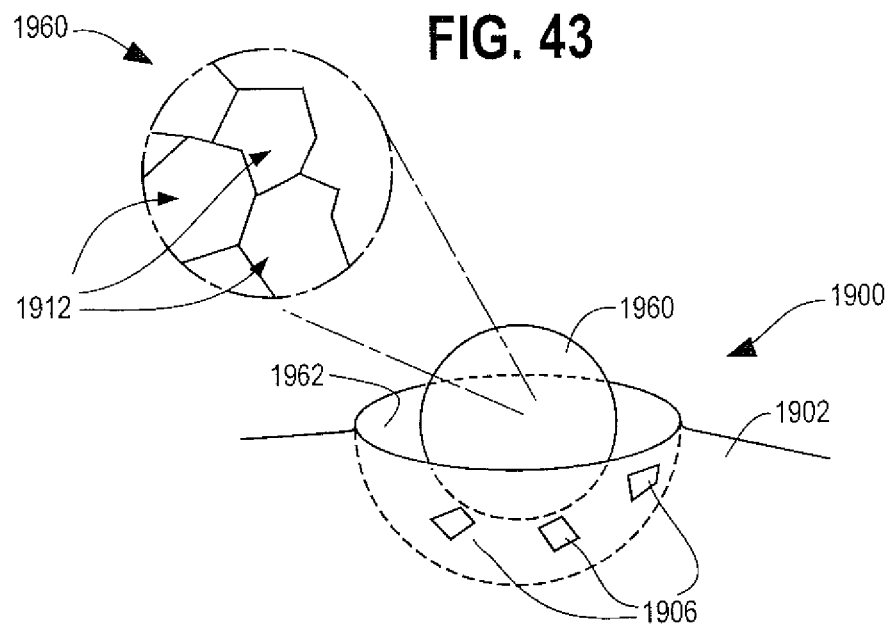
FIG. 43 is a side elevation view of an embodiment of a ball switch emulation according to the present invention.

FIG. 43 illustrates an embodiment 1900 of the present invention emulating a mechanical spherical switch or track ball. Embodiment 1900 includes a substrate 1902 forming a housing 1962 for ball 1960. One or more field effect sensors 1906 are arranged on the surface or embedded within substrate 1902. The perimeter of ball 1960 includes electric field stimulators 1912 arranged in a unique, non-repetitive pattern. In operation, as ball 1960 rotates within housing 1962, electric field stimulators couple to and decouple from the electric fields about field effect sensors 1906. Detection and control circuitry associated with field effect sensors 1906 can be adapted to determine the degree and direction of rotation of ball 1960, as would be recognized by one skilled in the art. In an alternate embodiment, ball 1960 can be fixed and substrate 1902 and housing 1962 can be permitted to rotate or otherwise move about housing 1962. This embodiment could be used, for example, to detect tilt or vibration.

Figure 44:
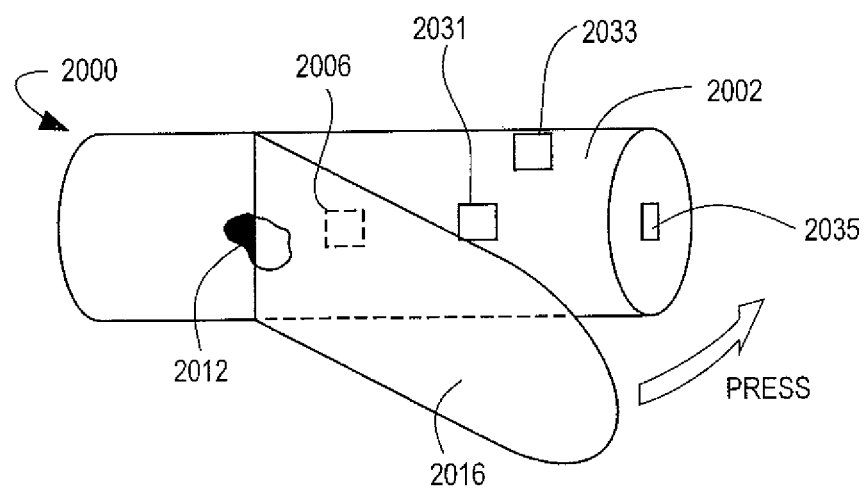
FIG. 44 is an illustration of a throttle control and related sensors embodying the principles of the present invention.

FIG. 44 illustrates an application specific embodiment 2000 of a mechanical switch emulation according to the present invention, in particular, a throttle for a snowmobile or personal watercraft. A field effect sensor 2006 is disposed in or encapsulated within handle 2002. Electric field stimulator 2012 in the form of a conductive mass is disposed on throttle lever 2016. As a user depresses and releases throttle lever 2016, electric field stimulator 2012 moves closer to and farther from field effect sensor 2006, respectively. An analog detection and control can be used to determine throttle position based on signals received from field effect sensor 2006. In preferred embodiments, additional field effect sensors 2031, 2033, and 2035 can be disposed on handle 2002. These additional sensors can include, for example, a redundant sensor 2031 for throttle control, a hand position sensor 2033 that disables the throttle unless it detects a rider's hand on handle 2002, and a water sensor 2035 that disables the throttle when immersed in water due to, for example, inversion of a watercraft.

Figure 45A:
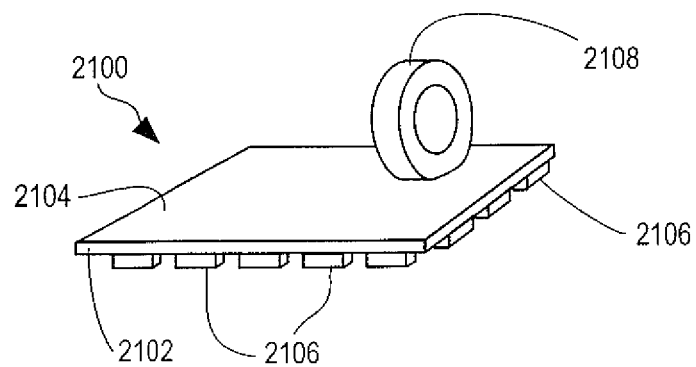
FIG. 45A is a perspective view of a tire pressure sensing apparatus according to the present invention.
Figure 45B:
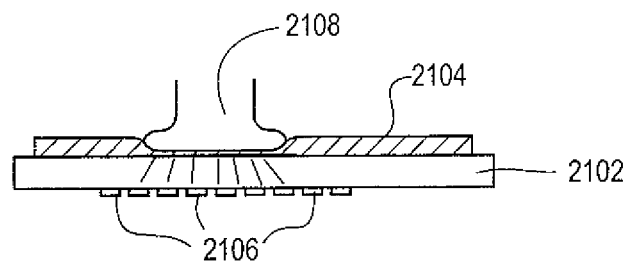
FIG. 45B is a side elevation view of a tire pressure sensing apparatus according to the present invention.

FIGS. 45A-45B illustrate an application specific embodiment of a tire pressure sensor 2100 according to the present invention. In preferred embodiments, a compressible and preferably conductive foam substrate 2104 is disposed on a surface of substrate 2102. A plurality of field effect sensors 2106 are arranged in a matrix array on the other surface of substrate 2102. In operation, tire 2108 of, for example, an automobile (not shown), is placed upon foam substrate 2104, thereby compressing the portion of foam substrate 2104 in contact with tire 2108. The compressed portion of foam substrate 2104 couples with the electric fields about corresponding field effect sensors 2106, thus actuating these sensors, as would be understood by one skilled in the art. A microprocessor (not shown) programmed with the weight of the load on tire 2108 can determine the air pressure in tire 2108 based on the signals it receives from field effect sensors 2106 corresponding to the area of foam compressed by tire 2108. In other embodiments, foam substrate 2104 can be omitted, such that tire 2108 itself effects the coupling to field effect sensors 2106.

Figure 46:
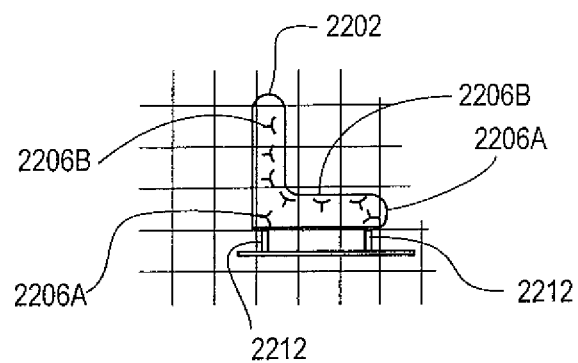
FIG. 46 is a side elevation view of an automobile seat including weight and position sensors according to the present invention.

FIG. 46 illustrates automobile passenger seat 2202 having seat portion 2202A and back portion 2202B. Seat 2202 preferably is stuffed or padded using compressible foam 2204 in which are embedded a plurality of field effect sensors 2206A for detecting weight placed on seat 2202 and a plurality of field effect sensors 2206B for sensing the physical dimensions of a person or item placed on seat 2202. Field effect stimulators 2212, embodied as seat support posts in the illustrated embodiment, are located in predetermined spatial relation to field effect sensors 2206A.

With seat 2202 empty, field effect sensors 2206A are a predetermined distance from field effect stimulators 2212 such that field effect sensors 2206A are not actuated. When a load, for example, a person or package, is placed on seat 2202, foam 2204 in seat portion 2202A is compressed, moving field effect sensors 2206A closer to field effect stimulators 2212, causing field effect stimulators 2212 to disturb the electric field about field effect sensors 2206A. The heavier the load placed on seat 2202, the greater the compression of foam 2204 in seat portion 2202B and corresponding displacement of field effect sensors 2206A. An analog detection and control circuit (not shown) receiving output signals from field effect sensors 2206A can determine from these signals the displacement of field effect sensors 2206A in response to the load placed on seat 2202. The control circuit can determine the weight of the person sitting or article placed on seat 2202 based on this displacement data and the compressibility characteristics of foam 2204.

Also, with seat 2202 empty, no stimulus couples to the electric fields about field effect sensors 2206B. When a person sits or a package is placed on seat 2202, the portions of the person or package in proximity to any of field effect sensors 2206B couple to the electric fields about these sensors. An analog or digital detection and control circuit receiving the output signals from field effect sensors 2206B can determine the physical outline of the load (person or package) on seat 2202. The control circuit could use this data in connection with the weight data derived from the signals received from field effect sensors 2206A, as discussed above, to determine whether the load on seat 2202 was a person or package. If the control circuit determined the load was a package and not a person, it might deactivate the passenger airbag. If the control circuit determined the load was a person and not a package, it might tailor the air bag deployment speed and force to the size and weight of the person occupying seat 2202.

While several embodiments of the present invention have been shown, it will be obvious to those skilled in the art that numerous modifications may be made without departing from the spirit of the claims appended hereto.

The invention claimed is:

1. A touch switch sensor apparatus comprising:
   a first sensor electrode;
   a first additional electrode in selectively variable capacitive relationship with said first electrode;
   a signal source; and
   a control circuit, said control circuit in the form of an integrated circuit in proximity to said first sensor electrode, said control circuit comprising:
      an input section having a first input channel and a second input channel;
      a decision section having a first input, a second input, and an output; and
      an output section;
      said first input channel coupled to said signal source, to said first sensor electrode, and to said first input of said decision section, said first input channel comprising as least one first input channel electrical component;
      said second input channel coupled to said signal source and to said second input of said decision section, said second input channel comprising at least one second input channel electrical component, each of said second input channel electrical components corresponding to one of said first input channel electrical components; and
      said output of said decision section coupled to said output section;
      wherein each of said second input channel electrical component is electrically matched to the corresponding first input channel electrical component.

2. The apparatus of claim 1 wherein a first of said first input channel electrical components comprises a first transistor having an input terminal, an output terminal, and a control terminal; said input terminal of said first transistor coupled to said signal source and to said first electrode; and said output terminal of said first transistor coupled to said first input of said decision section; and
   wherein a first of said second input channel electrical components comprises a second transistor having an input terminal, an output terminal, and a control terminal; said input terminal of said second transistor coupled to said signal source and said output terminal of said second transistor coupled to said second input of said decision section.

3. The apparatus of claim 2 wherein at least one of said said first and said second input channels further comprises a peak detector circuit.

4. The apparatus of claim 3 wherein said peak detector circuit comprises a rectifier coupled to said output terminal of said first transistor and to said first input of said decision section and a capacitor coupled to said first rectifier and to said first input of said decision section.

5. The apparatus of claim 3 wherein said rectifier comprises a first diode.

6. The apparatus of claim 2 wherein at least one of said first and said second input channels further comprises a square root extractor.

7. The apparatus of claim 1 further comprising a second additional electrode in variable capacitive relationship with said first electrode.

8. The apparatus of claim 1 wherein said apparatus generates a decision section output signal at the output of said decision section, wherein said decision section output signal changes in response to a change in capacitance between said first sensor electrode and said first additional electrode.

9. The apparatus of claim 1 wherein the separation between said first sensor electrode projected against the surface area of said first additional electrode is selectively variable.

10. The apparatus of any claim 1 wherein the surface area of said first sensor electrode projected against the surface area of said first additional electrode is selectively variable.

11. The apparatus of claim 1 wherein said first sensor electrode and said first additional electrode are configured to selectively receive a first medium having a first dielectric constant and a second medium having a second dielectric constant therebetween.

12. The apparatus of claim 1 wherein said first additional electrode is coupled to an electrical ground.

13. The apparatus of claim 1 further comprising a second sensor electrode coupled to said second input channel, said first additional electrode further in selectively variable capacitive relationship with said second sesnor electrode.

14. The apparatus of claim 13 wherein a first of said first input channel electrical components comprises a first transistor having an input terminal, an output terminal, and a control terminal; said input terminal of said first transistor coupled to said signal source and to said first electrode; and said output terminal of said first transistor coupled to said first input of said decision section; and
   wherein a first of said second input channel electrical components comprises a second transistor having an input terminal, an output terminal, and a control terminal;
   said input terminal of said second transistor coupled to said signal source and to said second electrode; and said output terminal of said second transistor coupled to said second input of said decision section.

15. The apparatus of claim 14 wherein at least one of said first and said second input channels further comprises a peak detector circuit.

16. The apparatus of claim 15 wherein said peak detector circuit comprises a rectifier coupled to said output terminal of said first transistor and to said first input of said decision section and a capacitor coupled to said first rectifier and to said first input of said decision section.

17. The apparatus of claim 16 wherein said rectifier comprises a first diode.

18. The apparatus of claim 13 wherein at least one of said first and said second input channels further comprises a square root extractor.

19. The apparatus of claim 13 further comprising a second additional electrode in variable capacitive relationship with said first sensor electrode and said second sensor electrode.

20. The apparatus of claim 19 wherein at least one of said first auxiliary additional electrode and said second additional electrode is coupled to an electrical ground.

21. The apparatus of claim 13 wherein said apparatus generates a decision section output signal at the output of said decision section in response to at least one of a change in capacitance between said first sensor electrode and said first additional electrode and a change in capacitance between said second sensor electrode and said first additional electrode.

22. The apparatus of claim 13 wherein the separation between said first sensor electrode projected against the surface area of said first additional electrode is selectively variable.

23. The apparatus of claim 13 wherein the surface area of said first sensor electrode projected against the surface area of said first additional electrode is selectively variable.

24. The apparatus of claim 13 wherein said first sensor electrode and said first additional electrode are configured to selectively receive a first medium having a first dielectric constant and a second medium having a second dielectric constant therebetween.

* * * * *

UNITED STATES PATENT AND TRADEMARK OFFICE
CERTIFICATE OF CORRECTION

PATENT NO. : 9,306,561 B2
APPLICATION NO. : 13/540250
DATED : April 5, 2016
INVENTOR(S) : David W. Caldwell Page 1 of 1

It is certified that error appears in the above-identified patent and that said Letters Patent is hereby corrected as shown below:

In the Claims claim 1, at column 51, line 55, add the letter --s-- to the word component;

claim 3, at column 52, line 4, delete the word "said" after the word "said";

claim 10, at column 52, line 29, delete the word "any" after the word "of";

claim 13, at column 52, line 43, delete the word "sesnor" and add in its place the word --sensor--.

Signed and Sealed this
Seventh Day of June, 2016

Michelle K. Lee
*Director of the United States Patent and Trademark Office*